US009859061B2

(12) United States Patent
Okada et al.

(10) Patent No.: US 9,859,061 B2
(45) Date of Patent: Jan. 2, 2018

(54) CHIP CAPACITOR AND METHOD FOR MANUFACTURING THE SAME

(71) Applicant: ROHM CO., LTD., Kyoto (JP)

(72) Inventors: Hiroyuki Okada, Kyoto (JP); Yasuhiro Fuwa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 239 days.

(21) Appl. No.: 14/372,741

(22) PCT Filed: Dec. 26, 2012

(86) PCT No.: PCT/JP2012/083571
§ 371 (c)(1),
(2) Date: Jul. 16, 2014

(87) PCT Pub. No.: WO2013/108555
PCT Pub. Date: Jul. 25, 2013

(65) Prior Publication Data
US 2015/0022938 A1      Jan. 22, 2015

(30) Foreign Application Priority Data

Jan. 17, 2012  (JP) ................................ 2012-007071
Jan. 17, 2012  (JP) ................................ 2012-007072
(Continued)

(51) Int. Cl.
*H01G 5/011*     (2006.01)
*H01G 4/33*      (2006.01)
(Continued)

(52) U.S. Cl.
CPC ............. *H01G 5/011* (2013.01); *H01G 4/015* (2013.01); *H01G 4/33* (2013.01); *H01G 4/385* (2013.01);
(Continued)

(58) Field of Classification Search
CPC .......... H01G 5/38; H01G 5/011; H01G 4/385; H01G 4/40; H01G 4/33; H01G 4/015
See application file for complete search history.

(56) References Cited

U.S. PATENT DOCUMENTS 3,737,805 A * 6/1973 Shimodaira ............. G04F 5/066
                                                       331/116 R
4,439,814 A * 3/1984 Rhodes .................... H01G 4/08
                                                         29/25.42
(Continued)

FOREIGN PATENT DOCUMENTS

CN           1725396 A      1/2006
JP        S-55-62721 A      5/1980
(Continued)

*Primary Examiner* — David M Sinclair
(74) *Attorney, Agent, or Firm* — Rabin & Berdo, P.C.

(57) ABSTRACT

[Theme] To provide a chip capacitor capable of easily and rapidly accommodating a plurality of types of capacitance values using a common design and a method for manufacturing the chip capacitor. [Solution] A chip capacitor 1 includes a substrate 2, a first external electrode 3, a second external electrode 4, capacitor elements C1 to C19, and fuses F1 to F9 disposed on the substrate 2. The capacitor elements C1 to C19 respectively include a first electrode film 11, a first capacitance film 12 on the first electrode film 11, a second electrode film 13 disposed on the first capacitance film 12 and facing the first electrode film 11, a second capacitance film 17 on the second electrode film 13, and a third electrode film 16 disposed on the second capacitance film 17 and facing the second electrode film 13 and are connected between the first external electrode 3 and the second external electrode 4. The fuses F1 to F9 are each interposed between the capacitor elements C1 to C19 and the first external electrode 3 or the second external electrode 4 and are capable of disconnecting each of the capacitor elements C1 to C19.

24 Claims, 53 Drawing Sheets

(30) Foreign Application Priority Data

| | | | |
|---|---|---|---|
| Jan. 17, 2012 | (JP) | ................................ | 2012-007073 |
| Jan. 17, 2012 | (JP) | ................................ | 2012-007074 |
| Jan. 17, 2012 | (JP) | ................................ | 2012-007075 |
| Jan. 17, 2012 | (JP) | ................................ | 2012-007076 |
| Dec. 7, 2012 | (JP) | ................................ | 2012-268570 |

(51) Int. Cl.

| | |
|---|---|
| *H01G 4/40* | (2006.01) |
| *H01G 4/015* | (2006.01) |
| *H01L 27/01* | (2006.01) |
| *H01L 49/02* | (2006.01) |
| *H01G 5/38* | (2006.01) |
| *H01G 4/38* | (2006.01) |

(52) U.S. Cl.
CPC ................. *H01G 4/40* (2013.01); *H01G 5/38* (2013.01); *H01L 27/016* (2013.01); *H01L 28/40* (2013.01)

(56) References Cited

U.S. PATENT DOCUMENTS

| | | | | |
|---|---|---|---|---|
| 4,894,746 A | * | 1/1990 | Mori | ........................ H01G 2/14 361/275.4 |
| 5,394,294 A | * | 2/1995 | Mei | ..................... H01L 27/0805 257/E27.048 |
| 6,980,413 B1 | | 12/2005 | Kim et al. | |
| 8,767,374 B2 | * | 7/2014 | Masuda | ................... H01G 4/06 361/301.4 |
| 8,907,449 B2 | | 12/2014 | Takahashi et al. | |
| 2004/0104451 A1 | * | 6/2004 | Ooi | ........................ H01G 4/224 257/532 |
| 2004/0264103 A1 | | 12/2004 | Otsuka et al. | |
| 2011/0075319 A1 | * | 3/2011 | Oikawa | ................... H01G 4/005 361/305 |
| 2011/0128669 A1 | | 6/2011 | Yano et al. | |
| 2011/0193194 A1 | | 8/2011 | Takahashi et al. | |

FOREIGN PATENT DOCUMENTS

| | | | | | |
|---|---|---|---|---|---|
| JP | S59-180463 U | | | 12/1984 | |
| JP | 60102727 A | * | | 6/1985 | |
| JP | 01036011 A | * | | 2/1989 | |
| JP | 02152212 A | * | | 6/1990 | |
| JP | 03190117 A | * | | 8/1991 | |
| JP | 05283282 A | * | | 10/1993 | |
| JP | H06-36965 A | | | 2/1994 | |
| JP | H06-140764 A | | | 5/1994 | |
| JP | H07-57970 A | | | 3/1995 | |
| JP | H09-55625 A | | | 2/1997 | |
| JP | 2001-284166 A | | | 10/2001 | |
| JP | 2002-359152 A | | | 12/2002 | |
| JP | 2005-033195 A | | | 2/2005 | |
| JP | 2007-280998 A | | | 10/2007 | |
| JP | 2010-045297 A | | | 2/2010 | |
| JP | 2010-109014 A | | | 5/2010 | |
| JP | WO 2011105312 A1 | * | | 9/2011 | ............... H01G 4/06 |

* cited by examiner

Examine impedance characteristics at
f=5GHz for
Cp=0.3pF, Ro=0.5Ω,
C=0.2pF, 1pF, and 10pF, and
Rs = 10Ω to 10MΩ

CHIP CAPACITOR AND METHOD FOR MANUFACTURING THE SAME

FIELD OF THE ART

The present invention relates to a chip capacitor and a method for manufacturing the same.

BACKGROUND ART

Patent Document 1 discloses a laser trimmable capacitor in which a dielectric layer is formed via an internal electrode on a top surface of a base substrate and a laser trimmable upper electrode is formed on the dielectric layer so as to face the internal electrode. A portion of the upper electrode is removed by a laser to make the electrostatic capacitance between the electrodes take on a desired value.

PRIOR ART DOCUMENT

Patent Document

Patent Document 1: Japanese Patent Application Publication No. 2001-284166

SUMMARY OF THE INVENTION

Problem to be Solved by the Invention

With the above arrangement, when capacitors of a plurality of types of capacitance values are required, a plurality of types of capacitors corresponding to the plurality of capacitance values need to be designed individually. A long period of time is thus required for design and much labor is required therefor. Moreover, when a specification of an equipment in which a capacitor is installed is changed and a capacitor of a new capacitance value becomes necessary, this cannot be accommodated rapidly.

An object of the present invention is to provide a chip capacitor capable of easily and rapidly accommodating a plurality of types of capacitance values using a common design and a method for manufacturing the chip capacitor.

Means for Solving the Problem

A first aspect of the present invention provides a chip capacitor including a substrate, a first external electrode disposed on the substrate, a second external electrode disposed on the substrate, a plurality of capacitor elements, respectively including a first electrode film formed on the substrate, a first capacitance film formed on the first electrode film, a second electrode film formed on the first capacitance film so as to face the first electrode film, a second capacitance film formed on the second electrode film, and a third electrode film formed on the second capacitance film so as to face the second electrode film, and being connected between the first external electrode and the second external electrode, and a plurality of fuses that are formed on the substrate, are each interposed between the plurality of capacitor elements and the first external electrode or the second external electrode, and are capable of disconnecting each of the plurality of capacitor elements.

With this arrangement, the plurality of capacitor elements are connected between the first and second external electrodes disposed on the substrate. The plurality of fuses that are capable of disconnecting each of the plurality of capacitor elements are provided between the plurality of capacitor elements and the first or second external electrodes. A plurality of types of capacitance values can thus be accommodated easily and rapidly by selecting and cutting one or a plurality of the fuses. In other words, a common design can be applied to chip capacitors of a plurality of types of capacitance values.

Further with the present invention, one capacitor structure is formed by the first electrode film, the first capacitance film, and the second electrode film, and another capacitor structure is formed by the second electrode film, the second capacitance film, and the third electrode film. Multilayer capacitor structures are thus formed on the substrate to enable the chip capacitor to be made high in capacitance. That is, a high capacitance capacitor can be provided even with a small substrate size and a more compact chip capacitor can be provided for the same capacitance.

A second aspect of the present invention provides the chip capacitor according to the first aspect, where the plurality of capacitor elements have mutually different capacitance values. With this arrangement, chip capacitors of various capacitance values can be realized with a common design by combining a plurality of the capacitor elements that differ in capacitance value. A third aspect of the present invention provides the chip capacitor according to the second aspect, where the capacitance values of the plurality of capacitor elements are set to form a geometric progression. With this arrangement, the capacitance value of the chip capacitor can be adjusted accurately to a desired capacitance value by appropriate selection of a plurality of the capacitor elements to be connected between the first external electrode and the second external electrode. For example, by setting the common ratio of the geometric progression to 2, the capacitance value of the chip capacitor can be adjusted at the precision of the first term of the geometric progression (term of the smallest value in the geometric progression).

A fourth aspect of the present invention provides the chip capacitor according to any one of the first to third aspects, where at least one of the plurality of fuses is cut. With the chip capacitor that has been adjusted in capacitance value, one or a plurality of the fuses may be cut. The capacitor elements to be connected between the first external electrode and the second external electrode can be selected by fuse cutting and the chip capacitor of the required capacitance value can thereby be realized.

A fifth aspect of the present invention provides the chip capacitor according to any one of the first to fourth aspects, where the second electrode film is divided into a plurality of second electrode film portions and the plurality of fuses are connected respectively to the plurality of the second electrode film portions. With this arrangement, a capacitor structure is arranged by the first capacitance film being sandwiched between the first electrode film and the second electrode film, and another capacitor structure is arranged by the second capacitance film being sandwiched between the second electrode film and the third electrode film. The second electrode film is divided into the plurality of second electrode film portions, the respective second electrode film portions thus face the first and third electrode films, and the plurality of capacitor elements are thereby provided on the substrate. The chip capacitor having the required capacitance value can be arranged by cutting the fuses corresponding to the relevant second electrode film portions of the plurality of capacitor elements.

A sixth aspect of the present invention provides the chip capacitor according to the fifth aspect, where the plurality of second electrode film portions face the first electrode film and the third electrode film over mutually different facing areas. With this arrangement, the plurality of capacitor elements corresponding to the plurality of second electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value.

A seventh aspect of the present invention provides the chip capacitor according to the sixth aspect, where the facing areas of the plurality of second electrode film portions are set to form a geometric progression. With this arrangement, the plurality of capacitor elements, the capacitance values of which are set to form a geometric progression, can be provided on the substrate. Chip capacitors of a plurality of types of capacitance values can thereby be realized and fine adjustment of the capacitance value can also be performed by fuse cutting.

An eighth aspect of the present invention provides the chip capacitor according to any one of the first to seventh aspects, where the first electrode film is divided into a plurality of first electrode film portions and the plurality of fuses are connected respectively to the plurality of the first electrode film portions. With this arrangement, the first electrode film is divided into the plurality of first electrode film portions, the respective first electrode film portions thus face the second electrode film, and the plurality of capacitor elements are thereby provided on the substrate. The chip capacitor having the required capacitance value can be arranged by cutting the fuses corresponding to the relevant first electrode film portions of the plurality of capacitor elements.

A ninth aspect of the present invention provides the chip capacitor according to the eighth aspect, where the plurality of first electrode film portions face the second electrode film over mutually different facing areas. With this arrangement, the plurality of capacitor elements corresponding to the plurality of first electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value.

A tenth aspect of the present invention provides the chip capacitor according to the ninth aspect, where the facing areas of the plurality of first electrode film portions are set to form a geometric progression. With this arrangement, the plurality of capacitor elements, the capacitance values of which are set to form a geometric progression, can be provided on the substrate. Chip capacitors of a plurality of types of capacitance values can thereby be realized and fine adjustment of the capacitance value can also be performed by fuse cutting.

An eleventh aspect of the present invention provides the chip capacitor according to any one of the first to tenth aspects, where the third electrode film is divided into a plurality of third electrode film portions and the plurality of fuses are connected respectively to the plurality of the third electrode film portions. With this arrangement, the third electrode film is divided into the plurality of third electrode film portions, the respective third electrode film portions thus face the second electrode film, and the plurality of capacitor elements are thereby provided on the substrate. The chip capacitor having the required capacitance value can be arranged by cutting the fuses corresponding to the relevant third electrode film portions of the plurality of capacitor elements.

A twelfth aspect of the present invention provides the chip capacitor according to the eleventh aspect, where the plurality of third electrode film portions face the second electrode film over mutually different facing areas. With this arrangement, the plurality of capacitor elements corresponding to the plurality of third electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value.

A thirteenth aspect of the present invention provides the chip capacitor according to the twelfth aspect, where the facing areas of the plurality of third electrode film portions are set to form a geometric progression. With this arrangement, the plurality of capacitor elements, the capacitance values of which are set to form a geometric progression, can be provided on the substrate. Chip capacitors of a plurality of types of capacitance values can thereby be realized and fine adjustment of the capacitance value can also be performed by cutting the fuses.

A fourteenth aspect of the present invention provides the chip capacitor according to any one of the first to thirteenth aspects, where the plurality of fuses are disposed with the positions thereof being shifted so as not to overlap with each other in a plan view of looking down at a principal surface of the substrate perpendicularly. With this arrangement, just the desired fuse can be cut by irradiating laser light from a direction perpendicular to the principal surface of the substrate and erroneous cutting of another fuse can be avoided. The capacitance value of the chip capacitor can thereby be adjusted reliably to the target value.

A fifteenth aspect of the present invention provides the chip capacitor according to any one of the fifth to thirteenth aspects, where the first electrode film, the second electrode film, or the third electrode film, and the fuses are formed of films of the same conductive material. With this arrangement, the electrode film portions and the fuses can be arranged from a conductive material film in common. Each electrode film portion can be disconnected by cutting the fuse corresponding to the electrode film portion.

A sixteenth aspect of the present invention provides a method for manufacturing a chip capacitor including a step of forming a plurality of capacitor elements on a substrate, a step of forming a first external electrode and a second external electrode on the substrate, and a step of forming, on the substrate, a plurality of fuses that disconnectably connect each of the plurality of capacitor elements to the first external electrode or the second external electrode, and where the step of forming the plurality of capacitor elements includes a step of forming a first electrode film on the substrate, a step of forming a first capacitance film on the first electrode film, a step of forming a second electrode film on the first capacitance film so as to face the first electrode film, a step of forming a second capacitance film on the second electrode film, a step of forming a third electrode film on the second capacitance film so as to face the second electrode film, and a step of dividing at least one among the first electrode film, the second electrode film, and the third electrode film into a plurality of electrode film portions.

By this method, chip capacitors being of a common design and yet being of a plurality of capacitance values can be manufactured by cutting the fuses that are selected in accordance with the required capacitance values. Also, a high capacitance capacitor can be provided even with a small substrate size and a more compact chip capacitor can be provided for the same capacitance.

A seventeenth aspect of the present invention provides the method for manufacturing a chip capacitor according to the sixteenth aspect, where the fuses are formed so as to be connected respectively to the plurality of electrode film portions. By this method, the chip capacitor having the required capacitance value can be arranged by cutting the fuses corresponding to the relevant electrode film portions of the plurality of capacitor elements provided on the substrate by means of the plurality of electrode film portions.

An eighteenth aspect of the present invention provides the method for manufacturing a chip capacitor according to the sixteenth or seventeenth aspect, where the plurality of electrode film portions are formed so as to face the electrode film, being faced across the first capacitance film or the second capacitance film, over mutually different facing areas. By this method, the plurality of electrode film portions are made to face the electrode film over mutually different facing areas to enable the plurality of capacitor elements differing in capacitance value to be formed on the substrate. Chip capacitors of a plurality of types of capacitance values can thus be manufactured by appropriately selecting and combining the capacitor elements of different capacitance values.

A nineteenth aspect of the present invention provides the method for manufacturing a chip capacitor according to the eighteenth aspect, where the facing areas of the plurality of electrode film portions are set to form a geometric progression. By this method, the plurality of capacitor elements with capacitance values being set to form a geometric progression can be formed on the substrate. Therefore, chip capacitors of a plurality of types of capacitance values can be provided and accurate adjustment to the desired capacitance value can be achieved by appropriately selecting and combining a plurality of capacitor elements.

A twentieth aspect of the present invention provides the method for manufacturing a chip capacitor according to any one of the sixteenth to nineteenth aspects, where the plurality of fuses are formed with the positions thereof being shifted so as not to overlap with each other in a plan view of looking down at a principal surface of the substrate perpendicularly. By this method, just the desired fuse can be cut by irradiating laser light from a direction perpendicular to the principal surface of the substrate and erroneous cutting of another fuse can be avoided. The capacitance value of the chip capacitor can thereby be adjusted reliably to the target value.

A twenty-first aspect of the present invention provides the method for manufacturing a chip capacitor according to any one of the sixteenth to twentieth aspects, where the first electrode film, the second electrode film, or the third electrode film, and the fuses are formed of films of the same conductive material. By this method, the electrode film portions and the fuses can be formed of films of the same conductive material and can therefore be formed by patterning the same film. The manufacturing process is thereby simplified.

A twenty-second aspect of the present invention provides the method for manufacturing a chip capacitor according to any one of the sixteenth to twenty-first aspects further including a fuse cutting step of cutting at least one of the plurality of fuses. By this method, the capacitance value of the chip capacitor can be adjusted to the desired capacitance value by appropriately selecting each fuse to be cut. That is, the chip capacitor adjusted to the desired capacitance value can be manufactured by appropriately selecting the capacitor elements to be connected to the first and second external electrodes and cutting the fuses corresponding to the capacitor elements besides those selected.

A twenty-third aspect of the present invention provides the method for manufacturing a chip capacitor according to the twenty-second aspect, further including a step of measuring a total capacitance value of the plurality of capacitor elements and a step of selecting each fuse to be cut based on the measured total capacitance value, and where each selected fuse is cut in the fuse cutting step. By this method, the total capacitance value of the plurality of capacitor elements is measured, each fuse to be cut is selected based on the measurement result, and therefore the capacitance value of the chip capacitor can be set to the targeted capacitance value reliably.

A twenty-fourth aspect of the present invention provides the method for manufacturing a chip capacitor according to the twenty-second or twenty-third aspect, further including a step of forming, after cutting the fuse or fuses, a protective film covering the cut portion of each fuse. By this method, the cut portion of each fuse is covered by the protective film and therefore entry of foreign matter and moisture with respect to the cut portion can be avoided to enable a chip capacitor, which can realize a plurality of types of capacitance values with a common design and is high in reliability, to be manufactured.

MODES FOR CARRYING OUT THE INVENTION

Figure 1:
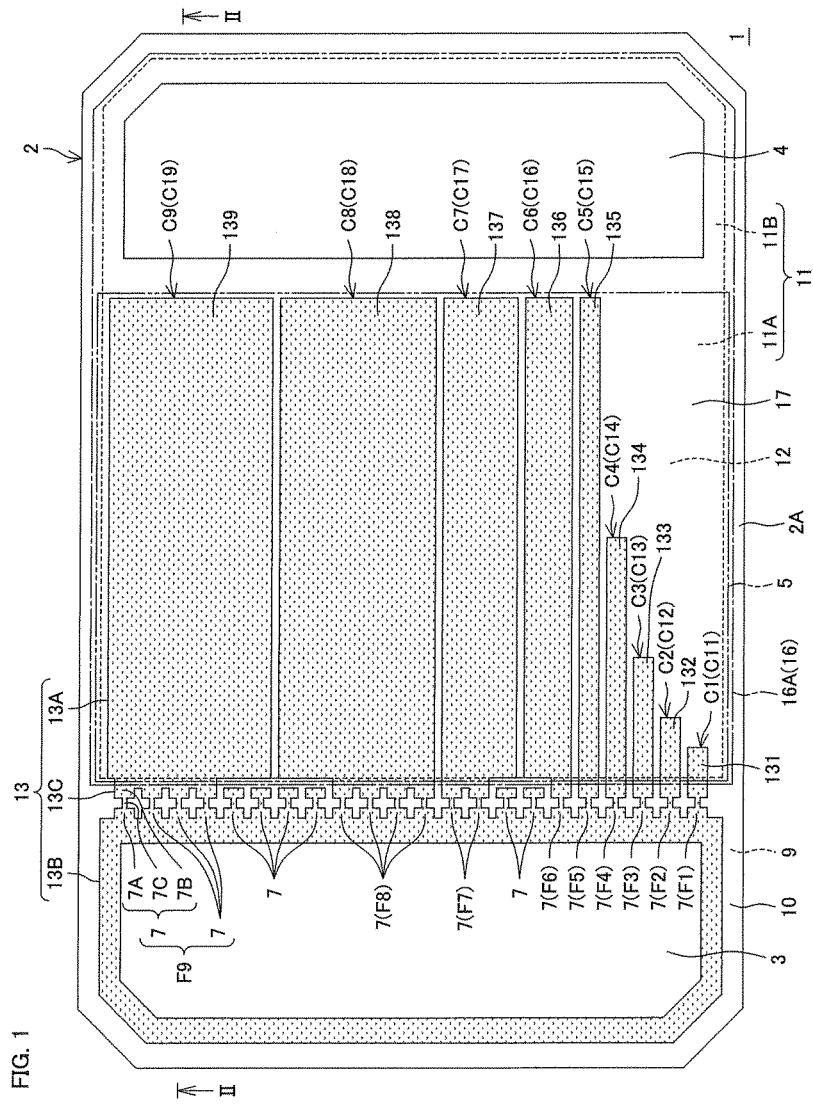
FIG. 1 is a plan view of a chip capacitor according to a first preferred embodiment of the present invention.
Figure 2:
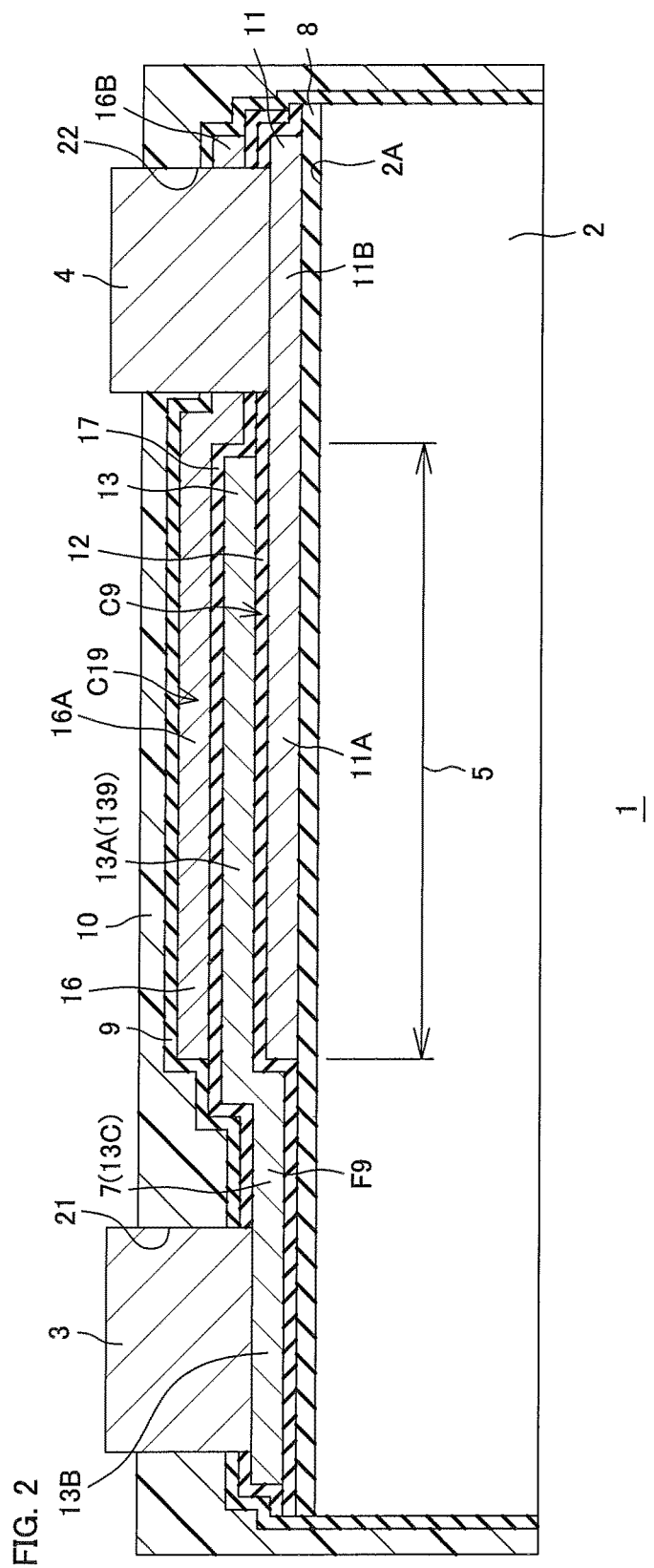
FIG. 2 is a sectional view taken along section line II-II in FIG. 1.
Figure 3:
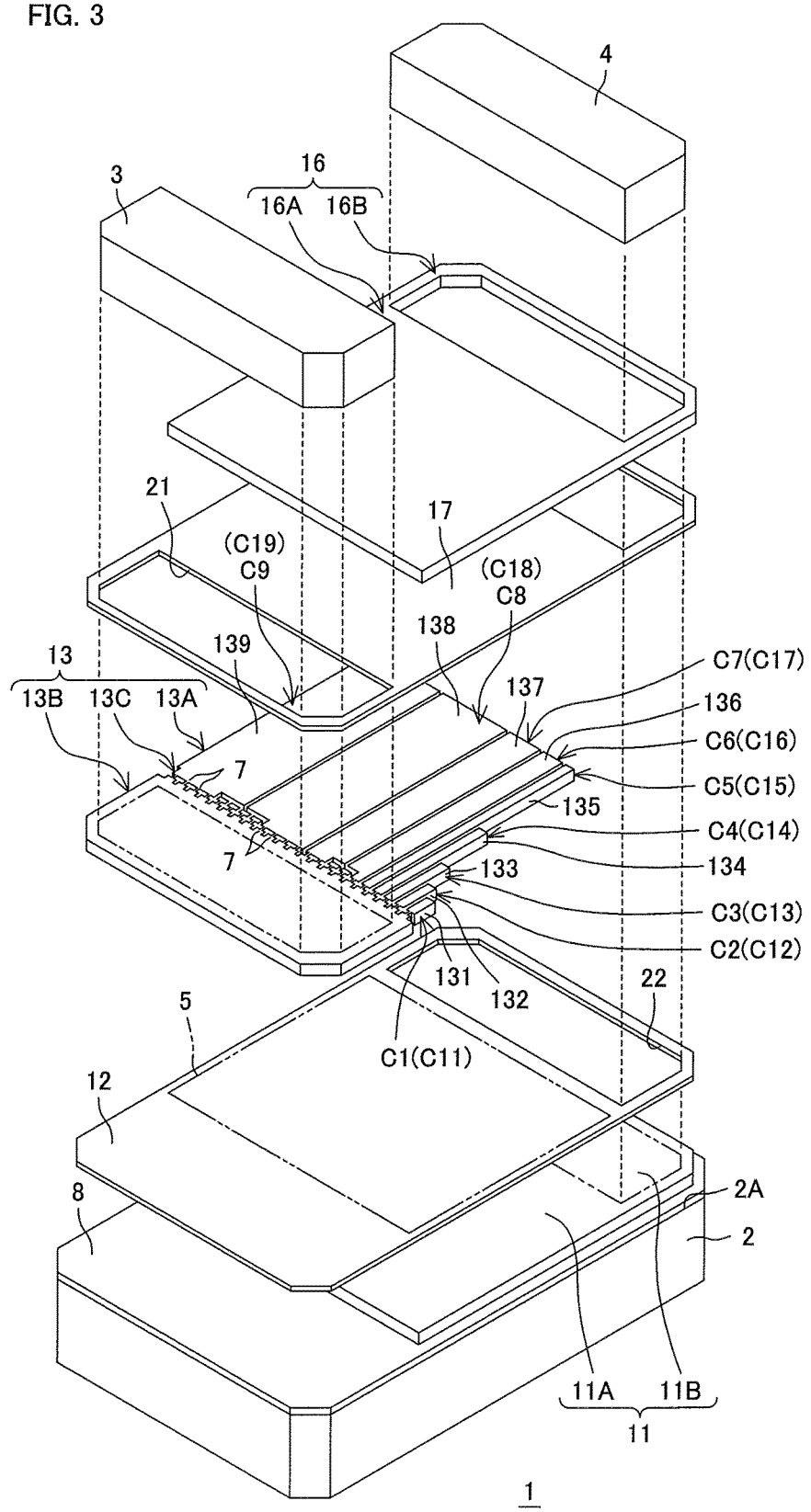
FIG. 3 is an exploded perspective view showing the arrangement of a portion of the chip capacitor in a separated state.

Preferred embodiments of the present invention shall now be described in detail with reference to the attached drawings. FIG. 1 is a plan view of a chip capacitor according to a first preferred embodiment of the present invention, and FIG. 2 is a sectional view thereof and shows a section taken along section line II-II in FIG. 1. Further, FIG. 3 is an exploded perspective view showing the arrangement of a portion of the chip capacitor in a separated state. The chip capacitor 1 includes a substrate 2, a first external electrode 3 disposed on the substrate 2, and a second external electrode 4 disposed similarly on the substrate 2. In the present preferred embodiment, the substrate 2 has, in a plan view of looking down at a principal surface (top surface) 2A of the substrate 2 perpendicularly, a rectangular shape with the four corners chamfered. The first external electrode 3 and the second external electrode 4 are respectively disposed at portions at respective ends in the long direction of the substrate 2. In the present preferred embodiment, each of the first external electrode 3 and the second external electrode 4 has a substantially rectangular planar shape extending in the short direction of the substrate 2 and has chamfered portions at two locations respectively corresponding to the corners of the substrate 2. On the substrate 2, a plurality of capacitor elements C1 to C19 are disposed within a capacitor arrangement region 5 between the first external electrode 3 and the second external electrode 4. The plurality of capacitor elements C1 to C19 are electrically connected respectively to the first external electrode 3 via a plurality of fuse units 7 (fuses). In the present preferred embodiment, the capacitor element C11 is positioned directly above the capacitor element C1, and similarly, each of the capacitor elements C12 to C19 is positioned directly above the corresponding capacitor element (the capacitor element with the numeral at the end of the symbol being the same) among the capacitor elements C2 to C9. The present chip capacitor 1 thus has capacitor structures of multiple layers (two layers in the present case) of vertically laminated capacitor elements.

As shown in FIG. 2 and FIG. 3, an insulating film 8 is formed on the top surface of the substrate 2, and a first electrode film 11 is formed on the top surface of the insulating film 8. The first electrode film 11 is formed to spread across substantially the entirety of the capacitor arrangement region 5 and extend to a region directly below the second external electrode 4. More specifically, the first electrode film 11 has a capacitor electrode region 11A functioning as a lower electrode in common to the capacitor elements C1 to C9 and a pad region 11B for leading out to an external electrode. The capacitor electrode region 11A is positioned in the capacitor arrangement region 5 and the pad region 11B is positioned directly below the second external electrode 4.

In the capacitor arrangement region 5, a first capacitance film (dielectric film) 12 is formed so as to cover the first electrode film 11 (capacitor electrode region 11A). The first capacitance film 12 is continuous across the entirety of the capacitor electrode region 11A and, in the present preferred embodiment, further extends to a region directly below the first external electrode 3 and covers the insulating film 8 outside the capacitor arrangement region 5. A second electrode film (capacitance adjustment electrode film) 13 is formed on the first capacitance film 12. In FIG. 1, the second electrode film 13 is colored for the sake of clarity. The second electrode film 13 includes a capacitor electrode region 13A positioned in the capacitor arrangement region 5, a pad region 13B positioned directly below the first external electrode 3, and a fuse region 13C disposed between the pad region 13B and the capacitor electrode region 13A.

In the capacitor electrode region 13A, the second electrode film 13 is divided into a plurality of (second) electrode film portions 131 to 139. In the present preferred embodiment, the respective electrode film portions 131 to 139 are all formed to rectangular shapes and extend in the form of bands from the fuse region 13C toward the second external electrode 4. The plurality of electrode film portions 131 to 139 face the first electrode film 11 across the first capacitance film 12 over a plurality of types of mutually different facing areas. More specifically, a ratio of the facing areas of the electrode film portions 131 to 139 with respect to the first electrode film 11 may be set to be 1:2:4:8:16:32:64:128:128. That is, the plurality of electrode film portions 131 to 139 include the plurality of electrode film portions differing in facing area and more specifically include the plurality of electrode film portions 131 to 138 (or 131 to 137 and 139) having facing areas (with respect to the first electrode film 11) that are set to form a geometric progression with a common ratio of 2. The plurality of capacitor elements C1 to C9, respectively arranged by the respective electrode film portions 131 to 139 and the facing first electrode film 11 across the first capacitance film 12, thus include the plurality of capacitor elements having mutually different capacitance values. If the ratio of the facing areas of the electrode film portions 131 to 139 is as mentioned above, the ratio of the capacitance values of the capacitor elements C1 to C9 is equal to the ratio of the facing areas and is 1:2:4:8:16:32:64:128:128. The plurality of capacitor elements C1 to C9 thus include the plurality of capacitor elements C1 to C8 (or C1 to C7 and C9) with capacitance values set to form the geometric progression with the common ratio of 2.

In the present preferred embodiment, the electrode film portions 131 to 135 are formed to bands that are equal in width and have lengths with the ratio thereof being set to 1:2:4:8:16. Also, the electrode film portions 135, 136, 137, 138, and 139 are formed to bands that are equal in length and have widths with the ratio thereof being set to 1:2:4:8:8. The electrode film portions 135 to 139 are formed to extend across a range from an end edge at the first external electrode 3 side to an end edge at the second external electrode 4 side of the capacitor arrangement region 5, and the electrode film portions 131 to 134 are formed to be shorter than this range.

The pad region 13B is formed to be substantially similar in shape to the first external electrode 3 and has a substantially rectangular planar shape having two chamfered portions corresponding to corner portions of the substrate 2. The fuse region 13C is disposed along one long side (the long side at the inner side with respect to the peripheral edge of the substrate 2) of the pad region 13B. The fuse region 13C includes the plurality of fuse units 7 that are aligned along the one long side of the pad region 13B. The fuse units 7 are formed of the same material as and to be integral to the pad region 13B of the second electrode film 13. The plurality of electrode film portions 131 to 139 are each formed integral to one or a plurality of the fuse units 7, are connected to the pad region 13B via the fuse units 7, and are electrically connected to the first external electrode 3 via the pad region 13B. Each of the electrode film portions 131 to 136 of comparatively small area is connected to the pad region 13B via a single fuse unit 7, and each of the electrode film portions 137 to 139 of comparatively large area is connected to the pad region 13B via a plurality of fuse units 7. It is not necessary for all of the fuse units 7 to be used and, in the present preferred embodiment, a portion of the fuse units 7 is unused.

The fuse units 7 include first wide portions 7A arranged to be connected to the pad region 13B, second wide portions 7B arranged to be connected to the electrode film portions 131 to 139, and narrow portions 7C connecting the first and second wide portions 7A and 7B. The narrow portions 7C are arranged to be capable of being cut (fused) by laser light. Unnecessary electrode film portions among the electrode film portions 131 to 139 can thus be electrically disconnected from the first and second external electrodes 3 and 4 by cutting the fuse units 7.

As shown in FIG. 2, a second capacitance film (dielectric film) 17 is formed so as to cover the second electrode film 13. The second capacitance film 17 is continuous across the entirety of the second electrode film 13 and, in the present preferred embodiment, further covers a portion of the first capacitance film 12 on which the second electrode film 13 is not disposed. A third electrode film 16 is formed on the second capacitance film 17. The third electrode film 16 has a capacitor electrode region 16A positioned in the capacitor arrangement region 5 and a pad region 16B positioned directly above (in an overlapping region in a plan view of) the pad region 11B of the first electrode film 11.

In this case, in the capacitor arrangement region 5, the capacitor electrode region 11A of the first electrode film 11 and the capacitor electrode region 13A of the second electrode film 13 face each other across the first capacitance film 12, and the capacitor electrode region 13A of the second electrode film 13 and the capacitor electrode region 16A of the third electrode film 16 face each other across the second capacitance film 17. Also, the plurality of electrode film portions 131 to 139 (see FIG. 1) in the capacitor electrode region 13A of the second electrode film 13 face the third electrode film 16 across the second capacitance film 17 over a plurality of types of mutually different facing areas. More specifically, as in the case with respect to the first electrode film 11, the ratio of the facing areas of the electrode film portions 131 to 139 with respect to the third electrode film 16 may be set to be 1:2:4:8:16:32:64:128:128. That is, the plurality of electrode film portions 131 to 139 include the plurality of electrode film portions differing in facing area and more specifically include the plurality of electrode film portions 131 to 138 (or 131 to 137 and 139) having facing areas (with respect to the third electrode film 16) that are set to form a geometric progression with a common ratio of 2. The plurality of capacitor elements C11 to C19, respectively arranged by the respective electrode film portions 131 to 139 and the facing third electrode film 16 across the second capacitance film 17, thus include the plurality of capacitor elements having mutually different capacitance values. If the ratio of the facing areas of the electrode film portions 131 to 139 is as mentioned above, the ratio of the capacitance values of the capacitor elements C11 to C19 is equal to the ratio of the facing areas and is 1:2:4:8:16:32:64:128:128. The plurality of capacitor elements C11 to C19 thus include the plurality of capacitor elements C11 to C18 (or C11 to C17 and C19) with capacitance values set to form the geometric progression with the common ratio of 2.

In the present preferred embodiment, each of the capacitor elements C1 to C9 and the corresponding capacitor element (the capacitor element with the numeral at the end of the symbol being the same) among the capacitor elements C11 to C19 share the electrode film portion in common among the electrode film portions 131 to 138 and therefore have equal capacitance values. Therefore with the chip capacitor 1, a single capacitor structure is formed by the first electrode film 11, the first capacitance film 12, and the second electrode film 13, and another capacitance structure is formed by the second electrode film 13, the second capacitance film 17, and the third electrode film 16. That is, capacitor structures of multiple layers (two layers in the present case) are formed on the substrate 2 and the chip capacitor 1 can thus be made high in capacitance. That is, a high capacitance capacitor can be provided even if the size of the substrate 2 is small and a more compact chip capacitor 1 can be provided for the same capacitance.

Although omitted from illustration in FIG. 1 and FIG. 3, the top surface of the chip capacitor 1 that includes the top surface of the third electrode film 16 is covered by a passivation film 9 as shown in FIG. 2. The passivation film 9 is constituted, for example, of a nitride film and is formed not only to cover the upper surface of the chip capacitor 1 but also to extend to side surfaces of the substrate 2 and cover the side surfaces. Further, a resin film 10, made of a polyimide resin, etc., is formed on the passivation film 9. The resin film 10 is formed to cover the upper surface of the chip capacitor 1 and extend to the side surfaces of the substrate 2 to cover the passivation film 9 on the side surfaces.

The passivation film 9 and the resin film 10 are protective films that protect the top surface of the chip capacitor 1. In these films, pad openings 21 and 22 are respectively formed in regions corresponding to the first external electrode 3 and the second external electrode 4. The pad opening 21 corresponds to the first external electrode 3 and penetrates through the passivation film 9, the resin film 10, and the second capacitance film 17 so as to expose a region of a portion of the pad region 13B of the second electrode film 13. The pad opening 22 corresponds to the second external electrode 4 and penetrates through the passivation film 9, the resin film 10, the third electrode film 16, the first capacitance film 12, and the second capacitance film 17 so as to expose regions of portions of the pad region 11B of the first electrode film 11 and the pad region 16B of the third electrode film 16.

The first external electrode 3 and the second external electrode 4 are respectively embedded in the pad openings 21 and 22. The first external electrode 3 is thereby bonded to the pad region 13B of the second electrode film 13 and the second external electrode 4 is bonded to the pad region 11B of the first electrode film 11 and the pad region 16B of the third electrode film 16. The first and second external electrodes 3 and 4 are formed to project from the top surface of the resin film 10. The chip capacitor 1 can thereby be flip-chip bonded to a mounting substrate.

Figure 4:
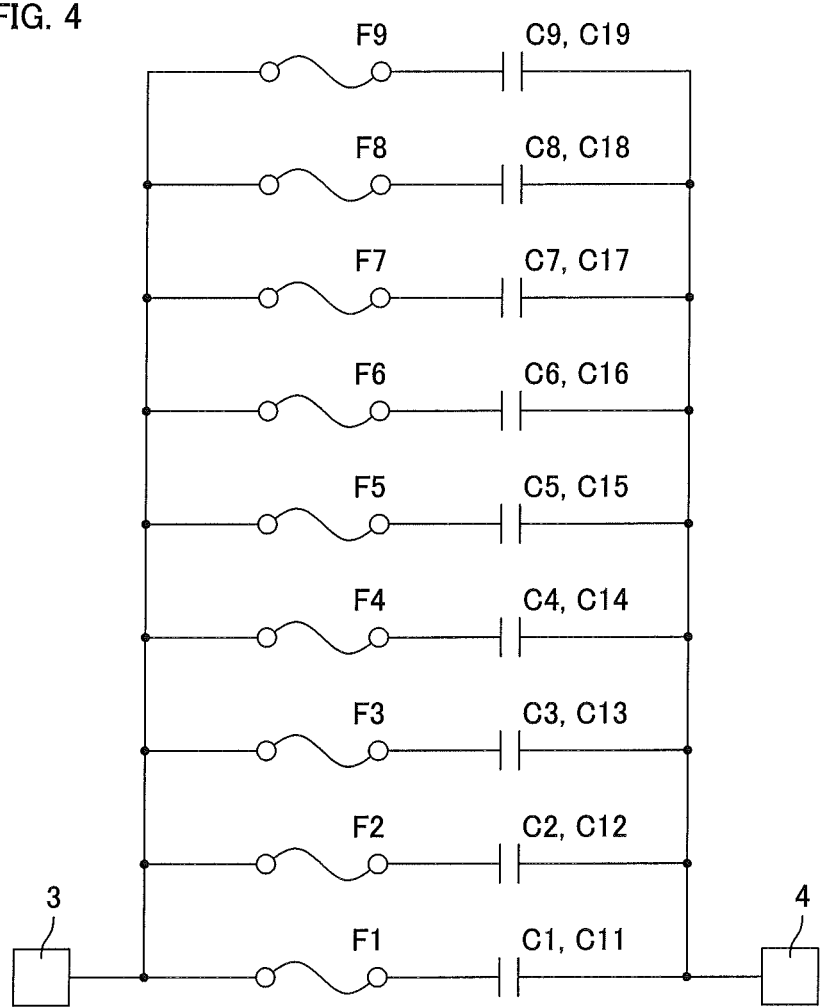
FIG. 4 is a circuit diagram of the electrical arrangement of the interior of the chip capacitor.

FIG. 4 is a circuit diagram of the electrical arrangement of the interior of the chip capacitor 1. The plurality of capacitor elements C1 to C19 are connected in parallel between the first external electrode 3 and the second external electrode 4. Fuses F1 to F9, each arranged from one or a plurality of the fuse units 7, are interposed in series between the respective capacitor elements C1 to C19 and the first external electrode 3. Specifically, each pair of vertically overlapping capacitor elements (the capacitor elements with the numeral at the end of the symbols being the same) are connected to the first external electrode 3 (an interval between first external electrode 3 and the second external electrode 4) via a common fuse. For example, the pair of capacitor elements C1 and C11 are connected to the first external electrode 3 via the common fuse F1.

When all of the fuses F1 to F9 are connected, the capacitance value of the chip capacitor 1 is equal to the total of the capacitance values of the capacitor elements C1 to C19. When one or two or more fuses selected from among the plurality of fuses F1 to F19 is or are cut, each pair of capacitor elements corresponding to a cut fuse are disconnected and the capacitance value of the chip capacitor 1 decreases by just the capacitance value of the disconnected pair or pairs of capacitor elements. For example, when the fuse F1 is cut, the corresponding pair of capacitor elements C1 and C11 are disconnected and the capacitance value of the chip capacitor 1 decreases by just the capacitance value of the disconnected pair of capacitor elements.

Therefore by measuring the capacitance value across the pad regions 11B (16B) and 13B (the total capacitance value of the capacitor elements C1 to C19) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor elements C1 to C8 (C11 to C18) are set to form a geometric progression with a common ratio of 2, fine adjustment to the targeted capacitance value at a precision corresponding to the capacitance value of the capacitor element C1, which is the smallest capacitance value (value of the first term in the geometric progression), is made possible.

For example, the capacitance values of the capacitor elements C1 to C19 may be set as follows. As mentioned above, each of the capacitor elements C1 to C9 and the corresponding capacitor element (the capacitor element with the numeral at the end of the symbol being the same) among the capacitor elements C11 to C19 have equal capacitance values. C1=C11=0.03125 pF C2=C12=0.0625 pF C3=C13=0.125 pF C4=C14=0.25 pF C5=C15=0.5 pF C6=C16=1 pF C7=C17=2 pF C8=C18=4 pF C9=C19=4 pF. In this case, the capacitance of the chip capacitor 1 can be finely adjusted at a minimum adjustment precision of 0.03125 pF. Also, the fuses to be cut from among the fuses F1 to F9 can be selected appropriately to provide the chip capacitor 1 with an arbitrary capacitance value between 0.1 pF and 20 pF.

As described above, with the present preferred embodiment, the plurality of capacitor elements C1 to C19 that can be disconnected by the fuses F1 to F9 are provided between the first external electrode 3 and the second external electrode 4. The capacitor elements C1 to C19 include a plurality of capacitor elements that differ in capacitance value and more specifically include a plurality of capacitor elements with capacitance values set to form a geometric progression. The chip capacitor 1, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor 1 shall now be described. With reference to FIG. 1, the substrate 2 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region 5 is generally a square region with each side having a length corresponding to the length of the short side of the substrate 2. The thickness of the substrate 2 may be approximately 150 μm. The substrate 2 may, for example, be a substrate that has been thinned by grinding or polishing from a rear surface side (surface on which the capacitor elements C1 to C19 are not formed). As the material of the substrate 2, a semiconductor substrate as represented by a silicon substrate may be used or a glass substrate may be used or a resin film may be used.

With reference to FIG. 2, the insulating film 8 may be a silicon oxide film or other oxide film. The film thickness thereof may be approximately 500 Å to 2000 Å. The first electrode film 11 is preferably a conductive film, a metal film in particular, and may, for example, be an aluminum film. The first electrode film 11 that is constituted of an aluminum film may be formed by a sputtering method. Similarly, the second electrode film 13 is preferably constituted of a conductive film, a metal film in particular, and may be an aluminum film. The second electrode film 13 that is constituted of an aluminum film may be formed by the sputtering method. The patterning for dividing the capacitor electrode region 13A of the second electrode film 13 into the electrode film portions 131 to 139 and shaping the fuse region 13C into the plurality of fuse units 7 may be performed by photolithography and etching processes. The third electrode film 16 is preferably constituted of a conductive film, a metal film in particular, and may be an aluminum film. The third electrode film 16 that is constituted of an aluminum film may be formed by a sputtering method.

At least any one of (in the present case, all of) the first electrode film 11, the second electrode film 13, and the third electrode film 16 is thus formed of a film of the same conductive material as the fuse units 7. In this case, the electrode film or films and the fuse unit 7 can be formed of films of the same conductive material and the manufacturing process is simplified because these can be formed by patterning the same film.

The first capacitance film 12 and the second capacitance film 17 may be constituted, for example, of silicon nitride films, and the film thicknesses thereof may be 500 Å to 2000 Å (for example, 1000 Å). The first capacitance film 12 and the second capacitance film 17 may be silicon nitride films formed by plasma CVD (chemical vapor deposition).

The passivation film 9 may be constituted, for example, of a silicon nitride film and may be formed, for example, by the plasma CVD method. The film thickness thereof may be approximately 8000 Å. As mentioned above, the resin film 10 may be constituted of a polyimide film or other resin film.

Each of the first and second external electrodes 3 and 4 may, for example, be constituted of a laminated structure film in which a nickel layer in contact with the first electrode film 11 (third electrode film 16) or the second electrode film 13, a palladium layer laminated on the nickel layer, and a gold layer laminated on the palladium layer are laminated, and may be formed, for example, by a plating method (or more specifically, an electroless plating method). The nickel layer contributes to improvement of adhesion with the first electrode film 11 (third electrode film 16) or the second electrode film 13, and the palladium layer functions as a diffusion preventing layer that suppresses mutual diffusion of the material of the first electrode film 11 (third electrode film 16) or the second electrode film 13 and the gold of the uppermost layer of each of the first and second external electrodes 3 and 4.

Figure 5:
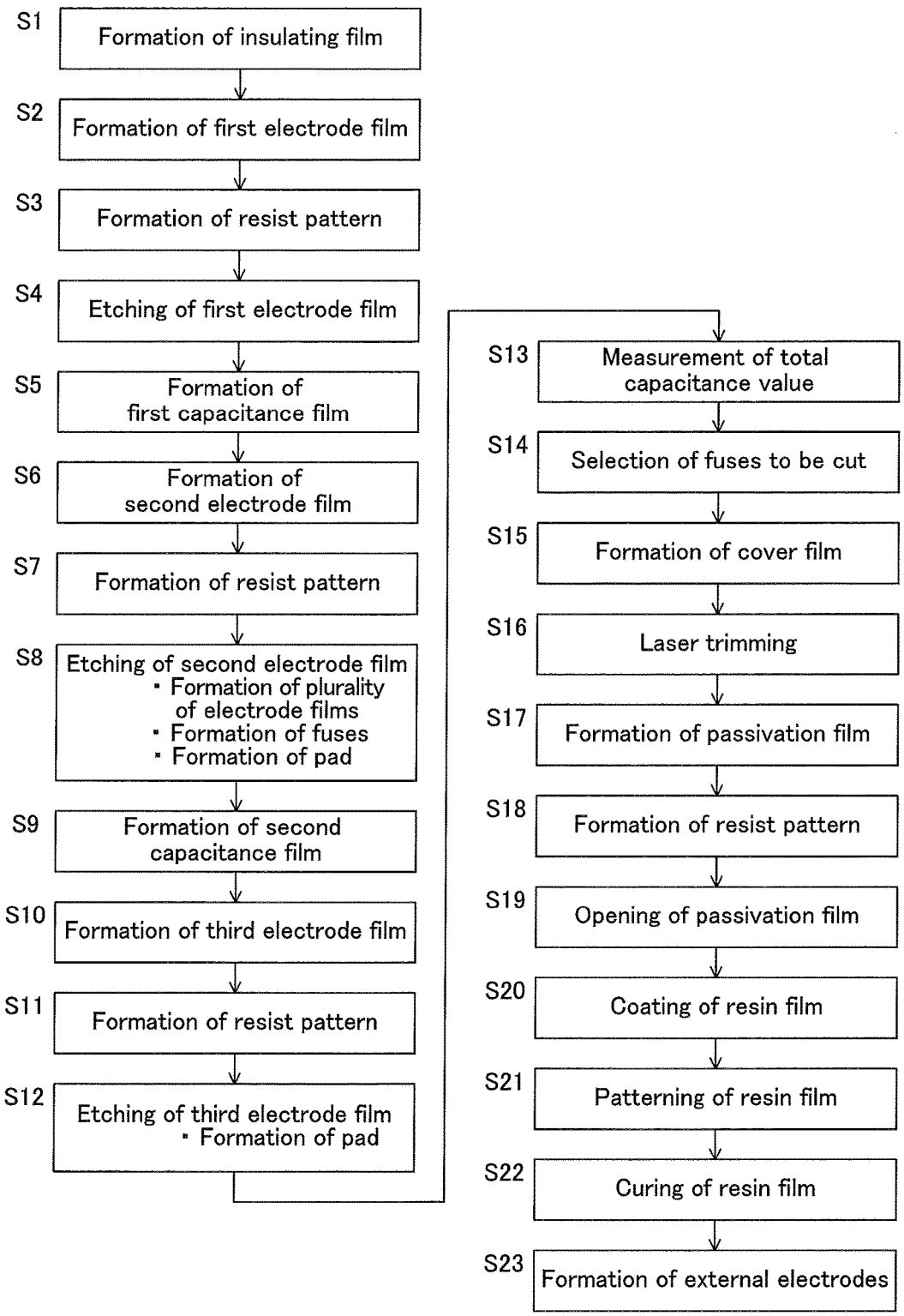
FIG. 5 is a flow diagram for describing an example of a process for manufacturing the chip capacitor.

FIG. 5 is a flow diagram for describing an example of a process for manufacturing the chip capacitor 1. The insulating film 8, constituted of an oxide film (for example, a silicon oxide film), is formed on the top surface of the substrate 2 by a thermal oxidation method and/or CVD method (step S1). Thereafter, the first electrode film 11, constituted of an aluminum film, is formed over the entire top surface of the insulating film 8, for example, by the sputtering method (step S2). The film thickness of the first electrode film 11 may be approximately 8000 Å. Thereafter, a resist pattern corresponding to the final shape of the first electrode film 11 is formed on the top surface of the first electrode film 11 by photolithography (step S3). The first electrode film 11 is etched using the resist pattern as a mask to obtain the first electrode film 11 of the pattern shown in FIG. 3, etc. (step S4). The etching of the first electrode film 11 may be performed, for example, by reactive ion etching.

Thereafter, the first capacitance film 12, constituted of a silicon nitride film, etc., is formed on the first electrode film 11, for example, by the plasma CVD method (step S5). In the region in which the first electrode film 11 is not formed, the first capacitance film 12 is formed on the top surface of the insulating film 8. Thereafter, the second electrode film 13 is formed on the first capacitance film 12 (step S6). The second electrode film 13 is constituted, for example, of an aluminum film and may be formed by the sputtering method. The film thickness thereof may be approximately 8000 Å. Thereafter, a resist pattern corresponding to the final shape of the second electrode film 13 is formed on the top surface of the second electrode film 13 by photolithography (step S7). The second electrode film 13 is patterned to its final shape (see FIG. 3, etc.) by etching using the resist pattern as a mask (step S8). The second electrode film 13 is thereby shaped to the pattern having the plurality of electrode film portions 131 to 139 in the capacitor electrode region 13A, having the plurality of fuse units 7 in the fuse region 13C, and having the pad region 13B connected to the fuse units 7. The etching for patterning the second electrode film 13 may be performed by wet etching using an etching liquid, such as phosphoric acid, etc., or may be performed by reactive ion etching.

Thereafter, the second capacitance film 17, constituted of a silicon nitride film, etc., is formed on the second electrode film 13, for example, by the plasma CVD method (step S9). In the region in which the second electrode film 13 is not formed, the second capacitance film 17 is formed on the top surface of the first capacitance film 12. Thereafter, the third electrode film 16 is formed on the second capacitance film 17 (step S10). Thereafter, a resist pattern corresponding to the final shape of the third electrode film 16 is formed on the top surface of the third electrode film 16 by photolithography (step S11). The third electrode film 16 is etched using the resist pattern as a mask to obtain the third electrode film 16 of the pattern having the pad region 16B shown in FIG. 3, etc. (step S12). The etching of the third electrode film 16 may be performed, for example, by reactive ion etching.

Thereafter, inspection probes are contacted against the pad region 13B of the second electrode film 13 and the pad region 11B of the first electrode film 11 (the pad region 16B of the third electrode film 16) to measure the total capacitance value of the plurality of capacitor elements C1 to C19 (step S13). Based on the measured total capacitance value, the capacitor elements to be disconnected, that is, the fuses to be cut are selected in accordance with the targeted capacitance value of the chip capacitor 1 (step S14).

Figure 6A:
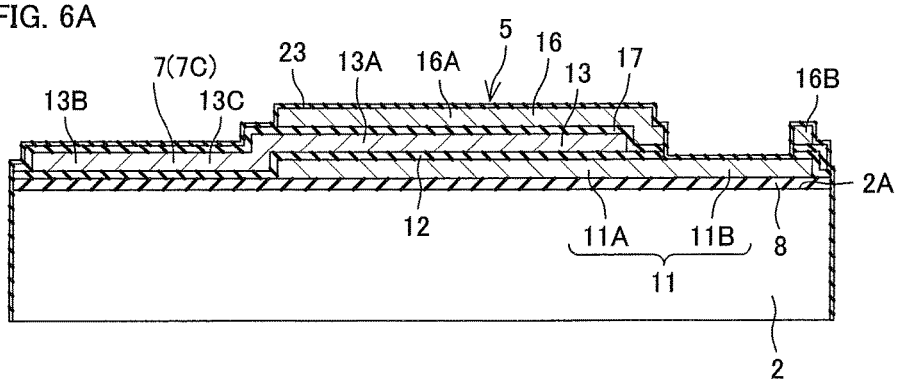
FIG. 6A, FIG. 6B, and FIG. 6C are sectional views for describing steps related to the cutting of a fuse.

Thereafter as shown in FIG. 6A, a cover film 23, constituted, for example, of a nitride film, is formed on the entire surface of the substrate 2 (step S15). The forming of the cover film 23 may be performed by the plasma CVD method and, for example, a silicon nitride film with a film thickness of approximately 3000 Å may be formed. The cover film 23 covers the patterned third electrode film 16 and, in the region in which the third electrode film 16 is not formed, covers the first capacitance film 12, the second capacitance film 17, the first electrode film 11 in the pad region 11B. The cover film 23 covers the fuse units 7 in the fuse region 13C.

Figure 6B:
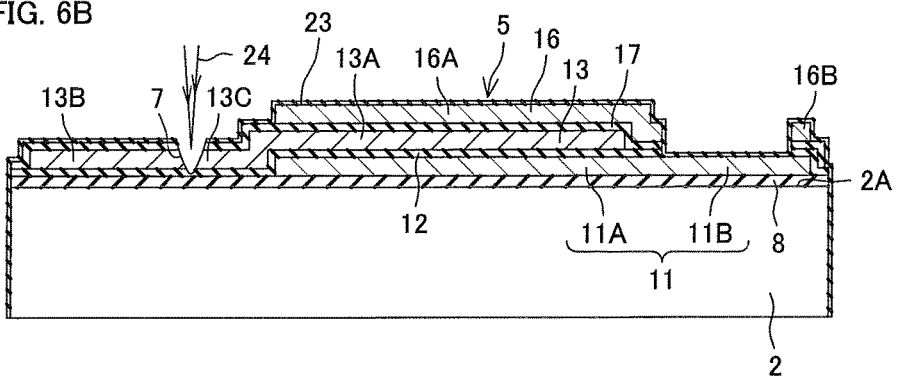

From this state, the laser trimming for fusing the fuse units 7 is performed (step S16). That is, as shown in FIG. 6B, each fuse unit 7 constituting a fuse selected in accordance with the measurement result of the total capacitance value is irradiated with laser light 24 and the narrow portion 7C of the fuse unit 7 is fused. The corresponding capacitor element (capacitor element pair) is thereby disconnected from the pad region 13B. When the laser light 24 is irradiated on the fuse unit 7, the energy of the laser light 24 is accumulated at a vicinity of the fuse unit 7 by the action of the cover film 23 and the fuse unit 7 is thereby fused.

Figure 6C:
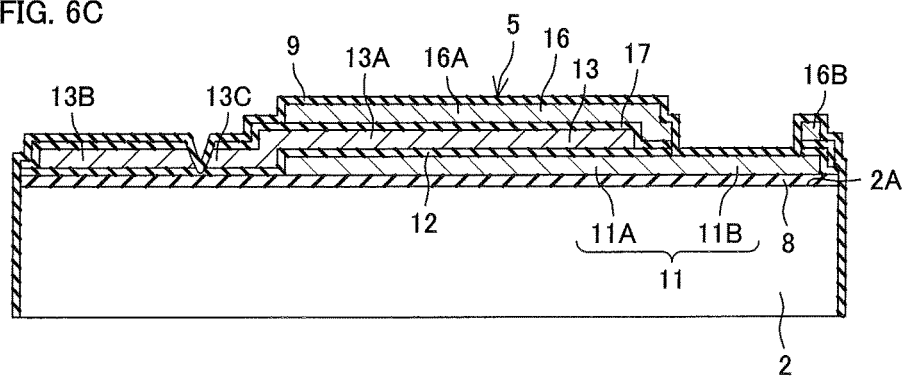

If the second capacitance film 17 has sufficient thickness enabling it to be used as a cover film for accumulating the energy of the laser light, the forming of the cover film 23 (step S15) immediately before the laser trimming may be omitted. Thereafter as shown in FIG. 6C, a silicon nitride film is deposited on the cover film 23, for example, by the plasma CVD method to form the passivation film 9 (step S17). In the final form, the cover film 23 is made integral with the passivation film 9 to constitute a portion of the passivation film 9. The passivation film 9 that is formed after the cutting of the fuses enters into openings in the cover film 23, destroyed at the same time as the fusing of the fuses, to cover and protect the cut surfaces of the fuse units 7. The passivation film 9 thus prevents entry of foreign matter and entry of moisture into the cut locations of the fuse units 7, thereby improving the reliability of the chip capacitor 1. The passivation film 9 may be formed to have a film thickness, for example, of approximately 8000 Å as a whole.

Thereafter, a resist pattern, having penetrating holes at positions at which the first and second external electrodes 3 and 4 are to be formed, is formed on the passivation film 9 (step S18). The passivation film 9 is etched using the resist pattern as a mask. In this process, the second capacitance film 17 is also etched as necessary. The pad opening exposing the first electrode film 11 in the pad region 11B, the pad opening exposing the third electrode film 16 in the pad region 16B, and the pad opening exposing the second electrode film 13 in the pad region 13B are thereby formed (step S19). The etching of the passivation film 9 may be performed by reactive ion etching.

Thereafter, a resin film is coated on the entire surface (step S20). As the resin film, for example, a coating film of a photosensitive polyimide is used. Patterning of the resin film by photolithography may be performed by performing an exposure step and a subsequent developing step on regions of the resin film corresponding to the pad openings (step S21). The pad openings 21 and 22 penetrating through the resin film 10 and the passivation film 9, etc., are thereby formed. Thereafter, heat treatment (curing) for hardening the resin film is performed (step S22) and further, the first external electrode 3 and the second external electrode 4 are grown inside the pad openings 21 and 22, for example, by the electroless plating method (step S23). The chip capacitor 1 of the structure shown in FIG. 1, etc., is thereby obtained.

In the patterning of the second electrode film 13 using the photolithography process, the electrode film portions 131 to 139 of minute areas can be formed with high precision and the fuse units 7 of even finer pattern can be formed. After the patterning of the third electrode film 16, the total capacitance value is measured and then the fuses to be cut are determined. By cutting the determined fuses, the chip capacitor 1 that is accurately adjusted to the desired capacitance value can be obtained.

Figure 7:
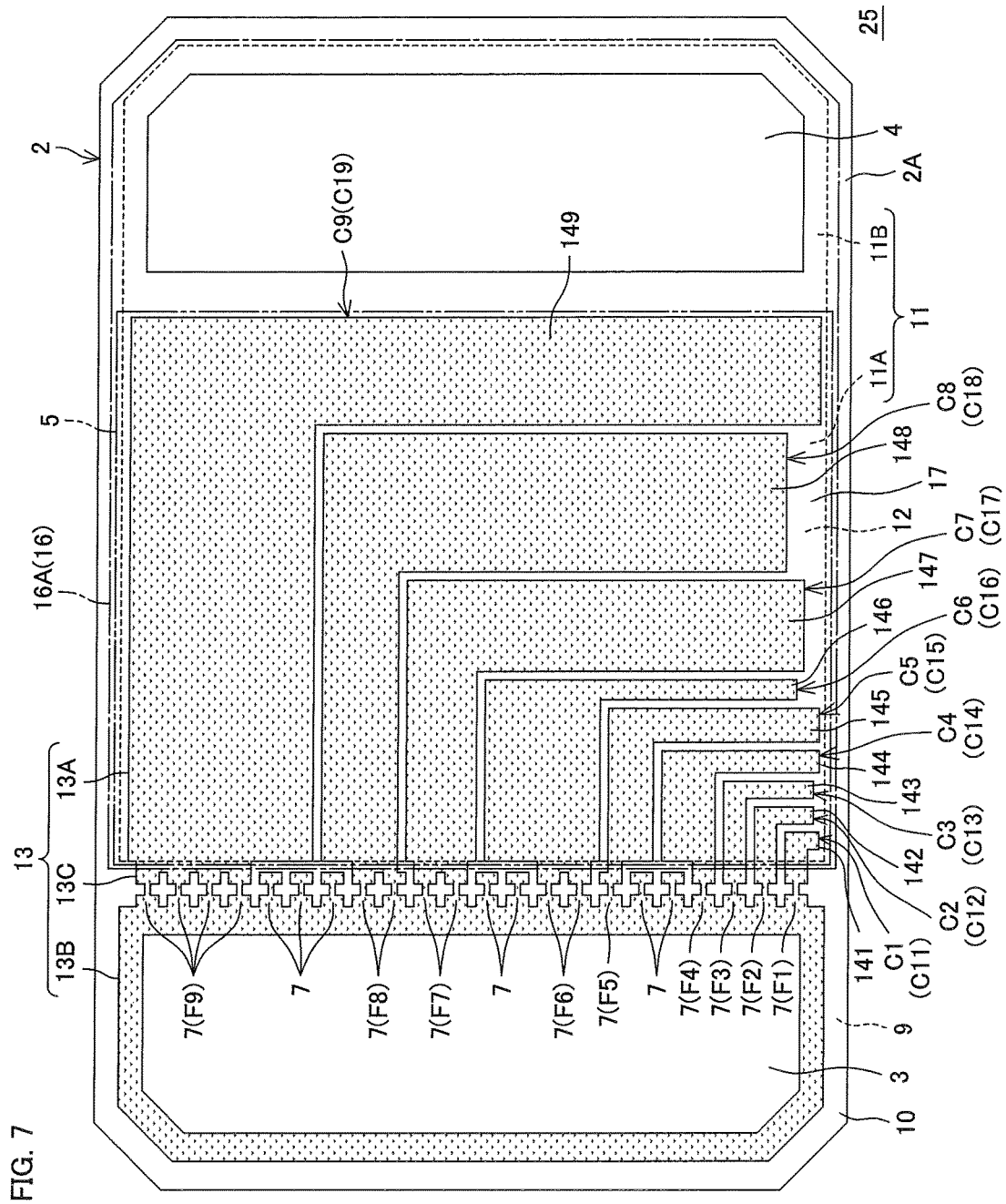
FIG. 7 is a plan view for describing the arrangement of a chip capacitor according to a second preferred embodiment of the present invention.

FIG. 7 is a plan view for describing the arrangement of a chip capacitor 25 according to a second preferred embodiment of the present invention. In FIG. 7, portions corresponding to respective portions shown in FIG. 1 are indicated using the same reference symbols as in FIG. 1. In the first preferred embodiment, the capacitor electrode region 13A of the second electrode film 13 is divided into the electrode film portions 131 to 139 each having a band shape. In this case, regions that cannot be used as capacitor elements are formed within the capacitor arrangement region 5 as shown in FIG. 1 and effective use cannot be made of the restricted region on the small substrate 2.

Therefore with the preferred embodiment shown in FIG. 7, the plurality of electrode film portions 131 to 139 are divided into L-shaped electrode film portions 141 to 149. For example, the electrode film portion 149 in the arrangement of FIG. 7 can thereby be made to face each of the first electrode film 11 and the third electrode film 16 over an area that is 1.5 times that of the electrode film portion 139 in the arrangement of FIG. 1. Therefore, if the capacitor element C9 (C19) corresponding to the electrode film portion 139 in the first preferred embodiment of FIG. 1 has a capacitance of 4 pF, the capacitor element C9 (C19) can be made to have a capacitance of 6 pF by use of the electrode film portion 149 of the present preferred embodiment. The capacitance value of the chip capacitor 25 can thereby be set over a wider range by making effective use of the interior of the capacitor arrangement region 5.

Figure 8:
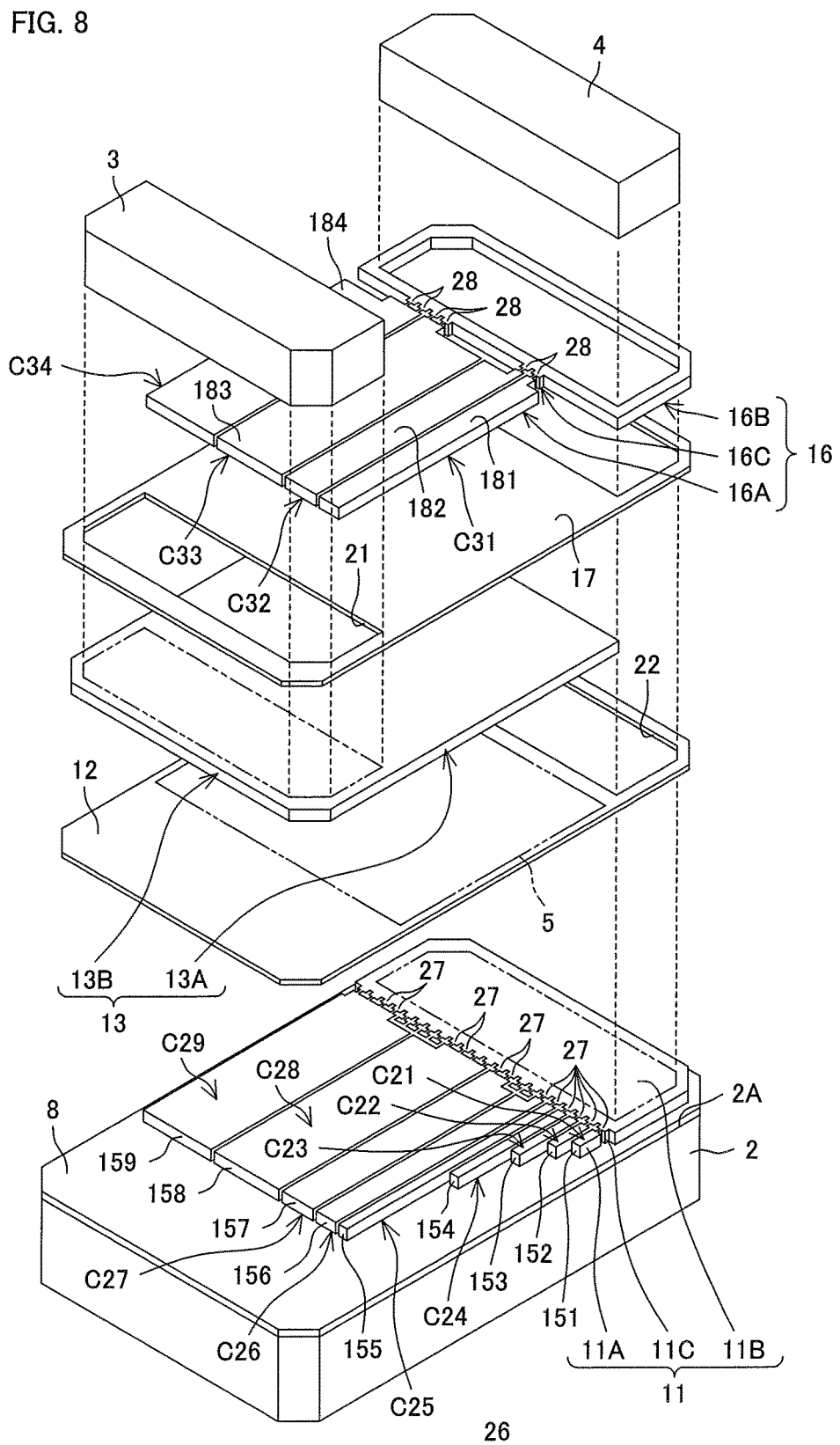
FIG. 8 is an exploded perspective view for describing the arrangement of a chip capacitor according to a third preferred embodiment of the present invention.

The process for manufacturing the chip capacitor 25 according to the present preferred embodiment is practically the same as the process shown in FIG. 5. However, in the patterning of the second electrode film 13 (steps S7 and S8), the capacitor electrode region 13A is divided into the plurality of electrode film portions 141 to 149 of the shapes shown in FIG. 7. FIG. 8 is an exploded perspective view for describing the arrangement of a chip capacitor 26 according to a third preferred embodiment of the present invention, and the respective portions of the chip capacitor 26 are shown in the same manner as in FIG. 3 used for describing the first preferred embodiment.

With the first preferred embodiment, the first electrode film 11 and the third electrode film 16 respectively have the capacitor electrode regions 11A and 16A that are constituted of patterns that are continuous across substantially the entirety of the capacitor arrangement region 5, and the capacitor electrode region 13A of the second electrode film 13 is divided into the plurality of electrode film portions 131 to 139 (see FIG. 3). In contrast, with the present preferred embodiment, whereas the capacitor electrode region 13A of the second electrode film 13 is formed to a continuous film pattern that is continuous across substantially the entirety of the capacitor arrangement region 5, the capacitor electrode region 11A of the first electrode film 11 is divided into a plurality of (first) electrode film portions 151 to 159 and the capacitor electrode region 16A of the third electrode film 16 is divided into the plurality of (third) electrode film portions 181 to 184. The electrode film portions 151 to 159 may be formed in the same shapes and area ratio as those of the electrode film portions 131 to 139 in the first preferred embodiment or may be formed in the same shapes and area ratio as those of the electrode film portions 141 to 149 in the second preferred embodiment. The electrode film portions 181 to 184 may also be formed in the same manner as the electrode film portions 151 to 159. That is, the electrode film portions 151 to 159 may face the second electrode film 13 over mutually different facing areas and the facing areas may be set to form a geometric progression. Similarly, the electrode film portions 181 to 184 may face the second electrode film 13 over mutually different facing areas and the facing areas may be set to form a geometric progression.

A plurality of capacitor elements C21 to C29 are thus arranged by the electrode film portions 151 to 159, the first capacitance film 12, and the second electrode film 13. At least a portion of the plurality of capacitor elements C21 to C29 constitutes a set of capacitor elements that differ in capacitance value (for example, with the respective capacitance values being set to form a geometric progression). Further, a plurality of capacitor elements C31 to C34 are arranged by the electrode film portions 181 to 184, the second capacitance film 17, and the second electrode film 13. At least a portion of the plurality of capacitor elements C31 to C34 constitutes a set of capacitor elements that differ in capacitance value (for example, with the respective capacitance values being set to form a geometric progression).

The first electrode film 11 further has a fuse region 11C between the capacitor electrode region 11A and the pad region 11B. In the fuse region 11C, a plurality of fuse units 27, similar to the fuse units 7 of the first preferred embodiment, are aligned in a single column along the pad region 11B. Each of the electrode film portions 151 to 159 (capacitor elements C21 to C29) is connected to the pad region 11B via one or a plurality of the fuse units 27. That is, the plurality of fuse units 27 are each interposed between the capacitor elements C21 to C29 and the second external electrode 4 on the pad region 11B. The fuse units 27 corresponding to the respective capacitor elements C21 to C29 constitute fuses F11 to F19 (see FIG. 9).

The third electrode film 16 further has a fuse region 16C between the capacitor electrode region 16A and the pad region 16B. In the fuse region 16C, a plurality of fuse units 28, similar to the fuse units 7 of the first preferred embodiment, are aligned in a single column along the pad region 16B. Each of the electrode film portions 181 to 184 (capacitor elements C31 to C34) is connected to the pad region 16B via one or a plurality of the fuse units 28. That is, the plurality of fuse units 28 are each interposed between the capacitor elements C31 to C34 and the second external electrode 4 on the pad region 16B. The fuse units 28 corresponding to the respective capacitor elements C31 to C34 constitute fuses F21 to F24 (see FIG. 9).

Figure 9:
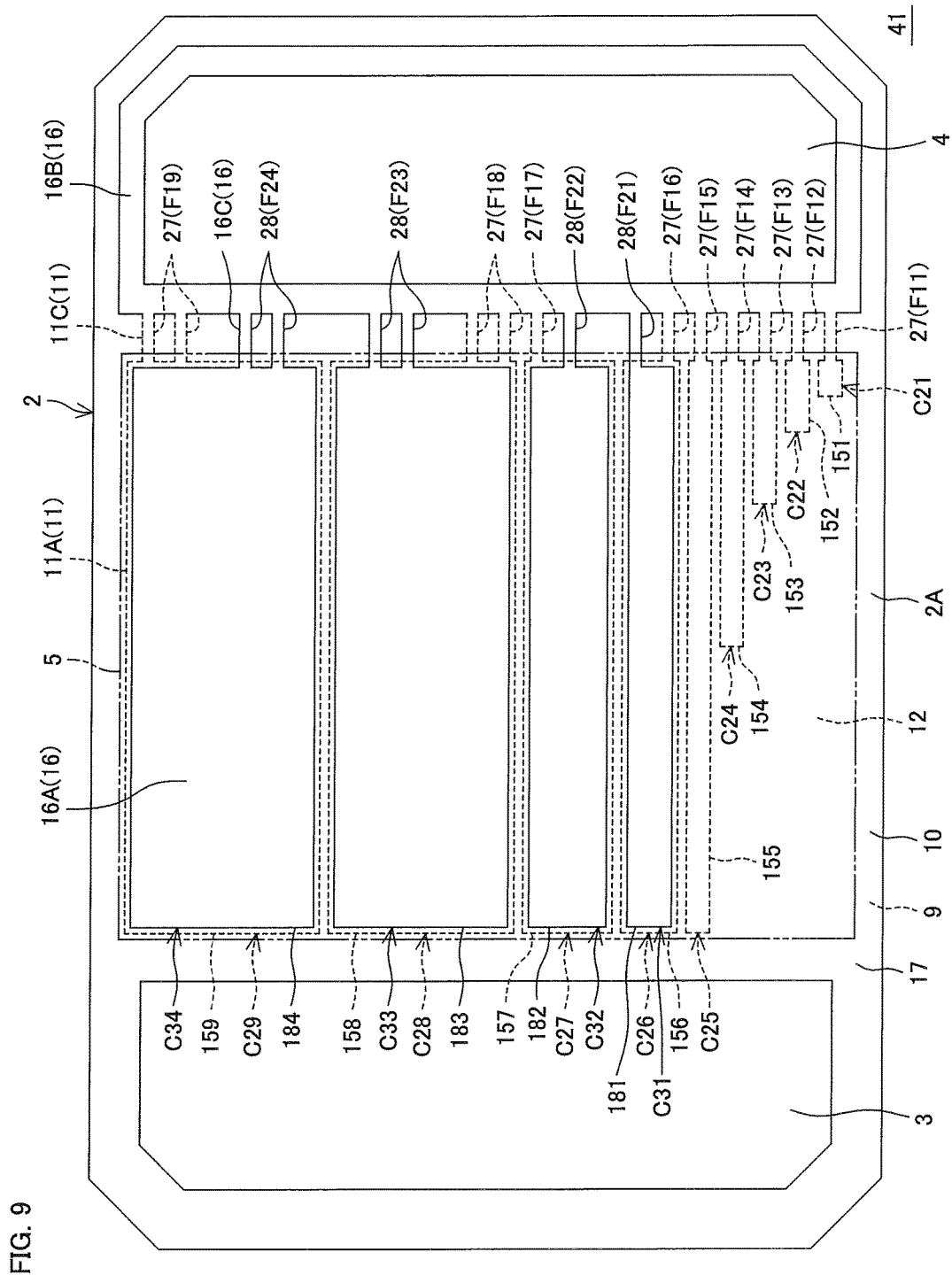
FIG. 9 is a schematic plan view of the chip capacitor according to a third preferred embodiment of the present invention.

The plurality of fuse units 27 (fuses F11 to F19) and 28 (fuses F21 to F24) are disposed with the positions thereof being shifted so as not to overlap with each other in a plan view (see FIG. 9). Specifically, the fuse units 27 and 28 are aligned one by one across intervals along the direction of extension of the second external electrode 4 (short direction of the substrate 2). Therefore, just the desired fuse (fuse unit 27 or 28) can be cut by irradiating laser light 24 (see FIG. 6B) from a direction perpendicular to a principal surface 2A of the substrate 2 and erroneous cutting of another fuse can be avoided. The capacitance value of the chip capacitor 26 can thereby be adjusted reliably to the target value. The second electrode film 13 must be disposed so as not to overlap with the fuse units 27 and 28 in a plan view to avoid being cut by the laser light 24.

The electrode film portions 151 to 159 face the second electrode film 13 across the first capacitance film 12 over mutually different facing areas in the arrangement of the third preferred embodiment as well and any of these can be disconnected individually by cutting the fuse unit 27. Similarly, the electrode film portions 181 to 184 face the second electrode film 13 across the second capacitance film 17 over mutually different facing areas and any of these can be disconnected individually by cutting the fuse unit 28. The same effects as those of the first preferred embodiment are thus obtained. In particular, by forming at least a portion of the plurality of electrode film portions 151 to 159 and at least a portion of the plurality of electrode film portions 181 to 184 so as to face the second electrode film 13 over facing areas set to form a geometric progression with a common ratio of 2, a chip capacitor that is precisely adjusted to the required capacitance value can be provided in the same manner as in the first preferred embodiment.

With the first and second preferred embodiments, vertically overlapping capacitor elements (for example, the capacitor elements C1 and C11) are connected via a common fuse (the fuse F1 in the case of the capacitor elements C1 and C11) to the first external electrode 3 as described above (see FIG. 1 to FIG. 3) and therefore when the common fuse is cut, the upper and lower capacitor elements are disconnected at once. On the other hand, with the third preferred embodiment, each of the capacitor elements C21 to C29 and C31 to C34 is connected via a dedicated fuse (fuse unit 27 or 28) to the second external electrode 4. Each capacitor element can thus be disconnected individually, the range of combination of the capacitor elements is thus broadened in comparison to those of the first and second preferred embodiments, and the capacitance value of the chip capacitor 26 as a whole can thus be set over an even broader range. Further, by making the capacitor elements C21 to C29 and C31 to C34 all differ in capacitance value, the capacitance value of the chip capacitor 26 as a whole can be set over an even broader range.

The process for manufacturing the chip capacitor 26 according to the third preferred embodiment is practically the same as the process shown in FIG. 5. However, in the patterning of the first electrode film 11 (steps S3 and S4), the capacitor electrode region 11A is divided into the electrode film portions 151 to 159 and the plurality of fuse units 27 are formed in the fuse region 11C. Also, in the patterning of the second electrode film 13 (steps S7 and S8), a plurality of electrode film portions are not formed and fuse units are also not formed. Also in the patterning of the third electrode film 16 (steps S11 and S12), the capacitor electrode region 16A is divided into the plurality of electrode film portions 181 to 184 and the plurality of fuse units 28 are formed in the fuse region 16C. Further, in the laser trimming (step S16), the selected fuse units among the fuse units 27 formed in the first electrode film 11 and the fuse units 28 formed in the third electrode film 16 are cut by laser light.

If just a fuse unit 27 formed in the first electrode film 11 is to be subject to laser trimming, the first electrode film 11 is covered by the first capacitance film 12 and the first capacitance film 12 can be used as a cover film for accumulating the energy of the laser light in the process of laser trimming. The forming of the cover film (step S15) immediately before the laser trimming may thus be omitted.

In the third preferred embodiment, the capacitor electrode region 11A of the first electrode film 11 and the capacitor electrode region 16A of the third electrode film 16 are made to have different shapes by dividing the first electrode film 11 into the nine electrode film portions 151 to 159 and on the other hand, dividing the third electrode film 16 into the four electrode film portions 181 to 184. However, this is only an example and obviously the capacitor electrode region 11A and the capacitor electrode region 16A may be mutually matched in shape (the number of electrode film portions). However, even in this case, the plurality of fuse units 27 and 28 must be disposed with the positions thereof being shifted so as not to overlap with each other in a plan view (see FIG. 9).

Although preferred embodiments of the present invention have been described above, the present invention may be implemented in yet other modes as well. For example, although with each of the preferred embodiments described above, the arrangement where just the second electrode film 13 is divided into the plurality of electrode films or the arrangement where the first electrode film 11 and the third electrode film 16 besides the second electrode film 13 are divided into the plurality of electrode films were described, the first electrode film 11, the second electrode film 13, and the third electrode film 16 may all be divided into a plurality of electrode film portions. In any of these cases, the chip capacitor 1 having the required capacitance values can be arranged by cutting the fuses (fuse units 7, 27, and 28) corresponding to the relevant electrode film portions (131 to 139, 141 to 149, 151 to 159, and 181 to 184) of the plurality of capacitor elements (C1 to C19, C21 to C29, and C31 to C34).

Also with the preferred embodiments, the chip capacitors 1, 25, and 26, each having a two-layer capacitor structure, was described, a chip capacitor having a capacitor structure of three or more layers may also be considered. For example, with the chip capacitor 26 of FIG. 8, a chip capacitor with a three-layer structure can be realized by forming a third capacitance film on the third electrode film 16 and forming a fourth electrode film, connected to the first external electrode 3, on the third capacitance film. Further, a chip capacitor with a four-layer structure can be realized by forming a fifth electrode film via a fourth capacitance film on the fourth electrode film. By arranging a chip capacitor with such a multilayer structure, the realization of both compact size and high capacitance at the same time in a chip capacitor can be achieved further and a capacitor with which the capacitance value can be adjusted with high precision over a wide range can be provided.

However, in arranging a chip capacitor with a multilayer structure, care must be taken to position the fuses of the respective electrode films so as not to overlap in a plan view as described above. Further, although with each of the preferred embodiments, an example where each fuse unit is made integral with any one of the first electrode film 11, second electrode film 13, and third electrode film 16 was described, the fuse units may be formed from a conductor film separate from the first electrode film 11, second electrode film 13, and third electrode film 16. Further, although with each of the preferred embodiments, an example where the plurality of capacitor elements include a plurality of capacitor elements having capacitance values that form a geometric progression with a common ratio r ($0<r$; $r\neq 1$)=2 was described, the common ratio of the geometric progression may be a numeral other than 2. Also with each of the preferred embodiments, the insulating film 8 is formed on the top surface of the substrate 2, the insulating film 8 may be omitted if the substrate 2 is an insulating substrate. Also, a conductive substrate may be used as the substrate 2, the conductive substrate may be used as a lower electrode, and the first capacitance film 12 may be formed so as to be in contact with the top surface of the conductive substrate. In this case, one of the external electrodes may be led out from a rear surface of the conductive substrate.

Besides the above, various design changes may be applied within the scope of the matters described in the claims. <Invention according to a first reference example> (1) Features of the invention according to the first reference example. For example, the features of the invention according to the first reference example are the following A1 to A20. (A1) A chip capacitor including a substrate, a first external electrode disposed on the substrate, a second external electrode disposed on the substrate, a plurality of capacitor elements formed on the substrate and connected between the first external electrode and the second external electrode, and a plurality of fuses that are formed on the substrate, are each interposed between the plurality of capacitor elements and the first external electrode or the second external electrode, and are capable of disconnecting each of the plurality of capacitor elements.

With the invention according to A1, the plurality of capacitor elements are connected between the first and second external electrodes disposed on the substrate. The plurality of fuses that are capable of disconnecting each of the plurality of capacitor elements are provided between the plurality of capacitor elements and the first or second external electrodes. A plurality of types of capacitance values can thus be accommodated easily and rapidly by selecting and cutting one or a plurality of the fuses. In other words, a common design can be applied to chip capacitors of a plurality of types of capacitance values. (A2) The chip capacitor according to A1, where the plurality of capacitor elements have mutually different capacitance values.

With the invention according to A2, chip capacitors of various capacitance values can be realized with a common design by combining a plurality of the capacitor elements that differ in capacitance value. (A3) The chip capacitor according to A2, where the capacitance values of the plurality of capacitor elements are set to form a geometric progression. By the invention according to A3, the capacitance value of the chip capacitor can be adjusted accurately to a desired capacitance value by appropriate selection of a plurality of the capacitor elements to be connected between the first external electrode and the second external electrode. For example, by setting the common ratio of the geometric progression to 2, the capacitance value of the chip capacitor can be adjusted at the precision of the first term of the geometric progression (term of the smallest value in the geometric progression). (A4) The chip capacitor according to any one of A1 to A3, where at least one of the plurality of fuses is cut.

With the chip capacitor that has been adjusted in capacitance value, one or a plurality of the fuses may be cut. The capacitor elements to be connected between the first external electrode and the second external electrode can be selected by fuse cutting and the chip capacitor of the required capacitance value can thereby be realized. (A5) The chip capacitor according to any one of A1 to A4, including a lower electrode film formed on the substrate, a capacitance film formed on the lower electrode film, and an upper electrode film formed on the capacitance film so as to face the lower electrode film, and where one electrode film among the upper electrode film and the lower electrode film includes a plurality of divided electrode film portions and the plurality of capacitor elements are formed by the plurality of the electrode film portions facing the other electrode film, among the upper electrode film and the lower electrode film, across the capacitance film.

With the invention according to A5, a capacitor structure is arranged by the capacitance film being sandwiched between the lower electrode film and the upper electrode film. One electrode film among the upper electrode film and the lower electrode film is divided into the plurality of electrode film portions so that the respective electrode film portions face the other electrode film and the plurality of capacitor elements are thereby provided on the substrate. (A6) The chip capacitor according to A5, where the plurality of electrode film portions face the other electrode film over mutually different facing areas.

With the invention according to A6, the plurality of capacitor elements corresponding to the plurality of electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value. (A7) The chip capacitor according to A6, where the facing areas of the plurality of electrode film portions are set to form a geometric progression.

By the invention according to A7, the plurality of capacitor elements, the capacitance values of which are set to form a geometric progression, can be provided on the substrate. Chip capacitors of a plurality of types of capacitance values can thereby be realized and fine adjustment of the capacitance value can also be performed by fuse cutting. (A8) The chip capacitor according to any one of A5 to A7, where the plurality of electrode film portions and the fuses are formed of films of the same conductive material.

By the invention according to A8, the electrode film portions and the fuses can be arranged from a conductive material film in common Each electrode film portion can be disconnected by cutting the fuse corresponding to the electrode film portion. (A9) The chip capacitor according to any one of A1 to A8, further including a protective film formed to cover the upper electrode film and expose the first external electrode and the second external electrode.

By the invention according to A9, the upper electrode film can be covered by the protective film while exposing the first and second external electrodes, thereby enabling a chip capacitor that is capable of realizing a plurality of types of capacitance values with a common design and is high in reliability to be provided. (A10) The chip capacitor according to A9, where the protective film extends to a side surface of the substrate and covers the side surface.

With the invention according to A10, protection is also provided from the side surface of the substrate, thereby enabling further improvement of the reliability of the chip capacitor. (A11) A method for manufacturing a chip capacitor including a first external electrode and a second external electrode, the method including a step of forming a plurality of capacitor elements on a substrate, a step of forming, on the substrate, a plurality of fuses that disconnectably connect each of the plurality of capacitor elements to the first external electrode or the second external electrode, and a step of forming the first external electrode and the second external electrode on the substrate.

By the invention according to A11, chip capacitors being of a common design and yet being of a plurality of capacitance values can be manufactured by cutting the fuses that are selected in accordance with the required capacitance values. (A12) The method for manufacturing a chip capacitor according to A11, where the plurality of capacitor elements are formed to have mutually different capacitance values.

By the invention according to A12, a plurality of types of capacitance values can be realized by appropriately selecting and combining a plurality of the capacitor elements. (A13) The method for manufacturing a chip capacitor according to A12, where the capacitance values of the plurality of capacitor elements are set to form a geometric progression. With the invention according to A13, a plurality of types of capacitance values can be realized and fine adjustment with respect to (adjustment to) a desired capacitance value is made possible by appropriately selecting and combining a plurality of the capacitor elements. For example, by setting the common ratio of the geometric progression to 2, the capacitance value of the chip capacitor can be adjusted at the precision of the first term of the geometric progression (term of the smallest value in the geometric progression). (A14) The method for manufacturing a chip capacitor according to any one of A11 to A13, further including a step of cutting at least one of the plurality of fuses.

By the invention according to A14, the capacitance value of the chip capacitor can be adjusted to the desired capacitance value by appropriately selecting each fuse to be cut. That is, the chip capacitor adjusted to the desired capacitance value can be manufactured by appropriately selecting the capacitor elements to be connected to the first and second external electrodes and cutting the fuses corresponding to the capacitor elements besides those selected. (A15) The method for manufacturing a chip capacitor according to A14, further including a step of measuring a total capacitance value of the plurality of capacitor elements and a step of selecting each fuse to be cut based on the measured total capacitance value, and where each selected fuse is cut in the fuse cutting step.

By the invention according to A15, the total capacitance value of the plurality of capacitor elements is measured, each fuse to be cut is selected based on the measurement result, and therefore the capacitance value of the chip capacitor can be set to the targeted capacitance value reliably. (A16) The method for manufacturing a chip capacitor according to A14 or A15, further including a step of forming, after cutting the fuse or fuses, a protective film covering the cut portion of each fuse.

By the invention according to A16, the cut portion of each fuse is covered by the protective film and therefore entry of foreign matter and moisture with respect to the cut portion can be avoided to enable a chip capacitor, which can realize a plurality of types of capacitance values with a common design and is high in reliability, to be manufactured. (A17) The method for manufacturing a chip capacitor according to any one of A11 to A16, where the step of forming the plurality of capacitor elements includes a step of forming a lower electrode film on the substrate, a step of forming a capacitance film on the lower electrode film, a step of forming an upper electrode film on the capacitance film so as to face the lower electrode film, and a step of dividing (for example, dividing by photolithography) one electrode film among the upper electrode film and the lower electrode film into a plurality of electrode film portions, and the plurality of capacitor elements are formed by the plurality of electrode film portions facing the other electrode film, among the upper electrode film and the lower electrode film, across the capacitance film.

By the invention according to A17, a capacitor structure having the capacitance film sandwiched between the lower electrode film and the upper electrode film can be formed. By one electrode film among the upper electrode film and the lower electrode film being divided into the plurality of electrode film portions, the plurality of capacitor elements, having the structure where the capacitance film is sandwiched between the divided electrode film portions and the other electrode film, can be formed on the substrate. (A18) The method for manufacturing a chip capacitor according to A17, where the one electrode film is divided so that the plurality of electrode film portions face the other electrode film over mutually different facing areas.

By the invention according to A18, the plurality of capacitor elements of different capacitance values can be formed on the substrate by making the plurality of electrode film portions face the other electrode film over mutually different facing areas. Chip capacitors of a plurality of types of capacitance values can thus be manufactured by appropriate selection and combination of the capacitor elements of different capacitance values. (A19) The method for manufacturing a chip capacitor according to A18, where the facing areas of the plurality of electrode film portions are set to form a geometric progression.

By the invention according to A19, the plurality of capacitor elements, the capacitance values of which are set to form a geometric progression, can be formed on the substrate. Chip capacitors of a plurality of types of capacitance values can thereby be provided and accurate adjustment to the desired capacitance value can be performed by appropriate selection and combination of a plurality of the capacitor elements. (A20) The method for manufacturing a chip capacitor according to any one of A17 to A19, where the one electrode film and the fuses are formed of films of the same conductive material.

By the invention according to A20, the electrode film portions and the fuses can be formed of films of the same conductive material and can thus be formed by patterning from the same film. The manufacturing process is thereby simplified. (2) Preferred embodiments of the invention according to the first reference example Preferred embodiments of the first reference example shall now be described in detail with reference to the attached drawings.

Figure 10:
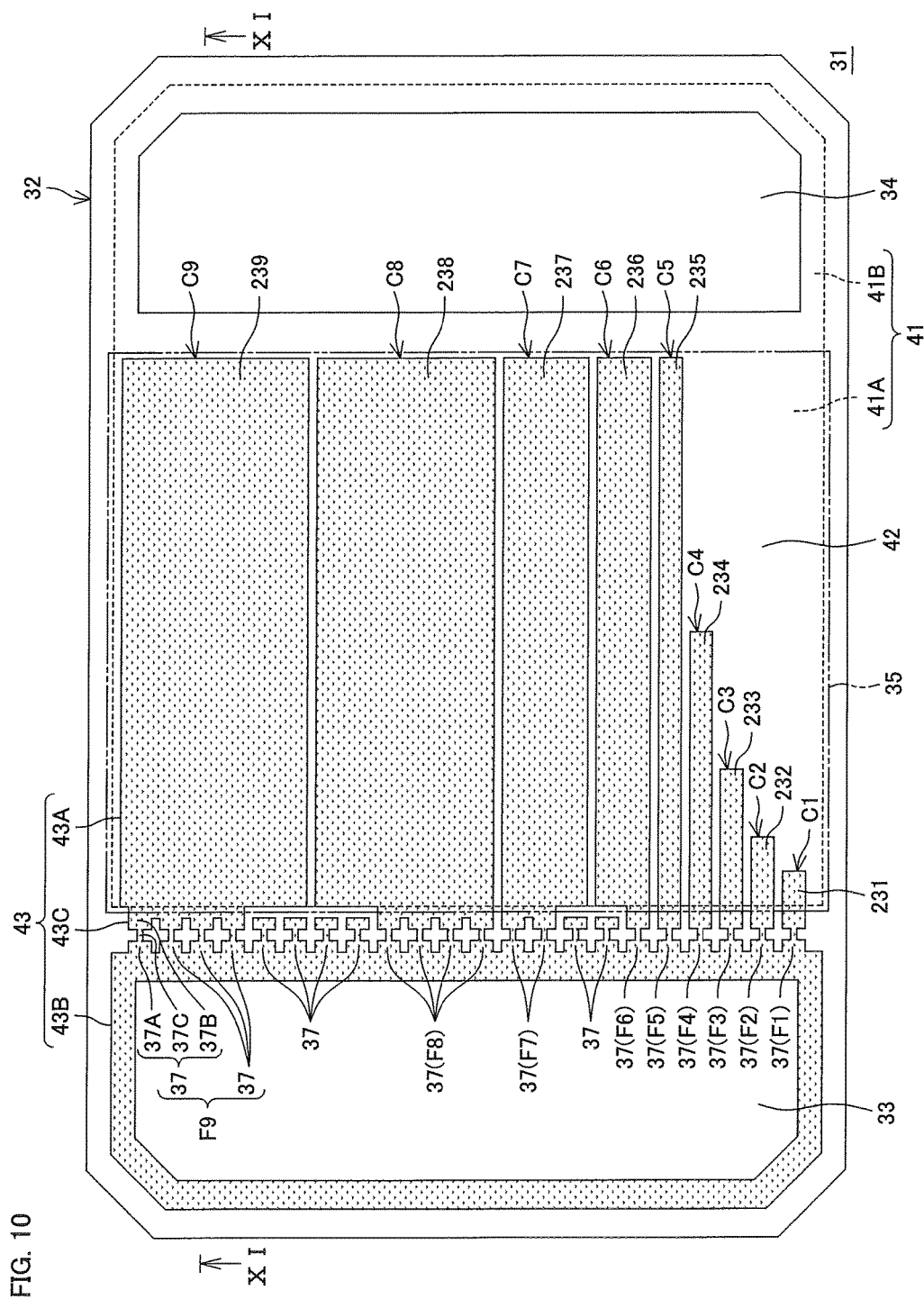
FIG. 10 is a plan view of a chip capacitor according to a first preferred embodiment of a first reference example.
Figure 11:
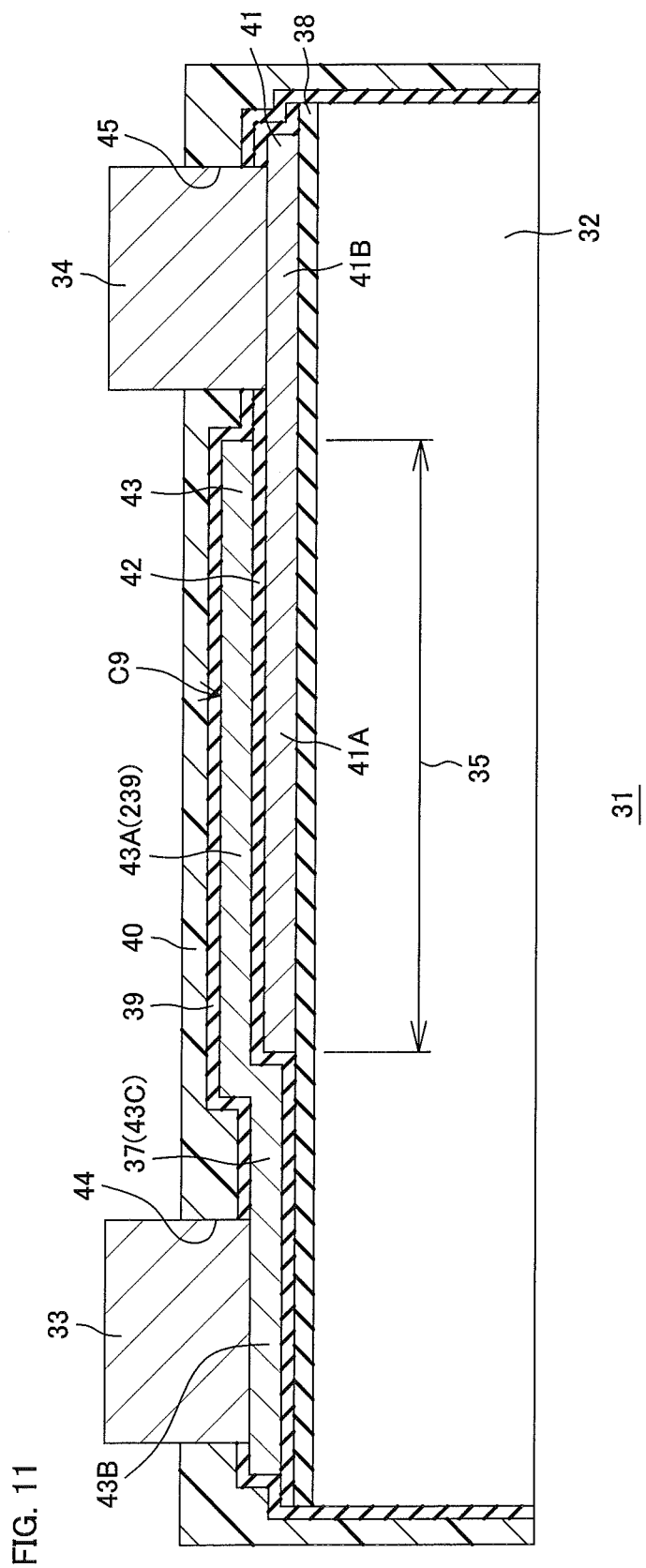
FIG. 11 is a sectional view taken along section line XI-XI in FIG. 10.
Figure 12:
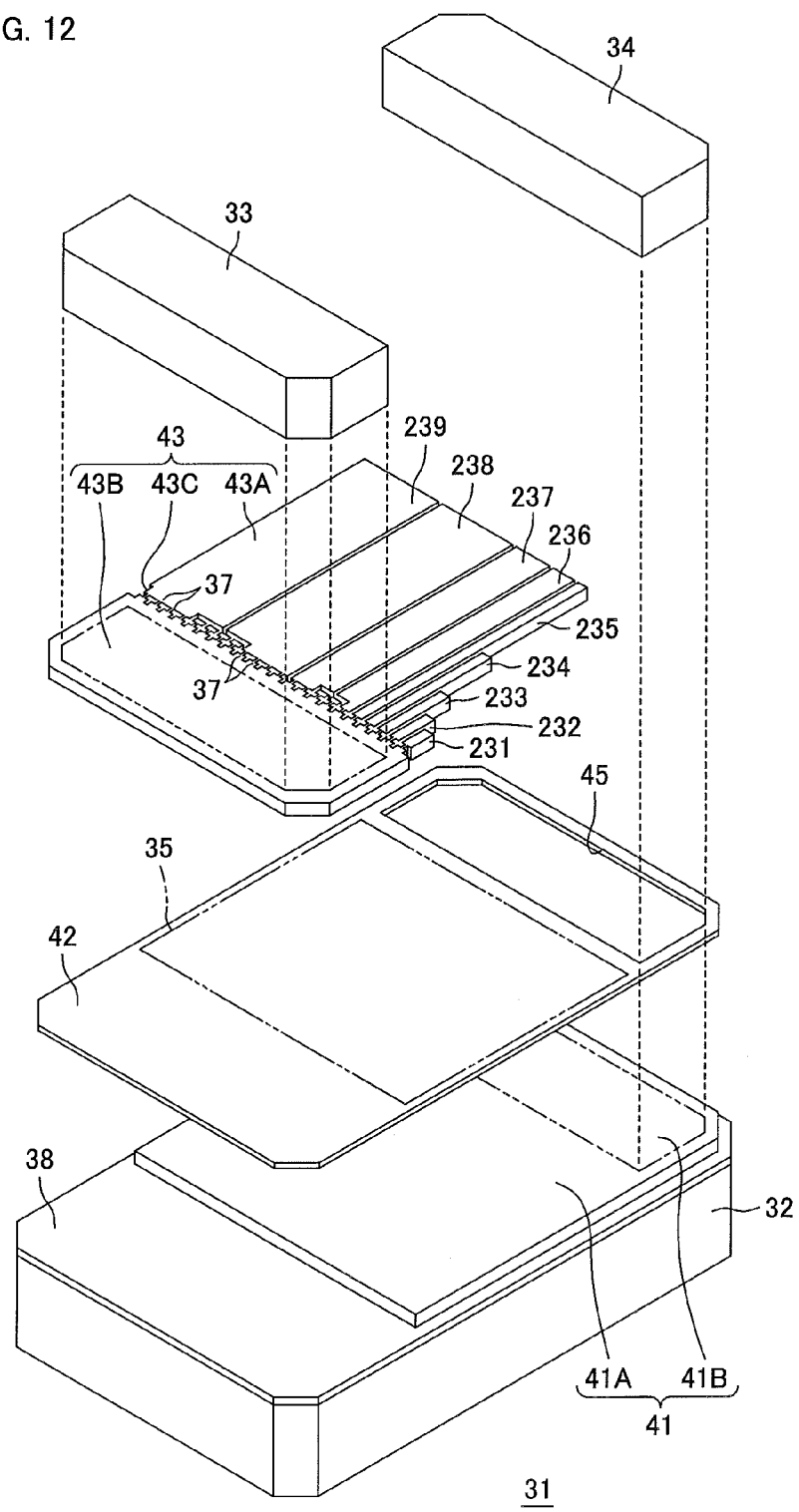
FIG. 12 is an exploded perspective view showing the arrangement of a portion of the chip capacitor in a separated state.

FIG. 10 is a plan view of a chip capacitor according to a first preferred embodiment of the first reference example, and FIG. 11 is a sectional view thereof showing a section taken along section line XI-XI in FIG. 10. Further, FIG. 12 is an exploded perspective view showing the arrangement of a portion of the chip capacitor in a separated state. The chip capacitor 31 includes a substrate 32, a first external electrode 33 disposed on the substrate 32, and a second external electrode 34 disposed similarly on the substrate 32. In the present preferred embodiment, the substrate 32 has, in a plan view, a rectangular shape with the four corners chamfered. The first external electrode 33 and the second external electrode 34 are respectively disposed at portions at respective ends in the long direction of the substrate 32. In the present preferred embodiment, each of the first external electrode 33 and the second external electrode 34 has a substantially rectangular planar shape extending in the short direction of the substrate 32 and has chamfered portions at two locations respectively corresponding to the corners of the substrate 32. On the substrate 32, a plurality of capacitor elements C1 to C9 are disposed within a capacitor arrangement region 35 between the first external electrode 33 and the second external electrode 34. The plurality of capacitor elements C1 to C9 are electrically connected respectively to the first external electrode 33 via a plurality of fuse units 37.

As shown in FIG. 11 and FIG. 12, an insulating film 38 is formed on the top surface of the substrate 32, and a lower electrode film 41 is formed on the top surface of the insulating film 38. The lower electrode film 41 is formed to spread across substantially the entirety of the capacitor arrangement region 35 and extend to a region directly below the second external electrode 34. More specifically, the lower electrode film 41 has a capacitor electrode region 41A functioning as a lower electrode in common to the capacitor elements C1 to C9 and a pad region 41B for leading out to an external electrode. The capacitor electrode region 41A is positioned in the capacitor arrangement region 35 and the pad region 41B is positioned directly below the second external electrode 34.

In the capacitor arrangement region 35, a capacitance film (dielectric film) 42 is formed so as to cover the lower electrode film 41 (capacitor electrode region 41A). The capacitance film 42 is continuous across the entirety of the capacitor electrode region 41A and, in the present preferred embodiment, further extends to a region directly below the first external electrode 33 and covers the insulating film 38 outside the capacitor arrangement region 35. An upper electrode film 43 is formed on the capacitance film 42. In FIG. 10, the upper electrode film 43 is colored for the sake of clarity. The upper electrode film 43 includes a capacitor electrode region 43A positioned in the capacitor arrangement region 35, a pad region 43B positioned directly below the first external electrode 33, and a fuse region 43C disposed between the pad region 43B and the capacitor electrode region 43A.

In the capacitor electrode region 43A, the upper electrode film 43 is divided into a plurality of electrode film portions 231 to 239. In the present preferred embodiment, the respective electrode film portions 231 to 239 are all formed to rectangular shapes and extend in the form of bands from the fuse region 43C toward the second external electrode 34. The plurality of electrode film portions 231 to 239 face the lower electrode film 41 across the capacitance film 42 over a plurality of types of facing areas. More specifically, a ratio of the facing areas of the electrode film portions 231 to 239 with respect to the lower electrode film 41 may be set to be 1:2:4:8:16:32:64:128:128. That is, the plurality of electrode film portions 231 to 239 include the plurality of electrode film portions differing in facing area and more specifically include the plurality of electrode film portions 231 to 238 (or 231 to 237 and 239) having facing areas that are set to form a geometric progression with a common ratio of 2. The plurality of capacitor elements C1 to C9, respectively arranged by the respective electrode film portions 231 to 239 and the facing lower electrode film 41 across the capacitance film 42, thus include the plurality of capacitor elements having mutually different capacitance values. If the ratio of the facing areas of the electrode film portions 231 to 239 is as mentioned above, the ratio of the capacitance values of the capacitor elements C1 to C9 is equal to the ratio of the facing areas and is 1:2:4:8:16:32:64:128:128. The plurality of capacitor elements C1 to C9 thus include the plurality of capacitor elements C1 to C8 (or C1 to C7 and C9) with capacitance values set to form the geometric progression with the common ratio of 2.

In the present preferred embodiment, the electrode film portions 231 to 235 are formed to bands that are equal in width and have lengths with the ratio thereof being set to 1:2:4:8:16. Also, the electrode film portions 235, 236, 237, 238, and 239 are formed to bands that are equal in length and have widths with the ratio thereof being set to 1:2:4:8:8. The electrode film portions 235 to 239 are formed to extend across a range from an end edge at the first external electrode 33 side to an end edge at the second external electrode 34 side of the capacitor arrangement region 35, and the electrode film portions 231 to 234 are formed to be shorter than this range.

The pad region 43B is formed to be substantially similar in shape to the first external electrode 33 and has a substantially rectangular planar shape having two chamfered portions corresponding to corner portions of the substrate 32. The fuse region 43C is disposed along one long side (the long side at the inner side with respect to the peripheral edge of the substrate 32) of the pad region 43B. The fuse region 43C includes the plurality of fuse units 37 that are aligned along the one long side of the pad region 43B. The fuse units 37 are formed of the same material as and to be integral to the pad region 43B of the upper electrode film 43. The plurality of electrode film portions 231 to 239 are each formed integral to one or a plurality of the fuse units 37, are connected to the pad region 43B via the fuse units 37, and are electrically connected to the first external electrode 33 via the pad region 43B. Each of the electrode film portions 231 to 236 of comparatively small area is connected to the pad region 43B via a single fuse unit 37, and each of the electrode film portions 237 to 239 of comparatively large area is connected to the pad region 43B via a plurality of fuse units 37. It is not necessary for all of the fuse units 37 to be used and, in the present preferred embodiment, a portion of the fuse units 37 is unused.

The fuse units 37 include first wide portions 37A arranged to be connected to the pad region 43B, second wide portions 37B arranged to be connected to the electrode film portions 231 to 239, and narrow portions 37C connecting the first and second wide portions 37A and 37B. The narrow portions 37C are arranged to be capable of being cut (fused) by laser light. Unnecessary electrode film portions among the electrode film portions 231 to 239 can thus be electrically disconnected from the first and second external electrodes 33 and 34 by cutting the fuse units 37.

Although omitted from illustration in FIG. 10 and FIG. 12, the top surface of the chip capacitor 31 that includes the top surface of the upper electrode film 43 is covered by a passivation film 39 as shown in FIG. 11. The passivation film 39 is constituted, for example, of a nitride film and is formed not only to cover the upper surface of the chip capacitor 31 but also to extend to side surfaces of the substrate 32 and cover the side surfaces. Further, a resin film 40, made of a polyimide resin, etc., is formed on the passivation film 39. The resin film 40 is formed to cover the upper surface of the chip capacitor 31 and extend to the side surfaces of the substrate 32 to cover the passivation film 39 on the side surfaces.

The passivation film 39 and the resin film 40 are protective films that protect the top surface of the chip capacitor 31. In these films, pad openings 44 and 45 are respectively formed in regions corresponding to the first external electrode 33 and the second external electrode 34. The pad openings 44 and 45 penetrate through the passivation film 39 and the resin film 40 so as to respectively expose a region of a portion of the pad region 43B of the upper electrode film 43 and a region of a portion of the pad region 41B of the lower electrode film 41. Further, with the present preferred embodiment, the pad opening 45 corresponding to the second external electrode 34 also penetrates through the capacitance film 42.

The first external electrode 33 and the second external electrode 34 are respectively embedded in the pad openings 44 and 45. The first external electrode 33 is thereby bonded to the pad region 43B of the upper electrode film 43 and the second external electrode 34 is bonded to the pad region 41B of the lower electrode film 41. The first and second external electrodes 33 and 34 are formed to project from the top surface of the resin film 40. The chip capacitor 31 can thereby be flip-chip bonded to a mounting substrate.

Figure 13:
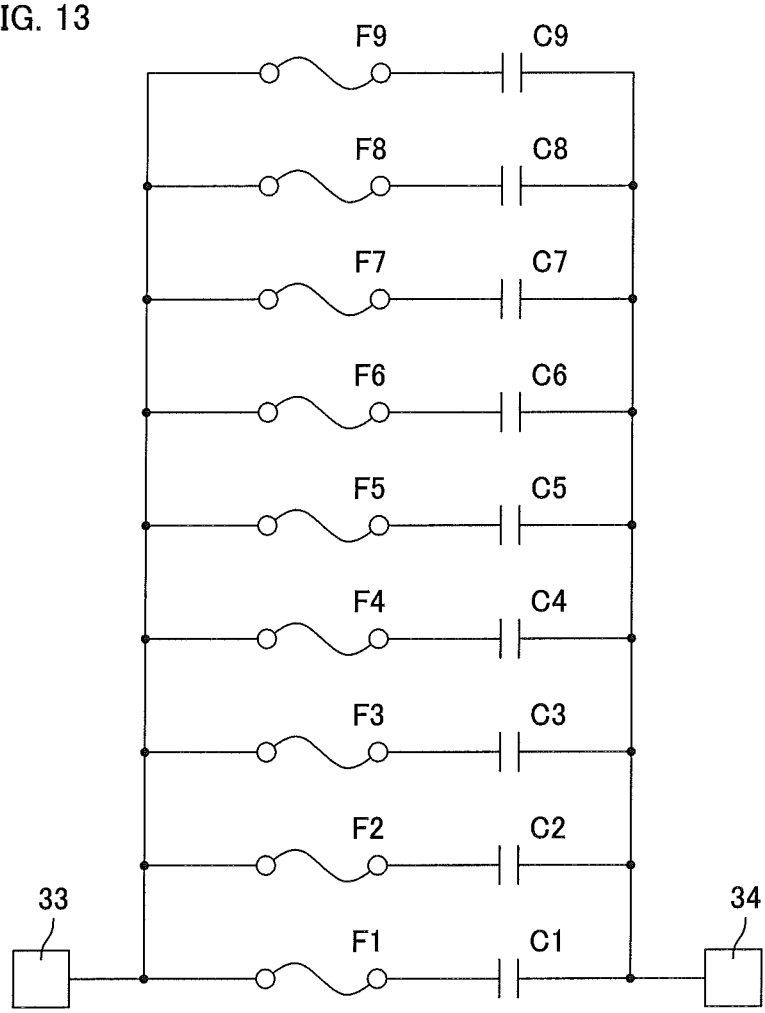
FIG. 13 is a circuit diagram of the electrical arrangement of the interior of the chip capacitor.

FIG. 13 is a circuit diagram of the electrical arrangement of the interior of the chip capacitor 31. The plurality of capacitor elements C1 to C9 are connected in parallel between the first external electrode 33 and the second external electrode 34. Fuses F1 to F9, each arranged from one or a plurality of the fuse units 37, are interposed in series between the respective capacitor elements C1 to C9 and the first external electrode 33. When all of the fuses F1 to F9 are connected, the capacitance value of the chip capacitor 31 is equal to the total of the capacitance values of the capacitor elements C1 to C9. When one or two or more fuses selected from among the plurality of fuses F1 to F9 is or are cut, each capacitor element corresponding to a cut fuse is disconnected and the capacitance value of the chip capacitor 31 decreases by just the capacitance value of the disconnected capacitor element or elements.

Therefore by measuring the capacitance value across the pad regions 41B and 43B (the total capacitance value of the capacitor elements C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor elements C1 to C8 are set to form a geometric progression with a common ratio of 2, fine adjustment to the targeted capacitance value at a precision corresponding to the capacitance value of the capacitor element C1, which is the smallest capacitance value (value of the first term in the geometric progression), is made possible.

For example, the capacitance values of the capacitor elements C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor 31 can be finely adjusted at a minimum adjustment precision of 0.03125 pF. Also, the fuses to be cut among the fuses F1 to F9 can be selected appropriately to provide the chip capacitor 31 with an arbitrary capacitance value between 0.1 pF and 10 pF.

As described above, with the present preferred embodiment, the plurality of capacitor elements C1 to C9 that can be disconnected by the fuses F1 to F9 are provided between the first external electrode 33 and the second external electrode 34. The capacitor elements C1 to C9 include a plurality of capacitor elements that differ in capacitance value and more specifically include a plurality of capacitor elements with capacitance values set to form a geometric progression. The chip capacitor 31, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor 31 shall now be described. The substrate 32 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region 35 is generally a square region with each side having a length corresponding to the length of the short side of the substrate 32. The thickness of the substrate 32 may be approximately 150 μm. The substrate 32 may, for example, be a substrate that has been thinned by grinding or polishing from a rear surface side (surface on which the capacitor elements C1 to C9 are not formed). As the material of the substrate 32, a semiconductor substrate as represented by a silicon substrate may be used or a glass substrate may be used or a resin film may be used.

The insulating film 38 may be a silicon oxide film or other oxide film. The film thickness thereof may be approximately 500 Å to 2000 Å. The lower electrode film 41 is preferably a conductive film, a metal film in particular, and may, for example, be an aluminum film. The lower electrode film 41 that is constituted of an aluminum film may be formed by a sputtering method. Similarly, the upper electrode film 43 is preferably constituted of a conductive film, a metal film in particular, and may, for example, be an aluminum film. The upper electrode film 43 that is constituted of an aluminum film may be formed by the sputtering method. The patterning for dividing the capacitor electrode region 43A of the upper electrode film 43 into the electrode film portions 231 to 239 and shaping the fuse region 43C into the plurality of fuse units 37 may be performed by photolithography and etching processes.

The capacitance film 42 may be constituted, for example, of a silicon nitride film, and the film thickness thereof may be 500 Å to 2000 Å (for example, 1000 Å). The capacitance film 42 may be a silicon nitride film formed by plasma CVD (chemical vapor deposition). The passivation film 39 may be constituted, for example, of a silicon nitride film and may be formed, for example, by the plasma CVD method. The film thickness thereof may be approximately 8000 Å. As mentioned above, the resin film 40 may be constituted of a polyimide film or other resin film.

Each of the first and second external electrodes 33 and 34 may, for example, be constituted of a laminated structure film in which a nickel layer in contact with the lower electrode film 41 or the upper electrode film 43, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film 41 or the upper electrode film 43, and the palladium layer functions as a diffusion preventing layer that suppresses mutual diffusion of the material of the upper electrode film or the lower electrode film and the gold of the uppermost layer of each of the first and second external electrodes 33 and 34.

Figure 14:
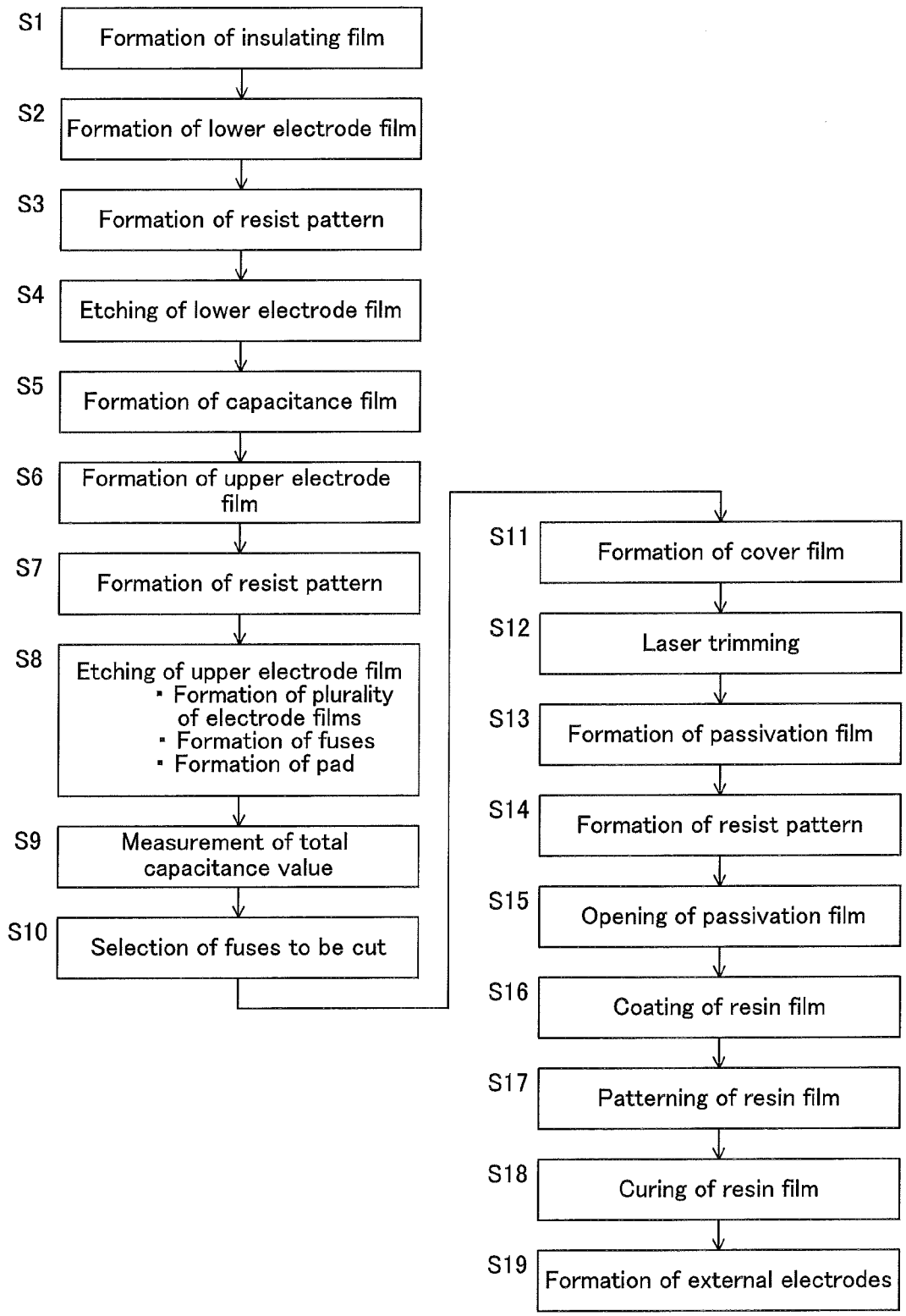
FIG. 14 is a flow diagram for describing an example of a process for manufacturing the chip capacitor.

FIG. 14 is a flow diagram for describing an example of a process for manufacturing the chip capacitor 31. The insulating film 38, constituted of an oxide film (for example, a silicon oxide film), is formed on the top surface of the substrate 32 by a thermal oxidation method and/or CVD method (step S1). Thereafter, the lower electrode film 41, constituted of an aluminum film, is formed over the entire top surface of the insulating film 38, for example, by the sputtering method (step S2). The film thickness of the lower electrode film 41 may be approximately 8000 Å. Thereafter, a resist pattern corresponding to the final shape of the lower electrode film 41 is formed on the top surface of the lower electrode film by photolithography (step S3). The lower electrode film 41 is etched using the resist pattern as a mask to obtain the lower electrode film 41 of the pattern shown in FIG. 10, etc. (step S4). The etching of the lower electrode film 41 may be performed, for example, by reactive ion etching.

Thereafter, the capacitance film 42, constituted of a silicon nitride film, etc., is formed on the lower electrode film 41, for example, by the plasma CVD method (step S5). In the region in which the lower electrode film 41 is not formed, the capacitance film 42 is formed on the top surface of the insulating film 38. Thereafter, the upper electrode film 43 is formed on the capacitance film 42 (step S6). The upper electrode film 43 is constituted, for example, of an aluminum film and may be formed by the sputtering method. The film thickness thereof may be approximately 8000 Å. Thereafter, a resist pattern corresponding to the final shape of the upper electrode film 43 is formed on the top surface of the upper electrode film 43 by photolithography (step S7). The upper electrode film 43 is patterned to its final shape (see FIG. 10, etc.) by etching using the resist pattern as a mask (step S8). The upper electrode film 43 is thereby shaped to the pattern having the plurality of electrode film portions 231 to 239 in the capacitor electrode region 43A, having the plurality of fuse units 37 in the fuse region 43C, and having the pad region 43B connected to the fuse units 37. The etching for patterning the upper electrode film 43 may be performed by wet etching using an etching liquid, such as phosphoric acid, etc., or may be performed by reactive ion etching.

Thereafter, inspection probes are contacted against the pad region 43B of the upper electrode film 43 and the pad region 41B of the lower electrode film 41 to measure the total capacitance value of the plurality of capacitor elements C1 to C9 (step S9). Based on the measured total capacitance value, the capacitor elements to be disconnected, that is, the fuses to be cut are selected in accordance with the targeted capacitance value of the chip capacitor 31 (step S10).

Figure 15A:
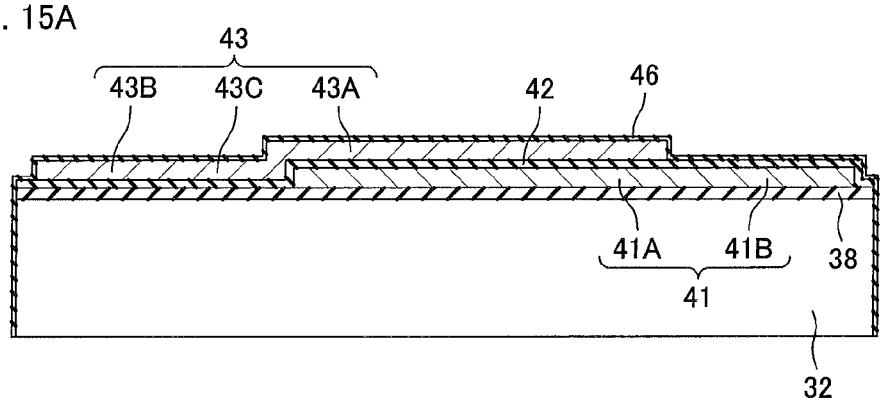
FIG. 15A, FIG. 15B, and FIG. 15C are sectional views for describing steps related to the cutting of a fuse.

Thereafter as shown in FIG. 15A, a cover film 46, constituted, for example, of a nitride film, is formed on the entire surface of the substrate 32 (step S11). The forming of the cover film 46 may be performed by the plasma CVD method and, for example, a silicon nitride film with a film thickness of approximately 3000 Å may be formed. The cover film 46 covers the patterned upper electrode film 43 and covers the capacitance film 42 in the region in which the upper electrode film 43 is not formed. The cover film 46 covers the fuse units 37 in the fuse region 43C.

Figure 15B:
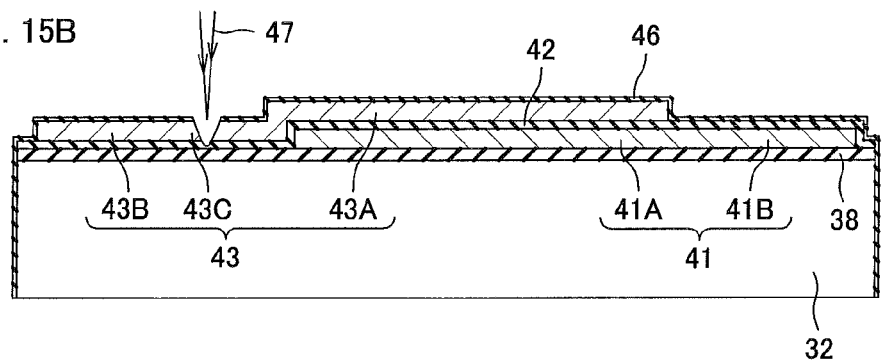

From this state, the laser trimming for fusing the fuse units 37 is performed (step S12). That is, as shown in FIG. 15B, each fuse unit 37 constituting a fuse selected in accordance with the measurement result of the total capacitance value is irradiated with laser light 47 and the narrow portion 37C of the fuse unit 37 is fused. The corresponding capacitor element is thereby disconnected from the pad region 43B. When the laser light 47 is irradiated on the fuse unit 37, the energy of the laser light 47 is accumulated at a vicinity of the fuse unit 37 by the action of the cover film 46 and the fuse unit 37 is thereby fused.

Figure 15C:
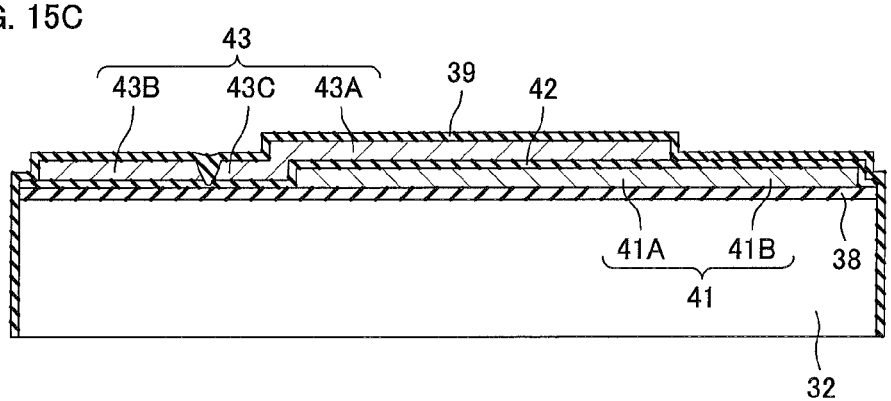

Thereafter as shown in FIG. 15C, a silicon nitride film is deposited on the cover film 46, for example, by the plasma CVD method to form the passivation film 39 (step S13). In the final form, the cover film 46 is made integral with the passivation film 39 to constitute a portion of the passivation film 39. The passivation film 39 that is formed after the cutting of the fuses enters into openings in the cover film 46, destroyed at the same time as the fusing of the fuses, to protect the cut surfaces of the fuse units 37. The passivation film 39 thus prevents entry of foreign matter and entry of moisture into the cut locations of the fuse units 37. The passivation film 39 may be formed to have a film thickness, for example, of approximately 8000 Å as a whole.

Thereafter, a resist pattern, having penetrating holes at positions at which the first and second external electrodes 33 and 34 are to be formed, is formed on the passivation film 39 (step S14). The passivation film 39 is etched using the resist pattern as a mask. The pad opening exposing the lower electrode film 41 in the pad region 41B and the pad opening exposing the upper electrode film 43 in the pad region 43B are thereby formed (step S15). The etching of the passivation film 39 may be performed by reactive ion etching. In the process of etching of the passivation film 39, the capacitance film 42, which is similarly constituted of a nitride film, is also opened and the pad region 41B of the lower electrode film 41 is thereby exposed.

Thereafter a resin film is coated on the entire surface (step S16). As the resin film, for example, a coating film of a photosensitive polyimide is used. Patterning of the resin film by photolithography may be performed by performing an exposure step and a subsequent developing step on regions of the resin film corresponding to the pad openings (step S17). The pad openings 44 and 45 penetrating through the resin film 40 and the passivation film 39 are thereby formed. Thereafter, heat treatment (curing) for hardening the resin film is performed (step S18) and further, the first external electrode 33 and the second external electrode 34 are grown inside the pad openings 44 and 45, for example, by the electroless plating method (step S19). The chip capacitor 31 of the structure shown in FIG. 10, etc., is thereby obtained.

In the patterning of the upper electrode film 43 using the photolithography process, the electrode film portions 231 to 239 of minute areas can be formed with high precision and the fuse units 37 of even finer pattern can be formed. After the patterning of the upper electrode film 43, the total capacitance value is measured and then the fuses to be cut are determined. By cutting the determined fuses, the chip capacitor 31 that is accurately adjusted to the desired capacitance value can be obtained.

Figure 16:
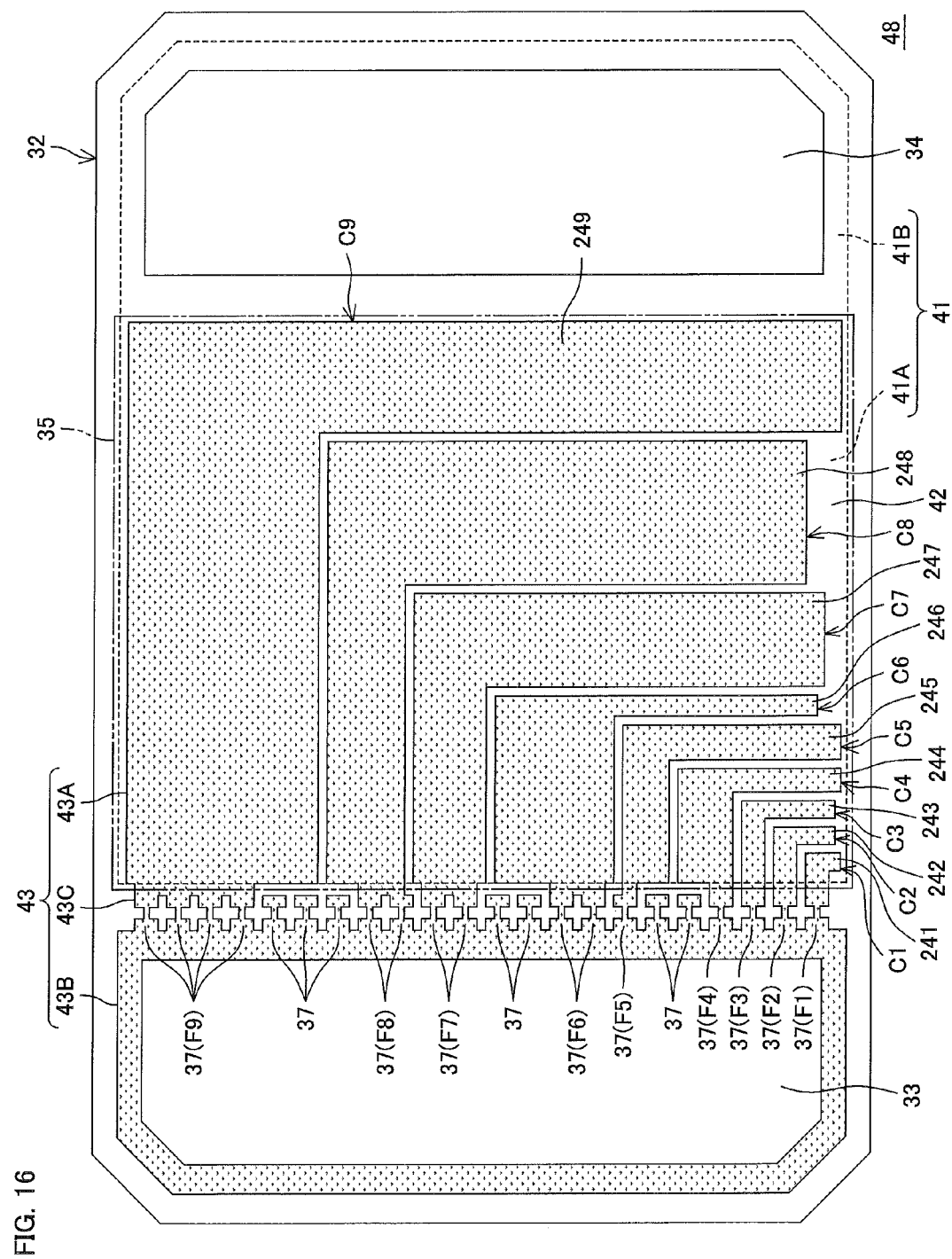
FIG. 16 is a plan view for describing the arrangement of a chip capacitor according to a second preferred embodiment of the first reference example.

FIG. 16 is a plan view for describing the arrangement of a chip capacitor 48 according to a second preferred embodiment of the first reference example. In FIG. 16, portions corresponding to respective portions shown in FIG. 10 are indicated using the same reference symbols as in FIG. 10. In the first preferred embodiment, the capacitor electrode region 43A of the upper electrode film 43 is divided into the electrode film portions 231 to 239 each having a band shape. In this case, regions that cannot be used as capacitor elements are formed within the capacitor arrangement region 35 as shown in FIG. 10 and effective use cannot be made of the restricted region on the small substrate 32.

Therefore with the preferred embodiment shown in FIG. 16, the plurality of electrode film portions 231 to 239 are divided into L-shaped electrode film portions 241 to 249. For example, the electrode film portion 249 in the arrangement of FIG. 16 can thereby be made to face the lower electrode film 41 over an area that is 1.5 times that of the electrode film portion 239 in the arrangement of FIG. 10. Therefore, if the capacitor element C9 corresponding to the electrode film portion 239 in the first preferred embodiment of FIG. 10 has a capacitance of 4 pF, the capacitor element C9 can be made to have a capacitance of 6 pF by use of the electrode film portion 249 of the present preferred embodiment. The capacitance value of the chip capacitor 48 can thereby be set over a wider range by making effective use of the interior of the capacitor arrangement region 35.

Figure 17:
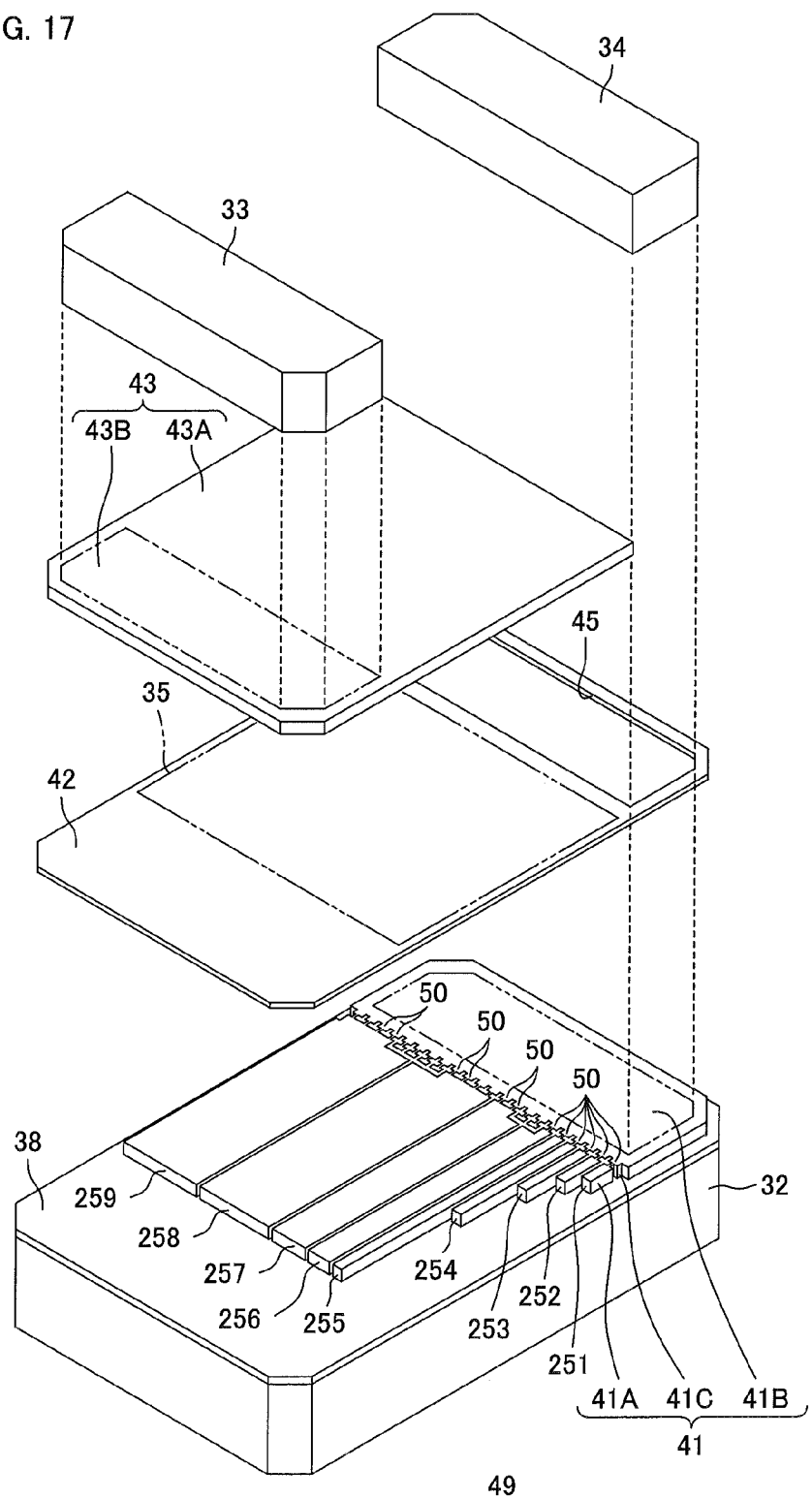
FIG. 17 is an exploded perspective view for describing the arrangement of a chip capacitor according to a third preferred embodiment of the first reference example.

The process for manufacturing the chip capacitor 48 according to the present preferred embodiment is practically the same as the process shown in FIG. 14. However, in the patterning of the upper electrode film 43 (steps S7 and S8), the capacitor electrode region 43A is divided into the plurality of electrode film portions 241 to 249 of the shapes shown in FIG. 16. FIG. 17 is an exploded perspective view for describing the arrangement of a chip capacitor 49 according to a third preferred embodiment of the first reference example, and the respective portions of the chip capacitor 49 are shown in the same manner as in FIG. 12 used for describing the first preferred embodiment.

With the first preferred embodiment, the lower electrode film 41 has the capacitor electrode region 41A constituted of a pattern that is continuous across substantially the entirety of the capacitor arrangement region 35, and the capacitor electrode region 43A of the upper electrode film 43 is divided into the plurality of electrode film portions 231 to 239. In contrast, with the present preferred embodiment, whereas the capacitor electrode region 43A of the upper electrode film 43 is formed to a continuous film pattern that is continuous across substantially the entirety of the capacitor arrangement region 35, the capacitor electrode region 41A of the lower electrode film 41 is divided into a plurality of electrode film portions 251 to 259. The electrode film portions 251 to 259 may be formed in the same shapes and area ratio as those of the electrode film portions 231 to 239 in the first preferred embodiment or may be formed in the same shapes and area ratio as those of the electrode film portions 241 to 249 in the second preferred embodiment. A plurality of capacitor elements are thus arranged by the electrode film portions 251 to 259, the capacitance film 42, and the upper electrode film 43. At least a portion of the plurality of capacitor elements constitutes a set of capacitor elements that differ in capacitance value (for example, with the respective capacitance values being set to form a geometric progression).

The lower electrode film 41 further has a fuse region 41C between the capacitor electrode region 41A and the pad region 41B. In the fuse region 41C, a plurality of fuse units 50, similar to the fuse units 37 of the first preferred embodiment, are aligned in a single column along the pad region 41B. Each of the electrode film portions 251 to 259 is connected to the pad region 41B via one or a plurality of the fuse units 50.

The electrode film portions 251 to 259 face the upper electrode film 43 over mutually different facing areas in the present arrangement as well and any of these can be disconnected individually by cutting the fuse unit 50. The same effects as those of the first preferred embodiment are thus obtained. In particular, by forming at least a portion of the plurality of electrode film portions 251 to 259 so as to face the upper electrode film 43 over facing areas set to form a geometric progression with a common ratio of 2, a chip capacitor that is precisely adjusted to the required capacitance value can be provided in the same manner as in the first preferred embodiment.

The process for manufacturing the chip capacitor 49 according to the present preferred embodiment is practically the same as the process shown in FIG. 14. However, in the patterning of the lower electrode film 41 (steps S3 and S4), the capacitor electrode region 41A is divided into the electrode film portions 251 to 259 and the plurality of fuse units 50 are formed in the fuse region 41C. Also, in the patterning of the upper electrode film 43 (steps S7 and S8), a plurality of electrode film portions are not formed and fuse units are also not formed. Further, in the laser trimming (step S12), the fuse units 50 formed in the lower electrode film 41 are cut by laser light. The lower electrode film 41 is covered by the capacitance film 42 and the capacitance film 42 can thus be used as a cover film for accumulating the energy of the laser light in the process of laser trimming. The forming of the cover film (step S11) immediately before the laser trimming may thus be omitted.

Although preferred embodiments of the first reference example have been described above, the first reference example may be implemented in yet other modes as well. For example, although with each of the preferred embodiments described above, the arrangement where just one of either of the upper electrode film and the lower electrode film is divided into the plurality of electrode films was described, both the upper electrode film and the lower electrode film may be divided into a plurality of electrode film portions. Further, although with each of the preferred embodiments, an example where each fuse unit is made integral with the upper electrode film or the lower electrode film was described, the fuse units may be formed from a conductor film separate from the upper electrode film and the lower electrode film. Further, although with each of the preferred embodiments, an example where the plurality of capacitor elements include a plurality of capacitor elements having capacitance values that form a geometric progression with a common ratio r (0<r; r≠1)=2 was described, the common ratio of the geometric progression may be a numeral other than 2. Also with each of the preferred embodiments, the insulating film 38 is formed on the top surface of the substrate 32, the insulating film 38 may be omitted if the substrate 32 is an insulating substrate. Also, a conductive substrate may be used as the substrate 32, the conductive substrate may be used as a lower electrode, and the capacitance film 42 may be formed so as to be in contact with the top surface of the conductive substrate. In this case, one of the external electrodes may be led out from a rear surface of the conductive substrate.

Besides the above, various design changes may be applied within the scope of the matters described as features of the invention according to the (1) first reference example. For example, arrangements with which a step of manufacture not specified in the respective features A1 to A20 is changed, omitted, or added are also included within the scope of the first reference example. <Invention according to a second reference example> (1) Features of the invention according to the second reference example. For example, the features of the invention according to the second reference example are the following B1 to B25. (B1) A chip capacitor including a substrate, a first external electrode disposed on the substrate, a second external electrode disposed on the substrate, a plurality of capacitor elements formed on the substrate and connected between the first external electrode and the second external electrode, a plurality of fuses that are formed on the substrate, are each interposed between the plurality of capacitor elements and the first external electrode or the second external electrode, and are capable of disconnecting each of the plurality of capacitor elements, and a pair of diodes formed inside the substrate and connected in mutually opposite directions between a region including a portion directly below the first external electrode and a region including a portion directly below the second external electrode.

With the invention according to B1, the plurality of capacitor elements are connected between the first and second external electrodes disposed on the substrate. The plurality of fuses that are capable of disconnecting each of the plurality of capacitor elements are provided between the plurality of capacitor elements and the first or second external electrodes. A plurality of types of capacitance values can thus be accommodated easily and rapidly by selecting and cutting one or a plurality of the fuses. In other words, a common design can be applied to chip capacitors of a plurality of types of capacitance values. Also, the chip capacitor can be adjusted in capacitance value accurately without being influenced by parasitic capacitance. (B2) The chip capacitor according to B1, where the pair of diodes include an impurity diffusion region, formed in a top surface region of the substrate including the portion directly below the first external electrode or a portion directly below the lower electrode, and an impurity diffusion region, formed in a top surface region of the substrate including the portion directly below the second external electrode or a portion directly below the lower electrode.

By the invention according to B2, the pair of diodes can be formed easily by forming the impurity diffusion regions. (B3) The chip capacitor according to B2, where the substrate is a semiconductor substrate and the pair of diodes are formed by pn junctions of the substrate and the impurity regions. By the invention according to B3, the pair of diodes can be prepared readily using the pn junctions of the semiconductors. (B4) The chip capacitor according to any one of B1 to B3, where the plurality of capacitor elements have mutually different capacitance values.

With the invention according to B4, chip capacitors of various capacitance values can be realized with a common design by combining a plurality of the capacitor elements that differ in capacitance value. (B5) The chip capacitor according to B4, where the capacitance values of the plurality of capacitor elements are set to form a geometric progression. By the invention according to B5, the capacitance value of the chip capacitor can be adjusted accurately to a desired capacitance value by appropriate selection of a plurality of the capacitor elements to be connected between the first external electrode and the second external electrode. For example, by setting the common ratio of the geometric progression to 2, the capacitance value of the chip capacitor can be adjusted at the precision of the first term of the geometric progression (term of the smallest value in the geometric progression). (B6) The chip capacitor according to any one of B1 to B5, where at least one of the plurality of fuses is cut.

With the invention according to B6, one or a plurality of the fuses may be cut in the chip capacitor that has been adjusted in capacitance value. The capacitor elements to be connected between the first external electrode and the second external electrode can be selected by fuse cutting and the chip capacitor of the required capacitance value can thereby be realized. (B7) The chip capacitor according to any one of B1 to B6, including a lower electrode film formed on the substrate, a capacitance film formed on the lower electrode film, and an upper electrode film formed on the capacitance film so as to face the lower electrode film, and where one electrode film among the upper electrode film and the lower electrode film includes a plurality of divided electrode film portions and the plurality of capacitor elements are formed by the plurality of the electrode film portions facing the other electrode film, among the upper electrode film and the lower electrode film, across the capacitance film.

With the invention according to B7, a capacitor structure is arranged by the capacitance film being sandwiched between the lower electrode film and the upper electrode film. One electrode film among the upper electrode film and the lower electrode film is divided into the plurality of electrode film portions so that the respective electrode film portions face the other electrode film and the plurality of capacitor elements are thereby provided on the substrate. (B8) The chip capacitor according to B7, where the plurality of electrode film portions face the other electrode film over mutually different facing areas.

With the invention according to B8, the plurality of capacitor elements corresponding to the plurality of electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value. (B9) The chip capacitor according to B8, where the facing areas of the plurality of electrode film portions are set to form a geometric progression.

By the invention according to B9, the plurality of capacitor elements, the capacitance values of which are set to form a geometric progression, can be provided on the substrate. Chip capacitors of a plurality of types of capacitance values can thereby be realized and fine adjustment of the capacitance value can also be performed by fuse cutting. (B10) The chip capacitor according to any one of B7 to B9, where the plurality of electrode film portions and the fuses are formed of films of the same conductive material.

By the invention according to B10, the electrode film portions and the fuses can be arranged from a conductive material film in common Each electrode film portion can be disconnected by cutting the fuse corresponding to the electrode film portion. (B11) The chip capacitor according to any one of B1 to B10, further including a protective film formed to cover the upper electrode film and expose the first external electrode and the second external electrode.

By the invention according to B11, the upper electrode film can be covered by the protective film while exposing the first and second external electrodes, thereby enabling a chip capacitor that is capable of realizing a plurality of types of capacitance values with a common design and is high in reliability to be provided. (B12) The chip capacitor according to B11, where the protective film extends to a side surface of the substrate and covers the side surface.

With the invention according to B12, protection is also provided from the side surface of the substrate, thereby enabling further improvement of the reliability of the chip capacitor. (B13) A method for manufacturing a chip capacitor including a first external electrode and a second external electrode, the method including a step of forming a diffusion region in each of regions of the top surface region of the substrate respectively directly below the first external electrode and the second external electrode, a step of forming a plurality of capacitor elements on a substrate, a step of forming, on the substrate, a plurality of fuses that disconnectably connect each of the plurality of capacitor elements to the first external electrode or the second external electrode, and a step of forming the first external electrode and the second external electrode on the substrate.

By the invention according to B13, chip capacitors being of a common design and yet being of a plurality of capacitance values can be manufactured by cutting the fuses that are selected in accordance with the required capacitance values. Chip capacitors that are not influenced by parasitic capacitance can also be manufactured. (B14) The method for manufacturing a chip capacitor according to B13, where the plurality of capacitor elements are formed to have mutually different capacitance values.

By the invention according to B14, a plurality of types of capacitance values can be realized by appropriately selecting and combining a plurality of the capacitor elements. (B15) The method for manufacturing a chip capacitor according to B14, where the capacitance values of the plurality of capacitor elements are set to form a geometric progression. With the invention according to B15, a plurality of types of capacitance values can be realized and fine adjustment with respect to (adjustment to) a desired capacitance value is made possible by appropriately selecting and combining a plurality of the capacitor elements. For example, by setting the common ratio of the geometric progression to 2, the capacitance value of the chip capacitor can be adjusted at the precision of the first term of the geometric progression (term of the smallest value in the geometric progression). (B16) The method for manufacturing a chip capacitor according to any one of B13 to B15, further including a step of cutting at least one of the plurality of fuses.

By the invention according to B16, the capacitance value of the chip capacitor can be adjusted to the desired capacitance value by appropriately selecting each fuse to be cut. That is, the chip capacitor adjusted to the desired capacitance value can be manufactured by appropriately selecting the capacitor elements to be connected to the first and second external electrodes and cutting the fuses corresponding to the capacitor elements besides those selected. (B17) The method for manufacturing a chip capacitor according to B16, further including a step of measuring a total capacitance value of the plurality of capacitor elements and a step of selecting each fuse to be cut based on the measured total capacitance value, and where each selected fuse is cut in the fuse cutting step.

By the invention according to B17, the total capacitance value of the plurality of capacitor elements is measured, each fuse to be cut is selected based on the measurement result, and therefore the capacitance value of the chip capacitor can be set to the targeted capacitance value reliably. (B18) The method for manufacturing a chip capacitor according to B16 or B17, further including a step of forming, after cutting the fuse or fuses, a protective film covering the cut portion of each fuse.

By the invention according to B18, the cut portion of each fuse is covered by the protective film and therefore entry of foreign matter and moisture with respect to the cut portion can be avoided to enable a chip capacitor, which can realize a plurality of types of capacitance values with a common design and is high in reliability, to be manufactured. (B19) The method for manufacturing a chip capacitor according to any one of B13 to B18, where the step of forming the plurality of capacitor elements includes a step of forming a lower electrode film on the substrate, a step of forming a capacitance film on the lower electrode film, a step of forming an upper electrode film on the capacitance film so as to face the lower electrode film, and a step of dividing (for example, dividing by photolithography) one electrode film among the upper electrode film and the lower electrode film into a plurality of electrode film portions, and the plurality of capacitor elements are formed by the plurality of electrode film portions facing the other electrode film, among the upper electrode film and the lower electrode film, across the capacitance film.

By the invention according to B19, a capacitor structure having the capacitance film sandwiched between the lower electrode film and the upper electrode film can be formed. By one electrode film among the upper electrode film and the lower electrode film being divided into the plurality of electrode film portions, the plurality of capacitor elements, having the structure where the capacitance film is sandwiched between the divided electrode film portions and the other electrode film, can be formed on the substrate. (B20) The method for manufacturing a chip capacitor according to B19, where the one electrode film is divided so that the plurality of electrode film portions face the other electrode film over mutually different facing areas.

By the invention according to B20, the plurality of capacitor elements of different capacitance values can be formed on the substrate by making the plurality of electrode film portions face the other electrode film over mutually different facing areas. Chip capacitors of a plurality of types of capacitance values can thus be realized by appropriate selection and combination of the capacitor elements of different capacitance values. (B21) The method for manufacturing a chip capacitor according to B20, where the facing areas of the plurality of electrode film portions are set to form a geometric progression.

By the invention according to B21, the plurality of capacitor elements, the capacitance values of which are set to form a geometric progression, can be formed on the substrate. Chip capacitors of a plurality of types of capacitance values can thereby be provided and accurate adjustment to the desired capacitance value can be performed by appropriate selection and combination of a plurality of the capacitor elements. (B22) The method for manufacturing a chip capacitor according to any one of B19 to B21, where the one electrode film and the fuses are formed of films of the same conductive material.

By the invention according to B22, the electrode film portions and the fuses can be formed of films of the same conductive material and can thus be formed by patterning from the same film. The manufacturing process is thereby simplified. (B23) A chip capacitor including a substrate, an insulating film formed on the substrate, a lower electrode film formed on the insulating film, a capacitance film formed on the lower electrode film, an upper electrode film formed on the capacitance film so as to face the lower electrode film, a first external electrode disposed on the insulating film and connected to the lower electrode film, a second external electrode disposed on the insulating film and connected to the upper electrode film, and a pair of diodes formed inside the substrate and connected in mutually opposite directions between a region including a portion directly below the first external electrode and a region including a portion directly below the second external electrode.

With the invention according to B23, the chip capacitor can be adjusted in capacitance value accurately without being influenced by parasitic capacitance. (B24) The chip capacitor according to B23, where the pair of diodes include an impurity diffusion region, formed in a top surface region of the substrate including the portion directly below the first external electrode or a portion directly below the lower electrode, and an impurity diffusion region, formed in a top surface region of the substrate including the portion directly below the second external electrode or a portion directly below the lower electrode.

By the invention according to B24, the pair of diodes can be formed easily by forming the impurity diffusion regions. (B25) The chip capacitor according to B24, where the substrate is a semiconductor substrate and the pair of diodes are formed by pn junctions of the substrate and the impurity regions. By the invention according to B25, the pair of diodes can be prepared readily using the pn junctions of the semiconductors. (2) Preferred embodiments of the invention according to the second reference example Preferred embodiments of the second reference example shall now be described in detail with reference to the attached drawings.

Figure 18:
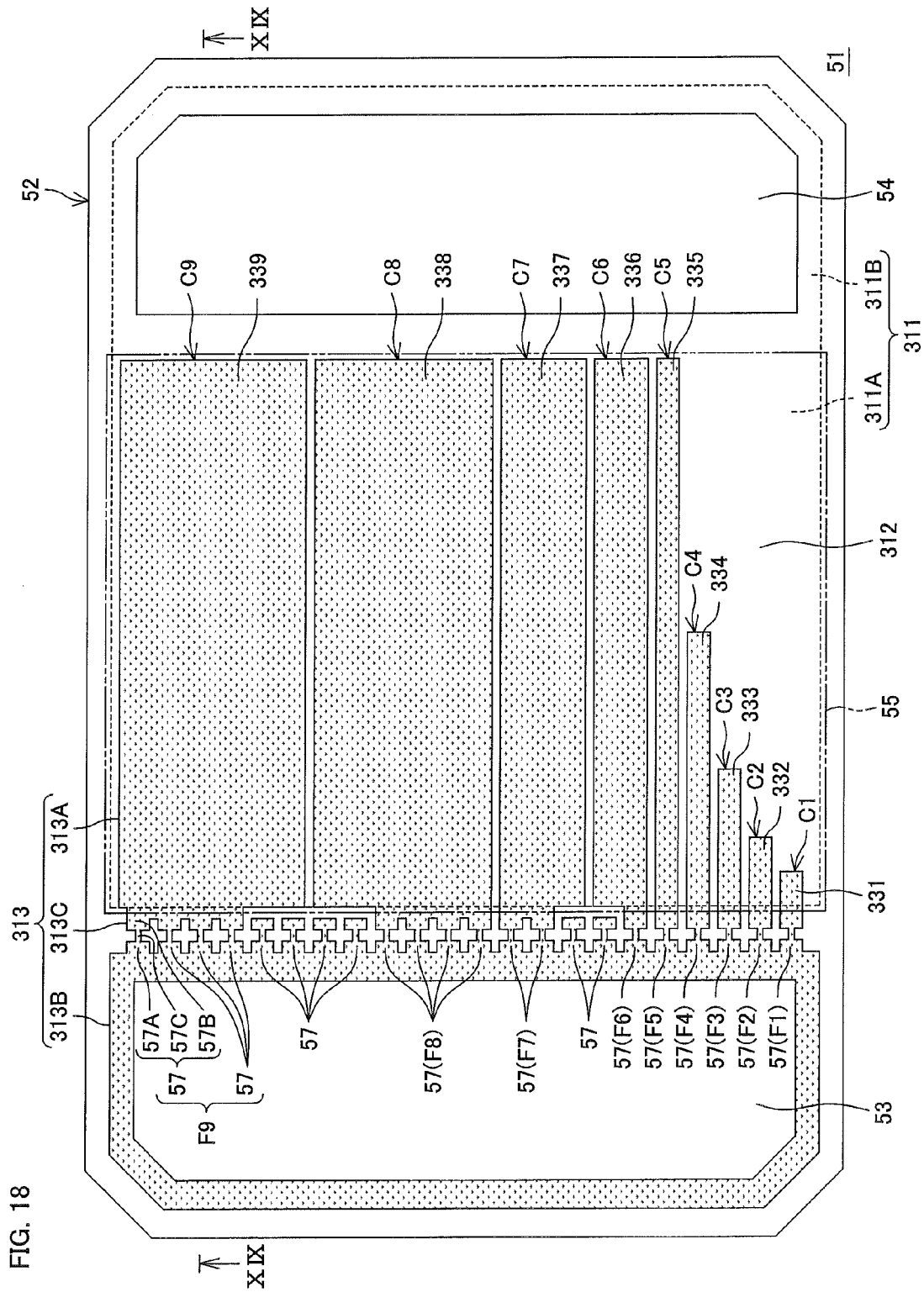
FIG. 18 is a plan view of a chip capacitor according to a first preferred embodiment of a second reference example.
Figure 19:
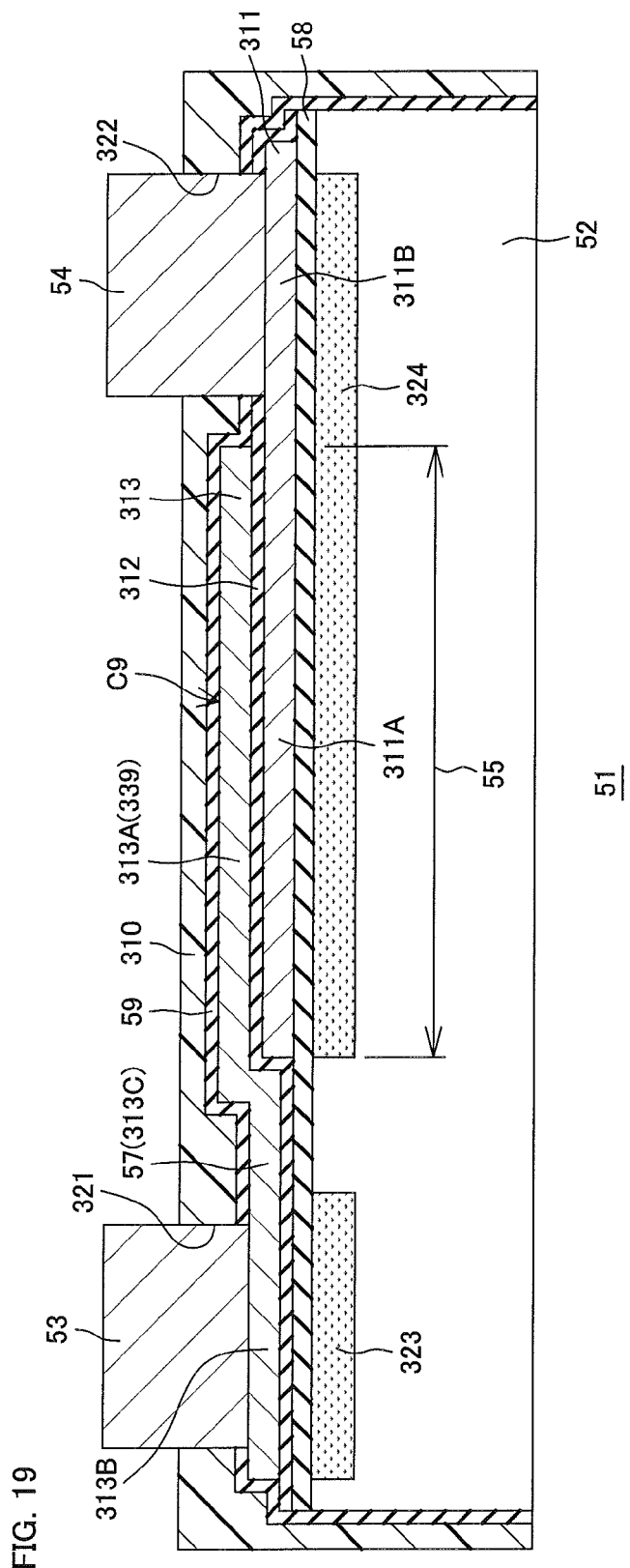
FIG. 19 is a sectional view taken along section line IXX-IXX in FIG. 19.
Figure 20:
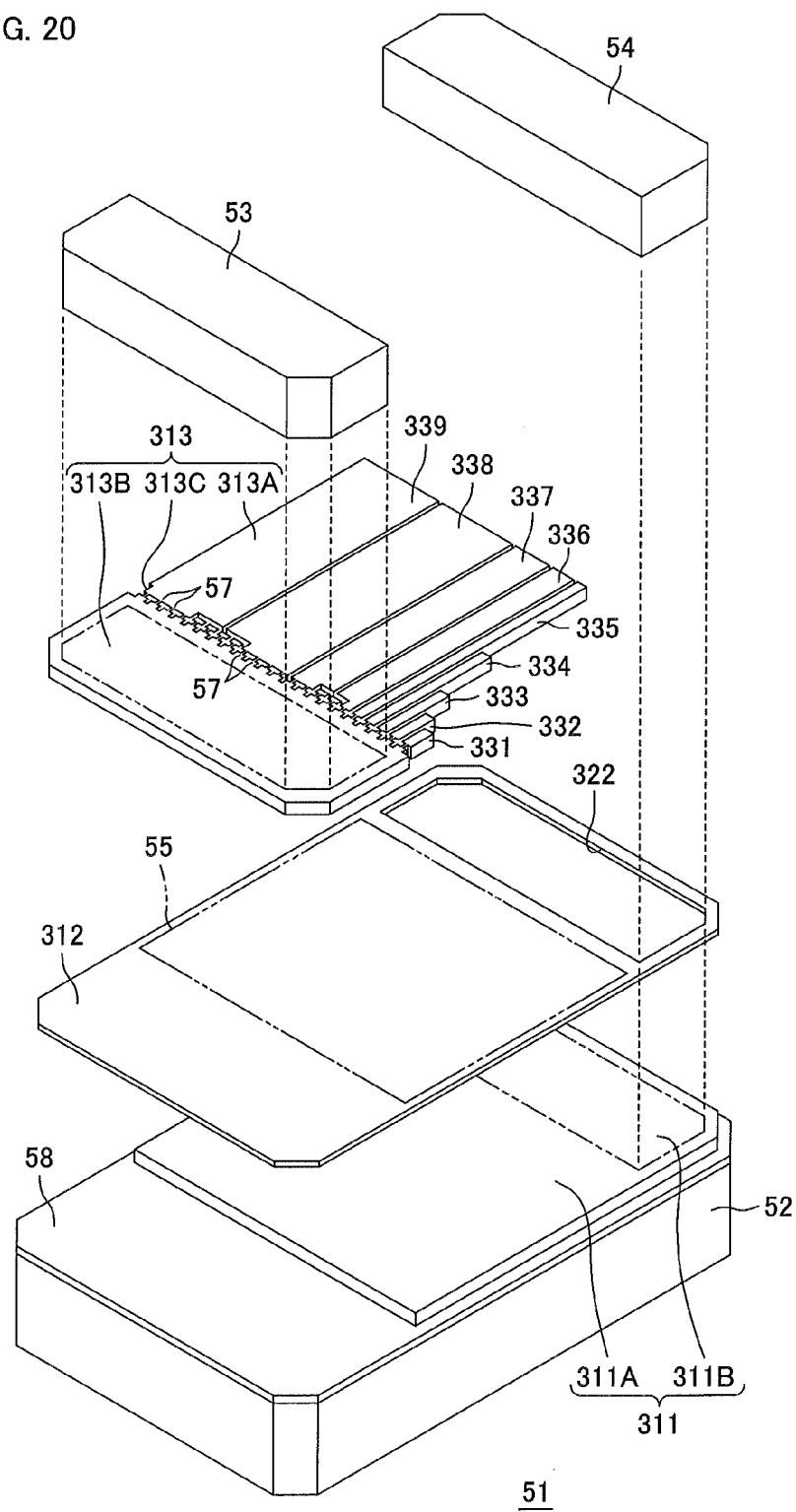
FIG. 20 is an exploded perspective view showing the arrangement of a portion of the chip capacitor in a separated state.

FIG. 18 is a plan view of a chip capacitor according to a first preferred embodiment of the second reference example, and FIG. 19 is a sectional view thereof showing a section taken along section line IXX-IXX in FIG. 18. Further, FIG. 20 is an exploded perspective view showing the arrangement of a portion of the chip capacitor in a separated state. The chip capacitor 51 includes a substrate 52, a first external electrode 53 disposed on the substrate 52, and a second external electrode 54 disposed similarly on the substrate 52. In the present preferred embodiment, the substrate 52 has, in a plan view, a rectangular shape with the four corners chamfered. The rectangular shape has dimensions of, for example, approximately 0.3 mm×0.15 mm. The first external electrode 53 and the second external electrode 54 are respectively disposed at portions at respective ends in the long direction of the substrate 52. In the present preferred embodiment, each of the first external electrode 53 and the second external electrode 54 has a substantially rectangular planar shape extending in the short direction of the substrate 52 and has chamfered portions at two locations respectively corresponding to the corners of the substrate 52. On the substrate 52, a plurality of capacitor elements C1 to C9 are disposed within a capacitor arrangement region 55 between the first external electrode 53 and the second external electrode 54. The plurality of capacitor elements C1 to C9 are electrically connected respectively to the first external electrode 53 via a plurality of fuse units 57.

As shown in FIG. 19 and FIG. 20, an insulating film 58 is formed on the top surface of the substrate 52, and a lower electrode film 311 is formed on the top surface of the insulating film 58. The lower electrode film 311 is formed to spread across substantially the entirety of the capacitor arrangement region 55 and extend to a region directly below the second external electrode 54. More specifically, the lower electrode film 311 has a capacitor electrode region 311A functioning as a lower electrode in common to the capacitor elements C1 to C9 and a pad region 311B for leading out to an external electrode. The capacitor electrode region 311A is positioned in the capacitor arrangement region 55 and the pad region 311B is positioned directly below the second external electrode 54.

In the capacitor arrangement region 55, a capacitance film (dielectric film) 312 is formed so as to cover the lower electrode film 311 (capacitor electrode region 311A). The capacitance film 312 is continuous across the entirety of the capacitor electrode region 311A and, in the present preferred embodiment, further extends to a region directly below the first external electrode 53 and covers the insulating film 58 outside the capacitor arrangement region 55. An upper electrode film 313 is formed on the capacitance film 312. In FIG. 18, the upper electrode film 313 is indicated with fine dots added for the sake of clarity. The upper electrode film 313 includes a capacitor electrode region 313A positioned in the capacitor arrangement region 55, a pad region 313B positioned directly below the first external electrode 53, and a fuse region 313C disposed between the pad region 313B and the capacitor electrode region 313A.

In the capacitor electrode region 313A, the upper electrode film 313 is divided into a plurality of electrode film portions 331 to 339. In the present preferred embodiment, the respective electrode film portions 331 to 339 are all formed to rectangular shapes and extend in the form of bands from the fuse region 313C toward the second external electrode 54. The plurality of electrode film portions 331 to 339 face the lower electrode film 311 across the capacitance film 312 over a plurality of types of facing areas. More specifically, a ratio of the facing areas of the electrode film portions 331 to 339 with respect to the lower electrode film 311 may be set to be 1:2:4:8:16:32:64:128:128. That is, the plurality of electrode film portions 331 to 339 include the plurality of electrode film portions differing in facing area and more specifically include the plurality of electrode film portions 331 to 338 (or 331 to 337 and 339) having facing areas that are set to form a geometric progression with a common ratio of 2. The plurality of capacitor elements C1 to C9, respectively arranged by the respective electrode film portions 331 to 339 and the facing lower electrode film 311 across the capacitance film 312, thus include the plurality of capacitor elements having mutually different capacitance values. If the ratio of the facing areas of the electrode film portions 331 to 339 is as mentioned above, the ratio of the capacitance values of the capacitor elements C1 to C9 is equal to the ratio of the facing areas and is 1:2:4:8:16:32:64:128:128. The plurality of capacitor elements C1 to C9 thus include the plurality of capacitor elements C1 to C8 (or C1 to C7 and C9) with capacitance values set to form the geometric progression with the common ratio of 2.

In the present preferred embodiment, the electrode film portions 331 to 335 are formed to bands that are equal in width and have lengths with the ratio thereof being set to 1:2:4:8:16. Also, the electrode film portions 335, 336, 337, 338, and 339 are formed to bands that are equal in length and have widths with the ratio thereof being set to 1:2:4:8:8. The electrode film portions 335 to 339 are formed to extend across a range from an end edge at the first external electrode 53 side to an end edge at the second external electrode 54 side of the capacitor arrangement region 55, and the electrode film portions 331 to 334 are formed to be shorter than this range.

The pad region 313B is formed to be substantially similar in shape to the first external electrode 53 and has a substantially rectangular planar shape having two chamfered portions corresponding to corner portions of the substrate 52. The fuse region 313C is disposed along one long side (the long side at the inner side with respect to the peripheral edge of the substrate 52) of the pad region 313B. The fuse region 313C includes the plurality of fuse units 57 that are aligned along the one long side of the pad region 313B. The fuse units 57 are formed of the same material as and to be integral to the pad region 313B of the upper electrode film 313. The plurality of electrode film portions 331 to 339 are each formed integral to one or a plurality of the fuse units 57, are connected to the pad region 313B via the fuse units 57, and are electrically connected to the first external electrode 53 via the pad region 313B. Each of the electrode film portions 331 to 336 of comparatively small area is connected to the pad region 313B via a single fuse unit 57, and each of the electrode film portions 337 to 339 of comparatively large area is connected to the pad region 313B via a plurality of fuse units 57. It is not necessary for all of the fuse units 57 to be used and, in the present preferred embodiment, a portion of the fuse units 57 is unused.

The fuse units 57 include first wide portions 57A arranged to be connected to the pad region 313B, second wide portions 57B arranged to be connected to the electrode film portions 331 to 339, and narrow portions 57C connecting the first and second wide portions 57A and 57B. The narrow portions 57C are arranged to be capable of being cut (fused) by laser light. Unnecessary electrode film portions among the electrode film portions 331 to 339 can thus be electrically disconnected from the first and second external electrodes 53 and 54 by cutting the fuse units 57.

Although omitted from illustration in FIG. 18 and FIG. 20, the top surface of the chip capacitor 51 that includes the top surface of the upper electrode film 313 is covered by a passivation film 59 as shown in FIG. 19. The passivation film 59 is constituted, for example, of a nitride film and is formed not only to cover the upper surface of the chip capacitor 51 but also to extend to side surfaces of the substrate 52 and cover the side surfaces. Further, a resin film 310, made of a polyimide resin, etc., is formed on the passivation film 59. The resin film 310 is formed to cover the upper surface of the chip capacitor 51 and extend to the side surfaces of the substrate 52 to cover the passivation film 59 on the side surfaces.

The passivation film 59 and the resin film 310 are protective films that protect the top surface of the chip capacitor 51. In these films, pad openings 321 and 322 are respectively formed in regions corresponding to the first external electrode 53 and the second external electrode 54. The pad openings 321 and 322 penetrate through the passivation film 59 and the resin film 310 so as to respectively expose a region of a portion of the pad region 313B of the upper electrode film 313 and a region of a portion of the pad region 311B of the lower electrode film 311. Further, with the present preferred embodiment, the pad opening 322 corresponding to the second external electrode 54 also penetrates through the capacitance film 312.

The first external electrode 53 and the second external electrode 54 are respectively embedded in the pad openings 321 and 322. The first external electrode 53 is thereby bonded to the pad region 313B of the upper electrode film 313 and the second external electrode 54 is bonded to the pad region 311B of the lower electrode film 311. The first and second external electrodes 53 and 54 are formed to project from the top surface of the resin film 310. The chip capacitor 51 can thereby be flip-chip bonded to a mounting substrate.

With the present preferred embodiment, for example, a semiconductor substrate formed of a semiconductor (for example, a p type silicon substrate) is used as the substrate 52. Therefore, directly below the first external electrode 53, a parasitic capacitance across the insulating film 58 and the capacitance film 312 is formed between the first external electrode 53 and the substrate 52. Also, directly below the second external electrode 54, a parasitic capacitance across the insulating film 58 is formed between the second external electrode 54 and the substrate 52. These parasitic capacitances are connected in series between the first external electrode 53 and the second external electrode 54 via the substrate 52. The series circuit of the parasitic capacitances is connected in parallel with respect to the capacitor elements C1 to C9 so that the parasitic capacitances are added to the chip capacitor 51 and, in particular, hinder the adjustment of the chip capacitor 51 to a desired capacitance value (for example, of not more than 1 pF).

Therefore in the present preferred embodiment, an n type diffusion region 323, doped with an n type impurity, is formed in a top surface region of the substrate 52 directly below the first external electrode 53 and directly below the pad region 313B. Also, an n type diffusion region 324, doped with an n type impurity, is formed in a top surface region of the substrate 52 directly below the second external electrode 54 and directly below the lower electrode film 311. By thus forming the diffusion regions 323 and 324 in the top surface regions of the substrate 52, a diode based on a pn junction is formed across the substrate 52, the diffusion region 323, and the first external electrode 53. Similarly, a diode based on a pn junction is also formed across the substrate 52, the diffusion region 324, and the second external electrode 54. Consequently, the electrical equivalent circuit of the chip capacitor 51 is arranged as shown in FIG. 21.

Figure 21:
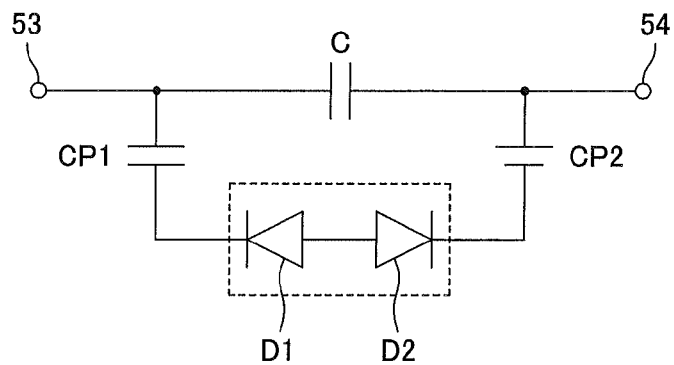
FIG. 21 is an electrical equivalent circuit diagram of the chip capacitor.

In FIG. 21, C is the proper capacitance of the chip capacitor 51 and CP1 and CP2 are the respective parasitic capacitances at the first external electrode 53 side and the second external electrode 54 side. The parasitic capacitances CP1 and CP2 are electrically cut off by a pair of diodes D1 and D2 that are formed by the pn junctions and are connected in mutually opposite directions and the serial parasitic capacitance circuit connecting the first external electrode 53 and the second external electrode 54 is thereby separated from the external electrodes 53 and 54.

Figure 22:
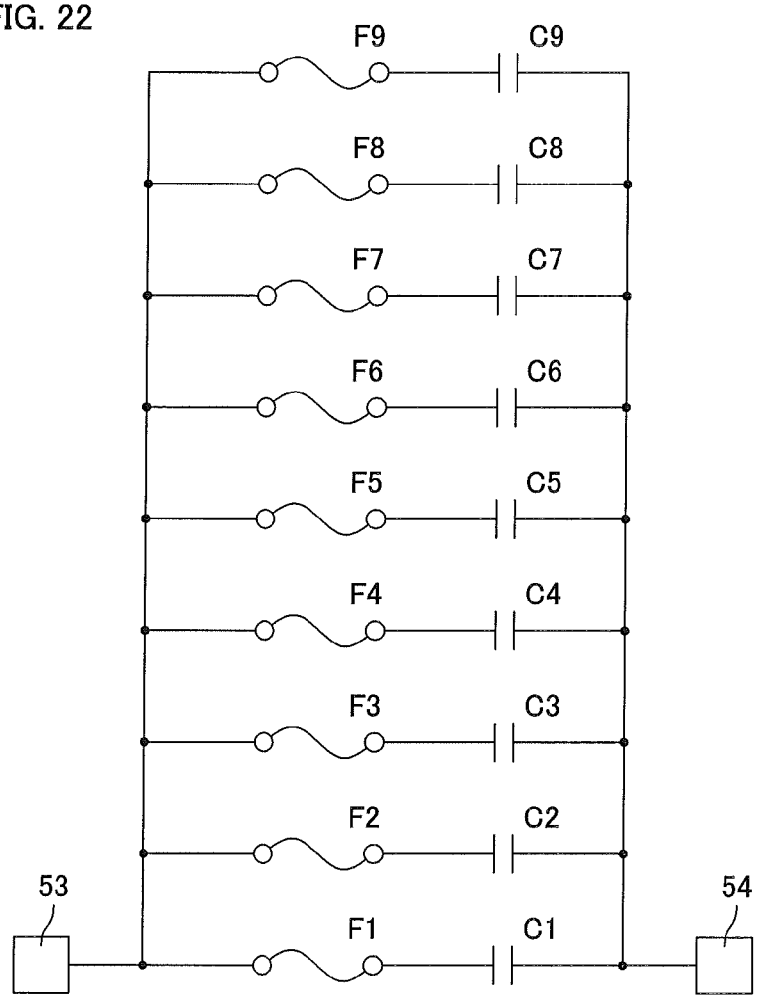
FIG. 22 is a circuit diagram of the electrical arrangement of the interior of the chip capacitor.

FIG. 22 is a circuit diagram of the electrical arrangement of the interior of the chip capacitor 51. The plurality of capacitor elements C1 to C9 are connected in parallel between the first external electrode 53 and the second external electrode 54. Fuses F1 to F9, each arranged from one or a plurality of the fuse units 57, are interposed in series between the respective capacitor elements C1 to C9 and the first external electrode 53. When all of the fuses F1 to F9 are connected, the capacitance value of the chip capacitor 51 is equal to the total of the capacitance values of the capacitor elements C1 to C9. When one or two or more fuses selected from among the plurality of fuses F1 to F9 is or are cut, each capacitor element corresponding to a cut fuse is disconnected and the capacitance value of the chip capacitor 51 decreases by just the capacitance value of the disconnected capacitor element or elements.

Therefore by measuring the capacitance value across the pad regions 311B and 313B (the total capacitance value of the capacitor elements C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor elements C1 to C8 are set to form a geometric progression with a common ratio of 2, fine adjustment to the targeted capacitance value at a precision corresponding to the capacitance value of the capacitor element C1, which is the smallest capacitance value (value of the first term in the geometric progression), is made possible.

For example, the capacitance values of the capacitor elements C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor 51 can be finely adjusted at a minimum adjustment precision of 0.03125 pF. Also, the fuses to be cut among the fuses F1 to F9 can be selected appropriately to provide the chip capacitor 51 with an arbitrary capacitance value between 0.1 pF and 10 pF.

As described above, with the present preferred embodiment, the plurality of capacitor elements C1 to C9 that can be disconnected by the fuses F1 to F9 are provided between the first external electrode 53 and the second external electrode 54. The capacitor elements C1 to C9 include a plurality of capacitor elements that differ in capacitance value and more specifically include a plurality of capacitor elements with capacitance values set to form a geometric progression. The chip capacitor 51, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor 51 shall now be described. The substrate 52 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region 55 is generally a square region with each side having a length corresponding to the length of the short side of the substrate 52. The thickness of the substrate 52 may be approximately 150 μm. The substrate 52 may, for example, be a substrate that has been thinned by grinding or polishing from a rear surface side (surface on which the capacitor elements C1 to C9 are not formed). As the material of the substrate 52, a semiconductor substrate as represented by a silicon substrate may be used or a glass substrate may be used or a resin film may be used.

The insulating film 58 may be a silicon oxide film or other oxide film. The film thickness thereof may be approximately 500 Å to 2000 Å. The lower electrode film 311 is preferably a conductive film, a metal film in particular, and may, for example, be an aluminum film. The lower electrode film 311 that is constituted of an aluminum film may be formed by a sputtering method. Similarly, the upper electrode film 313 is preferably constituted of a conductive film, a metal film in particular, and may, for example, be an aluminum film. The upper electrode film 313 that is constituted of an aluminum film may be formed by the sputtering method. The patterning for dividing the capacitor electrode region 313A of the upper electrode film 313 into the electrode film portions 331 to 339 and shaping the fuse region 313C into the plurality of fuse units 57 may be performed by photolithography and etching processes.

The capacitance film 312 may be constituted, for example, of a silicon nitride film, and the film thickness thereof may be 500 Å to 2000 Å (for example, 1000 Å). The capacitance film 312 may be a silicon nitride film formed by plasma CVD (chemical vapor deposition). The passivation film 59 may be constituted, for example, of a silicon nitride film and may be formed, for example, by the plasma CVD method. The film thickness thereof may be approximately 8000 Å. As mentioned above, the resin film 310 may be constituted of a polyimide film or other resin film.

Each of the first and second external electrodes 53 and 54 may, for example, be constituted of a laminated structure film in which a nickel layer in contact with the lower electrode film 311 or the upper electrode film 313, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film 311 or the upper electrode film 313, and the palladium layer functions as a diffusion preventing layer that suppresses mutual diffusion of the material of the upper electrode film or the lower electrode film and the gold of the uppermost layer of each of the first and second external electrodes 53 and 54.

Figure 23:
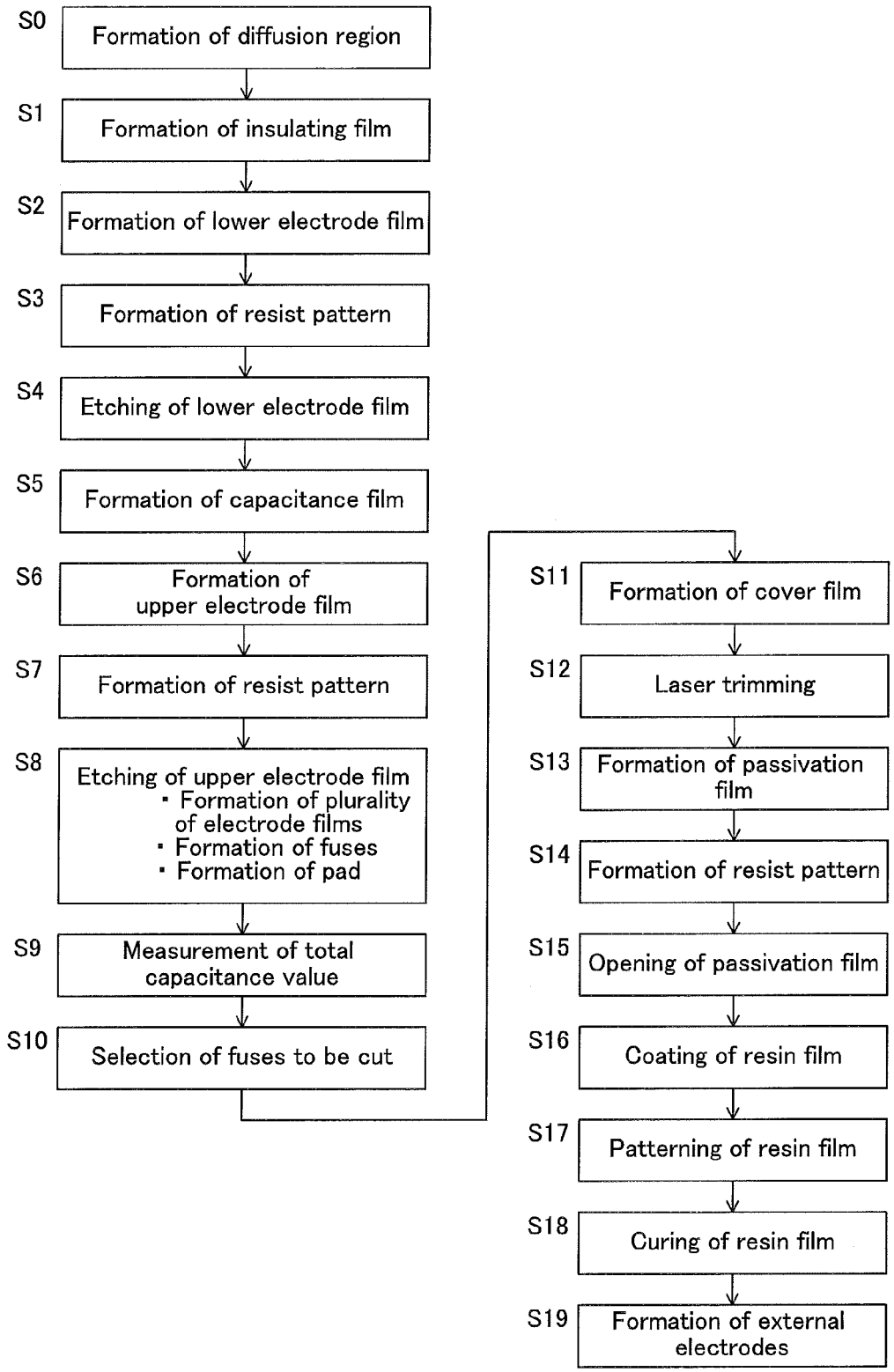
FIG. 23 is a flow diagram for describing an example of a process for manufacturing the chip capacitor.

FIG. 23 is a flow diagram for describing an example of a process for manufacturing the chip capacitor 51. For example, a p type silicon substrate is prepared as the substrate 52. Then of the top surface regions of the substrate 52, a region to be positioned directly below the lower electrode film 311 and a region to be positioned directly below the pad region 313B of the upper electrode film 313 are doped with an n type impurity to form the n type diffusion regions 323 and 324 (step S0). The insulating film 58, constituted of an oxide film (for example, a silicon oxide film), is formed on the top surface of the substrate 52 by a thermal oxidation method and/or CVD method (step S1). Thereafter, the lower electrode film 311, constituted of an aluminum film, is formed over the entire top surface of the insulating film 58, for example, by the sputtering method (step S2). The film thickness of the lower electrode film 311 may be approximately 8000 Å. Thereafter, a resist pattern corresponding to the final shape of the lower electrode film 311 is formed on the top surface of the lower electrode film by photolithography (step S3). The lower electrode film is etched using the resist pattern as a mask to obtain the lower electrode film 311 of the pattern shown in FIG. 18, etc. (step S4). The etching of the lower electrode film 311 may be performed, for example, by reactive ion etching.

Thereafter, the capacitance film 312, constituted of a silicon nitride film, etc., is formed on the lower electrode film 311, for example, by the plasma CVD method (step S5). In the region in which the lower electrode film 311 is not formed, the capacitance film 312 is formed on the top surface of the insulating film 58. Thereafter, the upper electrode film 313 is formed on the capacitance film 312 (step S6). The upper electrode film 313 is constituted, for example, of an aluminum film and may be formed by the sputtering method. The film thickness thereof may be approximately 8000 Å. Thereafter, a resist pattern corresponding to the final shape of the upper electrode film 313 is formed on the top surface of the upper electrode film 313 by photolithography (step S7). The upper electrode film 313 is patterned to its final shape (see FIG. 18, etc.) by etching using the resist pattern as a mask (step S8). The upper electrode film 313 is thereby shaped to the pattern having the plurality of electrode film portions 331 to 339 in the capacitor electrode region 313A, having the plurality of fuse units 57 in the fuse region 313C, and having the pad region 313B connected to the fuse units 57. The etching for patterning the upper electrode film 313 may be performed by wet etching using an etching liquid, such as phosphoric acid, etc., or may be performed by reactive ion etching.

Thereafter, inspection probes are contacted against the pad region 313B of the upper electrode film 313 and the pad region 311B of the lower electrode film 311 to measure the total capacitance value of the plurality of capacitor elements C1 to C9 (step S9). Based on the measured total capacitance value, the capacitor elements to be disconnected, that is, the fuses to be cut are selected in accordance with the targeted capacitance value of the chip capacitor 51 (step S10).

Figure 24A:
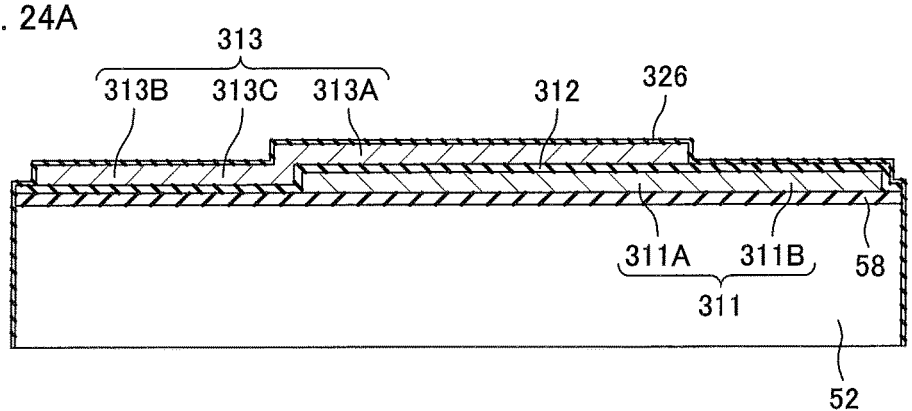
FIG. 24A, FIG. 24B, and FIG. 24C are sectional views for describing steps related to the cutting of a fuse.

Thereafter as shown in FIG. 24A, a cover film 326, constituted, for example, of a nitride film, is formed on the entire surface of the substrate 52 (step S11). The forming of the cover film 326 may be performed by the plasma CVD method and, for example, a silicon nitride film with a film thickness of approximately 3000 Å may be formed. The cover film 326 covers the patterned upper electrode film 313 and covers the capacitance film 312 in the region in which the upper electrode film 313 is not formed. The cover film 326 covers the fuse units 57 in the fuse region 313C.

Figure 24B:
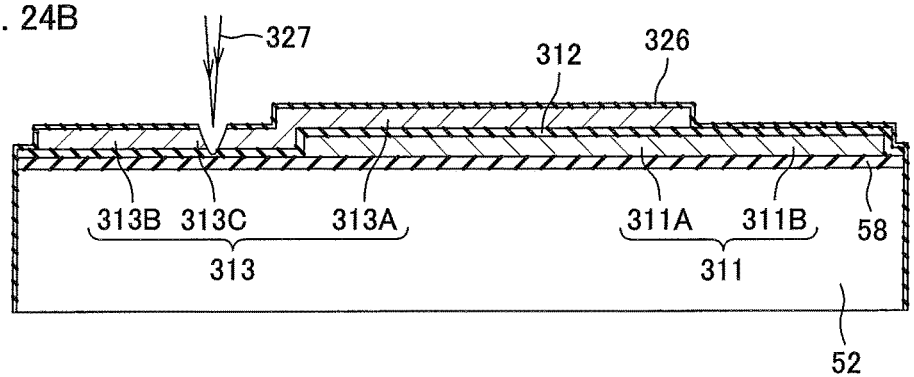

From this state, the laser trimming for fusing the fuse units 57 is performed (step S12). That is, as shown in FIG. 24B, each fuse unit 57 constituting a fuse selected in accordance with the measurement result of the total capacitance value is irradiated with laser light 327 and the narrow portion 57C of the fuse unit 57 is fused. The corresponding capacitor element is thereby disconnected from the pad region 313B. When the laser light 327 is irradiated on the fuse unit 57, the energy of the laser light 327 is accumulated at a vicinity of the fuse unit 57 by the action of the cover film 326 and the fuse unit 57 is thereby fused.

Figure 24C:
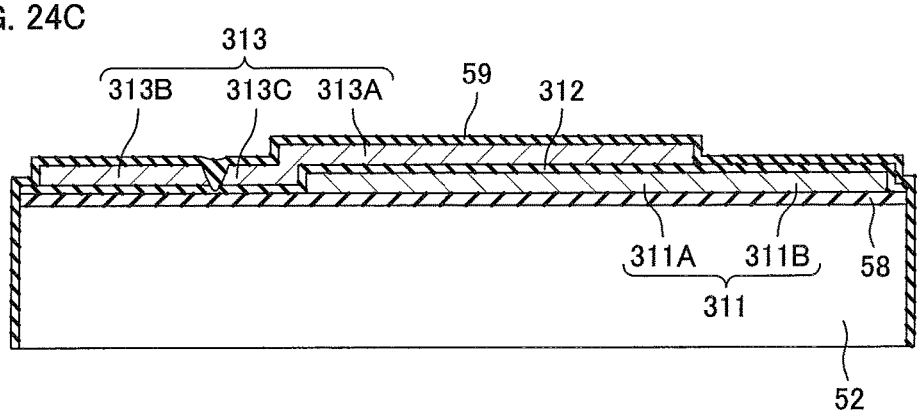

Thereafter as shown in FIG. 24C, a silicon nitride film is deposited on the cover film 326, for example, by the plasma CVD method to form the passivation film 59 (step S13). In the final form, the cover film 326 is made integral with the passivation film 59 to constitute a portion of the passivation film 59. The passivation film 59 that is formed after the cutting of the fuses enters into openings in the cover film 326, destroyed at the same time as the fusing of the fuses, to protect the cut surfaces of the fuse units 57. The passivation film 59 thus prevents entry of foreign matter and entry of moisture into the cut locations of the fuse units 57. The passivation film 59 may be formed to have a film thickness, for example, of approximately 8000 Å as a whole.

Thereafter, a resist pattern, having penetrating holes at positions at which the first and second external electrodes 53 and 54 are to be formed, is formed on the passivation film 59 (step S14). The passivation film 59 is etched using the resist pattern as a mask. The pad opening exposing the lower electrode film 311 in the pad region 311B and the pad opening exposing the upper electrode film 313 in the pad region 313B are thereby formed (step S15). The etching of the passivation film 59 may be performed by reactive ion etching. In the process of etching of the passivation film 59, the capacitance film 312, which is similarly constituted of a nitride film, is also opened and the pad region 311B of the lower electrode film 311 is thereby exposed.

Thereafter a resin film is coated on the entire surface (step S16). As the resin film, for example, a coating film of a photosensitive polyimide is used. Patterning of the resin film by photolithography may be performed by performing an exposure step and a subsequent developing step on regions of the resin film corresponding to the pad openings (step S17). The pad openings 321 and 322 penetrating through the resin film 310 and the passivation film 59 are thereby formed. Thereafter, heat treatment (curing) for hardening the resin film is performed (step S18) and further, the first external electrode 53 and the second external electrode 54 are grown inside the pad openings 321 and 322, for example, by the electroless plating method (step S19). The chip capacitor 51 of the structure shown in FIG. 18, etc., is thereby obtained.

In the patterning of the upper electrode film 313 using the photolithography process, the electrode film portions 331 to 339 of minute areas can be formed with high precision and the fuse units 57 of even finer pattern can be formed. After the patterning of the upper electrode film 313, the total capacitance value is measured and then the fuses to be cut are determined. By cutting the determined fuses, the chip capacitor 51 that is accurately adjusted to the desired capacitance value can be obtained.

Figure 25:
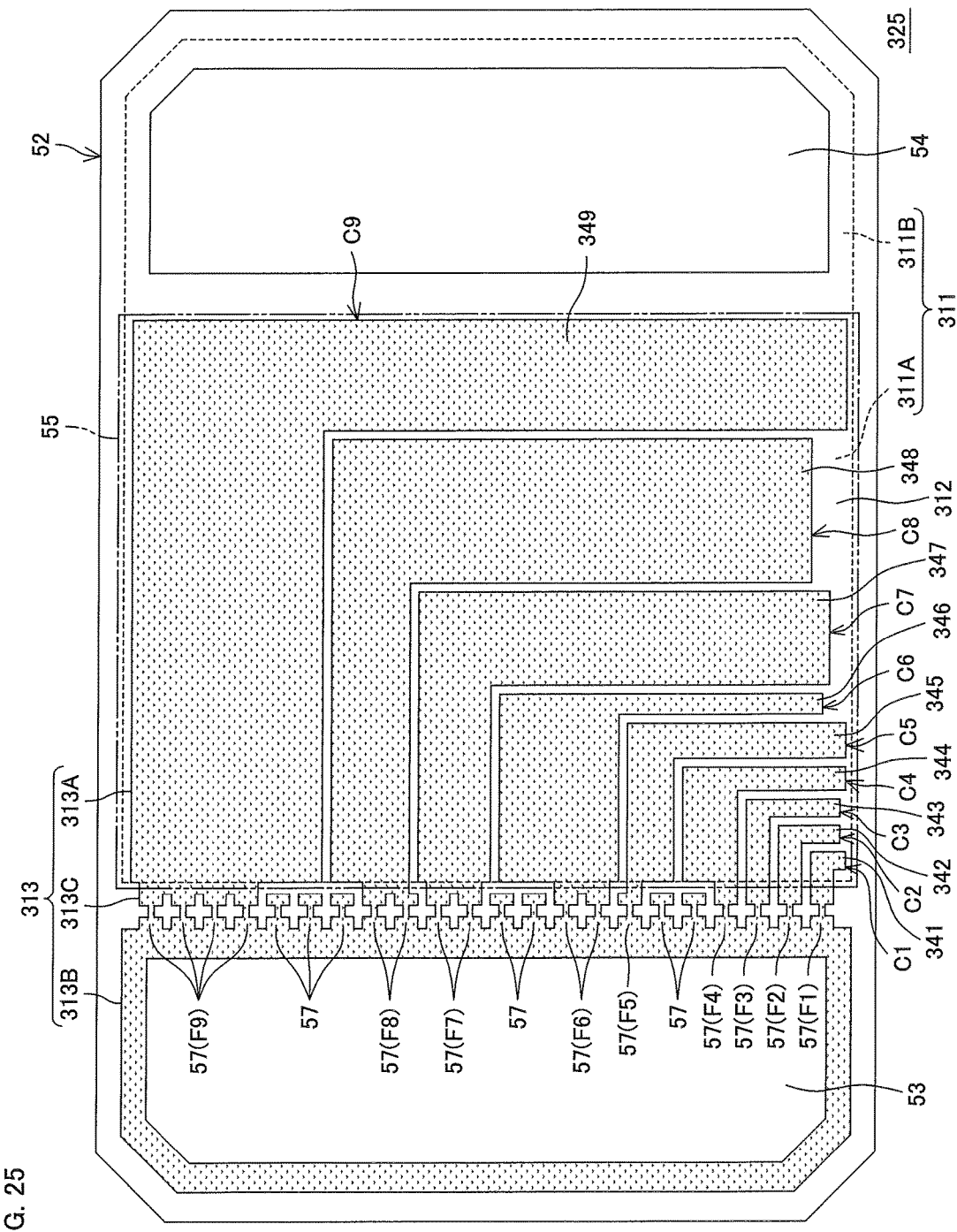
FIG. 25 is a plan view for describing the arrangement of a chip capacitor according to a second preferred embodiment of the second reference example.

FIG. 25 is a plan view for describing the arrangement of a chip capacitor 325 according to a second preferred embodiment of the second reference example. In FIG. 25, portions corresponding to respective portions shown in FIG. 18 are indicated using the same reference symbols as in FIG. 18. In the first preferred embodiment, the capacitor electrode region 313A of the upper electrode film 313 is divided into the electrode film portions 331 to 339 each having a band shape. In this case, regions that cannot be used as capacitor elements are formed within the capacitor arrangement region 55 as shown in FIG. 18 and effective use cannot be made of the restricted region on the small substrate 52.

Therefore with the preferred embodiment shown in FIG. 25, the plurality of electrode film portions 331 to 339 are divided into L-shaped electrode film portions 341 to 349. For example, the electrode film portion 349 in the arrangement of FIG. 25 can thereby be made to face the lower electrode film 311 over an area that is 1.5 times that of the electrode film portion 339 in the arrangement of FIG. 18. Therefore, if the capacitor element C9 corresponding to the electrode film portion 339 in the first preferred embodiment of FIG. 18 has a capacitance of 4 pF, the capacitor element C9 can be made to have a capacitance of 6 pF by use of the electrode film portion 349 of the present preferred embodiment. The capacitance value of the chip capacitor 51 can thereby be set over a wider range by making effective use of the interior of the capacitor arrangement region 55.

Diffusion regions are formed in a region directly below the first external electrode 53 and a region directly below the lower electrode film 31 that are top surface regions of the substrate 52 to form a pair of diodes by pn junctions to disconnect the parasitic capacitances in the present preferred embodiment as well. The process for manufacturing the chip capacitor 325 according to the present preferred embodiment is practically the same as the process shown in FIG. 23. However, in the patterning of the upper electrode film 313 (steps S7 and S8), the capacitor electrode region 313A is divided into the plurality of electrode film portions 341 to 349 of the shapes shown in FIG. 25.

Figure 26:
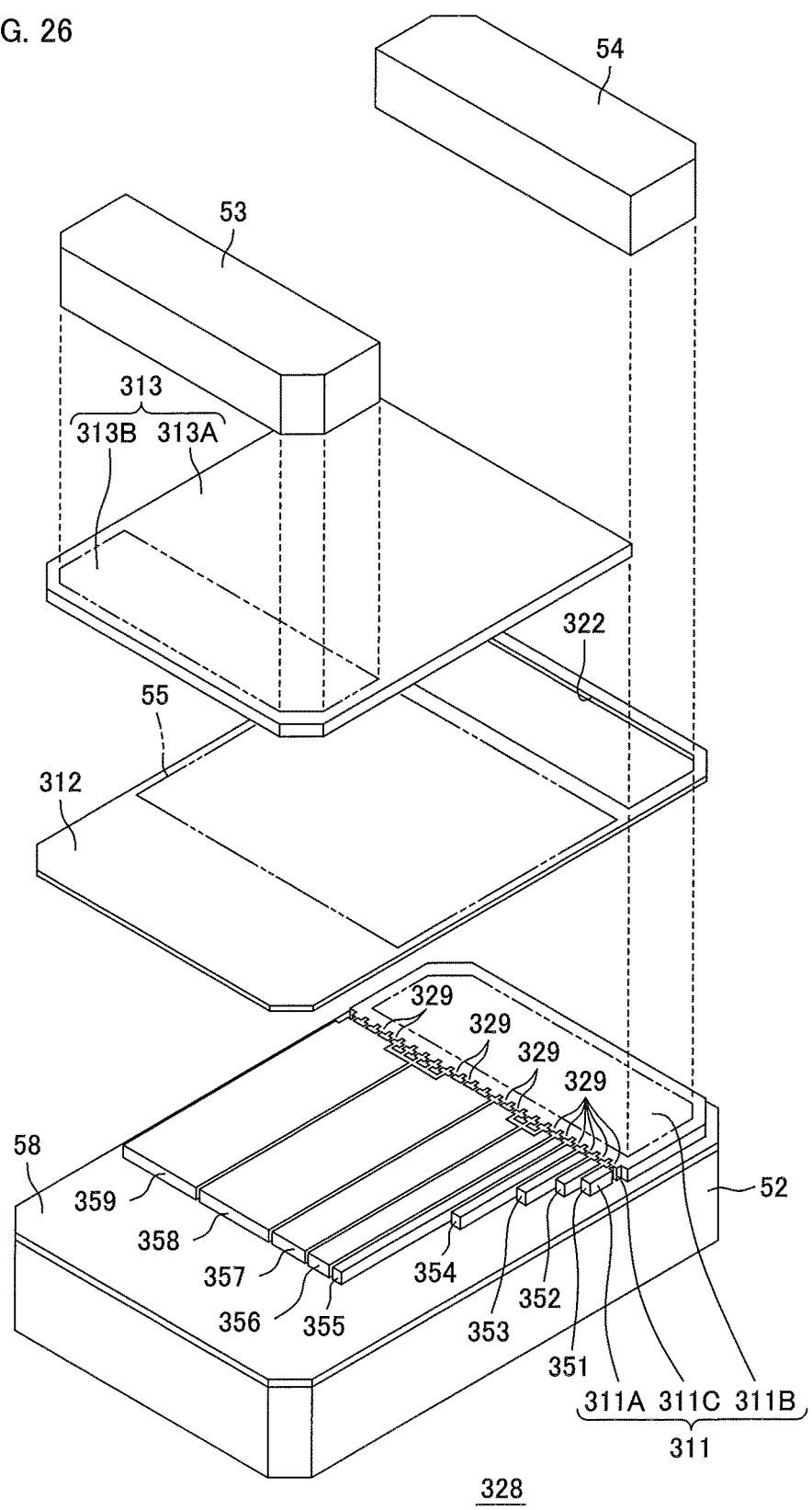
FIG. 26 is an exploded perspective view for describing the arrangement of a chip capacitor according to a third preferred embodiment of the second reference example.

FIG. 26 is an exploded perspective view for describing the arrangement of a chip capacitor 328 according to a third preferred embodiment of the second reference example, and the respective portions of the chip capacitor 328 are shown in the same manner as in FIG. 20 used for describing the first preferred embodiment. With the first preferred embodiment, the lower electrode film 311 has the capacitor electrode region 311A constituted of a pattern that is continuous across substantially the entirety of the capacitor arrangement region 55, and the capacitor electrode region 313A of the upper electrode film 313 is divided into the plurality of electrode film portions 331 to 339.

In contrast, with the present preferred embodiment, whereas the capacitor electrode region 313A of the upper electrode film 313 is formed to a continuous film pattern that is continuous across substantially the entirety of the capacitor arrangement region 55, the capacitor electrode region 311A of the lower electrode film 311 is divided into a plurality of electrode film portions 351 to 359. The electrode film portions 351 to 359 may be formed in the same shapes and area ratio as those of the electrode film portions 331 to 339 in the first preferred embodiment or may be formed in the same shapes and area ratio as those of the electrode film portions 341 to 349 in the second preferred embodiment. A plurality of capacitor elements are thus arranged by the electrode film portions 351 to 359, the capacitance film 312, and the upper electrode film 313. At least a portion of the plurality of capacitor elements constitutes a set of capacitor elements that differ in capacitance value (for example, with the respective capacitance values being set to form a geometric progression).

The lower electrode film 311 further has a fuse region 311C between the capacitor electrode region 311A and the pad region 311B. In the fuse region 311C, a plurality of fuse units 329, similar to the fuse units 57 of the first preferred embodiment, are aligned in a single column along the pad region 311B. Each of the electrode film portions 351 to 359 is connected to the pad region 311B via one or a plurality of the fuse units 329.

The electrode film portions 351 to 359 face the upper electrode film 313 over mutually different facing areas in the present arrangement as well and any of these can be disconnected individually by cutting the fuse unit 329. The same effects as those of the first preferred embodiment are thus obtained. In particular, by forming at least a portion of the plurality of electrode film portions 351 to 359 so as to face the upper electrode film 313 over facing areas set to form a geometric progression with a common ratio of 2, a chip capacitor that is precisely adjusted to the required capacitance value can be provided in the same manner as in the first preferred embodiment.

As in the respective preferred embodiments described above, diffusion regions are formed in a region directly below the first external electrode 53 and a region directly below the second external electrode 54 that are top surface regions of the substrate 52 to form a pair of diodes by pn junctions to disconnect the parasitic capacitances in the present preferred embodiment as well. The process for manufacturing the chip capacitor 328 according to the present preferred embodiment is practically the same as the process shown in FIG. 23. However, in the patterning of the lower electrode film 311 (steps S3 and S4), the capacitor electrode region 311A is divided into the electrode film portions 351 to 359 and the plurality of fuse units 329 are formed in the fuse region 311C. Also, in the patterning of the upper electrode film 313 (steps S7 and S8), a plurality of electrode film portions are not formed and fuse units are also not formed. Further, in the laser trimming (step S12), the fuse units 329 formed in the lower electrode film 311 are cut by laser light. The lower electrode film 311 is covered by the capacitance film 312 and the capacitance film 312 can thus be used as a cover film for accumulating the energy of the laser light in the process of laser trimming. The forming of the cover film (step S11) immediately before the laser trimming may thus be omitted.

Although preferred embodiments of the second reference example have been described above, the second reference example may be implemented in yet other modes as well. For example, although with each of the preferred embodiments described above, the arrangement where just one of either of the upper electrode film and the lower electrode film is divided into the plurality of electrode films was described, both the upper electrode film and the lower electrode film may be divided into a plurality of electrode film portions. Further, although with each of the preferred embodiments, an example where each fuse unit is made integral with the upper electrode film or the lower electrode film was described, the fuse units may be formed from a conductor film separate from the upper electrode film and the lower electrode film. Further, although with each of the preferred embodiments, an example where the plurality of capacitor elements include a plurality of capacitor elements having capacitance values that form a geometric progression with a common ratio r (0<r; r≠1)=2 was described, the common ratio of the geometric progression may be a numeral other than 2. Also with each of the preferred embodiments, the insulating film 58 is formed on the top surface of the substrate 52, the insulating film 58 may be omitted if the substrate 52 is an insulating substrate. Also, a conductive substrate may be used as the substrate 52, the conductive substrate may be used as a lower electrode, and the capacitance film 312 may be formed so as to be in contact with the top surface of the conductive substrate. In this case, one of the external electrodes may be led out from a rear surface of the conductive substrate. Further in the case of using the conductive substrate, diodes besides diodes based on pn junctions may be used to cut off the parasitic capacitances that can arise between the substrate and the external electrodes.

Besides the above, various design changes may be applied within the scope of the matters described as features of the invention according to the (1) second reference example. For example, arrangements with which a step of manufacture not specified in the respective features B1 to B25 is changed, omitted, or added are also included within the scope of the second reference example. <Invention according to a third reference example> (1) Features of the invention according to the third reference example. For example, the features of the invention according to the third reference example are the following C1 to C23. (C1) A chip capacitor including a substrate, a first external electrode disposed on the substrate, a second external electrode disposed on the substrate, a plurality of capacitor elements formed on the substrate and connected between the first external electrode and the second external electrode, and a plurality of fuses that are formed on the substrate, are each interposed between the plurality of capacitor elements and the first external electrode or the second external electrode, and are capable of disconnecting each of the plurality of capacitor elements, and where a substrate with a specific resistance of not less than 30 Ω·cm is used as the substrate.

With the invention according to C1, the plurality of capacitor elements are connected between the first and second external electrodes disposed on the substrate. The plurality of fuses that are capable of disconnecting each of the plurality of capacitor elements are provided between the plurality of capacitor elements and the first or second external electrodes. A plurality of types of capacitance values can thus be accommodated easily and rapidly by selecting and cutting one or a plurality of the fuses. In other words, a common design can be applied to chip capacitors of a plurality of types of capacitance values. Also, the chip capacitor can be adjusted in capacitance value accurately without being influenced by parasitic capacitance.

More specifically, if the specific resistance of the substrate is high, the parasitic capacitances that are formed directly below the first external electrode and the second external electrode will not be electrically connected to each other by the substrate. Therefore a circuit passing through these parasitic capacitances will not be formed between the first external electrode and the second external electrode. The parasitic capacitances arising between the substrate and the first external electrode and the second external electrode can thus be disconnected from the proper circuit of the chip capacitor, and a chip capacitor, with which a semiconductor can be selected without problem as the substrate material, can thus be manufactured. (C2) The chip capacitor according to C1, where the substrate has a specific resistance of not less than 100 Ω·cm.

With the invention according to C2, a substrate of greater specific resistance is used to enable the parasitic capacitances to be separated more reliably and enable the influences due to the parasitic capacitances to be eliminated even if the proper capacitance of the capacitor is small. (C3) The chip capacitor according to C1 or C2, where the plurality of capacitor elements have mutually different capacitance values.

With this arrangement, chip capacitors of various capacitance values can be realized with a common design by combining a plurality of the capacitor elements that differ in capacitance value. (C4) The chip capacitor according to C3, where the capacitance values of the plurality of capacitor elements are set to form a geometric progression. By the invention according to C4, the capacitance value of the chip capacitor can be adjusted accurately to a desired capacitance value by appropriate selection of a plurality of the capacitor elements to be connected between the first external electrode and the second external electrode. For example, by setting the common ratio of the geometric progression to 2, the capacitance value of the chip capacitor can be adjusted at the precision of the first term of the geometric progression (term of the smallest value in the geometric progression). (C5) The chip capacitor according to any one of C1 to C4, where at least one of the plurality of fuses is cut.

With the invention according to C5, one or a plurality of the fuses may be cut in the chip capacitor that has been adjusted in capacitance value. The capacitor elements to be connected between the first external electrode and the second external electrode can be selected by fuse cutting and the chip capacitor of the required capacitance value can thereby be realized. (C6) The chip capacitor according to any one of C1 to C5, including a lower electrode film formed on the substrate, a capacitance film formed on the lower electrode film, and an upper electrode film formed on the capacitance film so as to face the lower electrode film, and where one electrode film among the upper electrode film and the lower electrode film includes a plurality of divided electrode film portions and the plurality of capacitor elements are formed by the plurality of the electrode film portions facing the other electrode film, among the upper electrode film and the lower electrode film, across the capacitance film.

With the invention according to C6, a capacitor structure is arranged by the capacitance film being sandwiched between the lower electrode film and the upper electrode film. One electrode film among the upper electrode film and the lower electrode film is divided into the plurality of electrode film portions so that the respective electrode film portions face the other electrode film and the plurality of capacitor elements are thereby provided on the substrate. (C7) The chip capacitor according to C6, where the plurality of electrode film portions face the other electrode film over mutually different facing areas.

With the invention according to C7, the plurality of capacitor elements corresponding to the plurality of electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value. (C8) The chip capacitor according to C7, where the facing areas of the plurality of electrode film portions are set to form a geometric progression.

By the invention according to C8, the plurality of capacitor elements, the capacitance values of which are set to form a geometric progression, can be provided on the substrate. Chip capacitors of a plurality of types of capacitance values can thereby be realized and fine adjustment of the capacitance value can also be performed by fuse cutting. (C9) The chip capacitor according to any one of C6 to C8, where the plurality of electrode film portions and the fuses are formed of films of the same conductive material.

By the invention according to C9, the electrode film portions and the fuses can be arranged from a conductive material film in common Each electrode film portion can be disconnected by cutting the fuse corresponding to the electrode film portion. (C10) The chip capacitor according to any one of C1 to C9, further including a protective film formed to cover the upper electrode film and expose the first external electrode and the second external electrode.

By the invention according to C10, the upper electrode film can be covered by the protective film while exposing the first and second external electrodes, thereby enabling a chip capacitor that is capable of realizing a plurality of types of capacitance values with a common design and is high in reliability to be provided. (C11) The chip capacitor according to C10, where the protective film extends to a side surface of the substrate and covers the side surface.

With the invention according to C11, protection is also provided from the side surface of the substrate, thereby enabling further improvement of the reliability of the chip capacitor. (C12) A method for manufacturing a chip capacitor including a first external electrode and a second external electrode, the method including a step of preparing a substrate having a specific resistance of not less than 30 Ω·cm and preferably not less than 100 Ω·cm as the substrate, a step of forming a plurality of capacitor elements on a substrate, a step of forming, on the substrate, a plurality of fuses that disconnectably connect each of the plurality of capacitor elements to the first external electrode or the second external electrode, and a step of forming the first external electrode and the second external electrode on the substrate.

By the invention according to C12, chip capacitors being of a common design and yet being of a plurality of capacitance values can be manufactured by cutting the fuses that are selected in accordance with the required capacitance values. Chip capacitors that are not influenced by parasitic capacitance can also be manufactured. (C13) The method for manufacturing a chip capacitor according to C12, where the plurality of capacitor elements are formed to have mutually different capacitance values.

By the invention according to C13, a plurality of types of capacitance values can be realized by appropriately selecting and combining a plurality of the capacitor elements. (C14) The method for manufacturing a chip capacitor according to C13, where the capacitance values of the plurality of capacitor elements are set to form a geometric progression. With the invention according to C14, a plurality of types of capacitance values can be realized and fine adjustment with respect to (adjustment to) a desired capacitance value is made possible by appropriately selecting and combining a plurality of the capacitor elements. For example, by setting the common ratio of the geometric progression to 2, the capacitance value of the chip capacitor can be adjusted at the precision of the first term of the geometric progression (term of the smallest value in the geometric progression). (C15) The method for manufacturing a chip capacitor according to any one of C12 to C14, further including a step of cutting at least one of the plurality of fuses.

By the invention according to C15, the capacitance value of the chip capacitor can be adjusted to the desired capacitance value by appropriately selecting each fuse to be cut. That is, the chip capacitor adjusted to the desired capacitance value can be manufactured by appropriately selecting the capacitor elements to be connected to the first and second external electrodes and cutting the fuses corresponding to the capacitor elements besides those selected. (C16) The method for manufacturing a chip capacitor according to C15, further including a step of measuring a total capacitance value of the plurality of capacitor elements and a step of selecting each fuse to be cut based on the measured total capacitance value, and where each selected fuse is cut in the fuse cutting step.

By the invention according to C16, the total capacitance value of the plurality of capacitor elements is measured, each fuse to be cut is selected based on the measurement result, and therefore the capacitance value of the chip capacitor can be set to the targeted capacitance value reliably. (C17) The method for manufacturing a chip capacitor according to C15 or C16, further including a step of forming, after cutting the fuse or fuses, a protective film covering the cut portion of each fuse.

By the invention according to C17, the cut portion of each fuse is covered by the protective film and therefore entry of foreign matter and moisture with respect to the cut portion can be avoided to enable a chip capacitor, which can realize a plurality of types of capacitance values with a common design and is high in reliability, to be manufactured. (C18) The method for manufacturing a chip capacitor according to any one of C12 to C17, where the step of forming the plurality of capacitor elements includes a step of forming a lower electrode film on the substrate, a step of forming a capacitance film on the lower electrode film, a step of forming an upper electrode film on the capacitance film so as to face the lower electrode film, and a step of dividing (for example, dividing by photolithography) one electrode film among the upper electrode film and the lower electrode film into a plurality of electrode film portions, and the plurality of capacitor elements are formed by the plurality of electrode film portions facing the other electrode film, among the upper electrode film and the lower electrode film, across the capacitance film.

By the invention according to C18, a capacitor structure having the capacitance film sandwiched between the lower electrode film and the upper electrode film can be formed. By one electrode film among the upper electrode film and the lower electrode film being divided into the plurality of electrode film portions, the plurality of capacitor elements, having the structure where the capacitance film is sandwiched between the divided electrode film portions and the other electrode film, can be formed on the substrate. (C19) The method for manufacturing a chip capacitor according to C18, where the one electrode film is divided so that the plurality of electrode film portions face the other electrode film over mutually different facing areas.

By the invention according to C19, the plurality of capacitor elements of different capacitance values can be formed on the substrate by making the plurality of electrode film portions face the other electrode film over mutually different facing areas. Chip capacitors of a plurality of types of capacitance values can thus be manufactured by appropriate selection and combination of the capacitor elements of different capacitance values. (C20) The method for manufacturing a chip capacitor according to C19, where the facing areas of the plurality of electrode film portions are set to form a geometric progression.

By the invention according to C20, the plurality of capacitor elements, the capacitance values of which are set to form a geometric progression, can be formed on the substrate. Chip capacitors of a plurality of types of capacitance values can thereby be provided and accurate adjustment to the desired capacitance value can be performed by appropriate selection and combination of a plurality of the capacitor elements. (C21) The method for manufacturing a chip capacitor according to any one of C18 to C20, where the one electrode film and the fuses are formed of films of the same conductive material.

By the invention according to C21, the electrode film portions and the fuses can be formed of films of the same conductive material and can thus be formed by patterning from the same film. The manufacturing process is thereby simplified. (C22) A chip capacitor including a substrate having a specific resistance of not less than 30 Ω·cm, an insulating film formed on the substrate, a lower electrode film formed on the insulating film, a capacitance film formed on the lower electrode film, an upper electrode film formed on the capacitance film so as to face the lower electrode film, a first external electrode disposed on the insulating film and connected to the lower electrode film, and a second external electrode disposed on the insulating film and connected to the upper electrode film. (C23) The chip capacitor according to C22, where the substrate has a specific resistance of not less than 100 Ω·cm.

Figure 27:
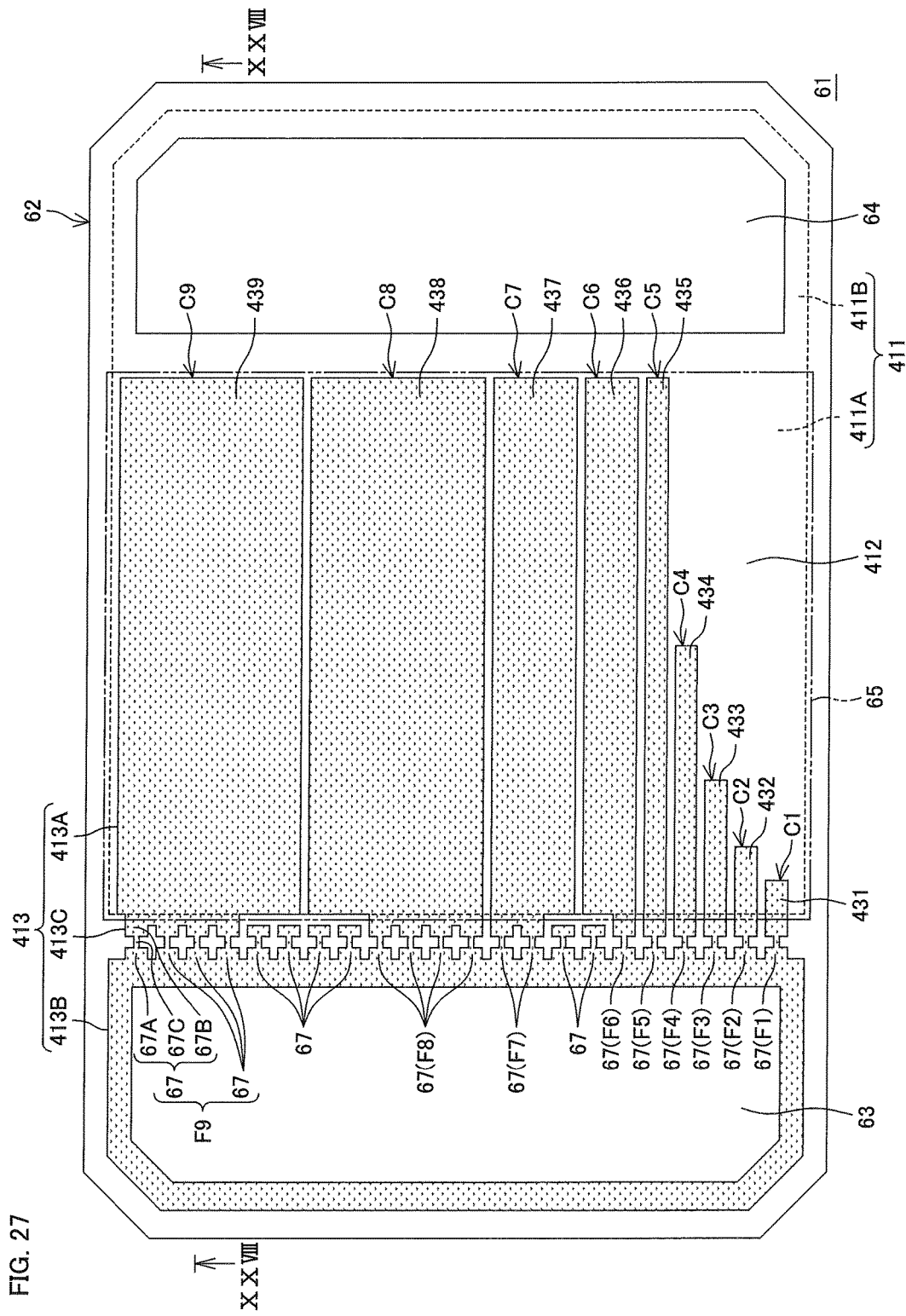
FIG. 27 is a plan view of a chip capacitor according to a first preferred embodiment of a third reference example.
Figure 28:
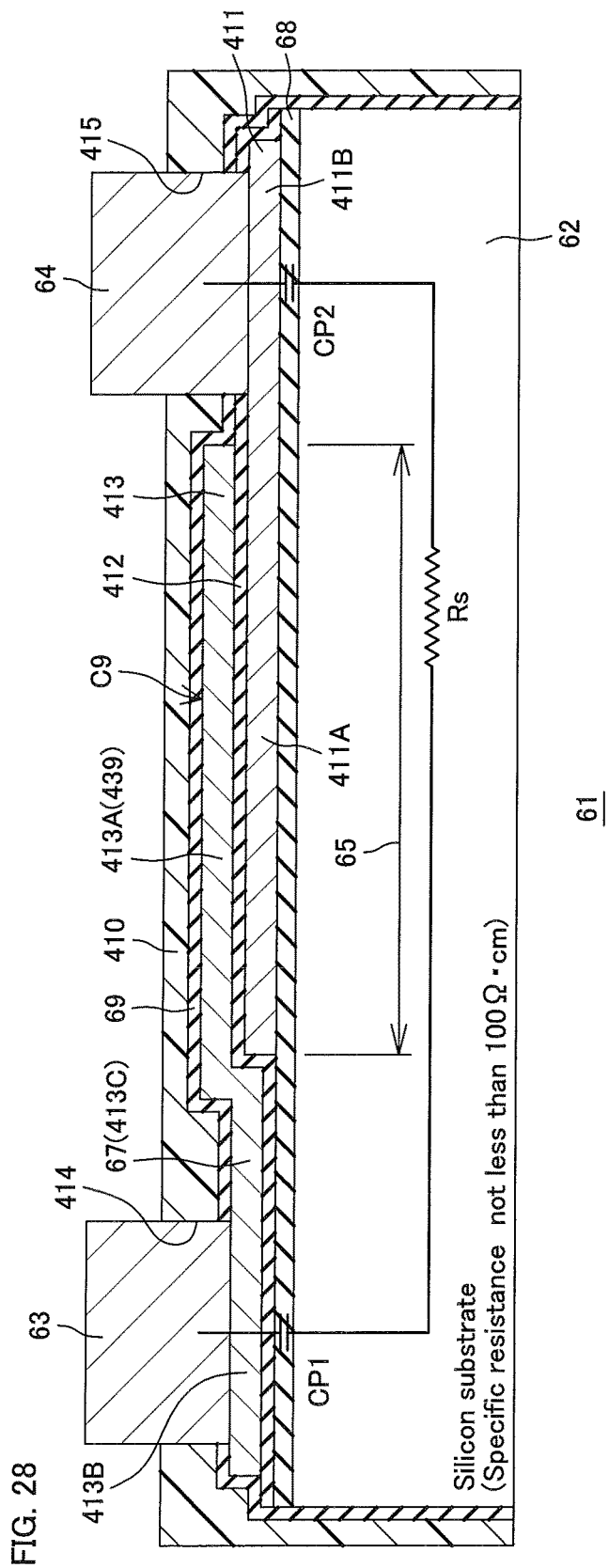
FIG. 28 is a sectional view taken along section line XXVIII-XXVIII in FIG. 27.

By each of the inventions according to C22 and C23, a semiconductor can be used as the substrate and the chip capacitor can be adjusted in capacitance value accurately without being influenced by parasitic capacitance. (2) Preferred embodiments of the invention according to the third reference example Preferred embodiments of the third reference example shall now be described in detail with reference to the attached drawings. FIG. 27 is a plan view of a chip capacitor according to a first preferred embodiment of the third reference example, and FIG. 28 is a sectional view thereof showing a section taken along section line XXVIII-XXVIII in FIG. 27. Further, FIG. 29 is an exploded perspective view showing the arrangement of a portion of the chip capacitor in a separated state.

The chip capacitor 61 includes a substrate 62, a first external electrode 63 disposed on the substrate 62, and a second external electrode 64 disposed similarly on the substrate 62. In the present preferred embodiment, the substrate 62 has, in a plan view, a rectangular shape with the four corners chamfered. The rectangular shape has dimensions of, for example, approximately 0.3 mm×0.15 mm. The first external electrode 63 and the second external electrode 64 are respectively disposed at portions at respective ends in the long direction of the substrate 62. In the present preferred embodiment, each of the first external electrode 63 and the second external electrode 64 has a substantially rectangular planar shape extending in the short direction of the substrate 62 and has chamfered portions at two locations respectively corresponding to the corners of the substrate 62. On the substrate 62, a plurality of capacitor elements C1 to C9 are disposed within a capacitor arrangement region 65 between the first external electrode 63 and the second external electrode 64. The plurality of capacitor elements C1 to C9 are electrically connected respectively to the first external electrode 63 via a plurality of fuse units 67.

Figure 29:
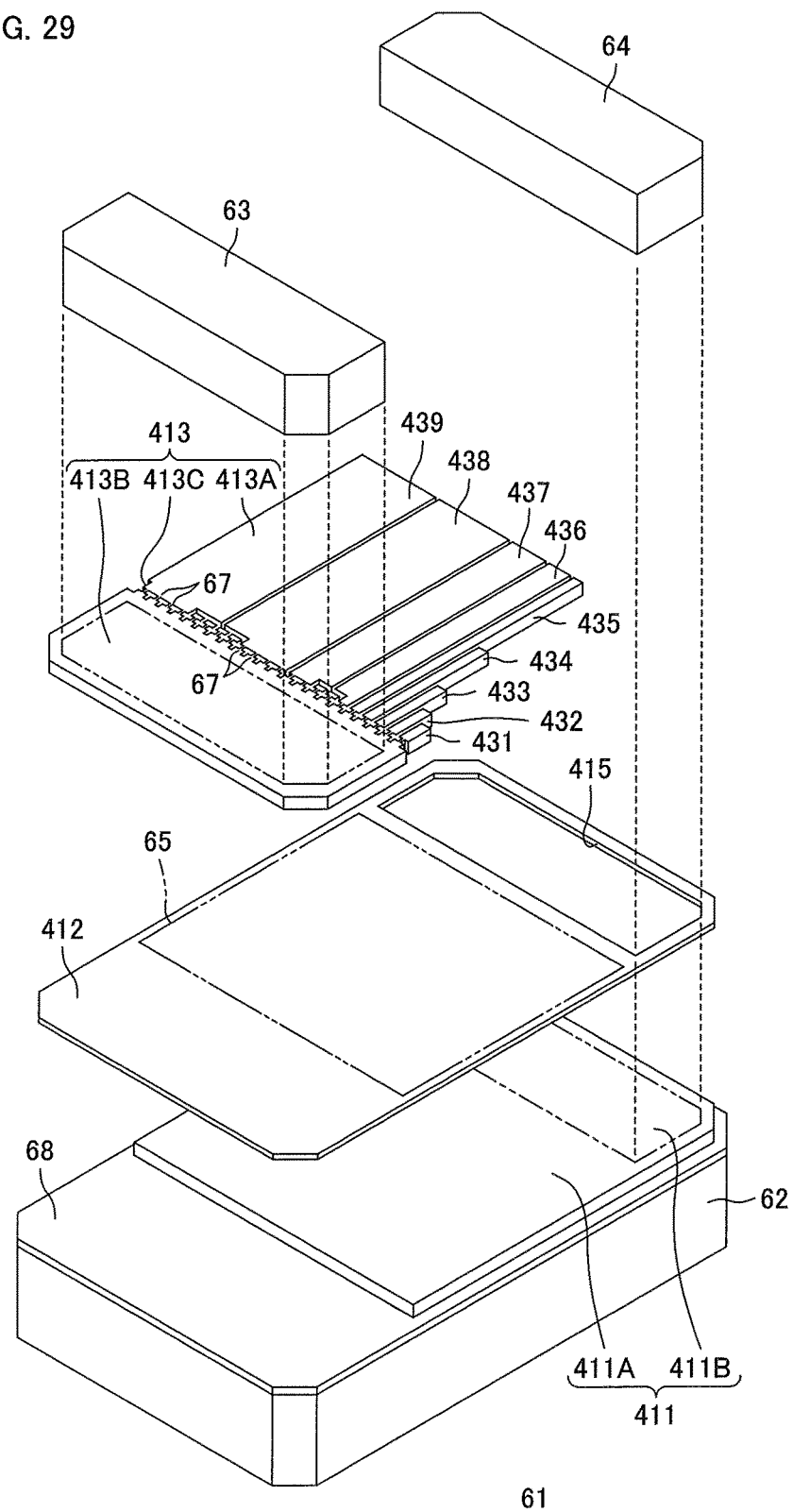
FIG. 29 is an exploded perspective view showing the arrangement of a portion of the chip capacitor in a separated state.

As shown in FIG. 28 and FIG. 29, an insulating film 68 is formed on the top surface of the substrate 62, and a lower electrode film 411 is formed on the top surface of the insulating film 68. The lower electrode film 411 is formed to spread across substantially the entirety of the capacitor arrangement region 65 and extend to a region directly below the second external electrode 64. More specifically, the lower electrode film 411 has a capacitor electrode region 411A functioning as a lower electrode in common to the capacitor elements C1 to C9 and a pad region 411B for leading out to an external electrode. The capacitor electrode region 411A is positioned in the capacitor arrangement region 65 and the pad region 411B is positioned directly below the second external electrode 64.

In the capacitor arrangement region 65, a capacitance film (dielectric film) 412 is formed so as to cover the lower electrode film 411 (capacitor electrode region 411A). The capacitance film 412 is continuous across the entirety of the capacitor electrode region 411A and, in the present preferred embodiment, further extends to a region directly below the first external electrode 63 and covers the insulating film 68 outside the capacitor arrangement region 65. An upper electrode film 413 is formed on the capacitance film 412. In FIG. 27, the upper electrode film 413 is indicated with fine dots added for the sake of clarity. The upper electrode film 413 includes a capacitor electrode region 413A positioned in the capacitor arrangement region 65, a pad region 413B positioned directly below the first external electrode 63, and a fuse region 413C disposed between the pad region 413B and the capacitor electrode region 413A.

In the capacitor electrode region 413A, the upper electrode film 413 is divided into a plurality of electrode film portions 431 to 439. In the present preferred embodiment, the respective electrode film portions 431 to 439 are all formed to rectangular shapes and extend in the form of bands from the fuse region 413C toward the second external electrode 64. The plurality of electrode film portions 431 to 439 face the lower electrode film 411 across the capacitance film 412 over a plurality of types of facing areas. More specifically, a ratio of the facing areas of the electrode film portions 431 to 439 with respect to the lower electrode film 411 may be set to be 1:2:4:8:16:32:64:128:128. That is, the plurality of electrode film portions 431 to 439 include the plurality of electrode film portions differing in facing area and more specifically include the plurality of electrode film portions 431 to 438 (or 431 to 437 and 439) having facing areas that are set to form a geometric progression with a common ratio of 2. The plurality of capacitor elements C1 to C9, respectively arranged by the respective electrode film portions 431 to 439 and the facing lower electrode film 411 across the capacitance film 412, thus include the plurality of capacitor elements having mutually different capacitance values. If the ratio of the facing areas of the electrode film portions 431 to 439 is as mentioned above, the ratio of the capacitance values of the capacitor elements C1 to C9 is equal to the ratio of the facing areas and is 1:2:4:8:16:32:64:128:128. The plurality of capacitor elements C1 to C9 thus include the plurality of capacitor elements C1 to C8 (or C1 to C7 and C9) with capacitance values set to form the geometric progression with the common ratio of 2.

In the present preferred embodiment, the electrode film portions 431 to 435 are formed to bands that are equal in width and have lengths with the ratio thereof being set to 1:2:4:8:16. Also, the electrode film portions 435, 436, 437, 438, and 439 are formed to bands that are equal in length and have widths with the ratio thereof being set to 1:2:4:8:8. The electrode film portions 435 to 439 are formed to extend across a range from an end edge at the first external electrode 63 side to an end edge at the second external electrode 64 side of the capacitor arrangement region 65, and the electrode film portions 431 to 434 are formed to be shorter than this range.

The pad region 413B is formed to be substantially similar in shape to the first external electrode 63 and has a substantially rectangular planar shape having two chamfered portions corresponding to corner portions of the substrate 62. The fuse region 413C is disposed along one long side (the long side at the inner side with respect to the peripheral edge of the substrate 62) of the pad region 413B. The fuse region 413C includes the plurality of fuse units 67 that are aligned along the one long side of the pad region 413B. The fuse units 67 are formed of the same material as and to be integral to the pad region 413B of the upper electrode film 413. The plurality of electrode film portions 431 to 439 are each formed integral to one or a plurality of the fuse units 67, are connected to the pad region 413B via the fuse units 67, and are electrically connected to the first external electrode 63 via the pad region 413B. Each of the electrode film portions 431 to 436 of comparatively small area is connected to the pad region 413B via a single fuse unit 67, and each of the electrode film portions 437 to 439 of comparatively large area is connected to the pad region 413B via a plurality of fuse units 67. It is not necessary for all of the fuse units 67 to be used and, in the present preferred embodiment, a portion of the fuse units 67 is unused.

The fuse units 67 include first wide portions 67A arranged to be connected to the pad region 413B, second wide portions 67B arranged to be connected to the electrode film portions 431 to 439, and narrow portions 67C connecting the first and second wide portions 67A and 67B. The narrow portions 67C are arranged to be capable of being cut (fused) by laser light. Unnecessary electrode film portions among the electrode film portions 431 to 439 can thus be electrically disconnected from the first and second external electrodes 63 and 64 by cutting the fuse units 67.

Although omitted from illustration in FIG. 27 and FIG. 29, the top surface of the chip capacitor 61 that includes the top surface of the upper electrode film 413 is covered by a passivation film 69 as shown in FIG. 28. The passivation film 69 is constituted, for example, of a nitride film and is formed not only to cover the upper surface of the chip capacitor 61 but also to extend to side surfaces of the substrate 62 and cover the side surfaces. Further, a resin film 410, made of a polyimide resin, etc., is formed on the passivation film 69. The resin film 410 is formed to cover the upper surface of the chip capacitor 61 and extend to the side surfaces of the substrate 62 to cover the passivation film 69 on the side surfaces.

The passivation film 69 and the resin film 410 are protective films that protect the top surface of the chip capacitor 61. In these films, pad openings 414 and 415 are respectively formed in regions corresponding to the first external electrode 63 and the second external electrode 64. The pad openings 414 and 415 penetrate through the passivation film 69 and the resin film 410 so as to respectively expose a region of a portion of the pad region 413B of the upper electrode film 413 and a region of a portion of the pad region 411B of the lower electrode film 411. Further, with the present preferred embodiment, the pad opening 415 corresponding to the second external electrode 64 also penetrates through the capacitance film 412.

The first external electrode 63 and the second external electrode 64 are respectively embedded in the pad openings 414 and 415. The first external electrode 63 is thereby bonded to the pad region 413B of the upper electrode film 413 and the second external electrode 64 is bonded to the pad region 411B of the lower electrode film 411. The first and second external electrodes 63 and 64 are formed to project from the top surface of the resin film 410. The chip capacitor 61 can thereby be flip-chip bonded to a mounting substrate.

Parasitic capacitances arise in the chip capacitor 61 according to the present preferred embodiment. To describe with reference to FIG. 28, directly below the first external electrode 63, a parasitic capacitance CP1 across the insulating film 68 and the capacitance film 412 is formed between the first external electrode 63 and the substrate 62. Also, directly below the second external electrode 64, a parasitic capacitance CP2 across the insulating film 68 is formed between the second external electrode 64 and the substrate 62. These parasitic capacitances CP1 and CP2 are connected in series between the first external electrode 63 and the second external electrode 64 via the substrate 62. By the series circuit of the parasitic capacitances being connected in parallel with respect to the capacitor elements C1 to C9, the capacitance value of the chip capacitor 61 as a whole is decreased and the adjustment of the chip capacitor 61 to a desired capacitance value is hindered.

However, in the present preferred embodiment, the substrate 62 having the specific resistance of not less than 30 Ω·cm and preferably not less than 100 Ω·cm is used as the substrate 62 so that the parasitic capacitances CP1 and CP2 can be separated and the influences of the parasitic capacitances CP1 and CP2 on the proper capacitance of the capacitor can be eliminated. This shall be described more specifically with reference to FIG. 30.

Figure 30A:
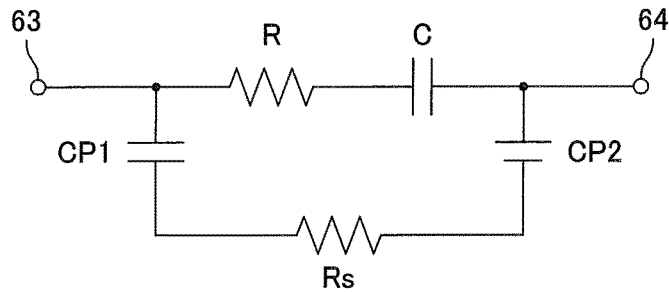
FIG. 30 shows electrical equivalent circuit diagrams of the chip capacitor.

FIG. 30A is an electrical equivalent circuit diagram of the chip capacitor 61. In FIG. 30A, C is the proper capacitance of the chip capacitor 61 and CP1 and CP2 are the respective parasitic capacitances at the first external electrode 63 side and the second external electrode 64 side. R is the resistance that is present serially in the proper capacitor circuit of the chip capacitor 61. On the other hand, Rs is the resistance of the substrate 62.

Figure 30B:
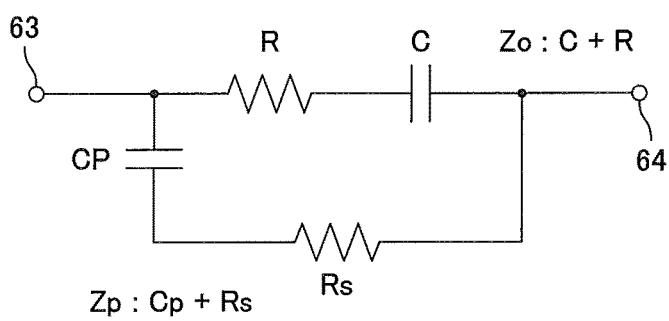

The equivalent circuit of FIG. 30A can be rewritten as the equivalent circuit shown in FIG. 30B. In FIG. 30B, Cp indicates the synthetic capacitance of the parasitic capacitances CP1 and CP2. In the equivalent circuit of FIG. 30B, the series circuit of R and C can be expressed by the impedance Z0 which is a value inherent to the chip capacitor 61, and the series circuit of the synthetic capacitance Cp and the resistance Rs of the substrate 62 can be expressed by the impedance Zp.

Figure 30C:
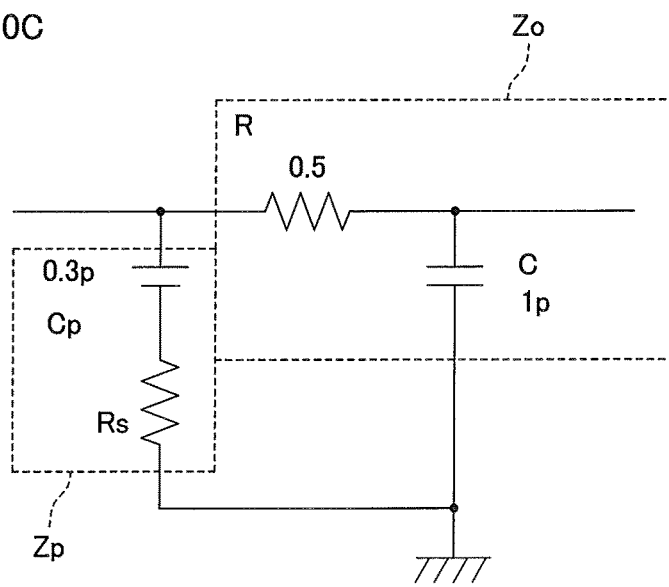

Then as shown in FIG. 30C, the impedance characteristics at f=5 GHz of the equivalent circuit including the parasitic capacitance Cp and the substrate resistance Rs were examined with Cp=0.3 pF and R=0.5Ω, C being varied as C=0.2 pF, 1 pF, and 10 pF, and Rs being varied from 10Ω· to 10 MΩ.

Figure 31:
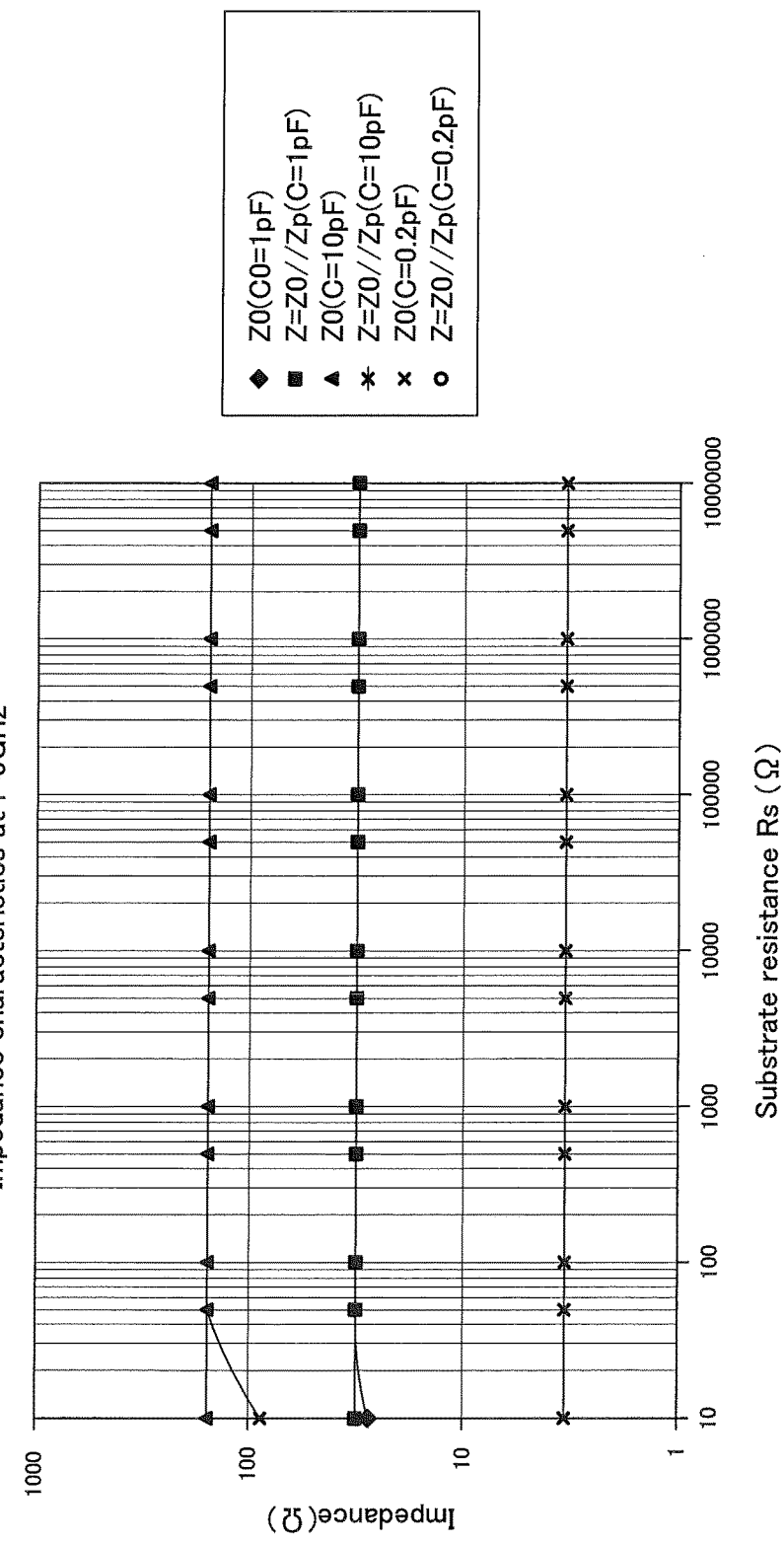
FIG. 31 is a graph of impedance characteristics of the chip capacitor.

FIG. 31 is a graph showing the impedance (Z0) characteristics of just R and C and the impedance (Z0/Zp) characteristics when Cp and Rs are synthesized for the case where the frequency f=5 GHz. From FIG. 31, it can be seen that at a capacitance of not less than 0.2 pF, the resistance value of the substrate 62 must be made not less than 1 KΩ to avoid influences of the parasitic capacitances.

Figure 32:
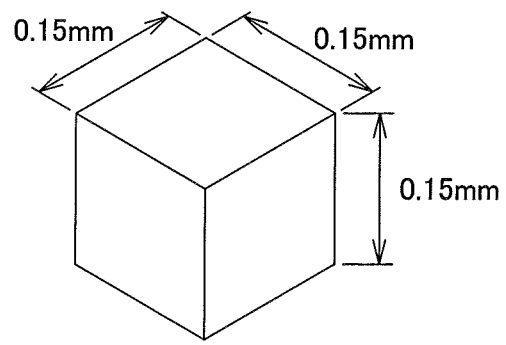
FIG. 32 is a diagram of a chip shape showing the size of an effective resistance region of the substrate.

In regard to the specific resistance of the substrate 62 necessary for making the resistance value of the substrate 62 not less than 1 KΩ, if it is assumed that an effective resistance region of the substrate 62 is the dimensions shown in FIG. 32, that is, a cubical chip with one side being 0.15 mm, the specific resistance ρ (Ω·cm) must be set so that ρ*10/0.15*10/0.15*0.15/10=Rs*66.7>1 KΩ.

Therefore, ρ>15 Ω·cm is the minimum specific resistance of the substrate 62. With the chip capacitor 61 of the present preferred embodiment, the substrate 62 has a size approximately twice the dimensions described with FIG. 32 and therefore the specific resistance of the substrate 62 used in the chip capacitor 61 suffices to be not less than 30 Ω·cm.

Figure 33:
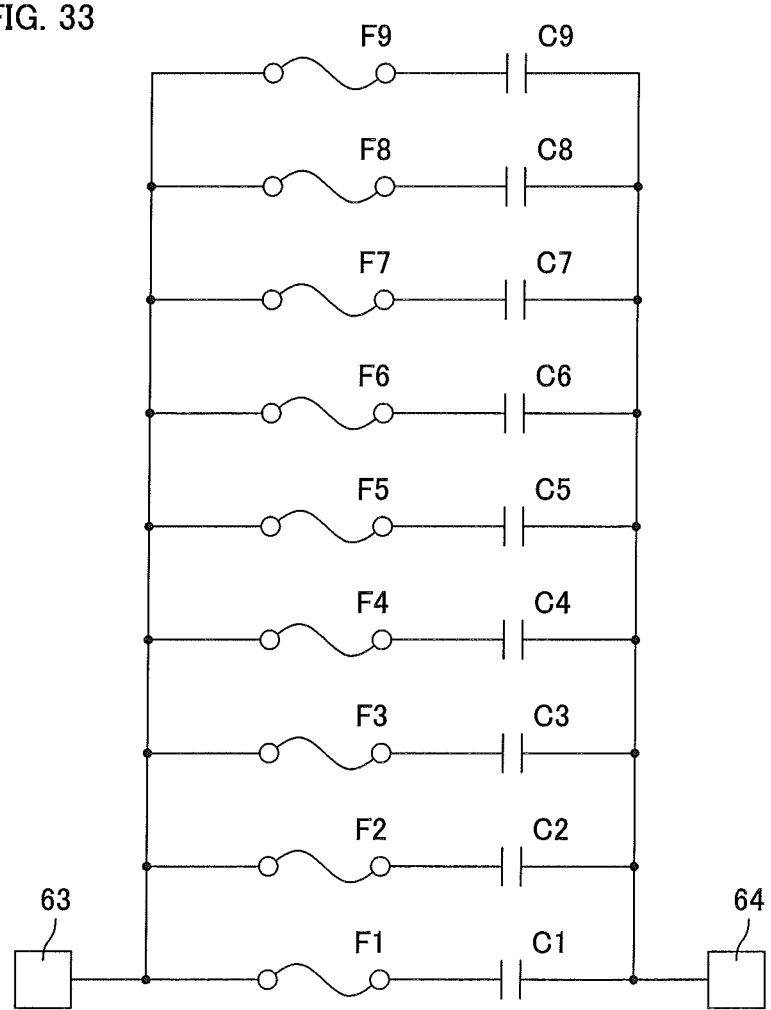
FIG. 33 is a circuit diagram of the electrical arrangement of the interior of the chip capacitor.

The chip capacitor 61 of the present preferred embodiment is manufactured using a silicon substrate with a specific resistance of not less than 100 Ω·cm to avoid the influences of the parasitic capacitances even at a low capacitance of 0.2 pF. FIG. 33 is a circuit diagram of the electrical arrangement of the interior of the chip capacitor 61. The plurality of capacitor elements C1 to C9 are connected in parallel between the first external electrode 63 and the second external electrode 64. Fuses F1 to F9, each arranged from one or a plurality of the fuse units 67, are interposed in series between the respective capacitor elements C1 to C9 and the first external electrode 63.

When all of the fuses F1 to F9 are connected, the capacitance value of the chip capacitor 61 is equal to the total of the capacitance values of the capacitor elements C1 to C9. When one or two or more fuses selected from among the plurality of fuses F1 to F9 is or are cut, each capacitor element corresponding to a cut fuse is disconnected and the capacitance value of the chip capacitor 61 decreases by just the capacitance value of the disconnected capacitor element or elements.

Therefore by measuring the capacitance value across the pad regions 411B and 413B (the total capacitance value of the capacitor elements C1 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor elements C1 to C8 are set to form a geometric progression with a common ratio of 2, fine adjustment to the targeted capacitance value at a precision corresponding to the capacitance value of the capacitor element C1, which is the smallest capacitance value (value of the first term in the geometric progression), is made possible.

For example, the capacitance values of the capacitor elements C1 to C9 may be set as follows. C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor 61 can be finely adjusted at a minimum adjustment precision of 0.03125 pF. Also, the fuses to be cut among the fuses F1 to F9 can be selected appropriately to provide the chip capacitor 61 with an arbitrary capacitance value between 0.1 pF and 10 pF.

As described above, with the present preferred embodiment, the plurality of capacitor elements C1 to C9 that can be disconnected by the fuses F1 to F9 are provided between the first external electrode 63 and the second external electrode 64. The capacitor elements C1 to C9 include a plurality of capacitor elements that differ in capacitance value and more specifically include a plurality of capacitor elements with capacitance values set to form a geometric progression. The chip capacitor 61, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor 61 shall now be described. The substrate 62 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region 65 is generally a square region with each side having a length corresponding to the length of the short side of the substrate 62. The thickness of the substrate 62 may be approximately 150 μm. The substrate 62 may, for example, be a substrate that has been thinned by grinding or polishing from a rear surface side (surface on which the capacitor elements C1 to C9 are not formed). As the material of the substrate 62, a semiconductor substrate as represented by a silicon substrate may be used or a glass substrate may be used or a resin film may be used.

The insulating film 68 may be a silicon oxide film or other oxide film. The film thickness thereof may be approximately 500 Å to 2000 Å. The lower electrode film 411 is preferably a conductive film, a metal film in particular, and may, for example, be an aluminum film. The lower electrode film 411 that is constituted of an aluminum film may be formed by a sputtering method. Similarly, the upper electrode film 413 is preferably constituted of a conductive film, a metal film in particular, and may, for example, be an aluminum film. The upper electrode film 413 that is constituted of an aluminum film may be formed by the sputtering method. The patterning for dividing the capacitor electrode region 413A of the upper electrode film 413 into the electrode film portions 431 to 439 and shaping the fuse region 413C into the plurality of fuse units 67 may be performed by photolithography and etching processes.

The capacitance film 412 may be constituted, for example, of a silicon nitride film, and the film thickness thereof may be 500 Å to 2000 Å (for example, 1000 Å). The capacitance film 412 may be a silicon nitride film formed by plasma CVD (chemical vapor deposition). The passivation film 69 may be constituted, for example, of a silicon nitride film and may be formed, for example, by the plasma CVD method. The film thickness thereof may be approximately 8000 Å. As mentioned above, the resin film 410 may be constituted of a polyimide film or other resin film.

Each of the first and second external electrodes 63 and 64 may, for example, be constituted of a laminated structure film in which a nickel layer in contact with the lower electrode film 411 or the upper electrode film 413, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film 411 or the upper electrode film 413, and the palladium layer functions as a diffusion preventing layer that suppresses mutual diffusion of the material of the upper electrode film or the lower electrode film and the gold of the uppermost layer of each of the first and second external electrodes 63 and 64.

Figure 34:
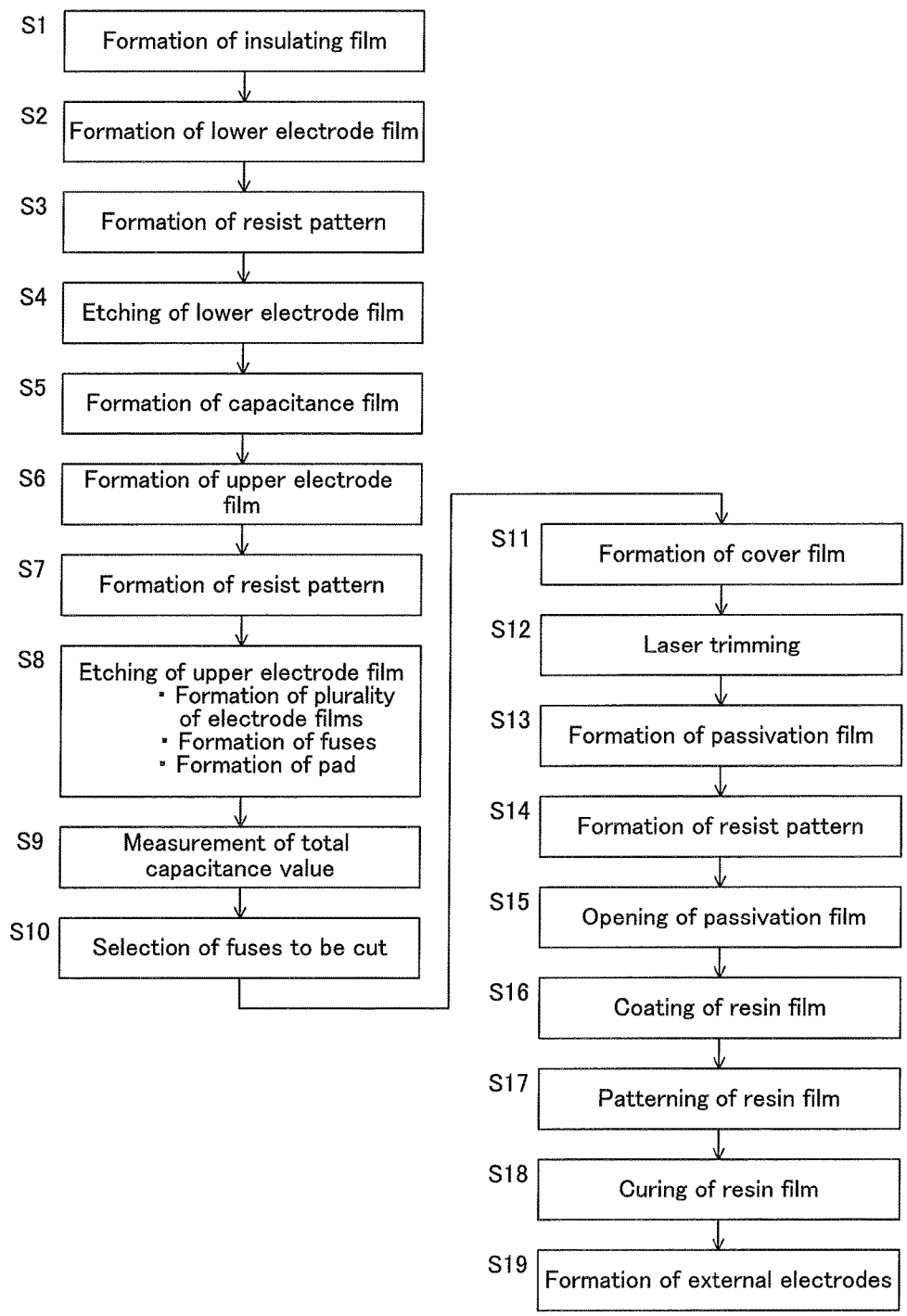
FIG. 34 is a flow diagram for describing an example of a process for manufacturing the chip capacitor.

FIG. 34 is a flow diagram for describing an example of a process for manufacturing the chip capacitor 61. A substrate with a specific resistance of not less than 100 Ω·cm is prepared as the substrate 62. The insulating film 68, constituted of an oxide film (for example, a silicon oxide film), is formed on the top surface of the substrate 62 by a thermal oxidation method and/or CVD method (step S1). Thereafter, the lower electrode film 411, constituted of an aluminum film, is formed over the entire top surface of the insulating film 68, for example, by the sputtering method (step S2). The film thickness of the lower electrode film 411 may be approximately 8000 Å. Thereafter, a resist pattern corresponding to the final shape of the lower electrode film 411 is formed on the top surface of the lower electrode film by photolithography (step S3). The lower electrode film is etched using the resist pattern as a mask to obtain the lower electrode film 411 of the pattern shown in FIG. 27, etc. (step S4). The etching of the lower electrode film 411 may be performed, for example, by reactive ion etching.

Thereafter, the capacitance film 412, constituted of a silicon nitride film, etc., is formed on the lower electrode film 411, for example, by the plasma CVD method (step S5). In the region in which the lower electrode film 411 is not formed, the capacitance film 412 is formed on the top surface of the insulating film 68. Thereafter, the upper electrode film 413 is formed on the capacitance film 412 (step S6). The upper electrode film 413 is constituted, for example, of an aluminum film and may be formed by the sputtering method. The film thickness thereof may be approximately 8000 Å. Thereafter, a resist pattern corresponding to the final shape of the upper electrode film 413 is formed on the top surface of the upper electrode film 413 by photolithography (step S7). The upper electrode film 413 is patterned to its final shape (see FIG. 27, etc.) by etching using the resist pattern as a mask (step S8). The upper electrode film 413 is thereby shaped to the pattern having the plurality of electrode film portions 431 to 439 in the capacitor electrode region 413A, having the plurality of fuse units 67 in the fuse region 413C, and having the pad region 413B connected to the fuse units 67. The etching for patterning the upper electrode film 413 may be performed by wet etching using an etching liquid, such as phosphoric acid, etc., or may be performed by reactive ion etching.

Thereafter, inspection probes are contacted against the pad region 413B of the upper electrode film 413 and the pad region 411B of the lower electrode film 411 to measure the total capacitance value of the plurality of capacitor elements C1 to C9 (step S9). Based on the measured total capacitance value, the capacitor elements to be disconnected, that is, the fuses to be cut are selected in accordance with the targeted capacitance value of the chip capacitor 61 (step S10).

Figure 35A:
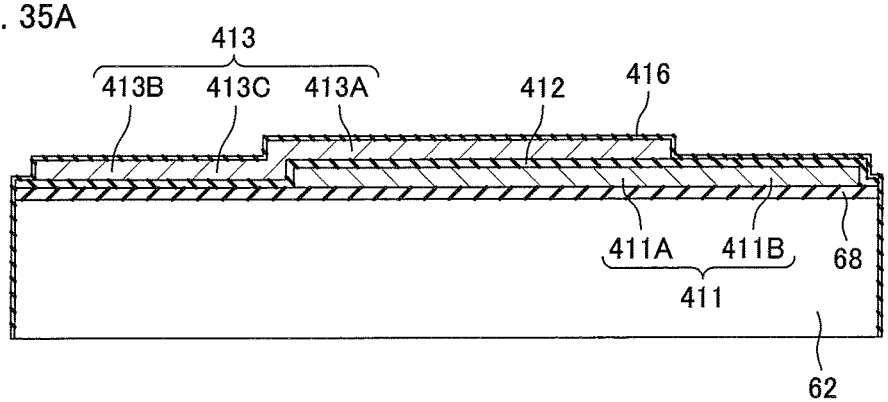
FIG. 35A, FIG. 35B, and FIG. 35C are sectional views for describing steps related to the cutting of a fuse.

Thereafter as shown in FIG. 35A, a cover film 416, constituted, for example, of a nitride film, is formed on the entire surface of the substrate 62 (step S11). The forming of the cover film 416 may be performed by the plasma CVD method and, for example, a silicon nitride film with a film thickness of approximately 3000 Å may be formed. The cover film 416 covers the patterned upper electrode film 413 and covers the capacitance film 412 in the region in which the upper electrode film 413 is not formed. The cover film 416 covers the fuse units 67 in the fuse region 413C.

Figure 35B:
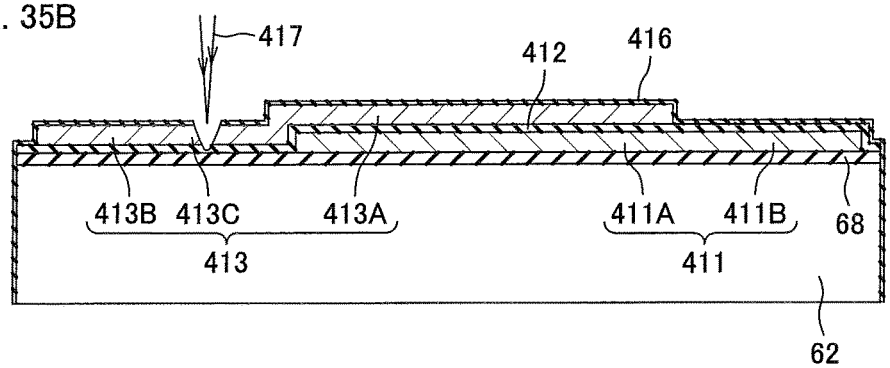

From this state, the laser trimming for fusing the fuse units 67 is performed (step S12). That is, as shown in FIG. 35B, each fuse unit 67 constituting a fuse selected in accordance with the measurement result of the total capacitance value is irradiated with laser light 417 and the narrow portion 67C of the fuse unit 67 is fused. The corresponding capacitor element is thereby disconnected from the pad region 413B. When the laser light 417 is irradiated on the fuse unit 67, the energy of the laser light 417 is accumulated at a vicinity of the fuse unit 67 by the action of the cover film 416 and the fuse unit 67 is thereby fused.

Figure 35C:
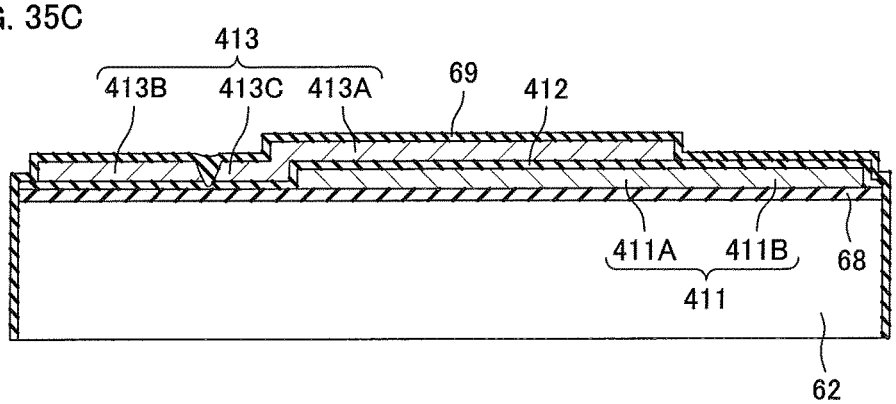

Thereafter as shown in FIG. 35C, a silicon nitride film is deposited on the cover film 416, for example, by the plasma CVD method to form the passivation film 69 (step S13). In the final form, the cover film 416 is made integral with the passivation film 69 to constitute a portion of the passivation film 69. The passivation film 69 that is formed after the cutting of the fuses enters into openings in the cover film 416, destroyed at the same time as the fusing of the fuses, to protect the cut surfaces of the fuse units 67. The passivation film 69 thus prevents entry of foreign matter and entry of moisture into the cut locations of the fuse units 67. The passivation film 69 may be formed to have a film thickness, for example, of approximately 8000 Å as a whole.

Thereafter, a resist pattern, having penetrating holes at positions at which the first and second external electrodes 63 and 64 are to be formed, is formed on the passivation film 69 (step S14). The passivation film 69 is etched using the resist pattern as a mask. The pad opening exposing the lower electrode film 411 in the pad region 411B and the pad opening exposing the upper electrode film 413 in the pad region 413B are thereby formed (step S15). The etching of the passivation film 69 may be performed by reactive ion etching. In the process of etching of the passivation film 69, the capacitance film 412, which is similarly constituted of a nitride film, is also opened and the pad region 411B of the lower electrode film 411 is thereby exposed.

Thereafter a resin film is coated on the entire surface (step S16). As the resin film, for example, a coating film of a photosensitive polyimide is used. Patterning of the resin film by photolithography may be performed by performing an exposure step and a subsequent developing step on regions of the resin film corresponding to the pad openings (step S17). The pad openings 414 and 415 penetrating through the resin film 410 and the passivation film 69 are thereby formed. Thereafter, heat treatment (curing) for hardening the resin film is performed (step S18) and further, the first external electrode 63 and the second external electrode 64 are grown inside the pad openings 414 and 415, for example, by the electroless plating method (step S19). The chip capacitor 61 of the structure shown in FIG. 27, etc., is thereby obtained.

In the patterning of the upper electrode film 413 using the photolithography process, the electrode film portions 431 to 439 of minute areas can be formed with high precision and the fuse units 67 of even finer pattern can be formed. After the patterning of the upper electrode film 413, the total capacitance value is measured and then the fuses to be cut are determined. By cutting the determined fuses, the chip capacitor 61 that is accurately adjusted to the desired capacitance value can be obtained.

Figure 36:
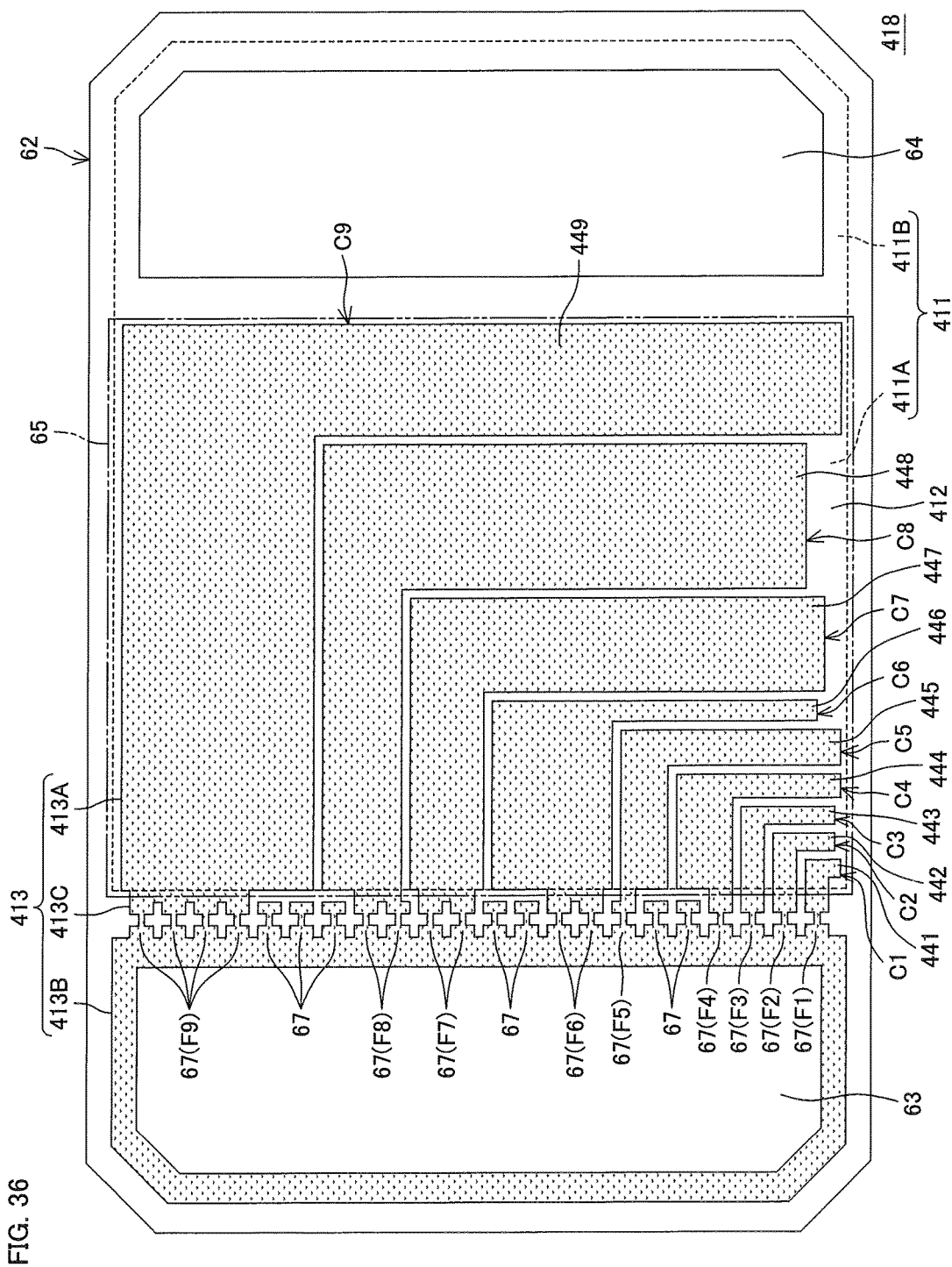
FIG. 36 is a plan view for describing the arrangement of a chip capacitor according to a second preferred embodiment of the third reference example.

FIG. 36 is a plan view for describing the arrangement of a chip capacitor 418 according to a second preferred embodiment of the third reference example. In FIG. 36, portions corresponding to respective portions shown in FIG. 27 are indicated using the same reference symbols as in FIG. 27. In the first preferred embodiment, the capacitor electrode region 413A of the upper electrode film 413 is divided into the electrode film portions 431 to 439 each having a band shape. In this case, regions that cannot be used as capacitor elements are formed within the capacitor arrangement region 65 as shown in FIG. 27 and effective use cannot be made of the restricted region on the small substrate 62.

Therefore with the preferred embodiment shown in FIG. 36, the plurality of electrode film portions 431 to 439 are divided into L-shaped electrode film portions 441 to 449. For example, the electrode film portion 449 in the arrangement of FIG. 36 can thereby be made to face the lower electrode film 411 over an area that is 1.5 times that of the electrode film portion 439 in the arrangement of FIG. 27.

Therefore, if the capacitor element C9 corresponding to the electrode film portion 439 in the first preferred embodiment of FIG. 27 has a capacitance of 4 pF, the capacitor element C9 can be made to have a capacitance of 6 pF by use of the electrode film portion 449 of the present preferred embodiment. The capacitance value of the chip capacitor 418 can thereby be set over a wider range by making effective use of the interior of the capacitor arrangement region 65.

In order to avoid receiving influences of the parasitic capacitances, the substrate 62 has a specific resistance of not less than 100 Ω·cm in the present preferred embodiment as well. The process for manufacturing the chip capacitor 418 according to the present preferred embodiment is practically the same as the process shown in FIG. 34. However, in the patterning of the upper electrode film 413 (steps S7 and S8), the capacitor electrode region 413A is divided into the plurality of electrode film portions 441 to 449 of the shapes shown in FIG. 36.

Figure 37:
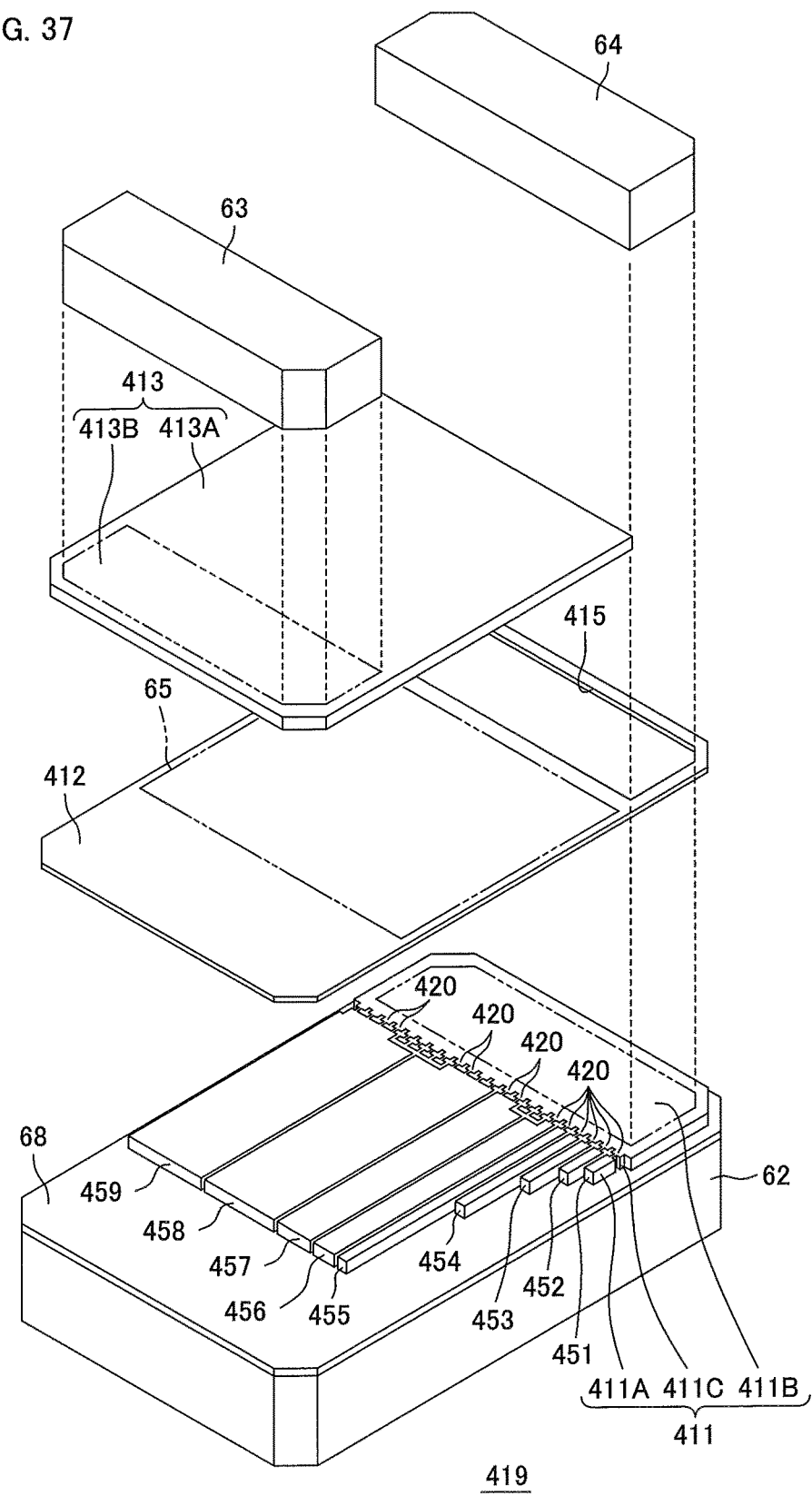
FIG. 37 is an exploded perspective view for describing the arrangement of a chip capacitor according to a third preferred embodiment of the third reference example.

FIG. 37 is an exploded perspective view for describing the arrangement of a chip capacitor 419 according to a third preferred embodiment of the third reference example, and the respective portions of the chip capacitor 419 are shown in the same manner as in FIG. 29 used for describing the first preferred embodiment. With the first preferred embodiment, the lower electrode film 411 has the capacitor electrode region 411A constituted of a pattern that is continuous across substantially the entirety of the capacitor arrangement region 65, and the capacitor electrode region 413A of the upper electrode film 413 is divided into the plurality of electrode film portions 431 to 439.

In contrast, with the present preferred embodiment, whereas the capacitor electrode region 413A of the upper electrode film 413 is formed to a continuous film pattern that is continuous across substantially the entirety of the capacitor arrangement region 65, the capacitor electrode region 411A of the lower electrode film 411 is divided into a plurality of electrode film portions 451 to 459. The electrode film portions 451 to 459 may be formed in the same shapes and area ratio as those of the electrode film portions 431 to 439 in the first preferred embodiment or may be formed in the same shapes and area ratio as those of the electrode film portions 441 to 449 in the second preferred embodiment. A plurality of capacitor elements are thus arranged by the electrode film portions 451 to 459, the capacitance film 412, and the upper electrode film 413. At least a portion of the plurality of capacitor elements constitutes a set of capacitor elements that differ in capacitance value (for example, with the respective capacitance values being set to form a geometric progression).

The lower electrode film 411 further has a fuse region 411C between the capacitor electrode region 411A and the pad region 411B. In the fuse region 411C, a plurality of fuse units 420, similar to the fuse units 67 of the first preferred embodiment, are aligned in a single column along the pad region 411B. Each of the electrode film portions 451 to 459 is connected to the pad region 411B via one or a plurality of the fuse units 420.

The electrode film portions 451 to 459 face the upper electrode film 413 over mutually different facing areas in the present arrangement as well and any of these can be disconnected individually by cutting the fuse unit 420. The same effects as those of the first preferred embodiment are thus obtained. In particular, by forming at least a portion of the plurality of electrode film portions 451 to 459 so as to face the upper electrode film 413 over facing areas set to form a geometric progression with a common ratio of 2, a chip capacitor that is precisely adjusted to the required capacitance value can be provided in the same manner as in the first preferred embodiment.

The substrate 62 has a specific resistance of not less than 100 Ω·cm to avoid receiving influences of the parasitic capacitances in the present preferred embodiment as well. The process for manufacturing the chip capacitor 419 according to the present preferred embodiment is practically the same as the process shown in FIG. 34. However, in the patterning of the lower electrode film 411 (steps S3 and S4), the capacitor electrode region 411A is divided into the electrode film portions 451 and 459 and the plurality of fuse units 420 are formed in the fuse region 411C. Also, in the patterning of the upper electrode film 413 (steps S7 and S8), a plurality of electrode film portions are not formed and fuse units are also not formed. Further, in the laser trimming (step S12), the fuse units 420 formed in the lower electrode film 411 are cut by laser light. The lower electrode film 411 is covered by the capacitance film 412 and the capacitance film 412 can thus be used as a cover film for accumulating the energy of the laser light in the process of laser trimming. The forming of the cover film (step S11) immediately before the laser trimming may thus be omitted.

Although preferred embodiments of the third reference example have been described above, the third reference example may be implemented in yet other modes as well. For example, although with each of the preferred embodiments described above, the arrangement where just one of either of the upper electrode film and the lower electrode film is divided into the plurality of electrode films was described, both the upper electrode film and the lower electrode film may be divided into a plurality of electrode film portions. Further, although with each of the preferred embodiments, an example where each fuse unit is made integral with the upper electrode film or the lower electrode film was described, the fuse units may be formed from a conductor film separate from the upper electrode film and the lower electrode film. Further, although with each of the preferred embodiments, an example where the plurality of capacitor elements include a plurality of capacitor elements having capacitance values that form a geometric progression with a common ratio r (0<r; r≠1)=2 was described, the common ratio of the geometric progression may be a numeral other than 2. Also with each of the preferred embodiments, the insulating film 68 is formed on the top surface of the substrate 62, the insulating film 68 may be omitted if the substrate 62 is an insulating substrate. Also, a conductive substrate may be used as the substrate 62, the conductive substrate may be used as a lower electrode, and the capacitance film 412 may be formed so as to be in contact with the top surface of the conductive substrate. In this case, one of the external electrodes may be led out from a rear surface of the conductive substrate. Further in a case of using a semiconductor substrate, the substrate 62 is formed of a semiconductor having a specific resistance of not less than 30 Ω·cm and preferably not less than 100 Ω·cm to avoid receiving influences of the parasitic capacitances.

Besides the above, various design changes may be applied within the scope of the matters described as features of the invention according to the (1) third reference example. For example, arrangements with which a step of manufacture not specified in the respective features C1 to C23 is changed, omitted, or added are also included within the scope of the third reference example. <Invention according to a fourth reference example> (1) Features of the invention according to the fourth reference example. For example, the features of the invention according to the fourth reference example are the following D1 to D22. (D1) A chip capacitor including a substrate having a top surface with a trench formed therein and a capacitor structure having a capacitance film conforming to the top surface of the substrate.

With the invention according to D1, the trench is formed in the top surface of the substrate and the capacitor structure is formed by providing the capacitance film so as to conform to the top surface in which the trench is formed. The surface area of the substrate is therefore greater than an apparent surface area in a plan view perpendicular to a principal surface of the substrate. Accordingly, the capacitance film conforming to the top surface of the substrate has a large area and therefore the capacitor structure can be made to have a high capacitance value. A chip capacitor with which both compact substrate size and high capacitance are realized at the same time can thus be provided. (D2) The chip capacitor according to D1, where the capacitor structure has a plurality of capacitor elements and further including a first external electrode provided on the substrate, a second external electrode provided on the substrate, and a plurality of fuses that are formed on the substrate, are each interposed between the plurality of capacitor elements and the first external electrode or the second external electrode, and are capable of disconnecting each of the plurality of capacitor elements.

With the invention according to D2, the plurality of capacitor elements are connected between the first and second external electrodes disposed on the substrate. The plurality of fuses that are capable of disconnecting each of the plurality of capacitor elements are provided between the plurality of capacitor elements and the first or second external electrodes. A plurality of types of capacitance values can thus be accommodated easily and rapidly by selecting and cutting one or a plurality of the fuses. In other words, a common design can be applied to chip capacitors of a plurality of types of capacitance values. (D3) The chip capacitor according to D2, where the plurality of capacitor elements have mutually different capacitance values.

With the invention according to D3, chip capacitors of various capacitance values can be realized with a common design by combining a plurality of the capacitor elements that differ in capacitance value. (D4) The chip capacitor according to D3, where the capacitance values of the plurality of capacitor elements are set to form a geometric progression. By the invention according to D4, the capacitance value of the chip capacitor can be adjusted accurately to a desired capacitance value by appropriate selection of a plurality of the capacitor elements to be connected between the first external electrode and the second external electrode. For example, by setting the common ratio of the geometric progression to 2, the capacitance value of the chip capacitor can be adjusted at the precision of the first term of the geometric progression (term of the smallest value in the geometric progression). (D5) The chip capacitor according to any one of D2 to D4, where at least one of the plurality of fuses is cut.

With the chip capacitor that has been adjusted in capacitance value, one or a plurality of the fuses may be cut. The capacitor elements to be connected between the first external electrode and the second external electrode can be selected by fuse cutting and the chip capacitor of the required capacitance value can thereby be realized. (D6) The chip capacitor according to any one of D2 to D5, where the capacitor structure includes a lower electrode and an upper electrode facing each other across the capacitance film, the lower electrode is disposed at the substrate side with respect to the capacitance film, the upper electrode is disposed at the side opposite to the substrate with respect to the capacitance film, and one electrode among the lower electrode and the upper electrode includes a plurality of electrode film portions respectively corresponding to the plurality of capacitor elements.

With the invention according to D6, the capacitor structure is arranged by the capacitance film being sandwiched between the lower electrode and the upper electrode. One electrode among the upper electrode and the lower electrode is divided into the plurality of electrode film portions so that the respective electrode film portions face the other electrode and the plurality of capacitor elements are thereby provided on the substrate. (D7) The chip capacitor according to D6, where the plurality of electrode film portions face the other electrode among the lower electrode and the upper electrode over mutually different facing areas.

With the invention according to D7, the plurality of capacitor elements corresponding to the plurality of electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value. (D8) The chip capacitor according to D7, where the facing areas of the plurality of electrode film portions are set to form a geometric progression.

By the invention according to D8, the plurality of capacitor elements, the capacitance values of which are set to form a geometric progression, can be provided on the substrate. Chip capacitors of a plurality of types of capacitance values can thereby be realized and fine adjustment of the capacitance value can also be performed by fuse cutting. (D9) The chip capacitor according to any one of D6 to D8, where the one electrode is the upper electrode. (D10) The chip capacitor according to any one of D6 to D9, where substrate is a conductive substrate, the capacitance film is formed to be in contact with the top surface of the substrate, and the substrate constitutes the lower electrode.

By the invention according to D10, the entire upper electrode can be made to face the lower electrode reliably even if the upper electrode is formed so as to be shifted with respect to a designed position during manufacture. The precision of the capacitance values of the respective capacitor elements can thus be improved. The respective capacitor elements can also be simplified in structure. Further, the manufacturing process can also be simplified because the lower electrode can be formed at the same time as the forming of the trench. (D11) The chip capacitor according to D10, where one of the first external electrode and the second external electrode is bonded to a rear surface of the substrate.

By the invention according to D11, the region of the top surface of the conductive substrate in which one of the first external electrode and the second external electrode is to be formed can also be used effectively as a space for forming the upper electrode. Consequently, maximum use can be made of the area of the top surface of the conductive substrate to enable an even higher capacitance to be realized. (D12) The chip capacitor according to any one of D6 to D8, where the upper electrode is the one electrode and the lower electrode includes a conductive film formed so as to conform to the top surface of the substrate. (D13) The chip capacitor according to D12, where an insulating film is formed on the top surface of the substrate and the conductive film is formed on the top surface of the insulating film. (D14) The chip capacitor according to any one of D6 to D13, where the electrode film portions and the fuses are formed of films of the same conductive material.

By the invention according to D14, the electrode film portions and the fuses can be arranged from a conductive material film in common Each electrode film portion can be disconnected by cutting the fuse corresponding to the electrode film portion. (D15) The chip capacitor according to any one of D6 to D13, where the upper electrode is constituted of an electrode film with which the top surface is formed flatly.

By the invention according to D15, the formability of a film on the top surface of the upper electrode is improved and therefore, for example, an insulating film or a metal film (an additional electrode film, etc.) can be formed with good precision on the upper electrode. (D16) The chip capacitor according to any one of D2 to D15, where the plurality of capacitor elements include at least two capacitor elements that share single trench.

By the invention according to D16, the capacitance values of the respective capacitor structures can be increased by the same ratio while maintaining the ratio of the apparent surface areas in a plan view of the plurality of the capacitor elements. (D17) The chip capacitor according to any one of D2 to D16, where the plurality of capacitor elements include at least one capacitor element disposed in a region in which the trench is formed and at least one capacitor element disposed in a region in which the trench is not formed.

By the invention according to D17, a capacitor element that is desired to be made high in capacitance can be increased in capacitance value by positioning the capacitor element in the region in which the trench is formed. On the other hand, a capacitor element that suffices to be low in capacitance may be positioned in the region in which trench is not formed so as not to be made high in capacitance but be capable of being used as an element for fine adjustment of the capacitance value in designing the capacitance value of the chip capacitor by fuse cutting. (D18) A method for manufacturing a chip capacitor including a step of forming a trench in the top surface of the substrate and a step of forming, on the top surface of the substrate in which the trench has been formed, a capacitor structure having a capacitance film conforming to the top surface of the substrate.

By the invention according to D18, a chip capacitor with which both compact substrate size and high capacitance are realized at the same time can thus be manufactured. (D19) The method for manufacturing a chip capacitor according to D18 where the chip capacitor includes a first external electrode and a second external electrode provided on the substrate, and the step of forming the capacitor structure includes a step of forming a plurality of capacitor elements, a step of forming, on the substrate, a plurality of fuses that disconnectably connect each of the plurality of capacitor elements to the first external electrode or the second external electrode, and a step of forming the first external electrode and the second external electrode.

By the invention according to D19, chip capacitors being of a common design and yet being of a plurality of capacitance values can be manufactured by cutting the fuses that are selected in accordance with the required capacitance values. (D20) The method for manufacturing a chip capacitor according to D18 or D19, further including a step of cutting at least one of the plurality of fuses.

By the invention according to D20, the capacitance value of the chip capacitor can be adjusted to the desired capacitance value by appropriately selecting each fuse to be cut. That is, the chip capacitor adjusted to the desired capacitance value can be manufactured by appropriately selecting the capacitor elements to be connected to the first and second external electrodes and cutting the fuses corresponding to the capacitor elements besides those selected. (D21) The method for manufacturing a chip capacitor according to D20, further including a step of measuring a total capacitance value of the plurality of capacitor elements and a step of selecting each fuse to be cut based on the measured total capacitance value, and where each selected fuse is cut in the fuse cutting step.

By the invention according to D21, the total capacitance value of the plurality of capacitor elements is measured, each fuse to be cut is selected based on the measurement result, and therefore the capacitance value of the chip capacitor can be set to the targeted capacitance value reliably. (D22) The method for manufacturing a chip capacitor according to D20 or D21, further including a step of forming, after cutting the fuse or fuses, a protective film covering the cut portion of each fuse.

By the invention according to D22, the cut portion of each fuse is covered by the protective film and therefore entry of foreign matter and moisture with respect to the cut portion can be avoided to enable a chip capacitor, which can realize a plurality of types of capacitance values with a common design and is high in reliability, to be manufactured. (2) Preferred embodiments of the invention according to the fourth reference example Preferred embodiments of the fourth reference example shall now be described in detail with reference to the attached drawings.

Figure 38:
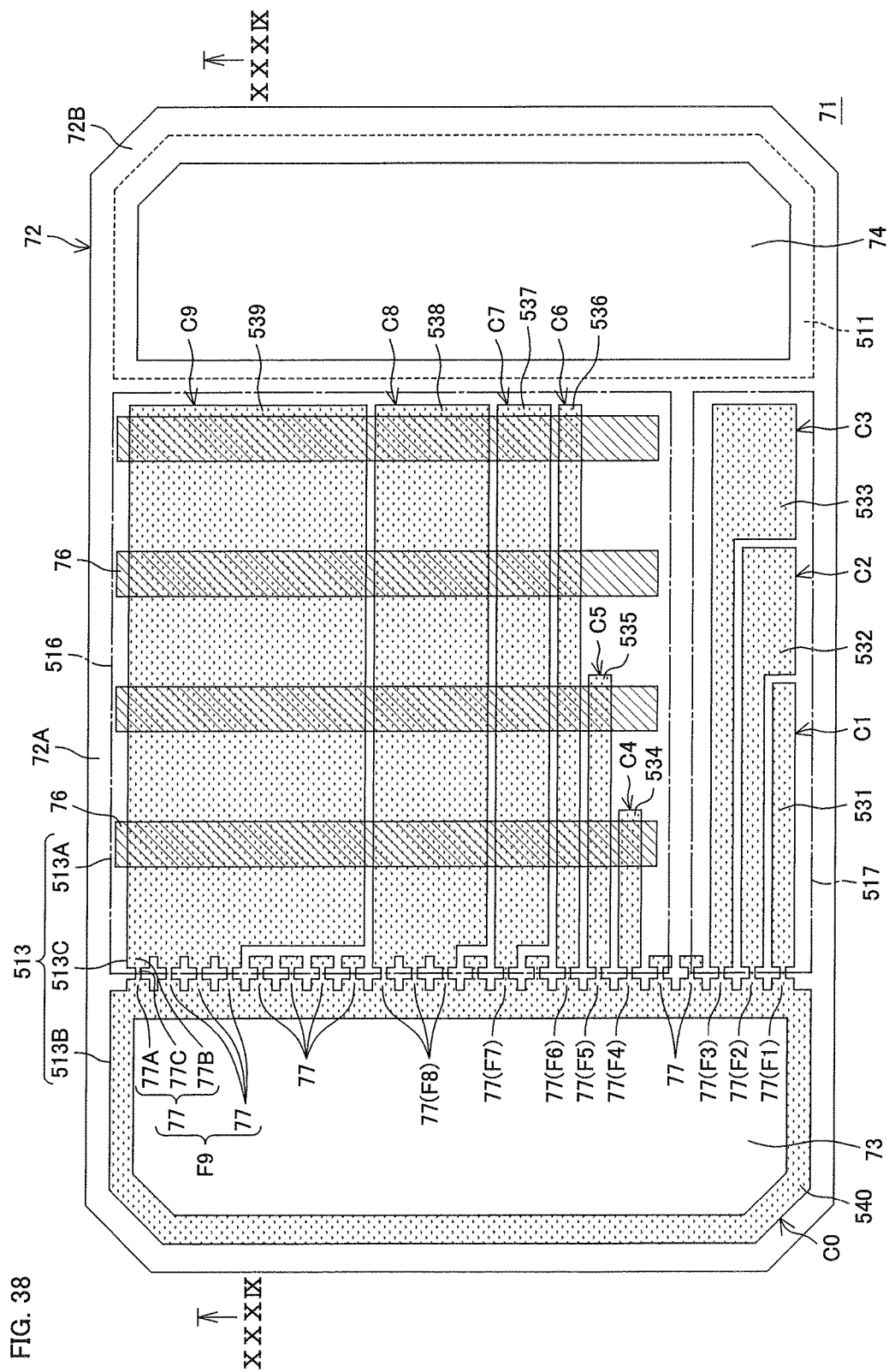
FIG. 38 is a plan view of a chip capacitor according to a first preferred embodiment of a fourth reference example.
Figure 39:
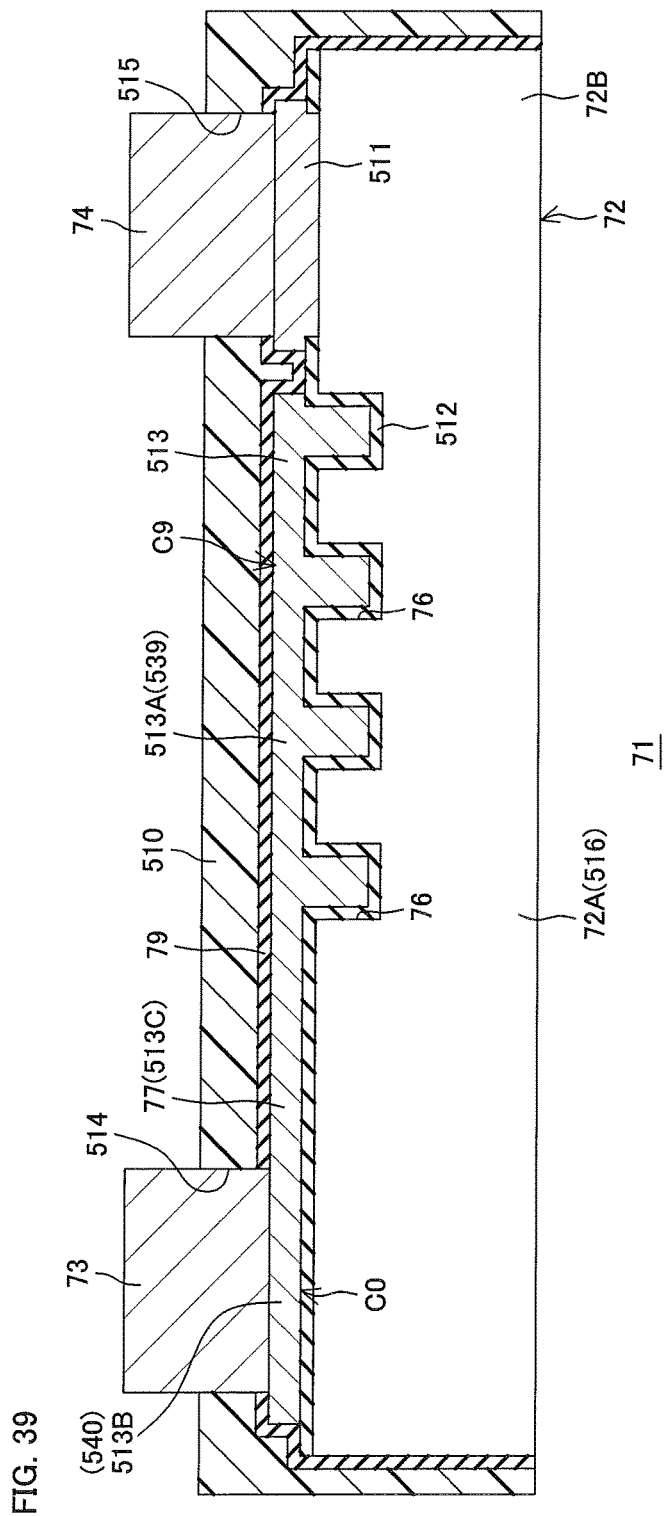
FIG. 39 is a sectional view taken along section line XXXIX-XXXIX in FIG. 38.
Figure 40:
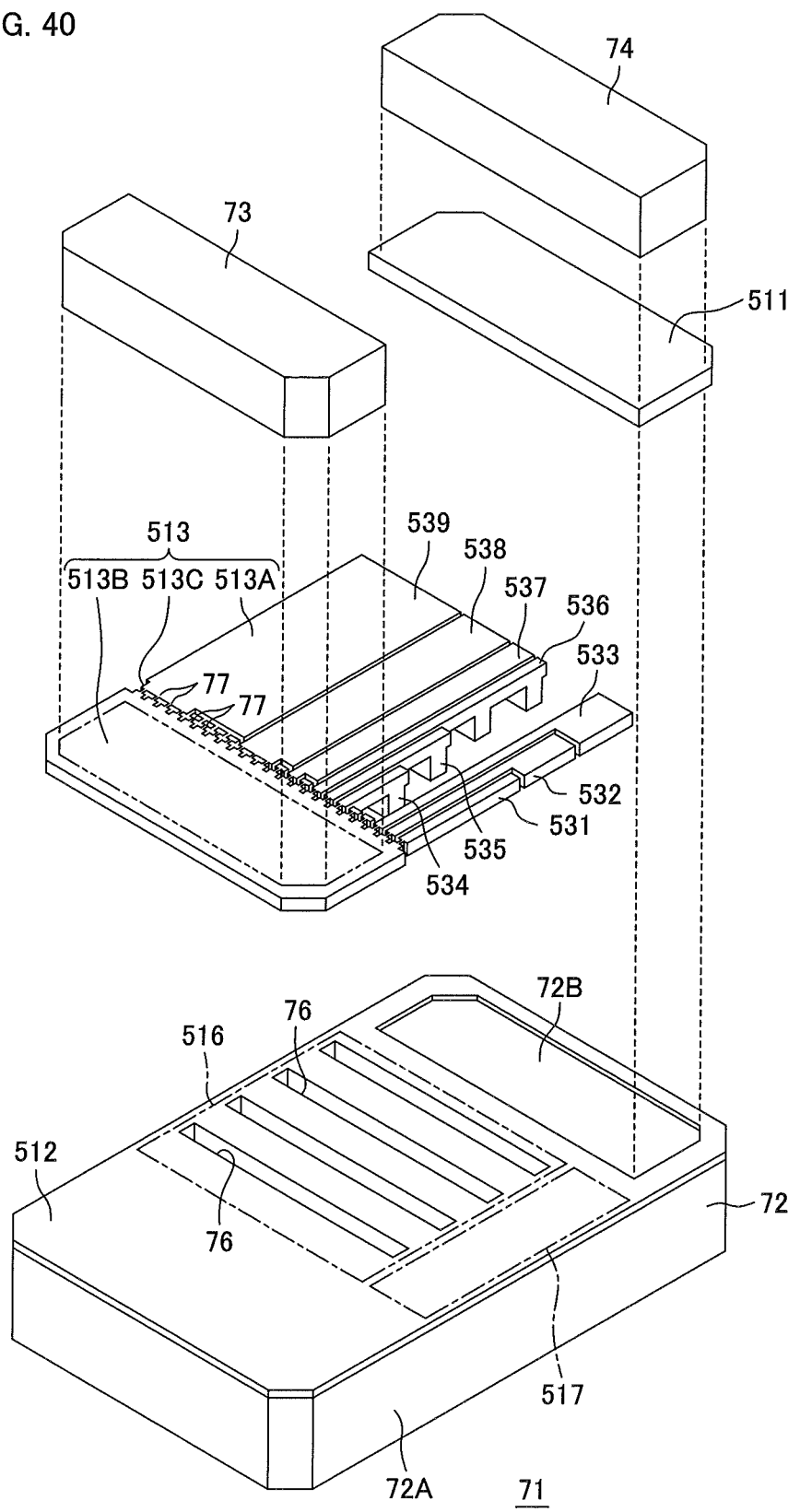
FIG. 40 is an exploded perspective view showing the arrangement of a portion of the chip capacitor in a separated state.

FIG. 38 is a plan view of a chip capacitor according to a first preferred embodiment of the fourth reference example, and FIG. 39 is a sectional view thereof showing a section taken along section line XXXIX-XXXIX in FIG. 38. Further, FIG. 40 is an exploded perspective view showing the arrangement of a portion of the chip capacitor in a separated state. The chip capacitor 71 includes a substrate 72, a first external electrode 73 disposed on the substrate, a second external electrode 74 disposed similarly on the substrate 72, and a plurality of capacitor elements C0 to C9.

In the present preferred embodiment, the substrate 72 is a conductive substrate (for example, a silicon substrate with a specific resistance of not more than 5 mΩ·cm) and has, in a plan view, a rectangular shape with the four corners chamfered. The first external electrode 73 and the second external electrode 74 are respectively disposed at portions at respective ends in the long direction of the substrate 72. In the present preferred embodiment, each of the first external electrode 73 and the second external electrode 74 has a substantially rectangular planar shape extending in the short direction of the substrate 72 and has chamfered portions at two locations respectively corresponding to the corners of the substrate 72.

Also, the substrate 72 has a capacitor electrode region 72A functioning as a lower electrode in common to the plurality of capacitor elements C0 to C9 and a pad region 72B for leading out to an external electrode. In the present preferred embodiment, the capacitor electrode region 72A includes a region directly below the first external electrode 73 and a region between the first external electrode 73 and the second external electrode 74. The capacitor element C0 is positioned in the region in the capacitor electrode region 72A directly below the first external electrode 73 and is directly connected electrically to the first external electrode 73. On the other hand, the capacitor elements C1 to C9 are positioned in the region in the capacitor electrode region 72A between the first external electrode 73 and the second external electrode 74 and are respectively connected electrically to the first external electrode 73 via a plurality of fuse units 77.

The substrate 72 has a plurality of trenches 76 formed in the capacitor electrode region 72A. In FIG. 38, the trenches 76 are indicated with diagonal hatching for the sake of clarity. The plurality of trenches 76 are formed selectively in a portion of the capacitor electrode region 72A. The capacitor electrode region 72A thus further includes a trench formation region 516 and a trench non-formation region 517. In the present preferred embodiment, the trench formation region 516 and the trench non-formation region 517 are, for example, formed adjacent to each other in the short direction of the substrate 72 so as to divide the region between the first external electrode 73 and the second external electrode 74 into two.

In the trench formation region 516, the plurality of trenches 76 are formed in the shape of mutually parallel stripes. Each trench 76 extends toward the trench non-formation region 517 in the direction of spanning across the trench formation region 516 and the trench non-formation region 517 (the short direction of the substrate 72 in the present preferred embodiment). The pitch of the plurality of trenches 76 and the depth, width, etc., of each trench 76 may be designed as suited in accordance with the capacitance value required of the chip capacitor 71.

On the top surface of the substrate 72, a capacitance film (dielectric film) 512 is formed so as to contact the top surface of the substrate 72 in the capacitor electrode region 72A. The capacitance film 512 is continuous across the entirety of the capacitor electrode region 72A and the surface at one side and the other side are formed to conform to (follow) the top surface of the substrate 72. The inner surfaces of the plurality of trenches 76 are thereby covered by the capacitance film 512. Also in the present preferred embodiment, the capacitance film 512 is formed so as to expose the pad region 72B. A lower electrode film 511 is formed on the exposed pad region 72B. The lower electrode film 511 is directly connected electrically to the pad region 72B of the substrate 72.

An upper electrode film 513 is formed on the capacitance film 512. In FIG. 38, the upper electrode film 513 is colored for the sake of clarity. The upper electrode film 513 has its top surface formed flatly and includes a capacitor electrode region 513A positioned in a region of the capacitor electrode region 72A between the first external electrode 73 and the second external electrode 74, a pad region 513B positioned directly below the first external electrode 73 in the capacitor electrode region 72A, and a fuse region 513C disposed between the pad region 513B and the capacitor electrode region 513A.

In the capacitor electrode region 513A, the upper electrode film 513 is divided into a plurality of electrode film portions 531 to 539. In the present preferred embodiment, among the respective electrode film portions 531 to 539, the electrode film portions 534 to 539 are disposed in the trench formation region 516 and the electrode film portions 531 to 533 are disposed in the trench non-formation region 517. The electrode film portions 534 to 539 disposed in the trench formation region 516 are formed to rectangular shapes and extend in the form of bands from the fuse region 513C toward the second external electrode 74 so as to cross the plurality of trenches 76. In other words, each of the plurality of trenches 76 intersects the plurality of electrode film portions 534 to 539 orthogonally so as to span across these portions. Each trench 76 is thereby shared by at least two of the capacitor elements C4 to C9.

The plurality of electrode film portions 534 to 539 face the capacitor electrode region 513A of the substrate 72 across the capacitance film 512 over a plurality of types of facing areas. More specifically, a ratio of the apparent facing areas of the electrode film portions 534 to 539 with respect to the capacitor electrode region 513A in a plan view perpendicular to a principal surface of the substrate 72 may be set to be 1:2:4:8:16:32. That is, the plurality of electrode film portions 534 to 539 include the plurality of electrode film portions differing in facing area and more specifically include the plurality of electrode film portions 534 to 539 having facing areas that are set to form a geometric progression with a common ratio of 2. The plurality of electrode film portions 534 to 539 are also embedded at the inner side of the capacitance film 512 in the trenches 76 and face the capacitor electrode region 513A across the capacitance film 512 inside each trench 76 as well.

The plurality of capacitor elements C4 to C9, respectively arranged by the respective electrode film portions 534 to 539 and the substrate 72 facing across the capacitance film 512, thus include the plurality of capacitor elements having mutually different capacitance values. If the ratio of the facing areas of the electrode film portions 534 to 539 is as mentioned above, the ratio of the capacitance values of the capacitor elements C4 to C9 is equal to the ratio of the facing areas and is 1:2:4:8:16:32. The plurality of capacitor elements C4 to C9 thus include the plurality of capacitor elements C4 to C9 with capacitance values set to form the geometric progression with the common ratio of 2.

In the present preferred embodiment, the electrode film portions 534 to 536 are formed to bands that are equal in width and have lengths with the ratio thereof being set to 1:2:4. Also, the electrode film portions 536 to 539 are formed to bands that are equal in length and have widths with the ratio thereof being set to 1:2:4:8. The electrode film portions 536 to 539 are formed to extend across a range from an end edge at the first external electrode 73 side to an end edge at the second external electrode 74 side of the capacitor electrode region 72A, and the electrode film portions 534 and 535 are formed to be shorter than this range.

On the other hand, the electrode film portions 531 to 533 disposed in the trench non-formation region 517 are formed to L-shapes. With an arrangement where the electrode film portions are formed to have band shapes like the electrode film portions 534 to 539, regions that cannot be used as capacitor elements are formed as in the trench formation region 516 shown in FIG. 38 and effective use cannot be made of the restricted region on the small substrate 72. Therefore by making the electrode film portions have L-shapes like the electrode film portions 531 to 533, the interior of the trench non-formation region 517 can be used effectively to enable the capacitance value of the chip capacitor 71 to be set over a wider range. Such L-shaped electrodes may also be applied to the electrode film portions 534 to 539 disposed in the trench formation region 516. Oppositely, the electrode film portions 531 to 533 disposed in the trench non-formation region 517 may be formed to bands.

The pad region 513B is formed to be substantially similar in shape to the first external electrode 73 and has a substantially rectangular planar shape having two chamfered portions corresponding to corner portions of the substrate 72. As shown in FIG. 39, the upper surface of the upper electrode film 513 in the pad region 513B is in contact with the first external electrode 73. The upper electrode film 513 in the pad region 513B functions as an electrode film portion 540. The electrode film portion 540 faces the capacitor electrode region 72A of the substrate 72 across the capacitance film 512. The electrode film portion 540, the capacitance film 512, and the capacitor electrode region 72A of the substrate 72 constitute the capacitor element C0.

With this arrangement, not only are capacitor structures (the capacitor elements C1 to C9) formed at the top surface side of the substrate 72 but a capacitor structure (the capacitor element C0) is also formed in a region directly below the first external electrode 73. The capacitance value is thus increased by the use of the region directly below the first external electrode 73 in the chip capacitor 71. A high capacitance can thus be realized by making maximum use of the area of the top surface of the substrate 72 and the chip capacitor 71, with which both compact size and high capacitance are realized, can be provided.

The fuse region 513C includes the plurality of fuse units 77 that are aligned along the one long side of the pad region 513B. The fuse units 77 are formed of the same material as and to be integral to the pad region 513B of the upper electrode film 513. The plurality of electrode film portions 531 to 539 are each formed integral to one or a plurality of the fuse units 77, are connected to the pad region 513B via the fuse units 77, and are electrically connected to the first external electrode 73 via the pad region 513B. Each of the electrode film portions 531 to 537 of comparatively small area is connected to the pad region 513B via a single fuse unit 77, and each of the electrode film portions 538 and 539 of comparatively large area is connected to the pad region 513B via a plurality of fuse units 77. It is not necessary for all of the fuse units 77 to be used and, in the present preferred embodiment, a portion of the fuse units 77 is unused.

The fuse units 77 include first wide portions 77A arranged to be connected to the pad region 513B, second wide portions 77B arranged to be connected to the electrode film portions 531 to 539, and narrow portions 77C connecting the first and second wide portions 77A and 77B. The narrow portions 77C are arranged to be capable of being cut (fused) by laser light. Unnecessary electrode film portions among the electrode film portions 531 to 539 can thus be electrically disconnected from the first and second external electrodes 73 and 74 by cutting the fuse units 77.

Although omitted from illustration in FIG. 38 and FIG. 40, the top surface of the chip capacitor 71 that includes the top surface of the upper electrode film 513 is covered by a passivation film 79 as shown in FIG. 39. The passivation film 79 is constituted, for example, of a nitride film and is formed not only to cover the upper surface of the chip capacitor 71 but also to extend to side surfaces of the substrate 72 and cover the side surfaces. Further, a resin film 510, made of a polyimide resin, etc., is formed on the passivation film 79. The resin film 510 is formed to cover the upper surface of the chip capacitor 71 and extend to the side surfaces of the substrate 72 to cover the passivation film 79 on the side surfaces.

The passivation film 79 and the resin film 510 are protective films that protect the top surface of the chip capacitor 71. In these films, pad openings 514 and 515 are respectively formed in regions corresponding to the first external electrode 73 and the second external electrode 74. The pad openings 514 and 515 penetrate through the passivation film 79 and the resin film 510 so as to respectively expose a region of a portion of the pad region 513B of the upper electrode film 513 and a region of a portion of the lower electrode film 511.

The first external electrode 73 and the second external electrode 74 are respectively embedded in the pad openings 514 and 515. The first external electrode 73 is thereby bonded to the pad region 513B of the upper electrode film 513 and the second external electrode 74 is bonded to the lower electrode film 511. The first and second external electrodes 73 and 74 are formed to project from the top surface of the resin film 510. The chip capacitor 71 can thereby be flip-chip bonded to a mounting substrate.

Figure 41:
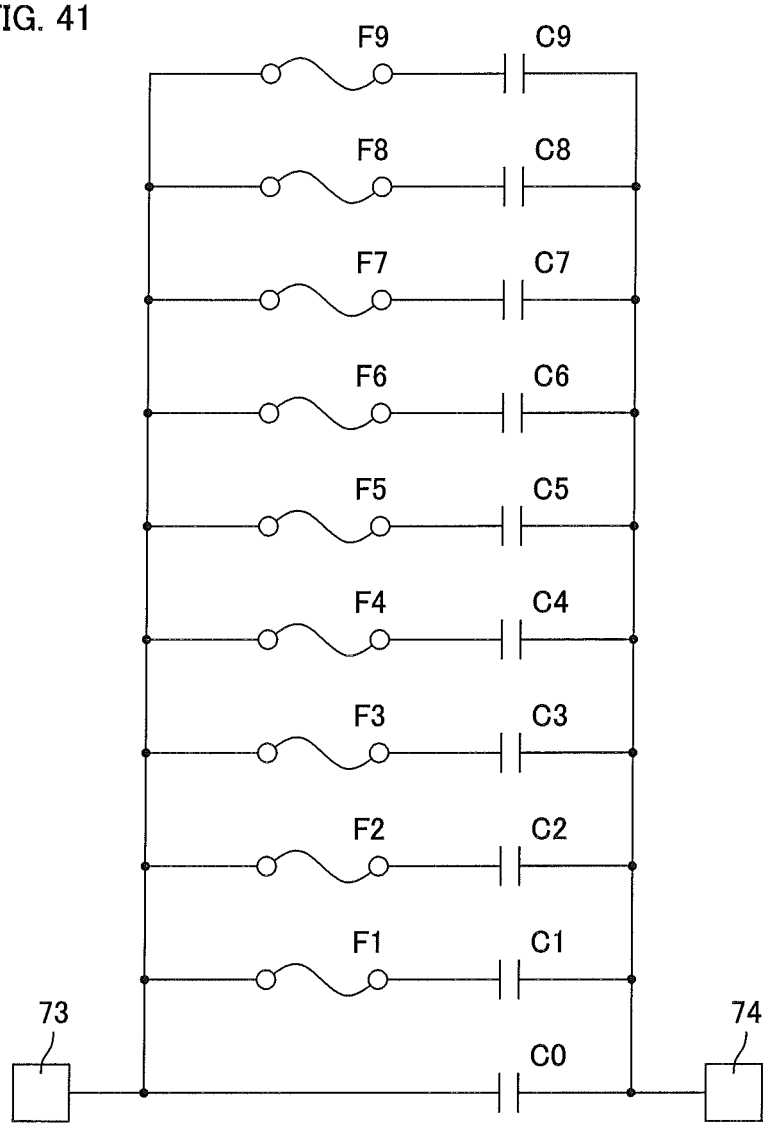
FIG. 41 is a circuit diagram of the electrical arrangement of the interior of the chip capacitor.

FIG. 41 is a circuit diagram of the electrical arrangement of the interior of the chip capacitor 71. The plurality of capacitor elements C0 to C9 are connected in parallel between the first external electrode 73 and the second external electrode 74. Fuses F1 to F9, each arranged from one or a plurality of the fuse units 77, are interposed in series between the respective capacitor elements C1 to C9 and the first external electrode 73. On the other hand, a fuse is not interposed between the capacitor element C0 and the first external electrode 73, and the capacitor element C0 is directly connected to the first external electrode 73.

When all of the fuses F1 to F9 are connected, the capacitance value of the chip capacitor 71 is equal to the total of the capacitance values of the capacitor elements C0 to C9. When one or two or more fuses selected from among the plurality of fuses F1 to F9 is or are cut, each capacitor element corresponding to a cut fuse is disconnected and the capacitance value of the chip capacitor 71 decreases by just the capacitance value of the disconnected capacitor element or elements. When all of the fuses F1 to F9 are cut, the capacitance value of the chip capacitor 71 is the capacitance value of the capacitor element C0.

Therefore by measuring the capacitance value across the lower electrode film 511 and the pad region 513B (the total capacitance value of the capacitor elements C0 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor elements C1 to C9 are set to form a geometric progression with a common ratio of 2, fine adjustment to the targeted capacitance value at a precision corresponding to the capacitance value of the capacitor element C1, which is the smallest capacitance value (value of the first term in the geometric progression), is made possible.

For example, the capacitance values of the capacitor elements C0 to C9 may be set as follows. C0=5 pF, C1=0.25 pF C2=0.5 pF C3=1 pF C4=2 pF C5=4 pF C6=8 pF C7=16 pF C8=32 pF C9=64 pF. In this case, the capacitance of the chip capacitor 71 can be finely adjusted at a minimum adjustment precision of 0.25 pF. Also, the fuses to be cut among the fuses F1 to F9 can be selected appropriately to provide the chip capacitor 71 with an arbitrary capacitance value between 0.1 pF and 10 pF.

As described above, with the present preferred embodiment, the plurality of capacitor elements C1 to C9 that can be disconnected by the fuses F1 to F9 are provided between the first external electrode 73 and the second external electrode 74. Further, the capacitor element C0 directly connected to the first external electrode 73 is provided directly below the first external electrode 73. The capacitor elements C1 to C9 include a plurality of capacitor elements that differ in capacitance value and more specifically include a plurality of capacitor elements with capacitance values set to form a geometric progression. The chip capacitor 71, which can accommodate a plurality of types of capacitance values without change of design and can be accurately adjusted to the desired capacitance value by selection and fusion by laser light of one or a plurality of fuses among the fuses F1 to F9, can thus be provided.

Moreover, the plurality of trenches 76 are formed in the substrate 72 and the capacitor structures (capacitor elements C4 to C9) are formed by the capacitance film being provided so as to conform to the top surface in which the trenches 76 are formed. Therefore in the trench formation region 516, the surface area of the substrate 72 is greater than the apparent surface area in the plan view perpendicular to the principal surface of the substrate 72. Accordingly, the capacitance film 512 conforming to the top surface of the substrate 72 has a large area and the capacitor elements C4 to C9 can thus be made to have high capacitance values. The chip capacitor with which both compact size of the substrate 72 and high capacitance are realized can thus be provided.

Also, the substrate 72 serves as the lower electrode in common to the capacitor structures (capacitor elements C0 to C9) and therefore even if the upper electrode film 513 is formed to be shifted with respect to the designed position during manufacture, the entirety of the upper electrode film 513 can be made to face the lower electrode (substrate 72) reliably. The respective capacitor elements C0 to C9 can thus be improved in the precision of capacitance value. Also, the respective capacitor elements C0 to C9 can be simplified in structure. Further, the lower electrode can be formed at the same time as the forming of the trenches 76, and the manufacturing process can thus be simplified.

Also, the upper electrode film 513, although being embedded in the trenches 76, has its top surface formed flatly, and the formability of the passivation film 79 and the resin film 510 on the upper electrode film 513 can thus be improved. Also, the trenches 76 are shared by the plurality of capacitor elements C4 to C9, and therefore the capacitance values of the respective capacitor structures can be increased by the same ratio while maintaining the ratio of the apparent surface areas in a plan view of the capacitor elements C4 to C9.

Further, the trenches 76 are formed selectively in a portion of the capacitor electrode region 72A of the substrate 72 and therefore, the capacitor elements that are desired to be made high in capacitance (C4 to C9 in the present preferred embodiment) can be increased in capacitance value by positioning these in the trench formation region 516. On the other hand, the capacitor elements that suffice to be low in capacitance (C1 to C3 in the present preferred embodiment) may be positioned in the trench non-formation region 517 so as not to be made high in capacitance but be capable of being used as elements for fine adjustment of the capacitance value in designing the capacitance value of the chip capacitor 71 by fuse cutting.

Details of respective portions of the chip capacitor 71 shall now be described. The substrate 72 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The thickness of the substrate 72 may be approximately 150 µm. The substrate 72 may, for example, be a substrate that has been thinned by grinding or polishing from a rear surface side (surface on which the capacitor elements C0 to C9 are not formed).

The lower electrode film 511 is preferably a conductive film, a metal film in particular, and may, for example, be an aluminum film. The lower electrode film 511 that is constituted of an aluminum film may be formed by a sputtering method. Similarly, the upper electrode film 513 is preferably constituted of a conductive film, a metal film in particular, and may, for example, be an aluminum film. The upper electrode film 513 that is constituted of an aluminum film may be formed by the sputtering method. The patterning for dividing the capacitor electrode region 513A of the upper electrode film 513 into the electrode film portions 531 to 539 and shaping the fuse region 513C into the plurality of fuse units 77 may be performed by photolithography and etching processes.

The capacitance film 512 may be constituted, for example, of a silicon nitride film, and the film thickness thereof may be 500 Å to 2000 Å (for example, 1000 Å). The capacitance film 512 may be a silicon nitride film formed by plasma CVD (chemical vapor deposition). The passivation film 79 may be constituted, for example, of a silicon nitride film and may be formed, for example, by the plasma CVD method. The film thickness thereof may be approximately 8000 Å. As mentioned above, the resin film 510 may be constituted of a polyimide film or other resin film.

Each of the first and second external electrodes 73 and 74 may, for example, be constituted of a laminated structure film in which a nickel layer in contact with the lower electrode film 511 or the upper electrode film 513, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film 511 or the upper electrode film 513, and the palladium layer functions as a diffusion preventing layer that suppresses mutual diffusion of the material of the upper electrode film or the lower electrode film and the gold of the uppermost layer of each of the first and second external electrodes 73 and 74.

Figure 42:
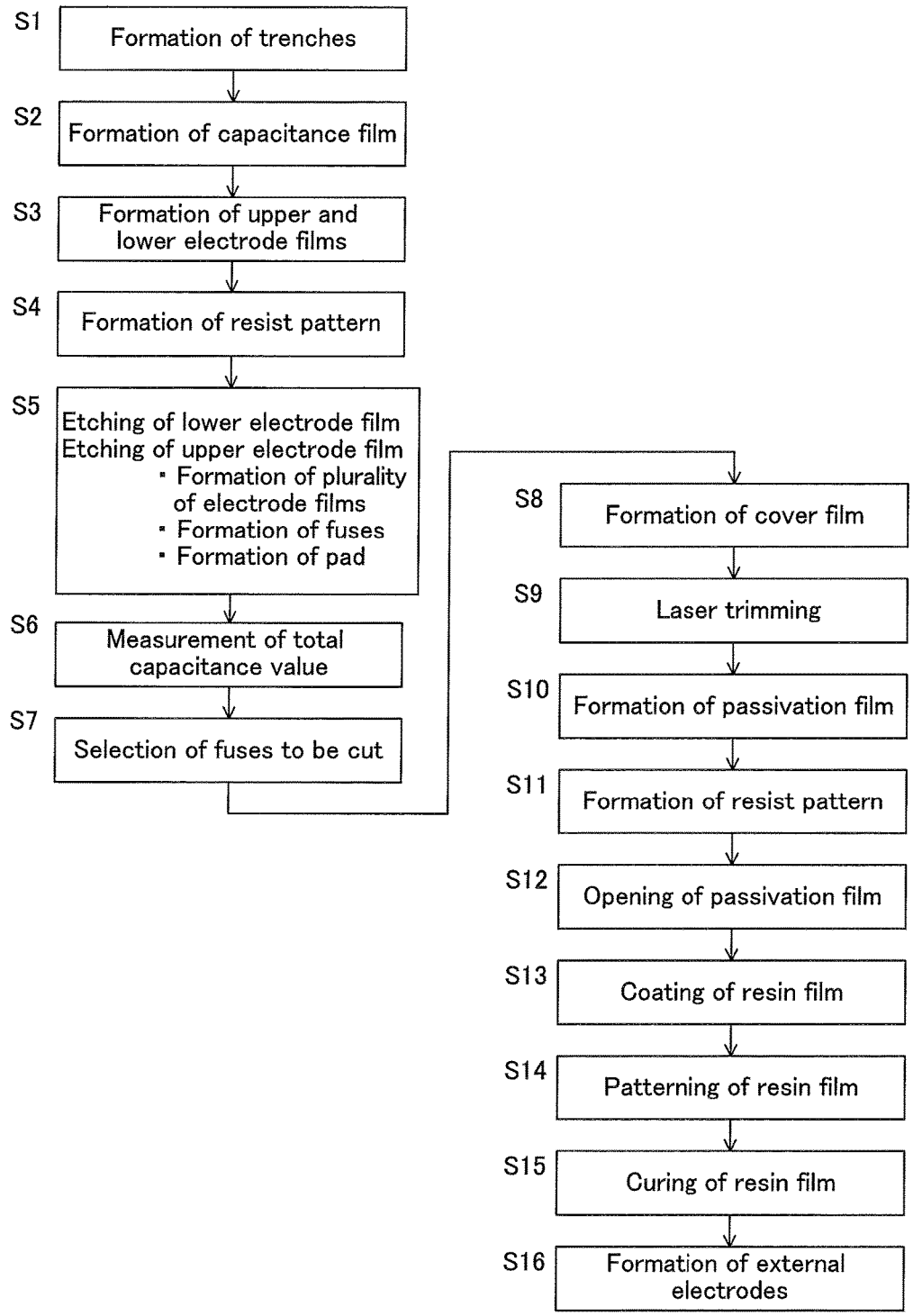
FIG. 42 is a flow diagram for describing an example of a process for manufacturing the chip capacitor.

FIG. 42 is a flow diagram for describing an example of a process for manufacturing the chip capacitor 71. The stripe-shaped trenches 76 are formed by etching the substrate 72 from the top surface (step S1). Thereafter, the capacitance film 512, constituted of a silicon nitride film, etc., is formed on the substrate 72, for example, by the plasma CVD method (step S2). The capacitance film 512 is formed so that its surface at one side and the other side conform to the top surface of the substrate 72. After forming the capacitance film 512, the capacitance film 512 is patterned to expose the pad region 72B of the substrate 72.

Thereafter, the material of the upper electrode film 513 and the lower electrode film 511, which are constituted of aluminum films, is formed over the entire top surface of the capacitance film 512, for example, by the sputtering method (step S3). At the portion at which the pad region 72B is exposed, the material of the electrode film is formed so as to contact the pad region 72B. The film thickness of each of the upper electrode film 513 and the lower electrode film 511 may be approximately 8000 Å. Thereafter, a resist pattern corresponding to the final shapes of the upper electrode film 513 and the lower electrode film 511 is formed on the top surfaces of the upper electrode film 513 and the lower electrode film 511 by photolithography (step S4).

The upper electrode film 513 and the lower electrode film 511 are etched using the resist pattern as a mask to obtain the upper electrode film 513 and the lower electrode film 511 of the patterns shown in FIG. 38, etc., at the same time (step S5). The etching of the upper electrode film 513 and the lower electrode film 511 may be performed, for example, by reactive ion etching. The upper electrode film 513 is thereby shaped to the pattern having the plurality of electrode film portions 531 to 539 in the capacitor electrode region 72A, having the plurality of fuse units 77 in the fuse region 513C, and having the electrode film portion 540 in the pad region 513B connected to the fuse units 77. The etching for patterning the upper electrode film 513 may be performed by wet etching using an etching liquid, such as phosphoric acid, etc., or may be performed by reactive ion etching. Here, the electrode film portions 531 to 540 and the fuse units 77 of the upper electrode film 513 are formed of films of the same conductive material and these can thus be formed by patterning from the same film. The manufacturing process is thereby simplified.

Thereafter, inspection probes are contacted against the pad region 513B of the upper electrode film 513 and against the lower electrode film 511 to measure the total capacitance value of the plurality of capacitor elements C0 to C9 (step S6). Based on the measured total capacitance value, the capacitor elements to be disconnected, that is, the fuses to be cut are selected in accordance with the targeted capacitance value of the chip capacitor 71 (step S7).

Figure 43A:
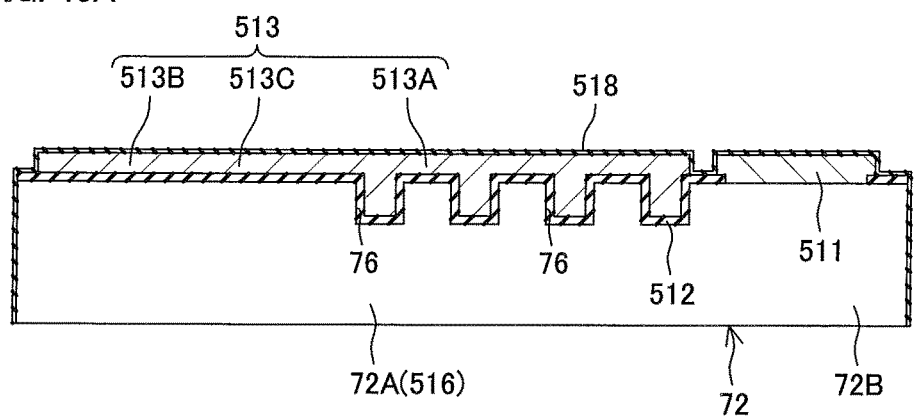
FIG. 43A, FIG. 43B, and FIG. 43C are sectional views for describing steps related to the cutting of a fuse.

Thereafter as shown in FIG. 43A, a cover film 518, constituted, for example, of a nitride film, is formed on the entire surface of the substrate 72 (step S8). The forming of the cover film 518 may be performed by the plasma CVD method and, for example, a silicon nitride film with a film thickness of approximately 3000 Å may be formed. The cover film 518 covers the patterned upper electrode film 513 and lower electrode film 511 and covers the capacitance film 512 in the region in which the upper electrode film 513 and the lower electrode film 511 are not formed. The cover film 518 covers the fuse units 77 in the fuse region 513C.

Figure 43B:
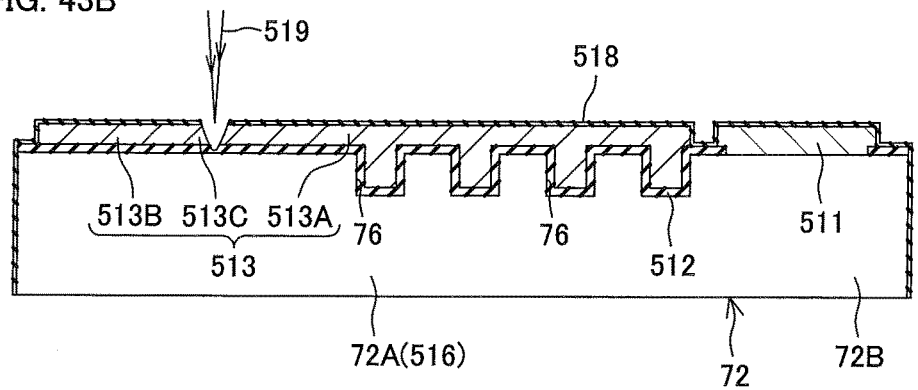

From this state, the laser trimming for fusing the fuse units 77 is performed (step S9). That is, as shown in FIG. 43B, each fuse unit 77 constituting a fuse selected in accordance with the measurement result of the total capacitance value is irradiated with laser light 519 and the narrow portion 77C of the fuse unit 77 is fused. The corresponding capacitor element is thereby disconnected from the pad region 513B. When the laser light 519 is irradiated on the fuse unit 77, the energy of the laser light 519 is accumulated at a vicinity of the fuse unit 77 by the action of the cover film 518 and the fuse unit 77 is thereby fused. The capacitance value of the chip capacitor 71 can thereby be set to the targeted capacitance value reliably.

Figure 43C:
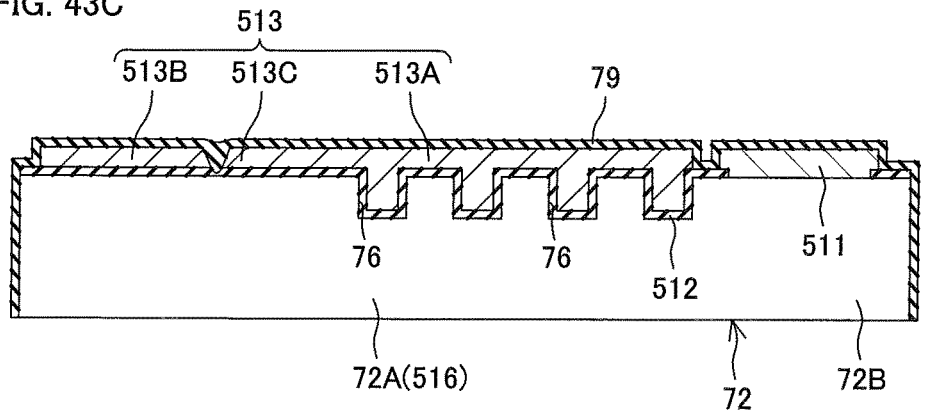

Thereafter as shown in FIG. 43C, a silicon nitride film is deposited on the cover film 518, for example, by the plasma CVD method to form the passivation film 79 (step S10). In the final form, the cover film 518 is made integral with the passivation film 79 to constitute a portion of the passivation film 79. The passivation film 79 that is formed after the cutting of the fuses enters into openings in the cover film 518, destroyed at the same time as the fusing of the fuses, to protect the cut surfaces of the fuse units 77. The passivation film 79 thus prevents entry of foreign matter and entry of moisture into the cut locations of the fuse units 77. The passivation film 79 may be formed to have a film thickness, for example, of approximately 8000 Å as a whole.

Thereafter, a resist pattern, having penetrating holes at positions at which the first and second external electrodes 73 and 74 are to be formed, is formed on the passivation film 79 (step S11). The passivation film 79 is etched using the resist pattern as a mask. The pad opening exposing the lower electrode film 511 and the pad opening exposing the upper electrode film 513 in the pad region 513B are thereby formed (step S12). The etching of the passivation film 79 may be performed by reactive ion etching.

Thereafter, a resin film is coated on the entire surface (step S13). As the resin film, for example, a coating film of a photosensitive polyimide is used. Patterning of the resin film by photolithography may be performed by performing an exposure step and a subsequent developing step on regions of the resin film corresponding to the pad openings (step S14). The pad openings 514 and 515 penetrating through the resin film 510 and the passivation film 79 are thereby formed. Thereafter, heat treatment (curing) for hardening the resin film is performed (step S15) and further, the first external electrode 73 and the second external electrode 74 are grown inside the pad openings 514 and 515, for example, by the electroless plating method (step S16). The chip capacitor 71 of the structure shown in FIG. 38, etc., is thereby obtained.

In the patterning of the upper electrode film 513 using the photolithography process, the electrode film portions 531 to 540 of minute areas can be formed with high precision and the fuse units 77 of even finer pattern can be formed. After the patterning of the upper electrode film 513, the total capacitance value is measured and then the fuses to be cut are determined. By cutting the determined fuses, the chip capacitor 71 that is accurately adjusted to the desired capacitance value can be obtained.

Figure 44:
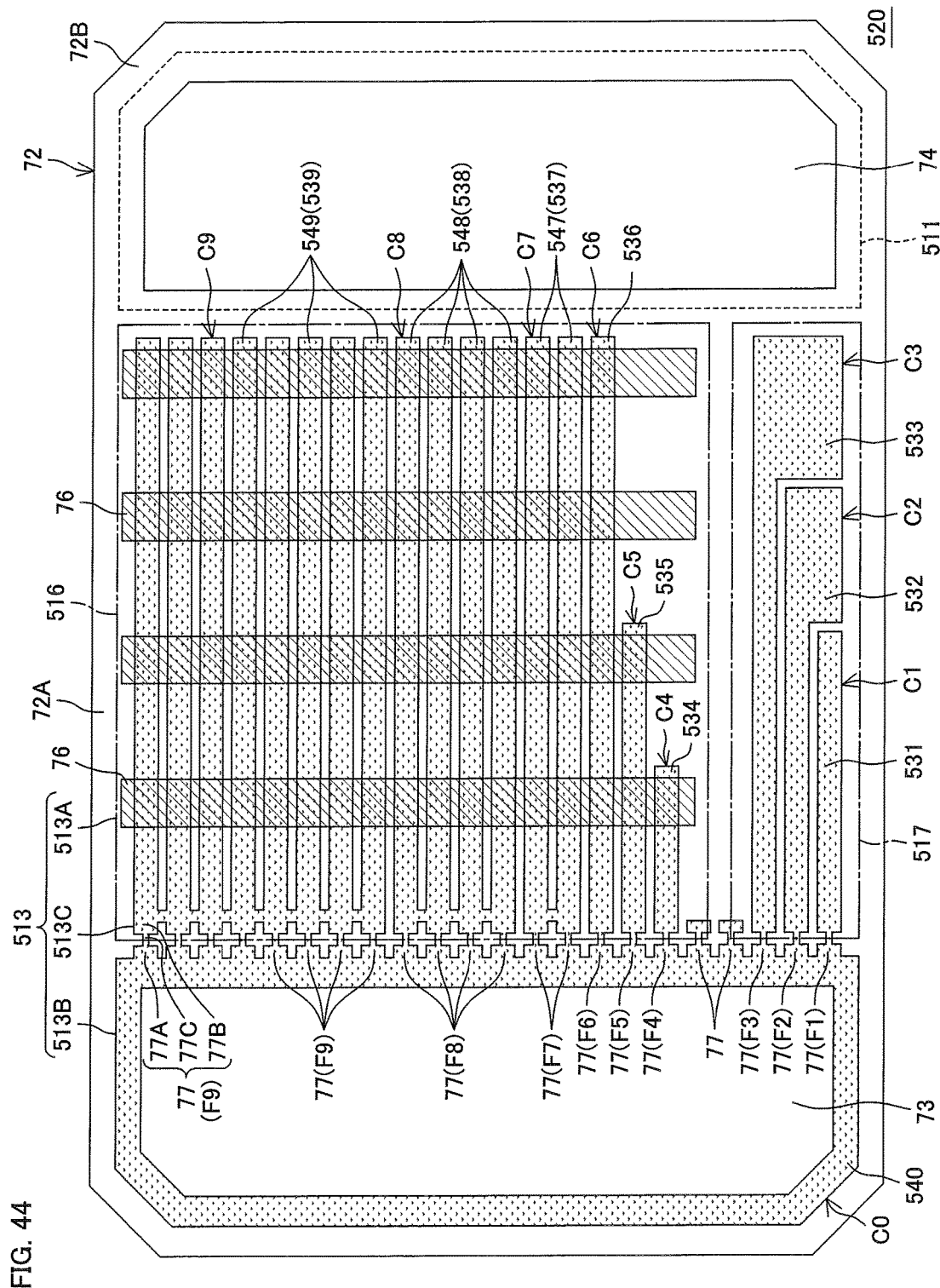
FIG. 44 is a plan view for describing the arrangement of a chip capacitor according to a second preferred embodiment of the fourth reference example.

FIG. 44 is a plan view for describing the arrangement of a chip capacitor 520 according to a second preferred embodiment of the fourth reference example. In FIG. 44, portions corresponding to respective portions shown in FIG. 38 are indicated using the same reference symbols as in FIG. 38. In the first preferred embodiment, each of the electrode film portions 536 to 539 of the upper electrode film 513 disposed in the trench formation region 516 is formed to a single band set to a desired width. In this case, the electrode film portions 536 to 539 differ mutually in width and therefore in the process of etching and finishing the upper electrode film 513 to its final shape (steps S4 and S5 in FIG. 42), the regions of the upper electrode film 513 that are to be removed by etching are distributed irregularly. Variation of etching may thus occur.

Therefore with the preferred embodiment shown in FIG. 44, the plurality of electrode film portions 537 to 539 are divided into electrode film portions 547 to 549 having the same width as each other (having the same width as the electrode film portions 534 to 536 in the present preferred embodiment). The ratio of the areas of the electrode film portions 537 to 539 is adjusted by increasing/decreasing the number of each of the electrode film portions 547 to 549. The regions of the upper electrode film 513 that are to be removed by etching are thereby distributed regularly to enable the variation of etching to be reduced.

Figure 45:
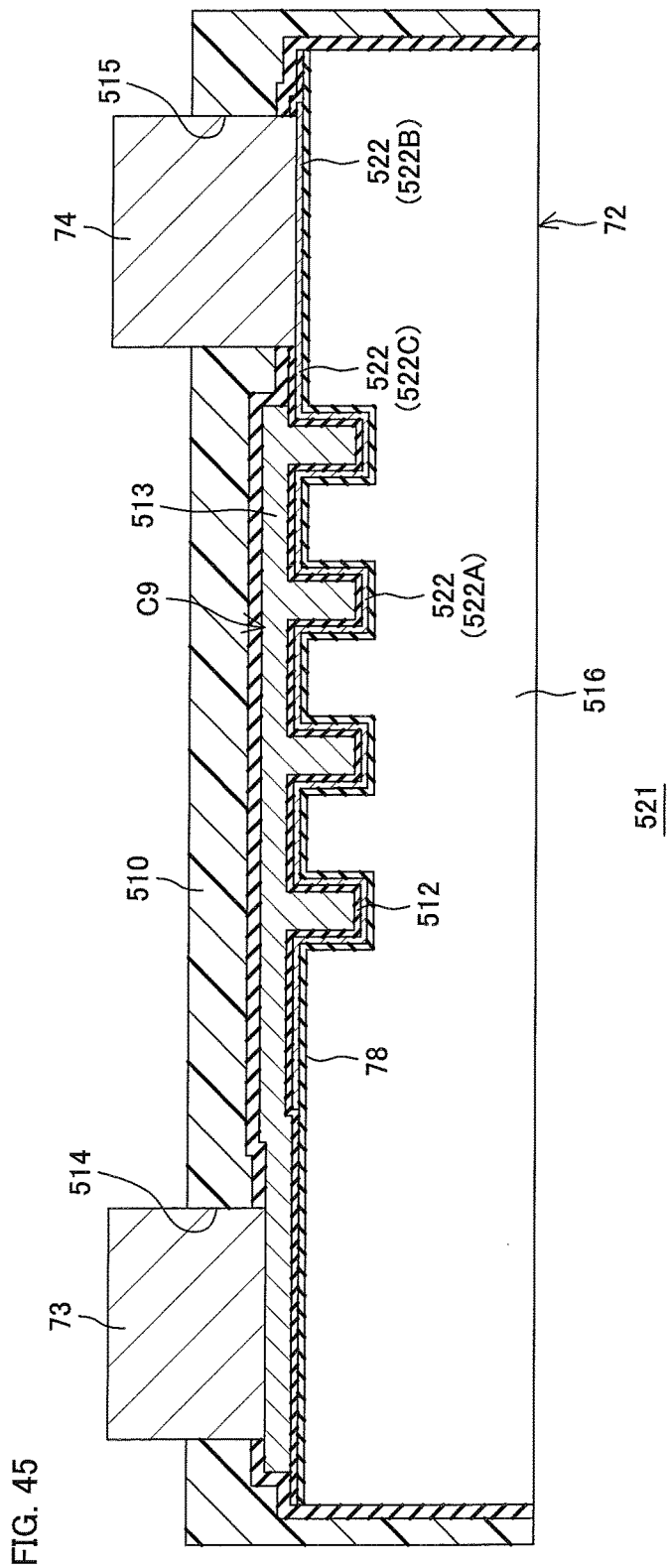
FIG. 45 is a sectional view for describing the arrangement of a chip capacitor according to a third preferred embodiment of the fourth reference example.
Figure 46:
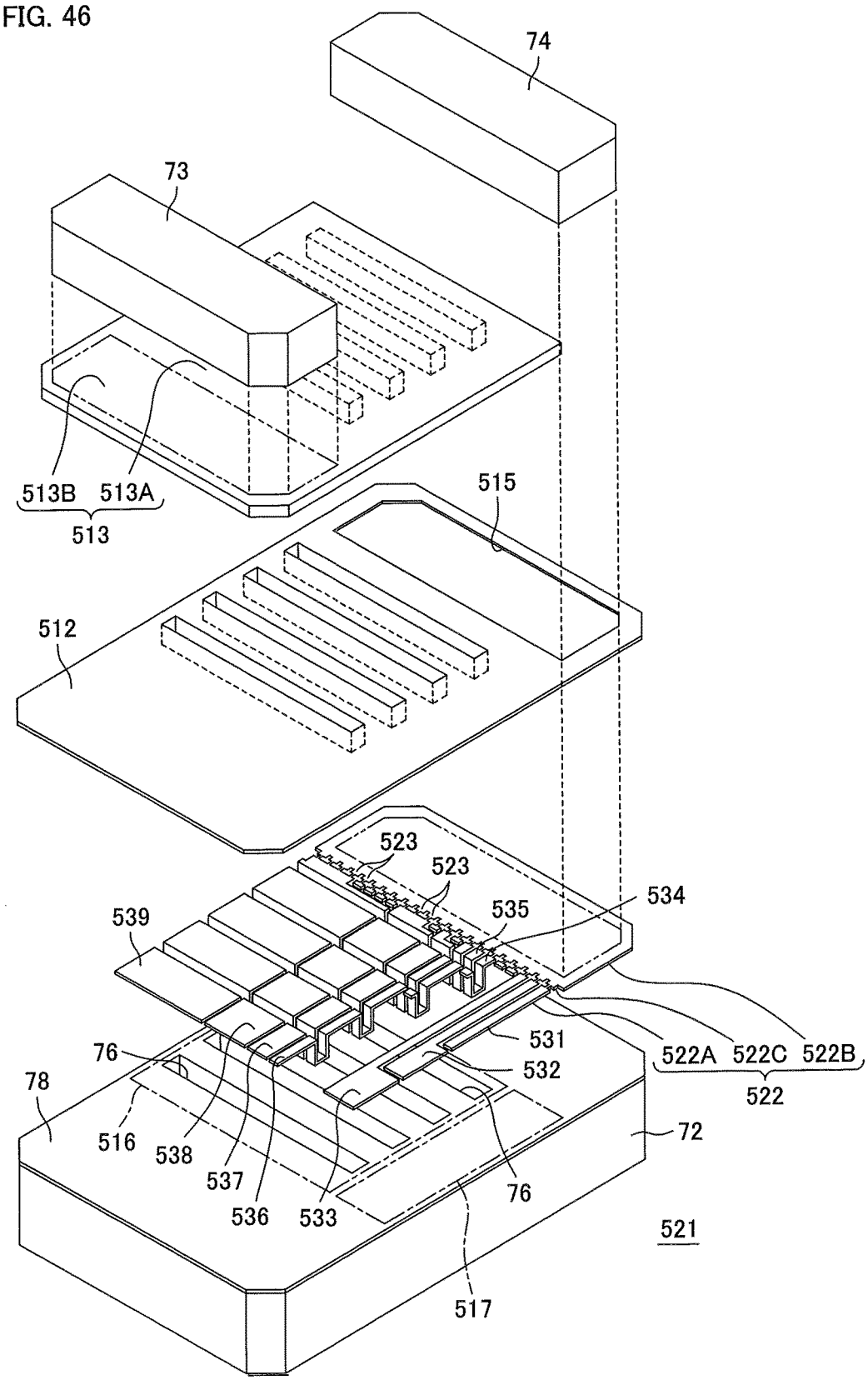
FIG. 46 is an exploded perspective view showing the arrangement of a portion of the chip capacitor of FIG. 45 in a separated state.

The process for manufacturing the chip capacitor 520 according to the present preferred embodiment is practically the same as the process shown in FIG. 42. However, in the patterning of the upper electrode film 513 (steps S4 and S5), the capacitor electrode region 513A is divided into the plurality of electrode film portions 531 to 539 of the shapes shown in FIG. 44. FIG. 45 is a sectional view for describing the arrangement of a chip capacitor 521 according to a third preferred embodiment of the fourth reference example. FIG. 46 is an exploded perspective view showing the arrangement of a portion of the chip capacitor 521 of FIG. 45 in a separated state. In FIG. 45 and FIG. 46, portions corresponding to respective portions shown in FIG. 39 and FIG. 40 are indicated using the same reference symbols as in FIG. 39 and FIG. 40.

Although in the first preferred embodiment, the substrate 72 also served the function of the lower electrode of the capacitor elements C0 to C9, the lower electrode may be arranged instead by forming a lower electrode film 522 as a conductive film so that the surface at one side and the other side are formed to conform to (follow) the top surface of the substrate 72 as shown in FIG. 45 and FIG. 46. As the material of the substrate 72, a semiconductor substrate as represented by a silicon substrate may be used or a glass substrate may be used or a resin film may be used.

In this case, an insulating film 78 is formed so that its surface at one side and surface at the other side conform to the top surface of the substrate 72 and the lower electrode film 522 is formed on the top surface of the insulating film 78. More specifically, the lower electrode film 522 includes a capacitor electrode region 522A functioning as a lower electrode in common to the capacitor elements C1 to C9 and a pad region 522B for leading out to an external electrode. The inner surfaces of the plurality of trenches 76 are thereby covered by the laminated film made up of the insulating film 78, the lower electrode film 522, and the capacitance film 512. The insulating film 78 may be a silicon oxide film or other oxide film. The film thickness thereof may be approximately 500 Å to 2000 Å.

Further with the present preferred embodiment, whereas the capacitor electrode region 513A of the upper electrode film 513 is formed to a continuous film pattern that is continuous substantially across its entirety, the capacitor electrode region 522A of the lower electrode film 522 is divided into a plurality of electrode film portions 531 to 539. The electrode film portions 531 to 539 may be formed to the same shapes and area ratio as those of the electrode film portions 531 to 539 in the first preferred embodiment. A plurality of capacitor elements are thus arranged by the electrode film portions 531 to 539, the capacitance film 512, and the upper electrode film 513. At least a portion of the plurality of capacitor elements constitutes a set of capacitor elements that differ in capacitance value (for example, with the respective capacitance values being set to form a geometric progression).

The lower electrode film 522 further has a fuse region 522C between the capacitor electrode region 522A and the pad region 522B. In the fuse region 522C, a plurality of fuse units 523, similar to the fuse units 77 of the first preferred embodiment, are aligned in a single column along the pad region 522B. Each of the electrode film portions 531 to 539 is connected to the pad region 522B via one or a plurality of the fuse units 523.

The electrode film portions 531 to 539 face the upper electrode film 513 over mutually different facing areas in the present arrangement as well and any of these can be disconnected individually by cutting the fuse unit 523. The same effects as those of the first preferred embodiment are thus obtained. In particular, by forming at least a portion of the plurality of electrode film portions 531 to 539 so as to face the upper electrode film 513 over facing areas set to form a geometric progression with a common ratio of 2, a chip capacitor that is precisely adjusted to the required capacitance value can be provided in the same manner as in the first preferred embodiment.

The process for manufacturing the chip capacitor 521 according to the present preferred embodiment is practically the same as the process shown in FIG. 42. However, a step of forming the insulating film 78, a step of forming the lower electrode film 522, a step of forming the resist pattern, and a step of etching the lower electrode film 522 (steps S1-2 to S1-5) are performed before forming the capacitance film 512 (step S2). Specifically, after forming the trenches 76 in the substrate 72 (step S1), the insulating film 78, constituted of an oxide film (for example, a silicon oxide film), is formed on the top surface of the substrate 72 by a thermal oxidation method and/or CVD method (step S1-2). Thereafter, the lower electrode film 522, constituted of an aluminum film, is formed over the entire top surface of the insulating film 78, for example, by the sputtering method (step S1-3). The film thickness of the lower electrode film 522 may be approximately 8000 Å. Thereafter, the resist pattern corresponding to the final shape of the lower electrode film 522 is formed on the top surface of the lower electrode film by photolithography (step S1-4). The lower electrode film is etched using the resist pattern as a mask to obtain the lower electrode film 522 of the pattern shown in FIG. 45 and FIG. 46, etc. (step S1-5). The etching of the lower electrode film 511 may be performed, for example, by reactive ion etching. Thereafter, the capacitance film 512, constituted of a silicon nitride film, etc., is formed on the lower electrode film 522, for example, by the plasma CVD method (step S2). Also, in the forming and patterning of the upper and lower electrode films (steps S3 to S5), the lower electrode films and a plurality of electrode film portions are not formed and fuse units are also not formed. Further, in the laser trimming (step S9), the fuse units 523 formed in the lower electrode film 522 are cut by laser light. The lower electrode film 522 is covered by the capacitance film 512 and the capacitance film 512 can thus be used as a cover film for accumulating the energy of the laser light in the process of laser trimming. The forming of the cover film (step S8) immediately before the laser trimming may thus be omitted.

Figure 47:
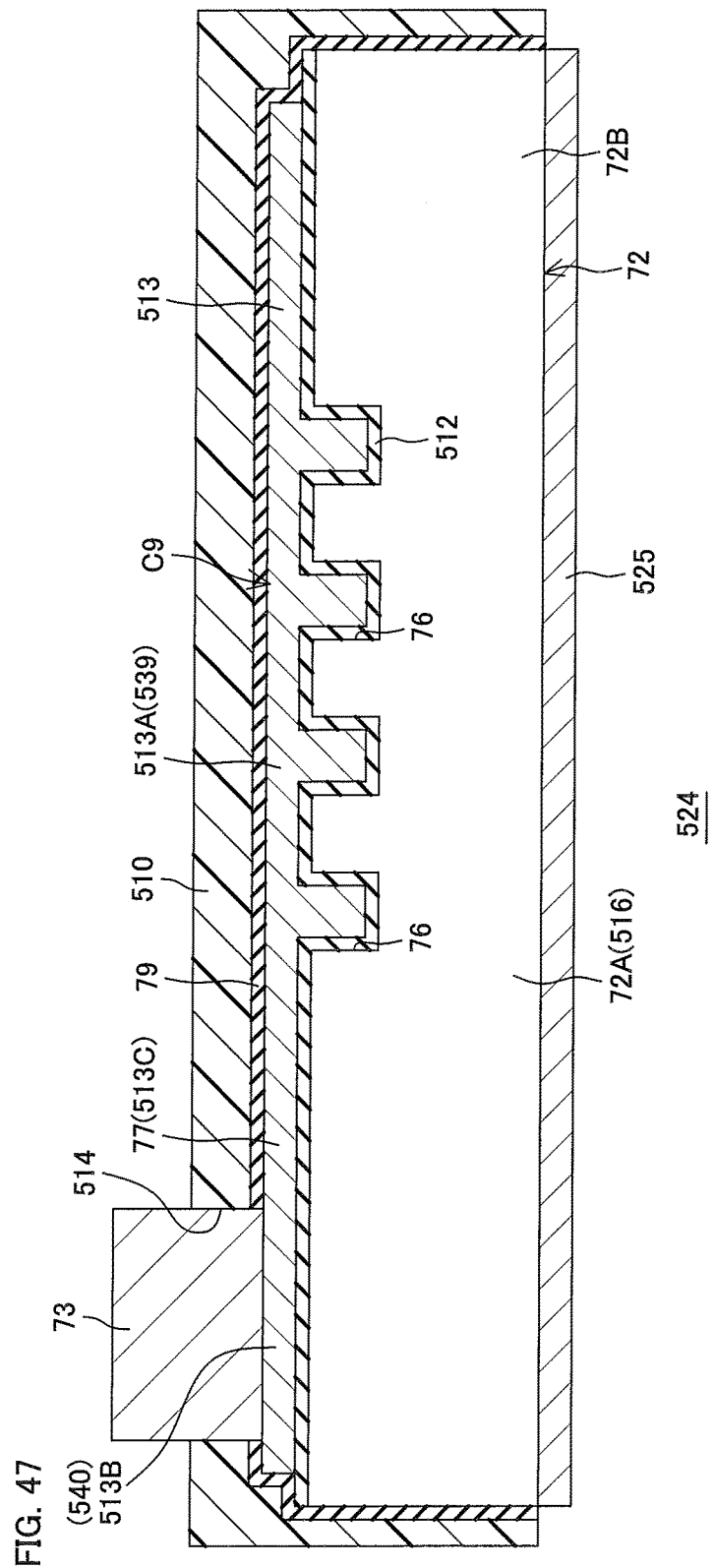
FIG. 47 is a sectional view for describing the arrangement of a chip capacitor according to a fourth preferred embodiment of the fourth reference example.

FIG. 47 is a sectional view for describing the arrangement of a chip capacitor 524 according to a fourth preferred embodiment of the fourth reference example. In FIG. 47, portions corresponding to respective portions shown in FIG. 39 are indicated using the same reference symbols as in FIG. 39. In the first preferred embodiment, the second external electrode 74 is disposed at the top surface side of the substrate 72 via the lower electrode film 511. In this case, the pad region 72B of the substrate 72 cannot be used as a capacitor element as shown in FIG. 38 and FIG. 39 and effective use cannot be made of the restricted region on the small substrate 72.

Therefore with the preferred embodiment shown in FIG. 47, a second external electrode 525 is formed so as to be in contact with the rear surface of the substrate 72. By this arrangement, the pad region 72B of the substrate 72 can also be put to effective use as a formation space for the upper electrode film 513. Consequently, maximum use can be made of the area of the top surface of the substrate 72 and an even higher capacitance can be realized. Also, a semiconductor device that includes a plurality of the chip capacitors 524 (multi chip) can be realized by mounting and packaging the plurality of chip capacitors 524 on a circuit substrate in face-up orientations in which the first external electrodes 73 face upward (orientations in which the second external electrodes 525 face downward). In this case, the first external electrodes 73 are electrically connected to circuits on the circuit board, for example, by wire bonding.

The process for manufacturing the chip capacitor 524 according to the present preferred embodiment is practically the same as the process shown in FIG. 42. However, in steps S3 to S5, only the upper electrode film 513 is formed and in the process of measuring the total capacitance value of the plurality of capacitor elements C0 to C9 (step S6), the inspection probes are contacted against the pad region 513B of the upper electrode film 513 and the rear surface of the substrate 72. The second external electrode 525 is formed, for example, by the sputtering method after growing the first external electrode 73.

Although preferred embodiments of the fourth reference example have been described above, the fourth reference example may be implemented in yet other modes as well. For example, although with each of the preferred embodiments described above, the arrangement where just one of either of the upper electrode film and the lower electrode film is divided into the plurality of electrode films was described, both the upper electrode film and the lower electrode film may be divided into a plurality of electrode film portions. Further, although with each of the preferred embodiments, an example where each fuse unit is made integral with the upper electrode film or the lower electrode film was described, the fuse units may be formed from a conductor film separate from the upper electrode film and the lower electrode film. Further, although with each of the preferred embodiments, an example where the plurality of capacitor elements include a plurality of capacitor elements having capacitance values that form a geometric progression with a common ratio r (0<r; r≠1)=2 was described, the common ratio of the geometric progression may be a numeral other than 2. Also, although with the preferred embodiment shown in FIG. 45 and FIG. 46, the insulating film 78 is formed on the top surface of the substrate 72, the insulating film 78 may be omitted if the substrate 72 is an insulating substrate.

Besides the above, various design changes may be applied within the scope of the matters described as features of the invention according to the (1) fourth reference example. For example, arrangements with which a step of manufacture not specified in the respective features D1 to D22 is changed, omitted, or added are also included within the scope of the fourth reference example. <Invention according to a fifth reference example> (1) Features of the invention according to the fifth reference example. For example, the features of the invention according to the fifth reference example are the following E1 to E22. (E1) A chip capacitor including a substrate, a first external electrode disposed at one surface side of the substrate, a second external electrode disposed at the one surface side of the substrate, a lower electrode film formed at the one surface side of the substrate so as to extend from a region between the first external electrode and the second external electrode to between the second external electrode and the substrate and having an upper surface in contact with the first external electrode, a capacitance film formed on the lower electrode film so as to extend from a region between the first external electrode and the second external electrode to between the second external electrode and the substrate, and an upper electrode film formed on the capacitance film so as to extend from a region between the first external electrode and the second external electrode to between the second external electrode and the substrate, facing the lower electrode film, and having an upper surface in contact with the second external electrode.

With the invention according to E1, both the first external electrode and the second external electrode are disposed at the one surface side of the substrate. Also, a capacitor structure that includes the lower electrode film, the capacitance film, and the upper electrode film is disposed at the one surface side of the substrate. With this arrangement, the lower electrode film, the capacitance film, and the upper electrode film enter between the second external electrode and the substrate and a capacitor structure is also formed in a region directly below the second external electrode. Increase of the capacitance value is thus realized by using the region directly below the second external electrode as well. A high capacitance can thereby be realized while making maximum use of the area of the one surface of the substrate and a chip capacitor with which both compact size and high capacitance are realized can be provided. (E2) The chip capacitor according to E1, where at least one of the upper electrode film and the lower electrode film is divided into a plurality of electrode film portions and a plurality of capacitor elements respectively including the plurality of electrode film portions are formed on the substrate.

With the invention according to E2, at least one of the upper electrode film and the lower electrode film is divided into the plurality of electrode film portions so that the respective electric film portions face the other electrode film and the plurality of capacitor elements are thereby provided on the substrate. (E3) The chip capacitor according to E2, where a plurality of fuses that are capable of disconnecting each of the plurality of capacitor elements are formed on the substrate.

With the chip capacitor according to E3, a plurality of types of capacitance values can be accommodated easily and rapidly by selecting and cutting one or a plurality of the fuses. In other words, a common design can be applied to chip capacitors of a plurality of types of capacitance values. (E4) The chip capacitor according to E3, where the plurality of capacitor elements have mutually different capacitance values.

With the invention according to E4, chip capacitors of various capacitance values can be realized with a common design by combining a plurality of the capacitor elements that differ in capacitance value. (E5) The chip capacitor according to E4, where the capacitance values of the plurality of capacitor elements are set to form a geometric progression. By the invention according to E5, the capacitance value of the chip capacitor can be adjusted accurately to a desired capacitance value by appropriate selection of a plurality of the capacitor elements to be connected between the first external electrode and the second external electrode. For example, by setting the common ratio of the geometric progression to 2, the capacitance value of the chip capacitor can be adjusted at the precision of the first term of the geometric progression (term of the smallest value in the geometric progression). (E6) The chip capacitor according to E3, where at least one of the plurality of fuses is cut.

With the invention according to E6, one or a plurality of the fuses may be cut in the chip capacitor that has been adjusted in capacitance value. The capacitor elements to be connected between the first external electrode and the second external electrode can be selected by fuse cutting and the chip capacitor of the required capacitance value can thereby be realized. (E7) The chip capacitor according to any one of E3 to E6, where the fuses and the upper electrode film or the lower electrode film are formed of films of the same conductive material.

By the invention according to E7, the fuses and the upper electrode film or the lower electrode film can be arranged from a conductive material film in common. Also, electrode film portions (capacitor elements) of the upper electrode film or the lower electrode film can be disconnected by cutting fuses corresponding to the respective electrode film portions. (E8) The chip capacitor according to E1, where the upper electrode film has a plurality of separated upper electrode film portions in a region between the first external electrode and the second external electrode, the plurality of the upper electrode film portions are electrically connected to the second external electrode respectively via the plurality of fuses, and the lower electrode film is formed in a region avoiding a region directly below the fuses.

With the invention according to E8, when, for example, a fuse is cut by irradiating laser light, even if a fragment resulting from the cutting reaches a region directly below the fuse, the lower electrode film is not present at that region.

Problems due to the fragment, such as short-circuiting between an upper electrode film portion and the lower electrode film and corrosion of the lower electrode film, can thus be avoided. Also, the lower electrode film is formed in the region avoiding the region directly below the fuses (region irradiated by laser light), and therefore when a fuse is cut, a problem of the lower electrode film becoming damaged due to the lower electrode film also being cut can be avoided. (E9) The chip capacitor according to E8, where the plurality of upper electrode film portions face the lower electrode film over mutually different facing areas.

With the invention according to E9, the plurality of capacitor elements corresponding to the plurality of upper electrode film portions that mutually differ in facing area have mutually different capacitance values. Chip capacitors of a plurality of types of capacitance values can thus be realized by appropriate combination of the capacitor elements. More specifically, when the fuses corresponding to the capacitor elements other than the selected plurality of the capacitor elements are cut, the fuses are disconnected from between the first and second external electrodes. The disconnection enables the chip capacitor to have the required capacitance value. (E10) The chip capacitor according to E9, where the facing areas of the plurality of upper electrode film portions are set to form a geometric progression.

By the invention according to E10, the plurality of capacitor elements, the capacitance values of which are set to form a geometric progression, can be provided on the substrate. Chip capacitors of a plurality of types of capacitance values can thereby be realized and fine adjustment of the capacitance value can also be performed by fuse cutting. (E11) A method for manufacturing a chip capacitor including a first external electrode and a second external electrode on a substrate, the method including a step of forming a lower electrode film on the substrate so as to extend from a region between the first external electrode and the second external electrode to between the second external electrode and the substrate, a step of forming a capacitance film on the lower electrode film so as to extend from a region between the first external electrode and the second external electrode to between the second external electrode and the substrate, a step of forming an upper electrode film facing the lower electrode film on the capacitance film so as to extend from a region between the first external electrode and the second external electrode to between the second external electrode and the substrate, a step of forming the first external electrode so as to contact an upper surface of the lower electrode film, and a step of forming the second external electrode so as to contact an upper surface of the upper electrode film.

By the invention according to E11, a capacitor structure is formed not only in a region between the first external electrode and the second external electrode but also in a region directly below the second external electrode, thereby enabling increase of the capacitance value of the chip capacitor and therefore enabling a chip capacitor with which both compact size and high capacitance are realized to be provided. (E12) The method for manufacturing a chip capacitor according to E11, where at least one of the upper electrode film and the lower electrode film is divided into a plurality of electrode film portions and a plurality of capacitor elements respectively including the plurality of electrode film portions are formed on the substrate.

With the invention according to E12, at least one of the upper electrode film and the lower electrode film is divided into the plurality of electrode film portions to enable the plurality of capacitor elements of a structure, with the capacitance film being sandwiched between the divided electrode film portions and the other electrode film, to be formed on the substrate. (E13) The method for manufacturing a chip capacitor according to E12, further including a step of forming, on the substrate, a plurality of fuses that are capable of disconnecting each of the plurality of capacitor elements.

By the invention according to E13, chip capacitors being of a common design and yet being of a plurality of capacitance values can be manufactured by cutting the fuses that are selected in accordance with the required capacitance values. (E14) The method for manufacturing a chip capacitor according to E13, where the plurality of capacitor elements are formed to have mutually different capacitance values.

By the invention according to E14, a plurality of types of capacitance values can be realized by appropriately selecting and combining a plurality of the capacitor elements. (E15) The method for manufacturing a chip capacitor according to E14, where the capacitance values of the plurality of capacitor elements are set to form a geometric progression. With the invention according to E15, a plurality of types of capacitance values can be realized and fine adjustment with respect to (adjustment to) a desired capacitance value is made possible by appropriately selecting and combining a plurality of the capacitor elements. For example, by setting the common ratio of the geometric progression to 2, the capacitance value of the chip capacitor can be adjusted at the precision of the first term of the geometric progression (term of the smallest value in the geometric progression). (E16) The method for manufacturing a chip capacitor according to any one of E13 to E15, further including a step of cutting at least one of the plurality of fuses.

By the invention according to E16, the capacitance value of the chip capacitor can be adjusted to the desired capacitance value by appropriately selecting each fuse to be cut. That is, the chip capacitor adjusted to the desired capacitance value can be manufactured by appropriately selecting the capacitor elements to be connected to the first and second external electrodes and cutting the fuses corresponding to the capacitor elements besides those selected. (E17) The method for manufacturing a chip capacitor according to E16, further including a step of measuring a total capacitance value of the plurality of capacitor elements and a step of selecting each fuse to be cut based on the measured total capacitance value, and where each selected fuse is cut in the fuse cutting step.

By the invention according to E17, the total capacitance value of the plurality of capacitor elements is measured, each fuse to be cut is selected based on the measurement result, and therefore the capacitance value of the chip capacitor can be set to the targeted capacitance value reliably. (E18) The method for manufacturing a chip capacitor according to E16 or E17, further including a step of forming, after cutting the fuse or fuses, a protective film covering the cut portion of each fuse.

By the invention according to E18, the cut portion of each fuse is covered by the protective film and therefore entry of foreign matter and moisture with respect to the cut portion can be avoided to enable a chip capacitor, which can realize a plurality of types of capacitance values with a common design and is high in reliability, to be manufactured. (E19) The method for manufacturing a chip capacitor according to any one of E13 to E18, where the fuses and the upper electrode film or the lower electrode film are formed of films of the same conductive material.

By the invention according to E19, the fuses and the upper electrode film or the lower electrode film can be formed of films of the same conductive material and can thus be formed by patterning from the same film. The manufacturing process is thereby simplified. (E20) The method for manufacturing a chip capacitor according to E11, where the upper electrode film is formed to have a plurality of separated upper electrode film portions in a region between the first external electrode and the second external electrode, a step of forming a plurality of fuses that disconnectably connect each of the plurality of upper electrode film portions to the second external electrode is further included, and the lower electrode film is formed in a region avoiding a region directly below the fuses.

With the invention according to E20, when, for example, a fuse is cut by irradiating laser light, even if a fragment resulting from the cutting reaches a region directly below the fuse, the lower electrode film is not present at that region. Problems due to the fragment, such as short-circuiting between an upper electrode film portion and the lower electrode film and corrosion of the lower electrode film, can thus be avoided. Also, the lower electrode film is formed in the region avoiding the region directly below the fuses (region irradiated by laser light), and therefore when a fuse is cut, a problem of the lower electrode film becoming damaged due to the lower electrode film also being cut can be avoided. (E21) The method for manufacturing a chip capacitor according to E20, where the plurality of upper electrode film portions are formed to face the lower electrode film over mutually different facing areas.

With the invention according to E21, the plurality of upper electrode film portions are made to face the lower electrode film over mutually different facing areas to enable the plurality of capacitor elements that differ in capacitance value to be formed on the substrate. Chip capacitors of a plurality of types of capacitance values can thus be manufactured by appropriate selection of the capacitor elements that differ in capacitance value. (E22) The method for manufacturing a chip capacitor according to E21, where the facing areas of the plurality of upper electrode film portions are set to form a geometric progression.

With the invention according to E22, the plurality of upper electrode film portions are made to face the lower electrode film over mutually different facing areas to enable the plurality of capacitor elements that differ in capacitance value to be formed on the substrate. Chip capacitors of a plurality of types of capacitance values can thus be realized by appropriate selection and combination of the capacitor elements that differ in capacitance value. (2) Preferred embodiments of the invention according to the fifth reference example Preferred embodiments of the fifth reference example shall now be described in detail with reference to the attached drawings.

Figure 48:
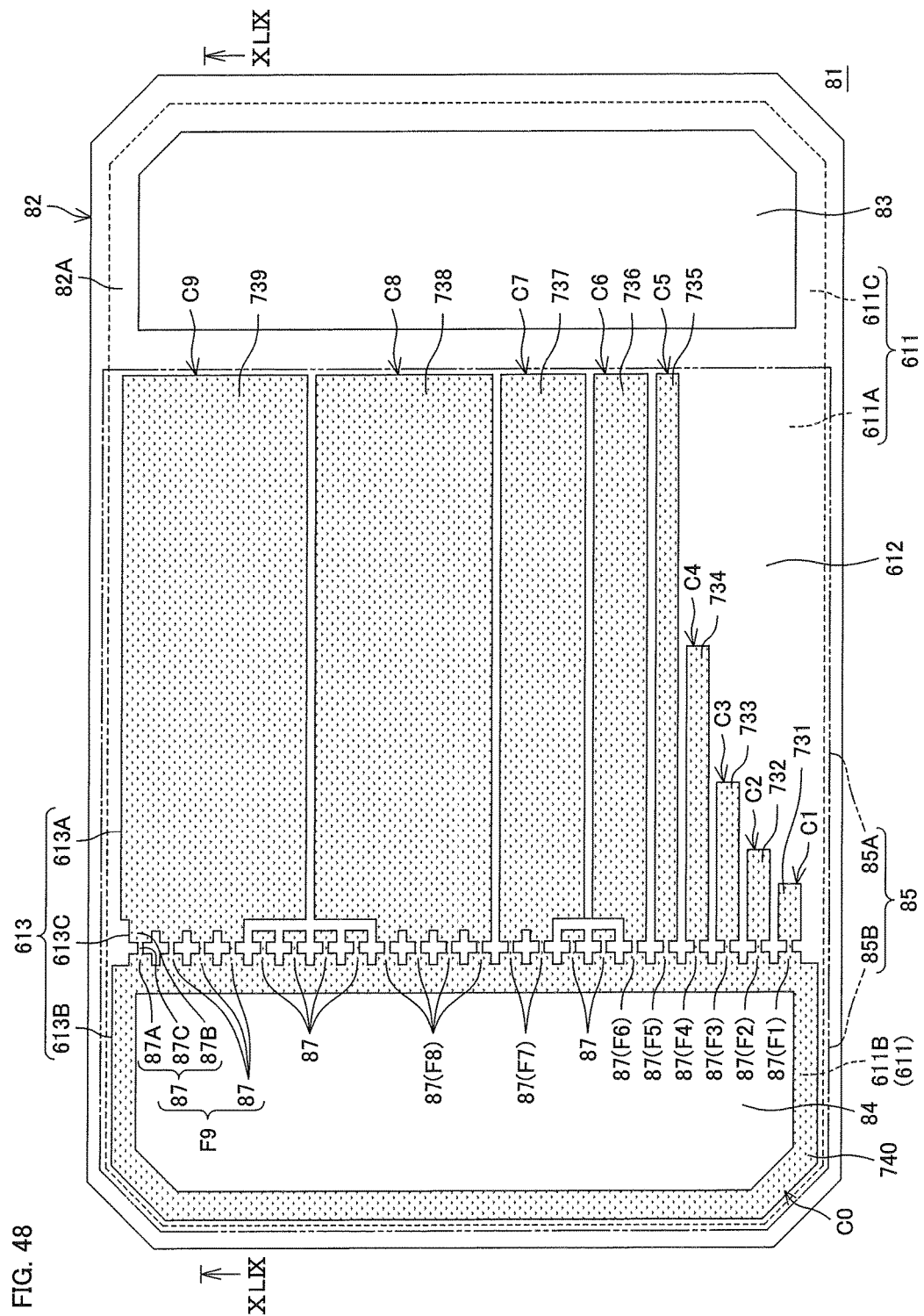
FIG. 48 is a plan view of a chip capacitor according to a first preferred embodiment of a fifth reference example.
Figure 49:
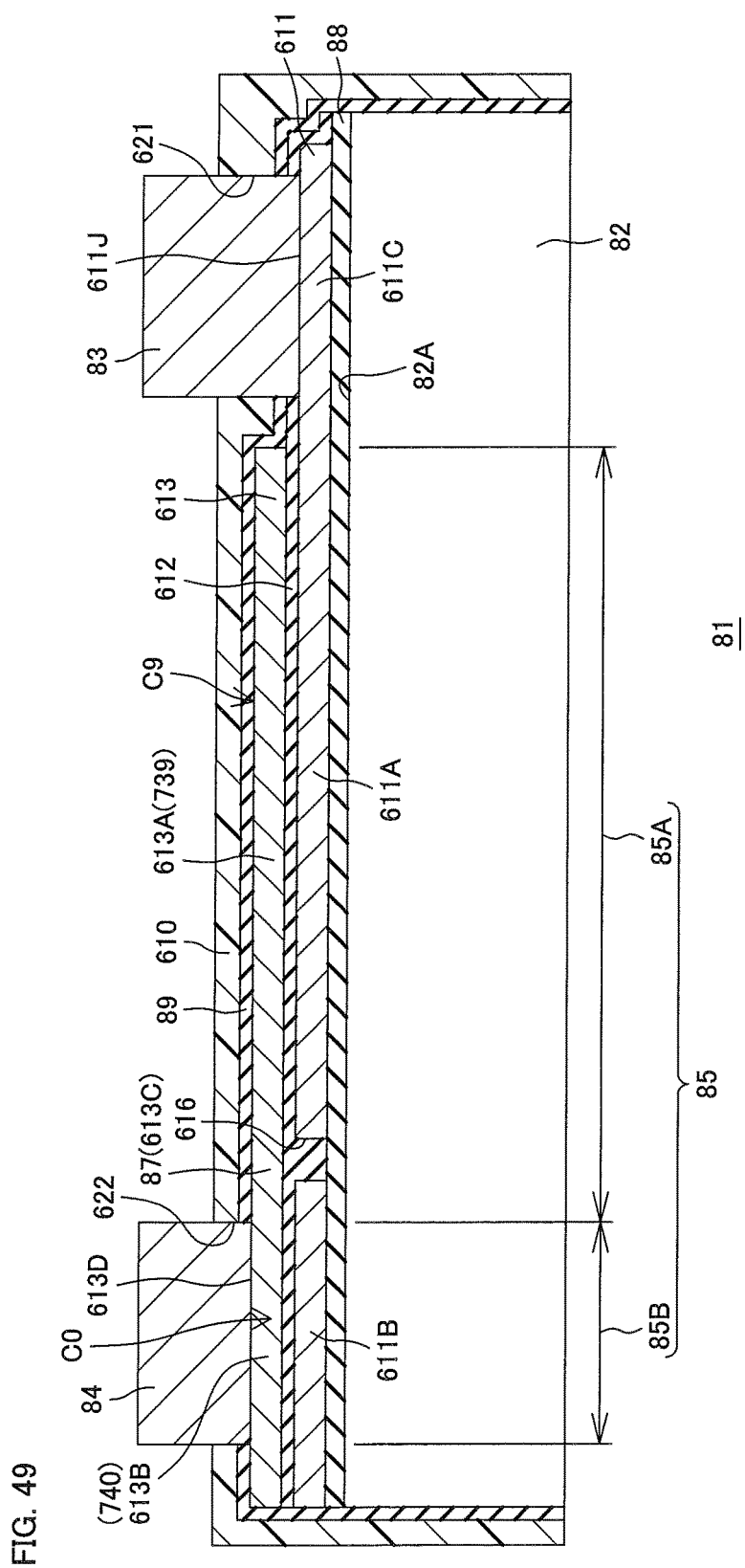
FIG. 49 is a sectional view taken along section line XLIX-XLIX in FIG. 48.
Figure 50:
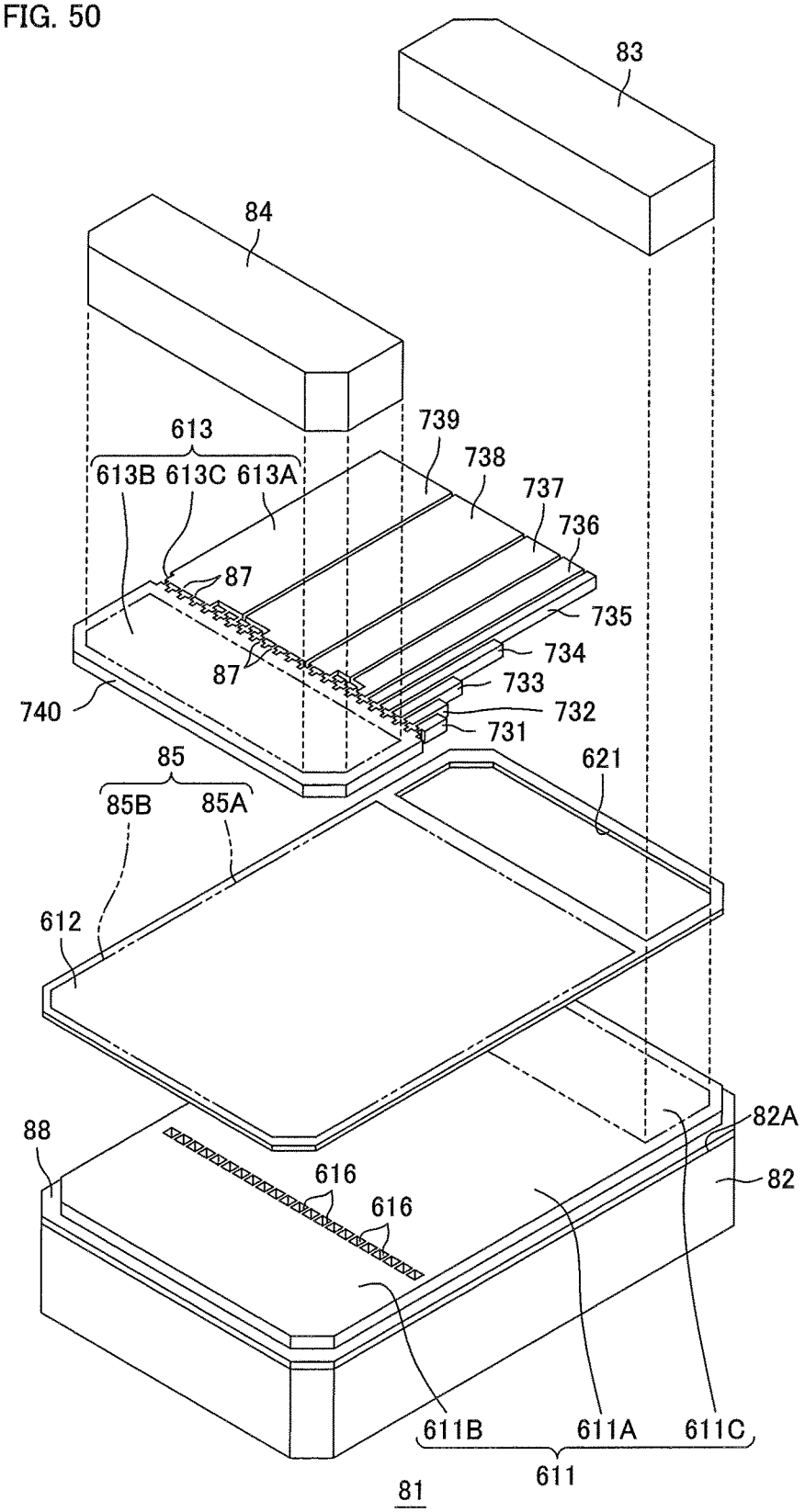
FIG. 50 is an exploded perspective view showing the arrangement of a portion of the chip capacitor in a separated state.

FIG. 48 is a plan view of a chip capacitor according to a first preferred embodiment of the fifth reference example, and FIG. 49 is a sectional view thereof showing a section taken along section line XLIX-XLIX in FIG. 48. Further, FIG. 50 is an exploded perspective view showing the arrangement of a portion of the chip capacitor in a separated state. The chip capacitor 81 includes a substrate 82, a first external electrode 83 disposed on the substrate 82 (at one surface 82A side of the substrate 82), and a second external electrode 84 disposed similarly on the substrate 82. In the present preferred embodiment, the substrate 82 has, in a plan view, a rectangular shape with the four corners chamfered. The first external electrode 83 and the second external electrode 84 are respectively disposed at portions at respective ends in the long direction of the substrate 82. In the present preferred embodiment, each of the first external electrode 83 and the second external electrode 84 has a substantially rectangular planar shape extending in the short direction of the substrate 82 and has chamfered portions at two locations respectively corresponding to the corners of the substrate 82. On the one surface 82A of the substrate 82, a plurality of capacitor elements C1 to C9 are disposed within a first capacitor arrangement region 85A between the first external electrode 83 and the second external electrode 84. The plurality of capacitor elements C1 to C9 are electrically connected respectively to the second external electrode 84 via a plurality of fuse units 87 (fuses). Also on the substrate 82, a capacitor element C0 is disposed in a second capacitor arrangement region 85B directly below the second external electrode 84 (at a position overlapping with the second external electrode 84 in a plan view). The capacitor element C0 is directly connected electrically to the second external electrode 84. Here, the entirety of the first capacitor arrangement region 85A and the second capacitor arrangement region 85B shall be referred to as the "capacitor arrangement region 85."

As shown in FIG. 49 and FIG. 50, an insulating film 88 is formed on the one surface 82A of the substrate 82, and a lower electrode film 611 is formed on the top surface of the insulating film 88. The lower electrode film 611 is formed to spread across substantially the entirety of the capacitor arrangement region 85. The lower electrode film 611 is thus formed to extend from first capacitor arrangement region 85A to the second capacitor arrangement region 85B between the second external electrode 84 and the substrate 82. Further, the lower electrode film 611 is formed to extend to a region directly below the first external electrode 83. More specifically, the lower electrode film 611 has a first capacitor electrode region 611A functioning as a lower electrode in common to the capacitor elements C1 to C9 in the first capacitor arrangement region 85A, a second capacitor electrode region 611B functioning as a lower electrode of the capacitor element C0 in the second capacitor arrangement region 85B, and a pad region 611C for leading out to an external electrode. The first capacitor electrode region 611A is positioned in the first capacitor arrangement region 85A, the second capacitor electrode region 611B is positioned in the second capacitor arrangement region 85B (directly below the second external electrode 84), and the pad region 611C is positioned directly below the first external electrode 83. An upper surface 611J of the pad region 611C is in contact with the first external electrode 83.

A plurality of openings 616 are formed at a boundary between the first capacitor electrode region 611A and the second capacitor electrode region 611B in the lower electrode film 611 (see FIG. 50). The plurality of openings 616 are disposed across intervals along the short direction of the substrate 82 (see FIG. 50). Each opening 616 penetrates through the lower electrode film 611 in the thickness direction. The first capacitor electrode region 611A and the second capacitor electrode region 611B are not continuous in regions in which the openings 616 are formed (see FIG. 49) but are continuous in regions in which the openings 616 are not formed (see FIG. 50).

In the capacitor arrangement region 85, a capacitance film (dielectric film) 612 is formed so as to cover the lower electrode film 611 (the first capacitor electrode region 611A and second capacitor electrode region 611B). The capacitance film 612 is continuous across the entireties of the first capacitor electrode region 611A (first capacitor arrangement region 85A) and the second capacitor electrode region 611B (second capacitor arrangement region 85B). The capacitance film 612 is thus formed on the lower electrode film 611 so as to extend from the first capacitor arrangement region 85A to the second capacitor arrangement region 85B between the second external electrode 84 and the substrate 82. In the present preferred embodiment, the capacitance film 612 further covers the insulating film 88 outside the capacitor arrangement region 85 and inside the respective openings 616.

An upper electrode film 613 is formed on the capacitance film 612. In FIG. 48, the upper electrode film 613 is colored for the sake of clarity. The upper electrode film 613 includes a capacitor electrode region 613A positioned in the first capacitor arrangement region 85A between the first external electrode 83 and the second external electrode 84, a pad region 613B positioned directly below the second external electrode 84 (in the second capacitor arrangement region 85B), and a fuse region 613C disposed between the capacitor electrode region 613A and the pad region 613B. The upper electrode film 613 is thus formed on the capacitance film 612 to extend from the first capacitor arrangement region 85A to the second capacitor arrangement region 85B between the second external electrode 84 and the substrate 82 (see FIG. 49).

In the capacitor electrode region 613A, the upper electrode film 613 is divided (separated) into a plurality of electrode film portions (upper electrode film portions) 731 to 739. In the present preferred embodiment, the respective electrode film portions 731 to 739 are all formed to rectangular shapes and extend in the form of bands from the fuse region 613C toward the first external electrode 83. The plurality of electrode film portions 731 to 739 face the lower electrode film 611 across the capacitance film 612 over a plurality of types of facing areas. More specifically, a ratio of the facing areas of the electrode film portions 731 to 739 with respect to the lower electrode film 611 may be set to be 1:2:4:8:16:32:64:128:128. That is, the plurality of electrode film portions 731 to 739 include the plurality of electrode film portions differing in facing area and more specifically include the plurality of electrode film portions 731 to 738 (or 731 to 737 and 739) having facing areas that are set to form a geometric progression with a common ratio of 2. The plurality of capacitor elements C1 to C9, respectively arranged by the respective electrode film portions 731 to 739 and the facing lower electrode film 611 across the capacitance film 612, thus include the plurality of capacitor elements having mutually different capacitance values. If the ratio of the facing areas of the electrode film portions 731 to 739 is as mentioned above, the ratio of the capacitance values of the capacitor elements C1 to C9 is equal to the ratio of the facing areas and is 1:2:4:8:16:32:64:128:128. The plurality of capacitor elements C1 to C9 thus include the plurality of capacitor elements C1 to C8 (or C1 to C7 and C9) with capacitance values set to form the geometric progression with the common ratio of 2.

In the present preferred embodiment, the electrode film portions 731 to 735 are formed to bands that are equal in width and have lengths with the ratio thereof being set to 1:2:4:8:16. Also, the electrode film portions 735, 736, 737, 738, and 739 are formed to bands that are equal in length and have widths with the ratio thereof being set to 1:2:4:8:8. The electrode film portions 735 to 739 are formed to extend across a range from an end edge at the second external electrode 84 side to an end edge at the first external electrode 83 side of the first capacitor arrangement region 85A, and the electrode film portions 731 to 734 are formed to be shorter than this range.

The pad region 613B is formed to be substantially similar in shape to the second external electrode 84 and has a substantially rectangular planar shape having two chamfered portions corresponding to corner portions of the substrate 82. As shown in FIG. 49, an upper surface 613D of the upper electrode film 613 in the pad region 613B is in contact with the second external electrode 84. The upper electrode film 613 in the pad region 613B functions as an electrode film portion 740. The electrode film portion 740 faces the lower electrode film 611 in the second capacitor electrode region 611B across the capacitance film 612. The electrode film portion 740, the capacitance film 612, and the lower electrode film 611 in the second capacitor electrode region 611B constitute the capacitor element C0. For example, the facing area of the electrode film portion 740 with respect to the lower electrode film 611 is approximately twice the facing area of the electrode film portion 738 or the electrode film portion 739 with respect to the lower electrode film 611 (see FIG. 48) and the capacitance value of the capacitor element C0 is approximately twice the capacitance value of the capacitor element C8 or the capacitor element C9.

With the present arrangement, a capacitor structure (capacitor elements C1 to C9) is formed not only at the one surface 82A side of the substrate 82 but a capacitor structure (capacitor element C0) is also formed in a region directly below the second external electrode 84. Increase of the capacitance value is thus realized by additional use of the region directly below the second external electrode 84 in the chip capacitor 81. A high capacitance can thus be realized by making maximum use of the area of the one surface 82A side of the substrate 82 and the chip capacitor 81 with which both compact size and high capacitance are realized can thus be provided.

The fuse region 613C is disposed along one long side (the long side at the inner side with respect to the peripheral edge of the substrate 82) of the pad region 613B. The fuse region 613C includes the plurality of fuse units 87 that are aligned along the one long side of the pad region 613B. The number of the fuse units 87 and the number of the openings 616 in the lower electrode film 611 are matched (see FIG. 50). A single opening 616 is positioned directly below a single fuse unit 87. The lower electrode film 611 is thus formed in a region avoiding regions (the openings 616) directly below the fuse units 87.

The fuse units 87 are formed of the same material as and to be integral to the pad region 613B of the upper electrode film 613. The plurality of electrode film portions 731 to 739 are each formed integral to one or a plurality of the fuse units 87, are connected to the pad region 613B (electrode film portion 740) via the fuse units 87, and are electrically connected to the second external electrode 84 via the pad region 613B. Each of the electrode film portions 731 to 736 of comparatively small area is connected to the pad region 613B via a single fuse unit 87, and each of the electrode film portions 737 to 739 of comparatively large area is connected to the pad region 613B via a plurality of fuse units 87. It is not necessary for all of the fuse units 87 to be used and, in the present preferred embodiment, a portion of the fuse units 87 is unused.

The fuse units 87 include first wide portions 87A arranged to be connected to the pad region 613B, second wide portions 87B arranged to be connected to the electrode film portions 731 to 739, and narrow portions 87C connecting the first and second wide portions 87A and 87B. The narrow portions 87C are arranged to be capable of being cut (fused) by laser light. Unnecessary electrode film portions among the electrode film portions 731 to 739 can thus be electrically disconnected from the first and second external electrodes 83 and 84 by cutting the fuse units 87.

Although omitted from illustration in FIG. 48 and FIG. 50, the top surface of the chip capacitor 81 that includes the top surface of the upper electrode film 613 is covered by a passivation film 89 as shown in FIG. 49. The passivation film 89 is constituted, for example, of a nitride film and is formed not only to cover the upper surface of the chip capacitor 81 but also to extend to side surfaces of the substrate 82 and cover the side surfaces. Further, a resin film 610, made of a polyimide resin, etc., is formed on the passivation film 89. The resin film 610 is formed to cover the upper surface of the chip capacitor 81 and extend to the side surfaces of the substrate 82 to cover the passivation film 89 on the side surfaces.

The passivation film 89 and the resin film 610 are protective films that protect the top surface of the chip capacitor 81. In these films, pad openings 621 and 622 are respectively formed in regions corresponding to the first external electrode 83 and the second external electrode 84. The pad openings 621 and 622 penetrate through the passivation film 89 and the resin film 610 so as to respectively expose a region of a portion of the pad region 611C of the lower electrode film 611 and a region of a portion of the pad region 613B of the upper electrode film 613. Further, with the present preferred embodiment, the pad opening 621 corresponding to the first external electrode 83 also penetrates through the capacitance film 612.

The first external electrode 83 and the second external electrode 84 are respectively embedded in the pad openings 621 and 622. The first external electrode 83 is thereby bonded to the pad region 611C of the lower electrode film 611 and the second external electrode 84 is bonded to the pad region 613B of the upper electrode film 613. The first and second external electrodes 83 and 84 are formed to project from the top surface of the resin film 610. The chip capacitor 81 can thereby be flip-chip bonded to a mounting substrate.

Figure 51:
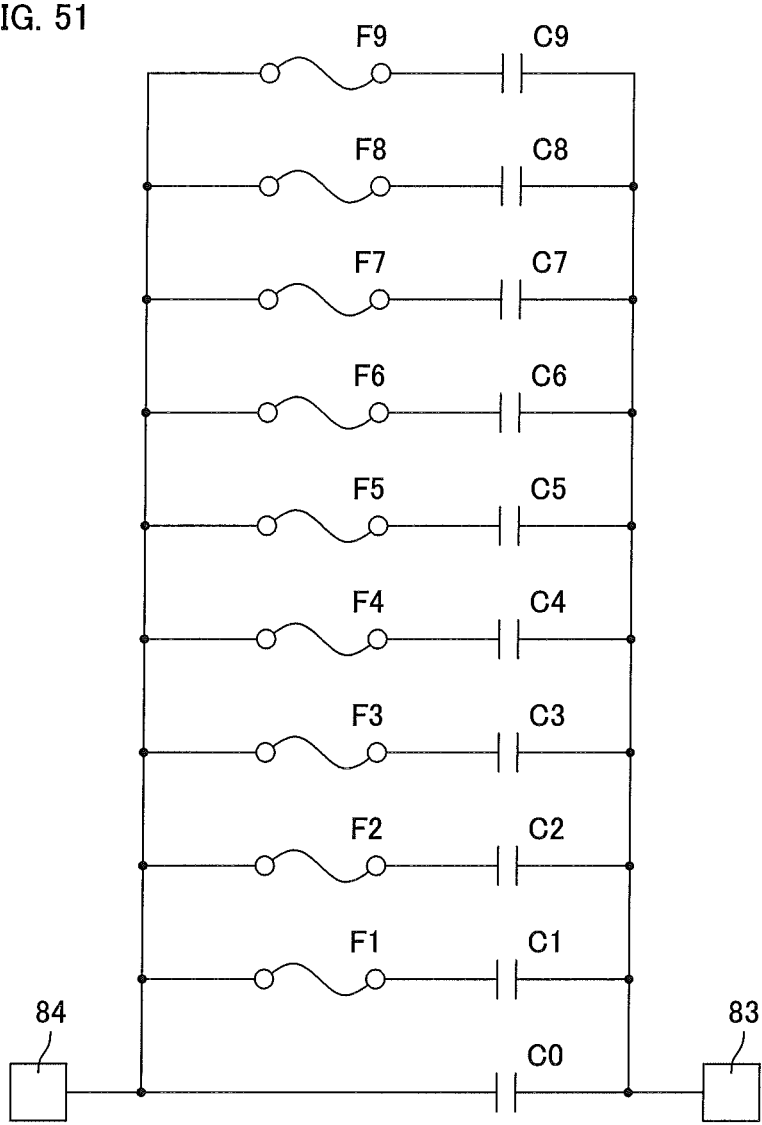
FIG. 51 is a circuit diagram of the electrical arrangement of the interior of the chip capacitor.

FIG. 51 is a circuit diagram of the electrical arrangement of the interior of the chip capacitor 81. The plurality of capacitor elements C0 to C9 are connected in parallel between the first external electrode 83 and the second external electrode 84. Fuses F1 to F9, each arranged from one or a plurality of the fuse units 87, are interposed in series between the respective capacitor elements C1 to C9 and the second external electrode 84. On the other hand, a fuse is not interposed between the capacitor element C0 and the second external electrode 84, and the capacitor element C0 is directly connected to the second external electrode 84.

When all of the fuses F1 to F9 are connected, the capacitance value of the chip capacitor 81 is equal to the total of the capacitance values of the capacitor elements C0 to C9. When one or two or more fuses selected from among the plurality of fuses F1 to F9 is or are cut, each capacitor element corresponding to a cut fuse is disconnected and the capacitance value of the chip capacitor 81 decreases by just the capacitance value of the disconnected capacitor element or elements. When all of the fuses F1 to F9 are cut, the capacitance value of the chip capacitor 81 is the capacitance value of the capacitor element C0.

Therefore by measuring the capacitance value across the pad regions 611C and 613B (the total capacitance value of the capacitor elements C0 to C9) and thereafter using laser light to fuse one or a plurality of fuses selected appropriately from among the fuses F1 to F9 in accordance with a desired capacitance value, adjustment (laser trimming) to the desired capacitance value can be performed. In particular, if the capacitance values of the capacitor elements C1 to C8 are set to form a geometric progression with a common ratio of 2, fine adjustment to the targeted capacitance value at a precision corresponding to the capacitance value of the capacitor element C1, which is the smallest capacitance value (value of the first term in the geometric progression), is made possible.

For example, the capacitance values of the capacitor elements C0 to C9 may be set as follows. C0=8 pF C1=0.03125 pF C2=0.0625 pF C3=0.125 pF C4=0.25 pF C5=0.5 pF C6=1 pF C7=2 pF C8=4 pF C9=4 pF. In this case, the capacitance of the chip capacitor 81 can be finely adjusted at a minimum adjustment precision of 0.03125 pF. Also, the fuses to be cut among the fuses F1 to F9 can be selected appropriately to provide the chip capacitor 81 with an arbitrary capacitance value between 10 pF and 18 pF.

As described above, with the present preferred embodiment, the plurality of capacitor elements C1 to C9 that can be disconnected by the fuses F1 to F9 are provided between the first external electrode 83 and the second external electrode 84. Further, the capacitor element C0 directly connected to the second external electrode 84 is provided directly below the second external electrode 84. The capacitor elements C1 to C9 include a plurality of capacitor elements that differ in capacitance value and more specifically include a plurality of capacitor elements with capacitance values set to form a geometric progression. The chip capacitor 81, which can accommodate a plurality of types of capacitance values without change of design and can be accurately adjusted to the desired capacitance value by selection and fusion by laser light of one or a plurality of fuses among the fuses F1 to F9, can thus be provided.

Details of respective portions of the chip capacitor 81 shall now be described. With reference to FIG. 48, the substrate 82 may have, for example, a rectangular shape of 0.3 mm×0.15 mm, 0.4 mm×0.2 mm, or 0.2 mm×0.1 mm, etc. (preferably a size of not more than 0.4 mm×0.2 mm) in a plan view. The capacitor arrangement region 85 is generally a square region with each side having a length corresponding to the length of the short side of the substrate 82. The thickness of the substrate 82 may be approximately 150 μm. With reference to FIG. 49, the substrate 82 may, for example, be a substrate that has been thinned by grinding or polishing from a rear surface side (surface on which the capacitor elements C0 to C9 are not formed). As the material of the substrate 82, a semiconductor substrate as represented by a silicon substrate may be used or a glass substrate may be used or a resin film may be used.

The insulating film 88 may be a silicon oxide film or other oxide film. The film thickness thereof may be approximately 500 Å to 2000 Å. The lower electrode film 611 is preferably a conductive film, a metal film in particular, and may, for example, be an aluminum film. The lower electrode film 611 that is constituted of an aluminum film may be formed by a sputtering method. Similarly, the upper electrode film 613 is preferably constituted of a conductive film, a metal film in particular, and may, for example, be an aluminum film. The upper electrode film 613 that is constituted of an aluminum film may be formed by the sputtering method. The patterning for dividing the capacitor electrode region 613A of the upper electrode film 613 into the electrode film portions 731 to 739, forming the electrode film portion 740 in the pad region 613B, and shaping the fuse region 613C into the plurality of fuse units 87 may be performed by photolithography and etching processes.

The capacitance film 612 may be constituted, for example, of a silicon nitride film, and the film thickness thereof may be 500 Å to 2000 Å (for example, 1000 Å). The capacitance film 612 may be a silicon nitride film formed by plasma CVD (chemical vapor deposition). The passivation film 89 may be constituted, for example, of a silicon nitride film and may be formed, for example, by the plasma CVD method. The film thickness thereof may be approximately 8000 Å. As mentioned above, the resin film 610 may be constituted of a polyimide film or other resin film.

Each of the first and second external electrodes 83 and 84 may, for example, be constituted of a laminated structure film in which a nickel layer in contact with the lower electrode film 611 or the upper electrode film 613, a palladium layer laminated on the nickel layer, and a gold layer laminated on the palladium layer are laminated, and may be formed, for example, by a plating method (or more specifically, an electroless plating method). The nickel layer contributes to improvement of adhesion with the lower electrode film 611 or the upper electrode film 613, and the palladium layer functions as a diffusion preventing layer that suppresses mutual diffusion of the material of the upper electrode film or the lower electrode film and the gold of the uppermost layer of each of the first and second external electrodes 83 and 84.

Figure 52:
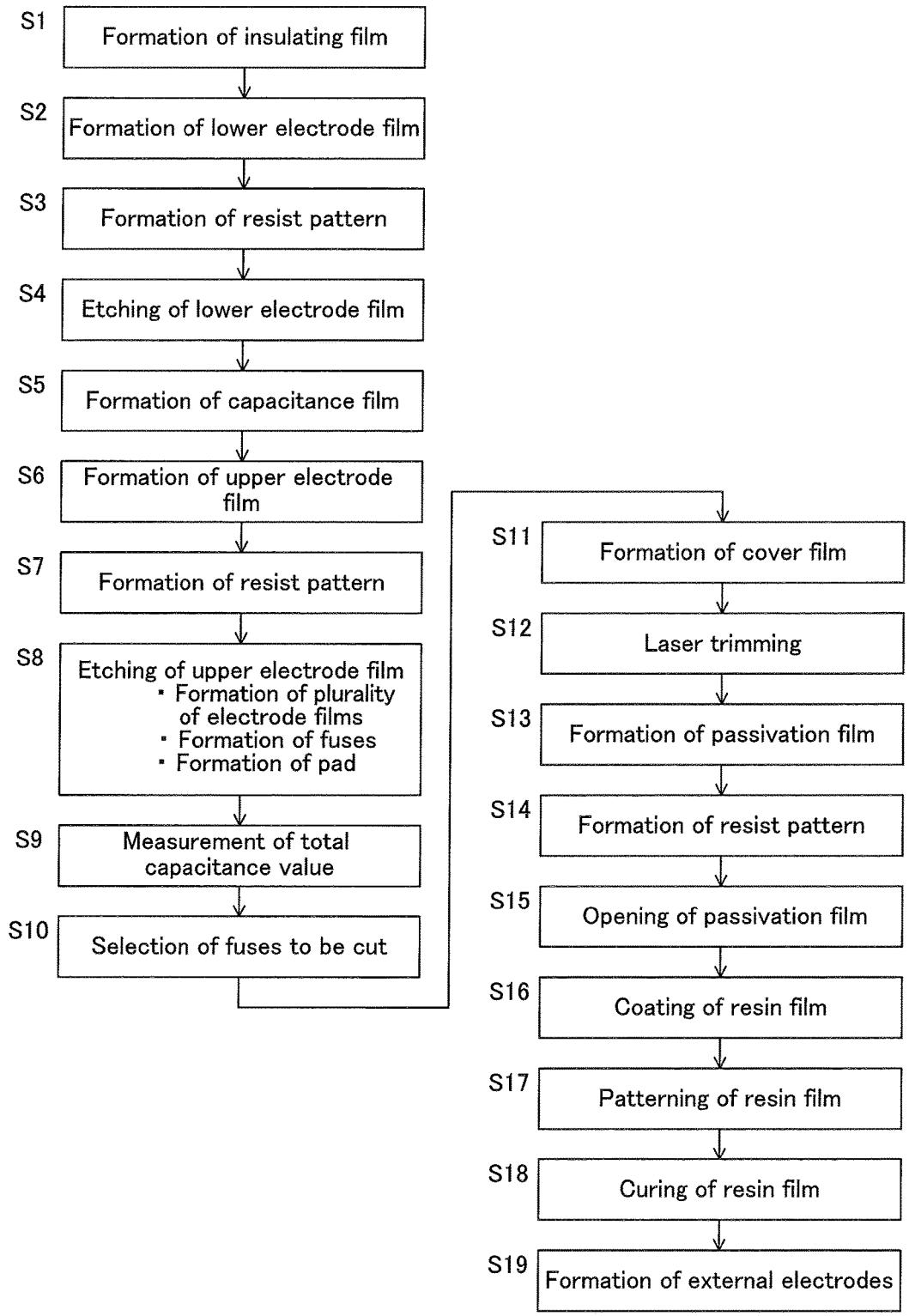
FIG. 52 is a flow diagram for describing an example of a process for manufacturing the chip capacitor.

FIG. 52 is a flow diagram for describing an example of a process for manufacturing the chip capacitor 81. The insulating film 88, constituted of an oxide film (for example, a silicon oxide film), is formed on the top surface of the substrate 82 by a thermal oxidation method and/or CVD method (step S1). Thereafter, the lower electrode film 611, constituted of an aluminum film, is formed over the entire top surface of the insulating film 88, for example, by the sputtering method (step S2). The film thickness of the lower electrode film 611 may be approximately 8000 Å. Thereafter, a resist pattern corresponding to the final shape of the lower electrode film 611 is formed on the top surface of the lower electrode film by photolithography (step S3). The lower electrode film is etched using the resist pattern as a mask to obtain the lower electrode film 611 of the pattern shown in FIG. 48, etc., and having the openings 616 (see FIG. 50) (step S4). The etching of the lower electrode film 611 may be performed, for example, by reactive ion etching.

Thereafter, the capacitance film 612, constituted of a silicon nitride film, etc., is formed on the lower electrode film 611, for example, by the plasma CVD method (step S5). In the regions in which the lower electrode film 611 is not formed (the inner sides of the openings 616, etc.), the capacitance film 612 is formed on the top surface of the insulating film 88. Thereafter, the upper electrode film 613 is formed on the capacitance film 612 (step S6). The upper electrode film 613 is constituted, for example, of an aluminum film and may be formed by the sputtering method. The film thickness thereof may be approximately 8000 Å. Thereafter, a resist pattern corresponding to the final shape of the upper electrode film 613 is formed on the top surface of the upper electrode film 613 by photolithography (step S7). The upper electrode film 613 is patterned to its final shape (see FIG. 48, etc.) by etching using the resist pattern as a mask (step S8). The upper electrode film 613 is thereby shaped to the pattern having the plurality of electrode film portions 731 to 739 in the capacitor electrode region 613A, having the plurality of fuse units 87 in the fuse region 613C, having the pad region 613B connected to the fuse units 87, and having the electrode film portion 740 in the pad region 613B. The etching for patterning the upper electrode film 613 may be performed by wet etching using an etching liquid, such as phosphoric acid, etc., or may be performed by reactive ion etching. Here, the electrode film portions 731 to 740 and the fuse units 87 of the upper electrode film 613 are formed of films of the same conductive material and these can thus be formed by patterning from the same film. The manufacturing process is thereby simplified.

Thereafter, inspection probes are contacted against the pad region 613B of the upper electrode film 613 and the pad region 611C of the lower electrode film 611 to measure the total capacitance value of the plurality of capacitor elements C0 to C9 (step S9). Based on the measured total capacitance value, the capacitor elements to be disconnected, that is, the fuses to be cut are selected in accordance with the targeted capacitance value of the chip capacitor 81 (step S10).

Figure 53A:
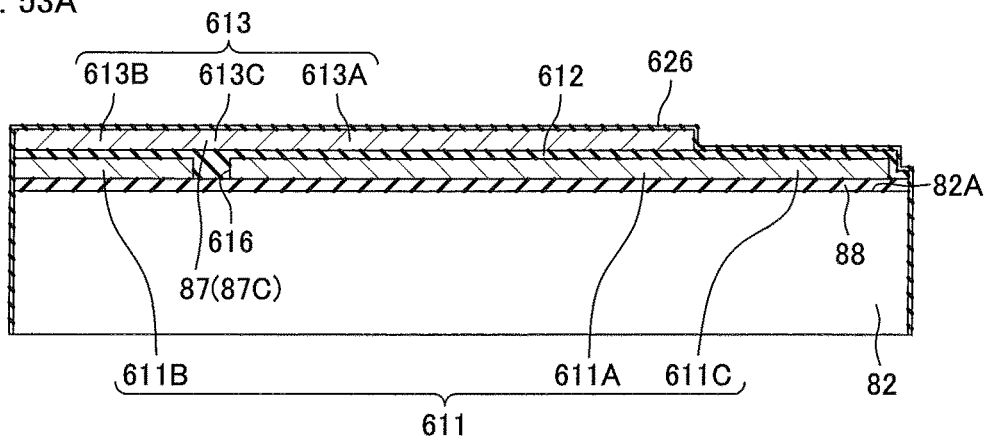
FIG. 53A, FIG. 53B, and FIG. 53C are sectional views for describing steps related to the cutting of a fuse.

Thereafter, as shown in FIG. 53A, a cover film 626, constituted, for example, of a nitride film, is formed on the entire surface of the substrate 82 (step S11). The forming of the cover film 626 may be performed by the plasma CVD method and, for example, a silicon nitride film with a film thickness of approximately 3000 Å may be formed. The cover film 626 covers the patterned upper electrode film 613 and covers the capacitance film 612 in the region in which the upper electrode film 613 is not formed. The cover film 626 covers the fuse units 87 in the fuse region 613C.

Figure 53B:
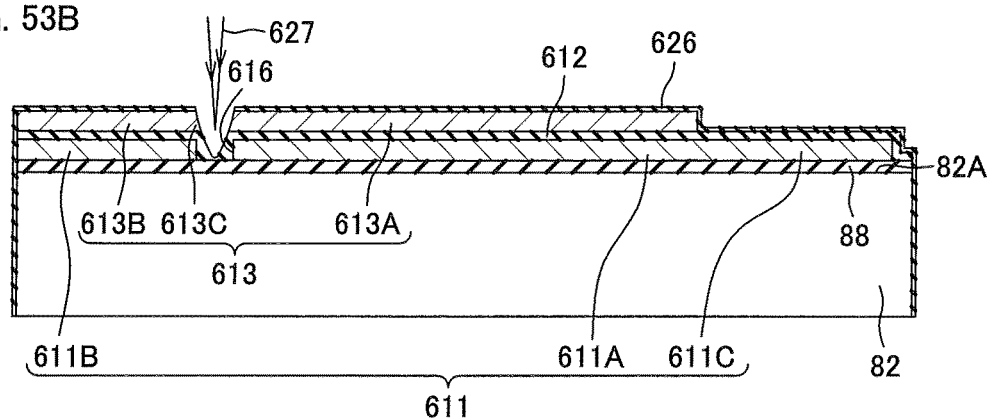

From this state, the laser trimming for fusing the fuse units 87 is performed (step S12). That is, as shown in FIG. 53B, each fuse unit 87 constituting a fuse selected in accordance with the measurement result of the total capacitance value is irradiated with laser light 627 and the narrow portion 87C of the fuse unit 87 is fused. The corresponding capacitor element is thereby disconnected from the pad region 613B. When the laser light 627 is irradiated on the fuse unit 87, the energy of the laser light 627 is accumulated at a vicinity of the fuse unit 87 by the action of the cover film 626 and the fuse unit 87 is thereby fused. The capacitance value of the chip capacitor 81 can thereby be set to the targeted capacitance value reliably.

Here, as mentioned above, the lower electrode film 611 is formed in the region avoiding the regions (openings 616) directly below the fuse units 87. Therefore when a fuse unit 87 is cut by the laser light 627, even if a fragment resulting from the cutting reaches the region directly below the fuse unit 87, the lower electrode film 611 is not present at that region. Problems due to the fragment, such as short-circuiting between the upper electrode film 613 and the lower electrode film 611 and corrosion of the lower electrode film 611, can thus be avoided. Also, the lower electrode film 611 is formed in the region avoiding the regions directly below the fuse units 87 (regions irradiated by the laser light), and therefore when a fuse unit 87 is cut, a problem of the lower electrode film 611 becoming damaged due to the lower electrode film 611 also being cut can be avoided.

Figure 53C:
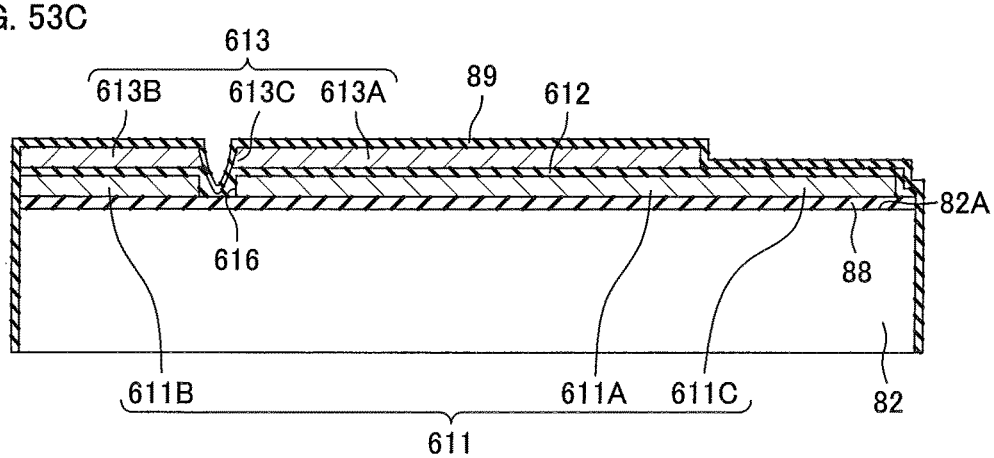

Thereafter, as shown in FIG. 53C, a silicon nitride film is deposited on the cover film 626, for example, by the plasma CVD method to form the passivation film 89 (step S13). In the final form, the cover film 626 is made integral with the passivation film 89 to constitute a portion of the passivation film 89. The passivation film 89 that is formed after the cutting of the fuses enters into openings in the cover film 626, destroyed at the same time as the fusing of the fuses, to cover and protect the cut surfaces of the fuse units 87. The passivation film 89 thus prevents entry of foreign matter and entry of moisture into the cut locations of the fuse units 87. The chip capacitor 81 which is high in reliability can thereby be manufactured. The passivation film 89 may be formed to have a film thickness, for example, of approximately 8000 Å as a whole.

Thereafter, a resist pattern, having penetrating holes at positions at which the first and second external electrodes 83 and 84 are to be formed, is formed on the passivation film 89 (step S14). The passivation film 89 is etched using the resist pattern as a mask. The pad opening exposing the lower electrode film 611 in the pad region 611C and the pad opening exposing the upper electrode film 613 in the pad region 613B are thereby formed (step S15). The etching of the passivation film 89 may be performed by reactive ion etching. In the process of etching of the passivation film 89, the capacitance film 612, which is similarly constituted of a nitride film, is also opened and the pad region 611C of the lower electrode film 611 is thereby exposed.

Thereafter a resin film is coated on the entire surface (step S16). As the resin film, for example, a coating film of a photosensitive polyimide is used. Patterning of the resin film by photolithography may be performed by performing an exposure step and a subsequent developing step on regions of the resin film corresponding to the pad openings (step S17). The pad openings 621 and 622 penetrating through the resin film 610 and the passivation film 89 are thereby formed. Thereafter, heat treatment (curing) for hardening the resin film is performed (step S18) and further, the first external electrode 83 and the second external electrode 84 are grown inside the pad openings 621 and 622, for example, by the electroless plating method (step S19). The chip capacitor 81 of the structure shown in FIG. 48, etc., is thereby obtained.

In the patterning of the upper electrode film 613 using the photolithography process, the electrode film portions 731 to 740 of minute areas can be formed with high precision and the fuse units 87 of even finer pattern can be formed. After the patterning of the upper electrode film 613, the total capacitance value is measured and then the fuses to be cut are determined. By cutting the determined fuses, the chip capacitor 81 that is accurately adjusted to the desired capacitance value can be obtained.

Figure 54:
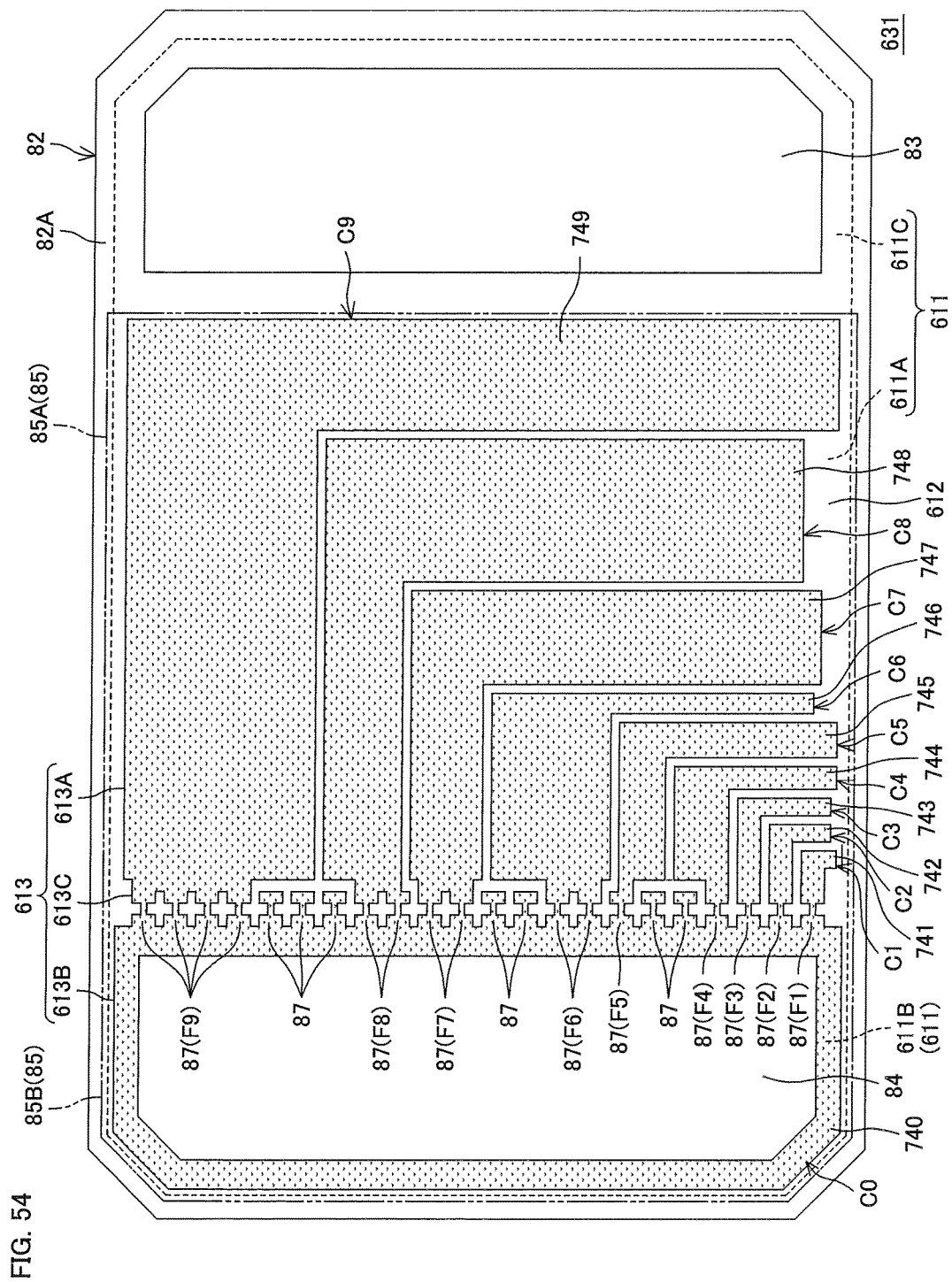
FIG. 54 is a plan view for describing the arrangement of a chip capacitor according to a second preferred embodiment of the fifth reference example.

Also by use of the portion directly below the second external electrode 84 as an effective capacitance area, the present chip capacitor 81 is made unlikely to be influenced by a parasitic capacitance between the second external electrode 84 and the substrate 82, and the chip capacitor 81 of higher precision can thereby be provided. FIG. 54 is a plan view for describing the arrangement of a chip capacitor 631 according to a second preferred embodiment of the fifth reference example. In FIG. 54, portions corresponding to respective portions shown in FIG. 48 are indicated using the same reference symbols as in FIG. 48.

In the first preferred embodiment, the capacitor electrode region 613A of the upper electrode film 613 is divided into the electrode film portions 731 to 739 each having a band shape. In this case, regions that cannot be used as capacitor elements are formed within the capacitor arrangement region 85 as shown in FIG. 48 and effective use cannot be made of the restricted region on the small substrate 82. Therefore with the preferred embodiment shown in FIG. 54, the plurality of electrode film portions 731 to 739 are divided into L-shaped electrode film portions 741 to 749. For example, the electrode film portion 749 in the arrangement of FIG. 54 can thereby be made to face the lower electrode film 611 over an area that is 1.5 times that of the electrode film portion 739 in the arrangement of FIG. 48. Therefore, if the capacitor element C9 corresponding to the electrode film portion 739 in the first preferred embodiment of FIG. 48 has a capacitance of 4 pF, the capacitor element C9 can be made to have a capacitance of 6 pF by use of the electrode film portion 749 of the present preferred embodiment. The capacitance value of the chip capacitor 81 can thereby be set over a wider range by making effective use of the interior of the capacitor arrangement region 85.

Figure 55:
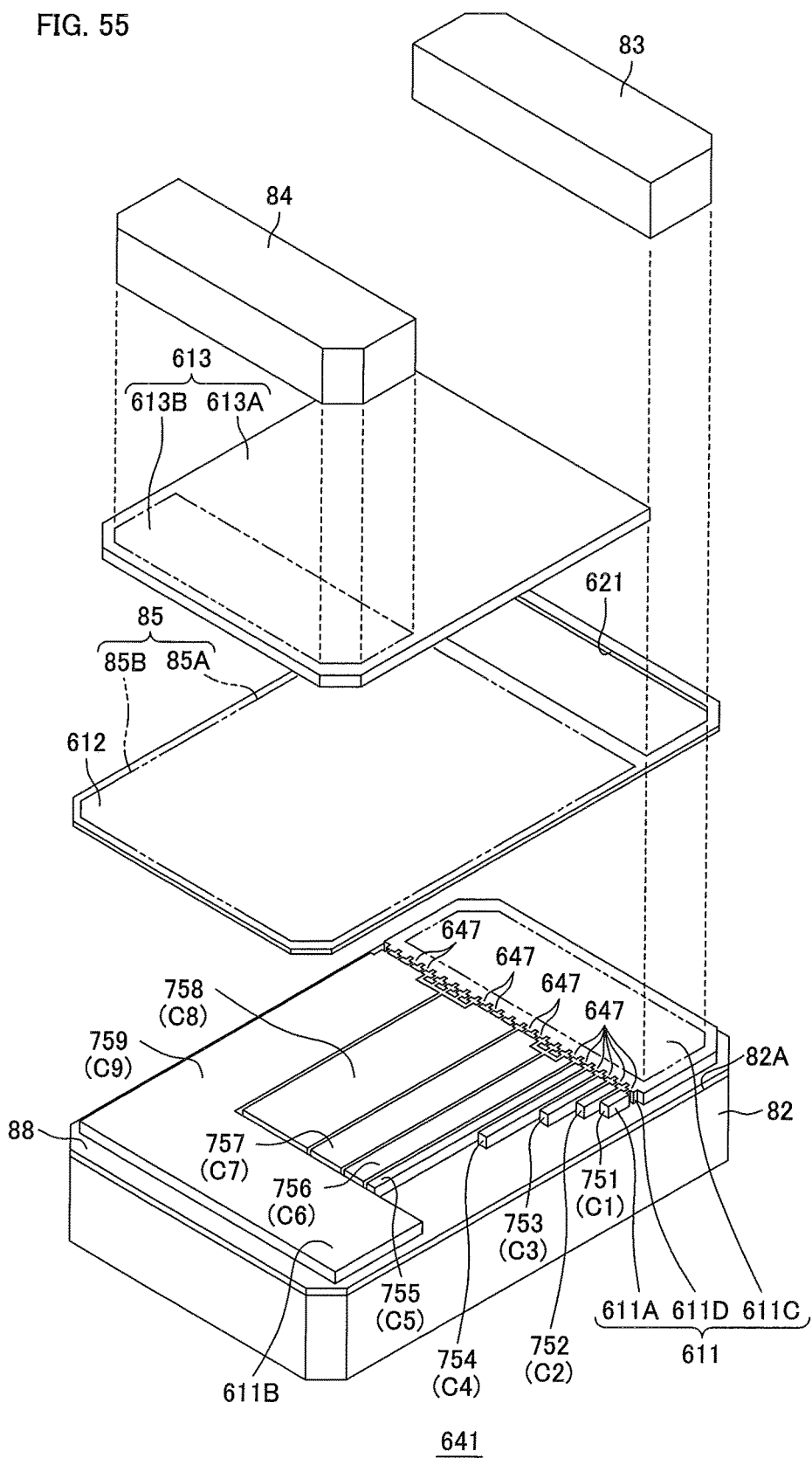
FIG. 55 is an exploded perspective view for describing the arrangement of a chip capacitor according to a third preferred embodiment of the fifth reference example.

The process for manufacturing the chip capacitor 631 according to the present preferred embodiment is practically the same as the process shown in FIG. 52. However, in the patterning of the upper electrode film 613 (steps S7 and S8), the capacitor electrode region 613A is divided into the plurality of electrode film portions 741 to 749 of the shapes shown in FIG. 54. FIG. 55 is an exploded perspective view for describing the arrangement of a chip capacitor 641 according to a third preferred embodiment of the fifth reference example, and the respective portions of the chip capacitor 641 are shown in the same manner as in FIG. 50 used for describing the first preferred embodiment.

With the first preferred embodiment, the lower electrode film 611 has the first capacitor electrode region 611A and the second capacitor electrode region 611B constituted of a pattern that is continuous across substantially the entirety of the capacitor arrangement region 85, and the capacitor electrode region 613A of the upper electrode film 613 is divided into the plurality of electrode film portions 731 to 739 (see FIG. 50). In contrast, with the third preferred embodiment, whereas the capacitor electrode region 613A and the pad region 613B of the upper electrode film 613 are formed to a continuous film pattern that is continuous across substantially the entirety of the capacitor arrangement region 85, the first capacitor electrode region 611A and the second capacitor electrode region 611B of the lower electrode film 611 are divided into a plurality of electrode film portions 751 to 759. The electrode film portions 751 to 759 may be formed in the same shapes and area ratio as those of the electrode film portions 731 to 739 in the first preferred embodiment or may be formed in the same shapes and area ratio as those of the electrode film portions 741 to 749 in the second preferred embodiment. At least one of the electrode film portions 751 to 759 (in FIG. 55, only the electrode film portion 759) extends to directly below the second external electrode 84 in the second capacitor electrode region 611B. A plurality of capacitor elements are thus arranged by the electrode film portions 751 to 759, the capacitance film 612, and the upper electrode film 613. At least a portion of the plurality of capacitor elements constitutes a set of capacitor elements that differ in capacitance value (for example, with the respective capacitance values being set to form a geometric progression). The electrode film portion 751 to 759 constitute the capacitor elements C1 to C9, in that order. The electrode film portion 759 in FIG. 55 is bent to an L-shape and is formed across the entirety of the second capacitor arrangement region 85B. Therefore the capacitance value of the capacitor element C9 can be made greater than the capacitance value of the capacitor element C8 and, for example, can be made twice the capacitance value of the capacitor element C8. Therefore unlike in the first preferred embodiment in which the capacitance values of the capacitor elements C8 and 9 are the same (see FIG. 48), the capacitance values of all of the capacitor elements C1 to C9 can be made to form a geometric progression.

The lower electrode film 611 further has a fuse region 611D between the first capacitor electrode region 611A and the pad region 611C. In the fuse region 611D, a plurality of fuse units 647, similar to the fuse units 87 of the first preferred embodiment, are aligned in a single column along the pad region 611C. Each of the electrode film portions 751 to 759 is connected to the pad region 611C via one or a plurality of the fuse units 647.

The electrode film portions 751 to 759 face the upper electrode film 613 over mutually different facing areas in the present arrangement as well and any of these can be disconnected individually by cutting the fuse unit 647. The same effects as those of the first preferred embodiment are thus obtained. In particular, by forming at least a portion of the plurality of electrode film portions 751 to 759 so as to face the upper electrode film 613 over facing areas set to form a geometric progression with a common ratio of 2, a chip capacitor that is precisely adjusted to the required capacitance value can be provided in the same manner as in the first preferred embodiment.

The process for manufacturing the chip capacitor 641 according to the present preferred embodiment is practically the same as the process shown in FIG. 52. However, in the patterning of the lower electrode film 611 (steps S3 and S4), the first capacitor electrode region 611A and the second capacitor electrode region 611B are divided into the electrode film portions 751 to 759 and the plurality of fuse units 647 are formed in the fuse region 611D. Also, in the patterning of the upper electrode film 613 (steps S7 and S8), a plurality of electrode film portions are not formed and fuse units are also not formed. However, the upper electrode film 613 is patterned so as not to overlap with the respective fuse units 647 in a plan view. Further, in the laser trimming (step S12), the fuse units 647 formed in the lower electrode film 611 are cut by laser light. The lower electrode film 611 is covered by the capacitance film 612 and the capacitance film 612 can thus be used as a cover film for accumulating the energy of the laser light in the process of laser trimming. The forming of the cover film (step S11) immediately before the laser trimming may thus be omitted. The upper electrode film 613 is not cut by the laser trimming because the upper electrode film 613 does not overlap with the respective fuse units 647 in a plan view as mentioned above.

Although preferred embodiments of the fifth reference example have been described above, the fifth reference example may be implemented in yet other modes as well. For example, although with each of the preferred embodiments described above, the arrangement where just one of either of the upper electrode film and the lower electrode film is divided into the plurality of electrode films was described, both the upper electrode film and the lower electrode film may be divided into a plurality of electrode film portions. Further, although with each of the preferred embodiments, an example where each fuse unit is made integral with the upper electrode film or the lower electrode film was described, the fuse units may be formed from a conductor film separate from the upper electrode film and the lower electrode film. Further, although with each of the preferred embodiments, an example where the plurality of capacitor elements include a plurality of capacitor elements having capacitance values that form a geometric progression with a common ratio r (0<r; r≠1)=2 was described, the common ratio of the geometric progression may be a numeral other than 2. Also with each of the preferred embodiments, the insulating film 88 is formed on the top surface of the substrate 82, the insulating film 88 may be omitted if the substrate 82 is an insulating substrate. Also, a conductive substrate may be used as the substrate 82, the conductive substrate may be used as a lower electrode, and the capacitance film 612 may be formed so as to be in contact with the top surface of the conductive substrate. In this case, one of the external electrodes may be led out from a rear surface of the conductive substrate.

Besides the above, various design changes may be applied within the scope of the matters described as features of the invention according to the (1) fifth reference example. For example, arrangements with which a step of manufacture not specified in the respective features E1 to E22 is changed, omitted, or added are also included within the scope of the fifth reference example.

DESCRIPTION OF THE SYMBOLS

C1 to C19 Capacitor elements, C21 to C29 Capacitor elements, C31 to C34 Capacitor elements, F1 to F9 Fuses, F11 to F19 Fuses, F21 to F24 Fuses, 1 Chip capacitor, 2 Substrate, 2A Principal surface, 3 First external electrode, 4 Second external electrode, 7 Fuse unit, 9 Passivation film, 10 Resin film, 11 First electrode film, 12 First capacitance film, Second electrode film, 131 to 139 Electrode film portions, 141 to 149 Electrode film portions, 151 to 159 Electrode film portions, 16 Third electrode film, 17 Second capacitance film, 181 to 184 Electrode film portions, 25 Chip capacitor, 26 Chip capacitor, 27 Fuse unit, 28 Fuse unit

What is claimed is:

1. A chip capacitor comprising:
a substrate having a front surface and a rear surface, the substrate made of a silicon;
a first external electrode disposed only on the front surface of the substrate;
a second external electrode disposed only on the front surface of the substrate;
a plurality of capacitor elements, respectively including a first electrode film formed on the substrate, a first capacitance film formed on the first electrode film, a second electrode film formed on the first capacitance film so as to face the first electrode film, a second capacitance film formed on the second electrode film, and a third electrode film formed on the second capacitance film so as to face the second electrode film, and being connected between the first external electrode and the second external electrode;
a plurality of fuses that are formed on the substrate, are each interposed between the plurality of capacitor elements and the first external electrode or the second external electrode, and are capable of disconnecting each of the plurality of capacitor elements; and
an insulating film covering the front surface and a side surface of the substrate, the insulating film having a first opening and a second opening, wherein
the first external electrode and the second external electrode project upwardly from the first opening and the second opening, respectively,
the insulating film is exposed on the side surface of the substrate and has an exposed portion which is not covered with the first external electrode and the second external electrode on the side surface of the substrate, and
the rear surface of the substrate is a polishing surface.

2. The chip capacitor according to claim 1, wherein the plurality of capacitor elements have mutually different capacitance values.

3. The chip capacitor according to claim 2, wherein the capacitance values of the plurality of capacitor elements are set to form a geometric progression.

4. The chip capacitor according to claim 1, wherein at least one of the plurality of fuses is cut.

5. The chip capacitor according to claim 1, wherein the second electrode film is divided into a plurality of second electrode film portions and the plurality of fuses are connected respectively to the plurality of the second electrode film portions.

6. The chip capacitor according to claim 5, wherein the plurality of second electrode film portions face the first electrode film and the third electrode film over mutually different facing areas.

7. The chip capacitor according to claim 6, wherein the facing areas of the plurality of second electrode film portions are set to form a geometric progression.

8. The chip capacitor according to claim 5, wherein the fuses and the first electrode film, the second electrode film, or the third electrode film are formed of films of the same conductive material.

9. The chip capacitor according to claim 1, wherein the first electrode film is divided into a plurality of first electrode film portions and the plurality of fuses are connected respectively to the plurality of the first electrode film portions.

10. The chip capacitor according to claim 9, wherein the plurality of first electrode film portions face the second electrode film over mutually different facing areas.

11. The chip capacitor according to claim 10, wherein the facing areas of the plurality of first electrode film portions are set to form a geometric progression.

12. The chip capacitor according to claim 1, wherein the third electrode film is divided into a plurality of third electrode film portions and the plurality of fuses are connected respectively to the plurality of the third electrode film portions.

13. The chip capacitor according to claim 12, wherein the plurality of third electrode film portions face the second electrode film over mutually different facing areas.

14. The chip capacitor according to claim 13, wherein the facing areas of the plurality of third electrode film portions are set to form a geometric progression.

15. The chip capacitor according to claim 1, wherein the plurality of fuses are disposed with the positions thereof being shifted so as not to overlap with each other in a plan view of looking down at a principal surface of the substrate perpendicularly.

16. A method for manufacturing a chip capacitor comprising:
   a step of forming a plurality of capacitor elements on a substrate having a front surface and a rear surface, the substrate made of a silicon;
   a step of forming a first external electrode disposed only on the front surface of the substrate and a second external electrode disposed only on the front surface of the substrate on the substrate; and
   a step of forming, on the substrate, a plurality of fuses that disconnectably connect each of the plurality of capacitor elements to the first external electrode or the second external electrode; and
   wherein the step of forming the plurality of capacitor elements includes:
   a step of forming a first electrode film on the substrate;
   a step of forming a first capacitance film on the first electrode film;
   a step of forming a second electrode film on the first capacitance film so as to face the first electrode film;
   a step of forming a second capacitance film on the second electrode film;
   a step of forming a third electrode film on the second capacitance film so as to face the second electrode film;
   a step of dividing at least one among the first electrode film, the second electrode film, and the third electrode film into a plurality of electrode film portions; and
   a step of forming an insulating film covering the front surface and a side surface of the substrate, the insulating film having a first opening and a second opening,
   wherein the first external electrode and the second external electrode project upwardly from the first opening and the second opening, respectively,
   the insulating film is exposed on the side surface of the substrate and has an exposed portion which is not covered with the first external electrode and the second external electrode on the side surface of the substrate, and
   the rear surface of the substrate is a polishing surface.

17. The method for manufacturing a chip capacitor according to claim 16, wherein the fuses are formed so as to be connected respectively to the plurality of electrode film portions.

18. The method for manufacturing a chip capacitor according to claim 16, wherein the plurality of electrode film portions are formed so as to face the electrode film, being faced across the first capacitance film or the second capacitance film, over mutually different facing areas.

19. The method for manufacturing a chip capacitor according to claim 18, wherein the facing areas of the plurality of electrode film portions are set to form a geometric progression.

20. The method for manufacturing a chip capacitor according to claim 16, wherein the plurality of fuses are formed with the positions thereof being shifted so as not to overlap with each other in a plan view of looking down at a principal surface of the substrate perpendicularly.

21. The method for manufacturing a chip capacitor according to claim 16, wherein the fuses and the first electrode film, the second electrode film, or the third electrode film are formed of films of the same conductive material.

22. The method for manufacturing a chip capacitor according to claim 16, further comprising a fuse cutting step of cutting at least one of the plurality of fuses.

23. The method for manufacturing a chip capacitor according to claim 22, further comprising: a step of measuring a total capacitance value of the plurality of capacitor elements; and a step of selecting each fuse to be cut based on the measured total capacitance value; and wherein each selected fuse is cut in the fuse cutting step.

24. The method for manufacturing a chip capacitor according to claim 22, further comprising a step of forming, after cutting the fuse or fuses, a protective film covering the cut portion of each fuse.

* * * * *